US012805194B2

(12) United States Patent
Furue et al.

(10) Patent No.: US 12,805,194 B2
(45) Date of Patent: Nov. 17, 2026

(54) LIGHT EMITTING ELEMENT AND FUSED POLYCYCLIC COMPOUND FOR THE SAME

(71) Applicant: Samsung Display Co., Ltd., Yongin-si (KR)

(72) Inventors: Ryuhei Furue, Yokohama (JP); Hirokazu Kuwabara, Yokohama (JP)

(73) Assignee: Samsung Display Co., Ltd., Yongin-si (KR)

(*) Notice: Subject to any disclaimer, the term of this patent is extended or adjusted under 35 U.S.C. 154(b) by 354 days.

(21) Appl. No.: 18/490,017

(22) Filed: Oct. 19, 2023

(65) Prior Publication Data

US 2024/0292751 A1 Aug. 29, 2024

(30) Foreign Application Priority Data

Jan. 30, 2023 (KR) ........................ 10-2023-0011607

(51) Int. Cl.
*H10K 85/60* (2023.01)
*C07F 5/02* (2006.01)
(Continued)

(52) U.S. Cl.
CPC ........... *H10K 85/658* (2023.02); *C07F 5/027* (2013.01); *C09K 11/06* (2013.01);
(Continued)

(58) Field of Classification Search
CPC ..... H10K 50/00; H10K 85/615; H10K 85/636
See application file for complete search history.

(56) References Cited

U.S. PATENT DOCUMENTS 12,171,142 B2 12/2024 Kim et al.
2020/0176679 A1 6/2020 Jeong et al.
(Continued)

FOREIGN PATENT DOCUMENTS

CN 113999256 2/2022
CN 114014881 2/2022
(Continued)

*Primary Examiner* — Khanh T Nguyen
(74) *Attorney, Agent, or Firm* — Womble Bond Dickinson (US) LLP

(57) ABSTRACT

Embodiments provide a light emitting element that includes a first electrode, a second electrode disposed on the first electrode, and an emission layer disposed between the first electrode and the second electrode. The emission layer includes a first compound represented by Formula 1, which is explained in the specification.

[Formula 1]

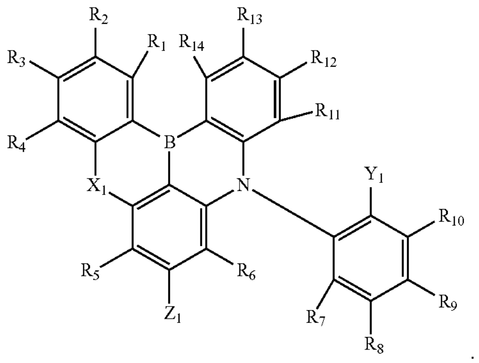

20 Claims, 10 Drawing Sheets

(51) Int. Cl.

| | |
|---|---|
| ***C09K 11/06*** | (2006.01) |
| *H10K 50/12* | (2023.01) |
| *H10K 101/00* | (2023.01) |

(52) U.S. Cl.
CPC ...... *C09K 2211/1018* (2013.01); *H10K 50/12* (2023.02); *H10K 2101/90* (2023.02)

(56) References Cited

U.S. PATENT DOCUMENTS

| | | | | |
|---|---|---|---|---|
| 2020/0185626 | A1* | 6/2020 | Yuuki | H10K 85/657 |
| 2020/0190115 | A1 | 6/2020 | Hatakeyama et al. | |
| 2021/0053998 | A1* | 2/2021 | Kim | H10K 85/6572 |
| 2021/0288259 | A1* | 9/2021 | Jeon | C09K 11/06 |

FOREIGN PATENT DOCUMENTS

| | | | |
|---|---|---|---|
| EP | 3876296 | | 9/2021 |
| KR | 10-1876763 | | 7/2018 |
| KR | 10-2020-0071192 | | 6/2020 |
| KR | 10-2020-0140694 | | 12/2020 |
| KR | 10-2022-0072932 | A | 6/2022 |
| WO | 2018/212169 | | 11/2018 |

* cited by examiner

LIGHT EMITTING ELEMENT AND FUSED POLYCYCLIC COMPOUND FOR THE SAME

CROSS-REFERENCE TO RELATED APPLICATION(S)

This patent application claims priority to and benefits of Korean Patent Application No. 10-2023-0011607 under 35 U.S.C. § 119, filed on Jan. 30, 2023, in the Korean Intellectual Property Office, the entire contents of which are incorporated herein by reference.

BACKGROUND

1. Technical Field

The disclosure relates to a light emitting element and a fused polycyclic compound used therein.

2. Description of the Related Art

Active development continues for an organic electroluminescence display device as an image display device. An organic electroluminescence display device is a so-called self-luminescent display device that includes a light emitting element in which holes and electrons respectively injected from a first electrode and a second electrode recombine in an emission layer, so that a light emitting material in the emission layer emits light to achieve display.

In the application of a light emitting element to a display device, there is a demand for the improvement of emission efficiency and lifetime, and continuous development is required on materials for a light emitting element that is capable of stably achieving such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element having improved light efficiency and lifetime.

The disclosure provides a fused polycyclic compound that is a material for a light emitting element having improved emission efficiency and lifetime.

An embodiment provides a light emitting element which may include a first electrode; a second electrode disposed on the first electrode; and an emission layer disposed between the first electrode and the second electrode, and including a first compound represented by Formula 1.

[Formula 1]

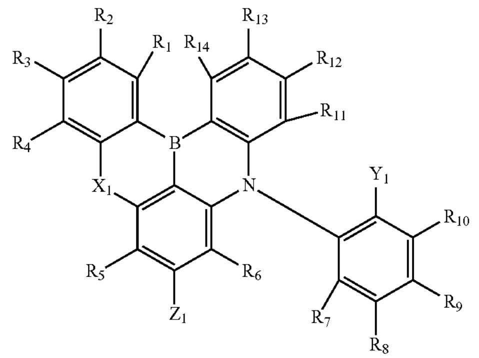

In Formula 1, $X_1$ may be $N(Ar_1)$, O, or S; $Ar_1$ and $Y_1$ may each independently be a substituted or unsubstituted aryl group of 6 to 30 ring-forming carbon atoms or a substituted or unsubstituted heteroaryl group of 2 to 30 ring-forming carbon atoms; at least one of $R_1$ to $R_{14}$ and $Z_1$ may each independently be a group represented by Formula 2; and the remainder of $R_1$ to $R_{14}$ and $Z_1$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

[Formula 2]

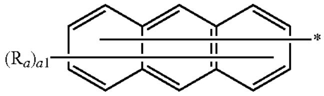

In Formula 2, a1 may be an integer from 0 to 9; and $R_a$ may be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In an embodiment, the emission layer may further include at least one of a second compound represented by Formula HT-1, a third compound represented by Formula ET-1, and a fourth compound represented by Formula M-b.

[Formula HT-1]

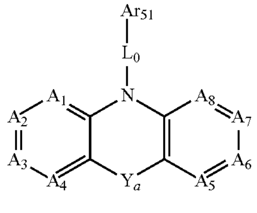

In Formula HT-1, $A_1$ to $A_8$ may each independently be N or $C(R_{91})$; $L_0$ may be a direct linkage, a substituted or unsubstituted arylene group of 6 to 30 ring-forming carbon atoms, or a substituted or unsubstituted heteroarylene group of 2 to 30 ring-forming carbon atoms; $Y_a$ may be a direct linkage, $C(R_{92})(R_{93})$, or $Si(R_{94})(R_{95})$; $Ar_{51}$ may be a substituted or unsubstituted aryl group of 6 to 30 ring-forming carbon atoms or a substituted or unsubstituted heteroaryl group of 2 to 30 ring-forming carbon atoms, and $R_{91}$ to $R_{95}$ may each independently be a hydrogen atom, a deuterium atom, a halogen atom, a cyano group, a substituted or unsubstituted silyl group, a substituted or unsubstituted thio group, a substituted or unsubstituted oxy group, a substituted or unsubstituted amine group, a substituted or unsubstituted boron group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring.

[Formula ET-1]

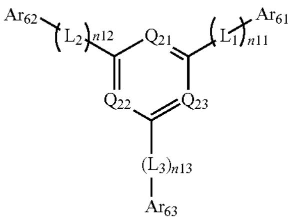

In Formula ET-1, at least one of $Q_{21}$ to $Q_{23}$ may each be N; the remainder of $Q_{21}$ to $Q_{23}$ may each independently be $C(R_{81})$; $R_{81}$ may be a hydrogen atom, a deuterium atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms; n11 to n13 may each independently be an integer from 0 to 10; $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms; and $Ar_{61}$ to $Ar_{63}$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

[Formula M-b]

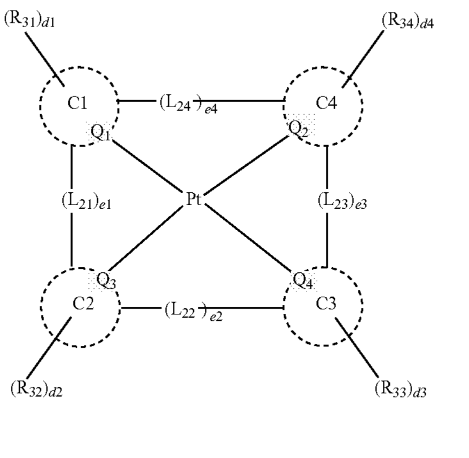

In Formula M-b, $Q_1$ to Q4 may each independently be C or N; C1 to C4 may each independently be a substituted or unsubstituted hydrocarbon ring of 5 to 30 ring-forming carbon atoms or a substituted or unsubstituted heterocycle of 2 to 30 ring-forming carbon atoms; el to e4 may each independently be 0 or 1; $L_{21}$ to $L_{24}$ may each independently be a direct linkage,

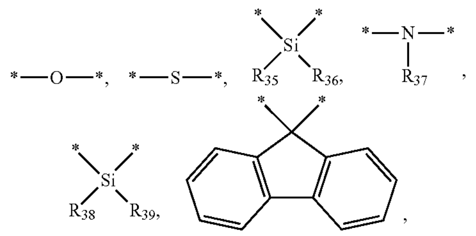

substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms; d1 to d4 may each independently be an integer from 0 to 4; and $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring.

In an embodiment, the first compound may be represented by one of Formula 1-A1 to Formula 1-A3.

[Formula 1-A1]

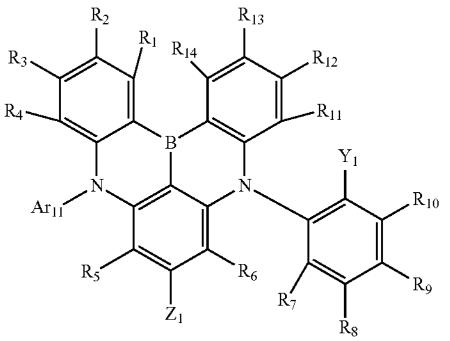

[Formula 1-A2]

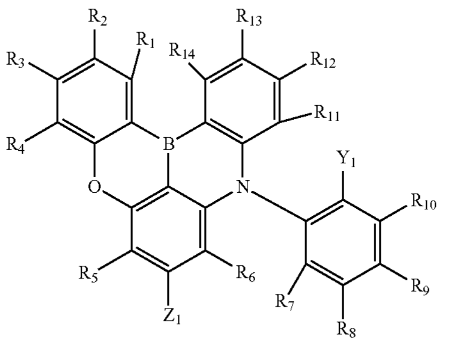

-continued

[Formula 1-A3]

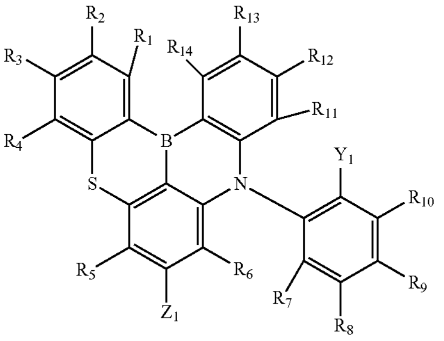

In Formula 1-A1, $Ar_{11}$ may be a substituted or unsubstituted aryl group of 6 to 30 ring-forming carbon atoms; and in Formula 1-A1 to Formula 1-A3, $Y_1$, $R_1$ to $R_{14}$, and $Z_1$ are the same as defined in Formula 1.

In an embodiment, in Formula 1-A1, $Ar_{11}$ may be a group represented by one of Formula AR-1 to Formula AR-5.

AR-1

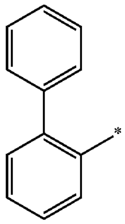

AR-2

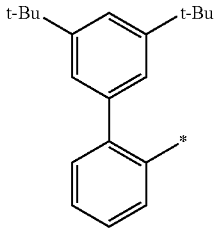

AR-3

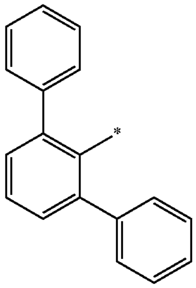

-continued

AR-4

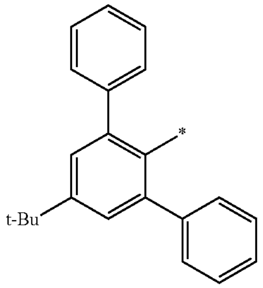

AR-5

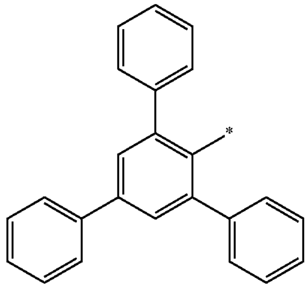

In an embodiment, the first compound may be represented by Formula 1-B.

[Formula 1-B]

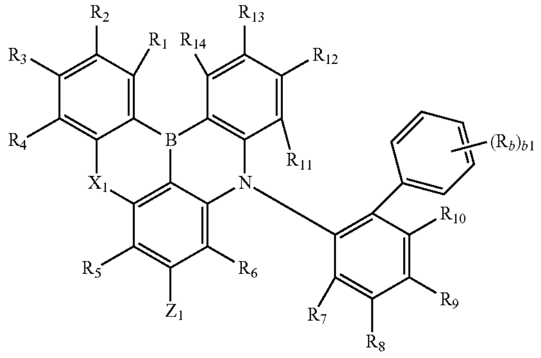

In Formula 1-B, b1 may be an integer from 0 to 5; $R_b$ is a hydrogen atom, a deuterium atom, or a substituted or unsubstituted alkyl group of 1 to 20 carbon atoms; and $X_1$, $R_1$ to $R_{14}$, and $Z_1$ are the same as defined in Formula 1.

In an embodiment, the group represented by Formula 2 may be a group represented by one of Formula 2-A to Formula 2-C.

[Formula 2-A]

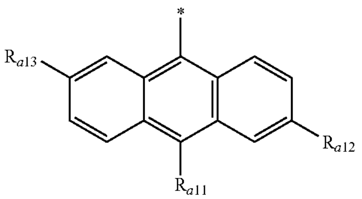

-continued

[Formula 2-B]

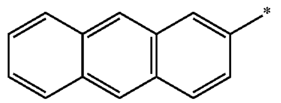

[Formula 2-C]

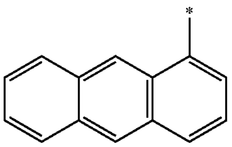

In Formula 2-A, $R_{a11}$ to $R_{a1}$ 3 may each independently be a hydrogen atom, a deuterium atom, or a substituted or unsubstituted aryl group of 6 to 30 ring-forming carbon atoms.

In an embodiment, the first compound may be represented by Formula 1-C.

[Formula 1-C]

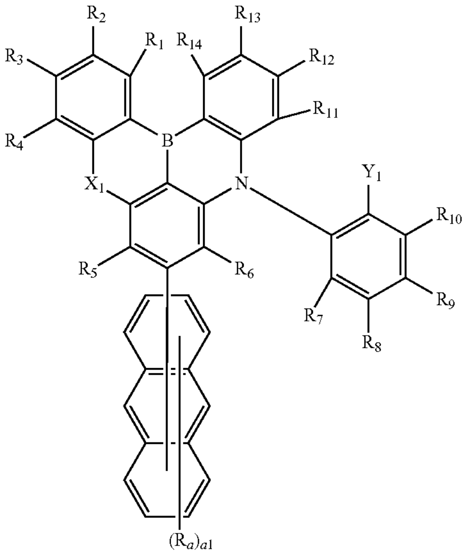

In Formula 1-C, $X_1$, $Y_1$, and $R_1$ to $R_{14}$ are the same as defined in Formula 1; and a1 and $R_a$ are the same as defined in Formula 2.

In an embodiment, the first compound may be represented by one of Formula 1-C1 to Formula 1-C3.

[Formula 1-C1]

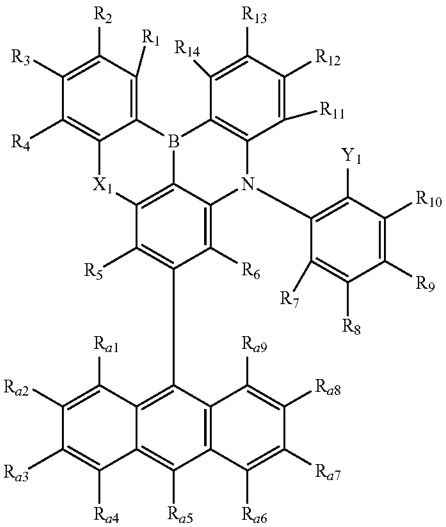

[Formula 1-C2]

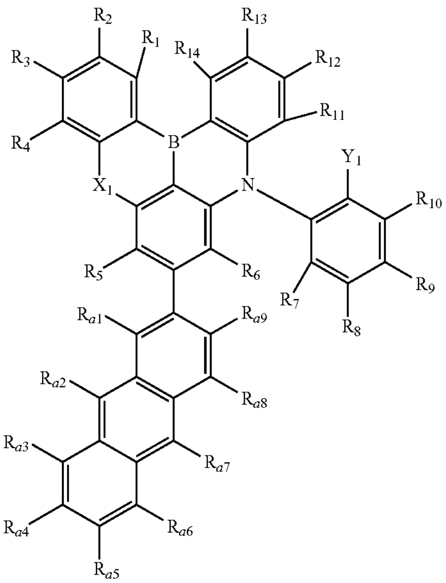

-continued

[Formula 1-C3]

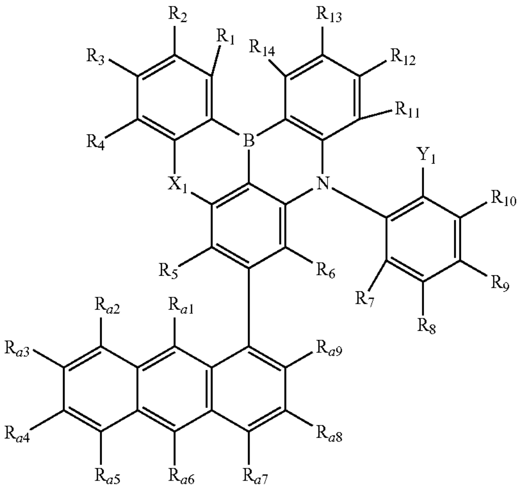

In Formula 1-C1 to Formula 1-C3, $R_{a1}$ to $R_{a9}$ may each independently be a hydrogen atom, a deuterium atom, or a substituted or unsubstituted aryl group of 6 to 30 ring-forming carbon atoms; and $X_1$, $Y_1$, and $R_1$ to $R_{14}$ are the same as defined in Formula 1.

In an embodiment, the first compound represented by Formula 1-C1 may be represented by one of Formula 1-C11 to Formula 1-C13.

[Formula 1-C11]

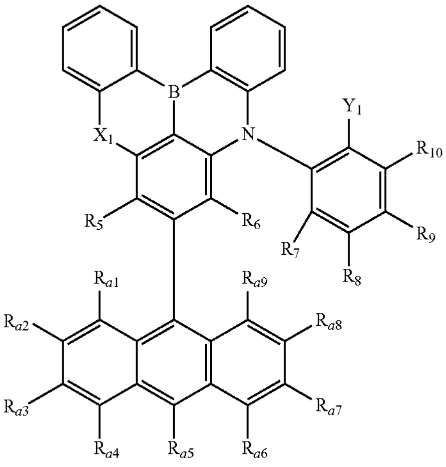

-continued

[Formula 1-C12]

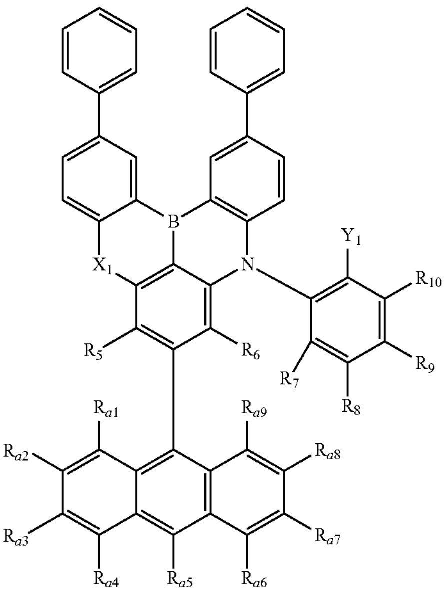

[Formula 1-C13]

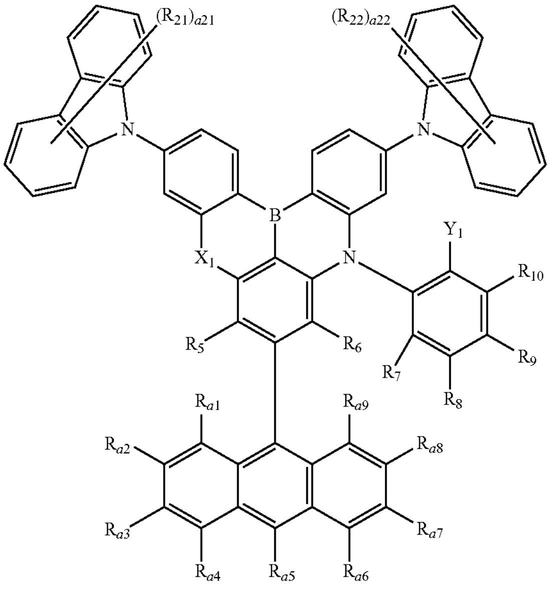

In Formula 1-C13, a21 and a22 may each independently be an integer from 0 to 8; and $R_{21}$ and $R_{22}$ may each independently be a hydrogen atom, a deuterium atom, or a substituted or unsubstituted alkyl group of 1 to 20 carbon atoms; and in Formula 1-C11 to Formula 1-C13, $X_1$, $Y_1$, $R_5$ to $R_{10}$, and $R_{a1}$ to $R_{a9}$ are the same as defined in Formula 1-C1.

In an embodiment, in Formula 1, at least one of $X_1$, $Y_1$, $R_1$ to $R_{14}$, and $Z_1$ may include a deuterium atom, or a substituent including a deuterium atom.

In an embodiment, the first compound may include at least one compound selected from Compound Group 1, which is explained below.

An embodiment provides a fused polycyclic compound which may be represented by Formula 1.

[Formula 1]

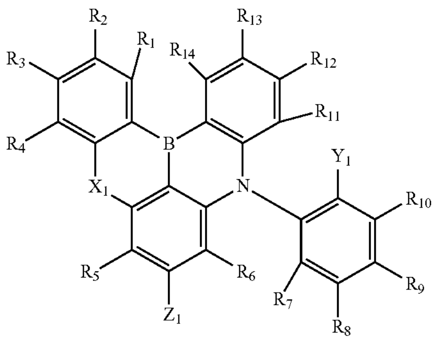

In Formula 1, $X_1$ may be $N(Ar_1)$, O, or S; $Ar_1$ and $Y_1$ may each independently be a substituted or unsubstituted aryl group of 6 to 30 ring-forming carbon atoms or a substituted or unsubstituted heteroaryl group of 2 to 30 ring-forming carbon atoms; at least one of $R_1$ to $R_{14}$ and $Z_1$ may each independently be a group represented by Formula 2; and the remainder of $R_1$ to $R_{14}$ and $Z_1$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

[Formula 2]

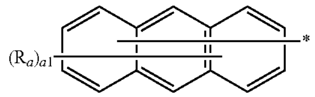

In Formula 2, a1 may be an integer from 0 to 9; and $R_a$ may be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In an embodiment, the fused polycyclic compound represented by Formula 1 may be represented by one of Formula 1-A1 to Formula 1-A3, which are explained herein.

In an embodiment, in Formula 1-A1, $Ar_{11}$ may be a group represented by one of Formula AR-1 to Formula AR-5, which are explained herein.

In an embodiment, the fused polycyclic compound represented by Formula 1 may be represented by Formula 1-B, which is explained herein.

In an embodiment, the group represented by Formula 2 may be a group represented by one of Formula 2-A to Formula 2-C, which are explained herein.

In an embodiment, the fused polycyclic compound represented by Formula 1 may be represented by Formula 1-C, which is explained herein.

In an embodiment, the fused polycyclic compound represented by Formula 1-C may be represented by one of Formula 1-C1 to Formula 1-C3, which are explained herein.

In an embodiment, the fused polycyclic compound represented by Formula 1-C1 may be represented by one of Formula 1-C11 to Formula 1-C13, which are explained herein.

In an embodiment, the fused polycyclic compound represented by Formula 1 may be selected from Compound Group 1, which is explained below.

It is to be understood that the embodiments above are described in a generic and explanatory sense only and not for the purposes of limitation, and the disclosure is not limited to the embodiments described above.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the accompanying drawings, in which.

DETAILED DESCRIPTION OF THE EMBODIMENTS

Figure 1:
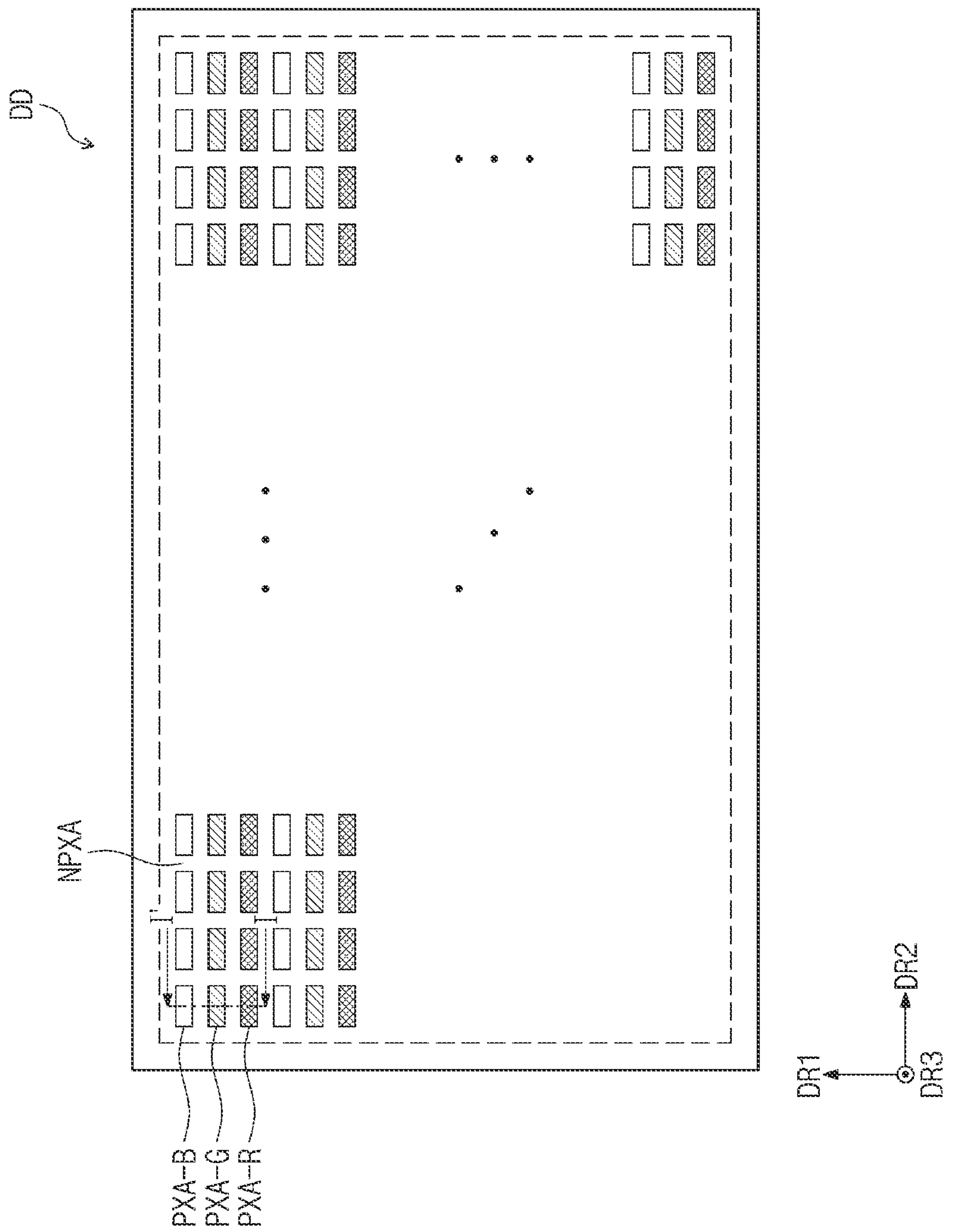
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like reference numbers and reference characters refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is “directly on,” “directly connected to,” or “directly coupled to” another element, there are no intervening elements present. For example, “directly on” may mean that two layers or two elements are disposed without an additional element such as an adhesion element therebetween.

As used herein, the expressions used in the singular such as “a,” “an,” and “the,” are intended to include the plural forms as well, unless the context clearly indicates otherwise.

As used herein, the term “and/or” includes any and all combinations of one or more of the associated listed items. For example, “A and/or B” may be understood to mean “A, B, or A and B.” The terms “and” and “or” may be used in the conjunctive or disjunctive sense and may be understood to be equivalent to “and/or”.

In the specification and the claims, the term “at least one of” is intended to include the meaning of “at least one selected from the group consisting of” for the purpose of its meaning and interpretation. For example, “at least one of A, B, and C” may be understood to mean A only, B only, C only, or any combination of two or more of A, B, and C, such as ABC, ACC, BC, or CC. When preceding a list of elements, the term, “at least one of,” modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms “below”, “beneath”, “lower”, “above”, “upper”, or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned “below” or “beneath” another device may be placed “above” another device. Accordingly, the illustrative term “below” may include both the lower and upper positions. The device may also be oriented in other directions and thus the spatially relative terms may be interpreted differently depending on the orientations.

The terms “about” or “approximately” as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, “about” may mean within one or more standard deviations, or within ±20%, ±10%, or ±5% of the stated value.

It should be understood that the terms “comprises,” “comprising,” “includes,” “including,” “have,” “having,” “contains,” “containing,” and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be explained with reference to the drawings.

Figure 2:
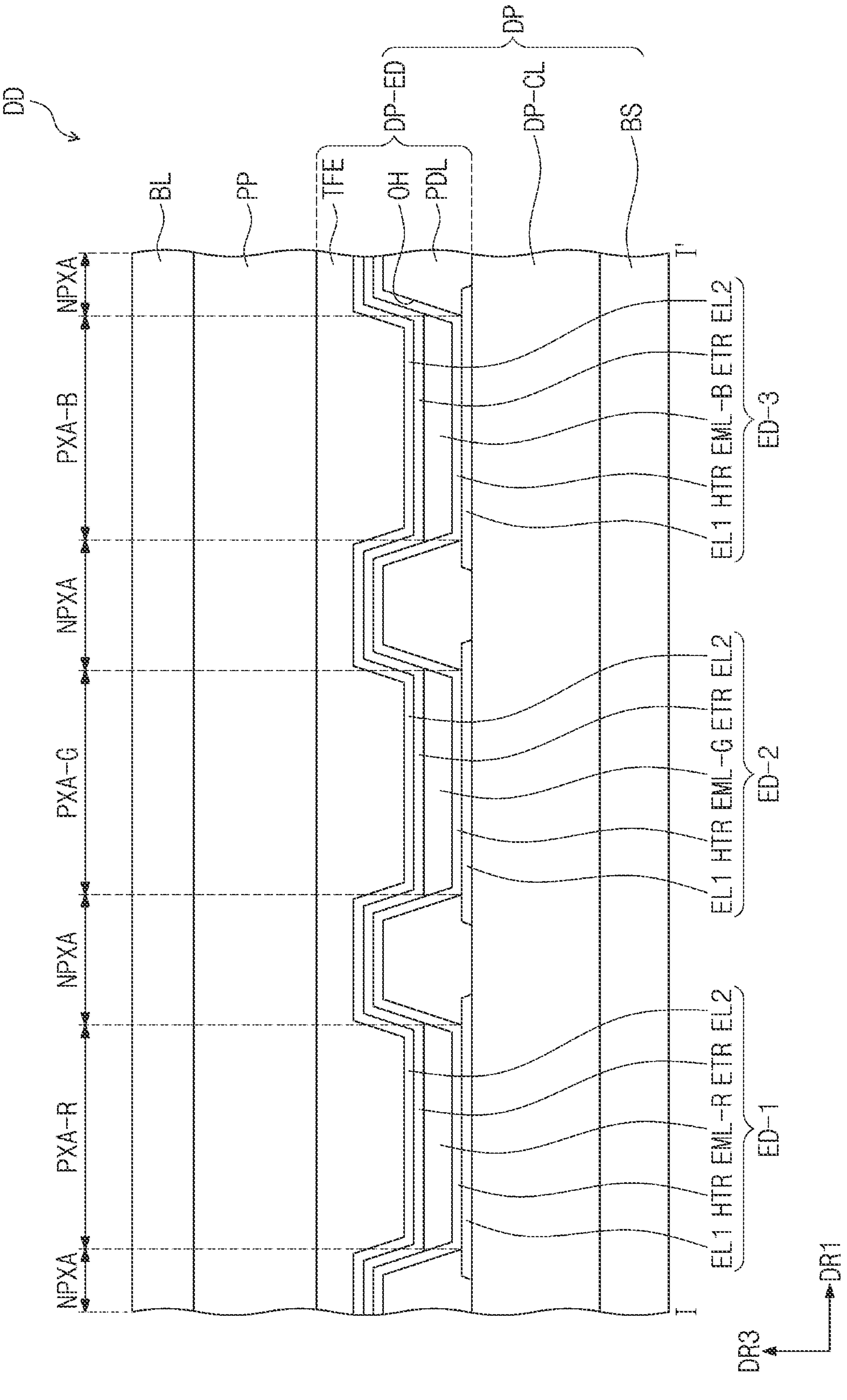
FIG. 2 is a schematic cross-sectional view of a display device, showing a part corresponding to line I-I' in FIG. 1.

FIG. 1 is a schematic plan view of a display device DD according to an embodiment. FIG. 2 is a schematic cross-sectional view of a display device DD according to an embodiment. FIG. 2 is a schematic cross-sectional view showing a part corresponding to line I-I' of FIG. 1.

The display device DD may include a display panel DP and an optical layer PP disposed on the display panel DP. The display panel DP may include light emitting elements ED-1, ED-2, and ED-3. The display device DD may include multiples of each of the light emitting elements ED-1, ED-2, and ED-3. The optical layer PP may be disposed on the display panel DP and may control light that is reflected at the display panel DP from an external light. The optical layer PP may include, for example, a polarization layer or a color filter layer. Although not shown in the drawings, in an embodiment, the optical layer PP may be omitted from the display device DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one of an acrylic resin, a silicon-based resin, and an epoxy-based resin.

The display panel DP may include a base layer BS, a circuit layer DP-CL provided on the base layer BS, and a display element layer DP-ED. The display element layer DP-ED may include a pixel definition layer PDL, light emitting elements ED-1, ED-2, and ED-3 disposed between portions of the pixel definition layer PDL, and an encapsulating layer TFE disposed on the light emitting elements ED-1, ED-2, and ED-3.

The base layer BS may provide a base surface on which the display element layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include multiple transistors (not shown). Each of the transistors (not shown) may include a control electrode, an input electrode, and an output electrode. For example, the circuit layer DP-CL may include switching transistors and driving transistors for driving the light emitting elements ED-1, ED-2, and ED-3 of the display element layer DP-ED.

The light emitting elements ED-1, ED-2, and ED-3 may each have a structure of a light emitting element ED of an embodiment according to any of FIG. 3 to FIG. 6, which will be explained later. The light emitting elements ED-1, ED-2, and ED-3 may each include a first electrode EL1, a hole transport region HTR, emission layers EML-R, EML-G, and EML-B, an electron transport region ETR, and a second electrode EL2.

FIG. 2 shows an embodiment in which the emission layers EML-R, EML-G, and EML-B of the light emitting elements ED-1, ED-2, and ED-3 are disposed in openings OH defined in a pixel definition layer PDL, and a hole transport region HTR, an electron transport region ETR, and a second electrode EL2 are each provided as a common layer for the light emitting elements ED-1, ED-2, and ED-3. However, embodiments are not limited thereto. Although not shown in FIG. 2, in an embodiment, the hole transport region HTR and the electron transport region ETR may each be provided by being patterned in the openings OH defined in the pixel definition layer PDL. For example, in an embodiment, the hole transport region HTR, the emission layers EML-R, EML-G, and EML-B, and the electron transport region ETR of the light emitting elements ED-1, ED-2, and ED-3 may each be provided by being patterned through an ink jet printing method.

An encapsulating layer TFE may cover the light emitting elements ED-1, ED-2, and ED-3. The encapsulating layer TFE may encapsulate the display element layer DP-ED. The encapsulating layer TFE may be disposed on the second electrode EL2 and may be disposed to fill the openings OH.

The encapsulating layer TFE may be a thin film encapsulating layer. The encapsulating layer TFE may be a single layer or a stack of multiple layers. The encapsulating layer TFE may include at least one insulating layer. In an embodiment, the encapsulating layer TFE may include at least one inorganic layer (hereinafter, encapsulating inorganic layer). In an embodiment, the encapsulating layer TFE may include at least one organic layer (hereinafter, encapsulating organic layer) and at least one encapsulating inorganic layer.

The encapsulating inorganic layer may protect the display element layer DP-ED from moisture and/or oxygen, and the encapsulating organic layer may protect the display element layer DP-ED from foreign materials such as dust particles. The encapsulating inorganic layer may include silicon nitride, silicon oxy nitride, silicon oxide, titanium oxide, or aluminum oxide, without limitation. The encapsulating organic layer may include an acrylic compound, an epoxy-based compound, etc. The encapsulating organic layer may include a photopolymerizable organic material, without limitation.

Referring to FIG. 1 and FIG. 2, the display device DD may include non-luminous areas NPXA and luminous areas PXA-R, PXA-G, and PXA-B. The luminous areas PXA-R, PXA-G, and PXA-B may each be an area that emits light produced from each of the light emitting elements ED-1, ED-2, and ED-3. The luminous areas PXA-R, PXA-G, and PXA-B may be separated from each other in a plan view.

The luminous areas PXA-R, PXA-G, and PXA-B may each be an area separated by the pixel definition layer PDL. The non-luminous areas NPXA may be areas between neighboring luminous areas PXA-R, PXA-G, and PXA-B, and which correspond to the pixel definition layer PDL. In an embodiment, the luminous areas PXA-R, PXA-G, and PXA-B may each correspond to a pixel. The pixel definition layer PDL may separate the light emitting elements ED-1, ED-2, and ED-3. The emission layers EML-R, EML-G, and EML-B of the light emitting elements ED-1, ED-2, and ED-3 may be disposed in the openings OH defined in the pixel definition layer PDL and separated from each other.

The luminous areas PXA-R, PXA-G, and PXA-B may be arranged into groups according to the color of light produced from the light emitting elements ED-1, ED-2, and ED-3. In the display device DD according to an embodiment shown in FIG. 1 and FIG. 2, three luminous areas PXA-R, PXA-G, and PXA-B which respectively emit red light, green light and blue light are illustrated as an example. For example, the display device DD may include a red luminous area PXA-R, a green luminous area PXA-G, and a blue luminous area PXA-B, which are distinct from one another.

In the display device DD according to an embodiment, the light emitting elements ED-1, ED-2, and ED-3 may emit light having wavelength regions that are different from each other.

For example, in an embodiment, the display device DD may include a first light emitting element ED-1 that emits red light, a second light emitting element ED-2 that emits green light, and a third light emitting element ED-3 that emits blue light. For example, the red luminous area PXA-R, the green luminous area PXA-G, and the blue luminous area PXA-B of the display device DD may respectively correspond to the first light emitting element ED-1, the second light emitting element ED-2, and the third light emitting element ED-3.

However, embodiments are not limited thereto, and the first to third light emitting elements ED-1, ED-2, and ED-3 may emit light in a same wavelength region, or at least one light emitting element may emit light in a wavelength region that is different from the remainder. For example, the first to third light emitting elements ED-1, ED-2, and ED-3 may each emit blue light.

The luminous areas PXA-R, PXA-G, and PXA-B in the display device DD according to an embodiment may be arranged in a stripe configuration. Referring to FIG. 1, the red luminous areas PXA-R, the green luminous areas PXA-G, and the blue luminous areas PXA-B may be respectively arranged along a second directional axis DR2. In another embodiment, the red luminous area PXA-R, the green luminous area PXA-G, and the blue luminous area PXA-B may be alternately arranged in this repeating order along a first directional axis DR1.

In FIG. 1 and FIG. 2, luminous areas PXA-R, PXA-G, and PXA-B are shown as having a similar area to each other, but embodiments are not limited thereto. In an embodiment, the areas of the luminous areas PXA-R, PXA-G, and PXA-B may be different from each other, according to a wavelength region of emitted light. The areas of the luminous areas PXA-R, PXA-G, and PXA-B may be areas in a plan view that are defined by the first directional axis DR1 and the second directional axis DR2.

An arrangement of the luminous areas PXA-R, PXA-G, and PXA-B is not limited to the configuration shown in FIG. 1, and the order in which the red luminous areas PXA-R, the green luminous areas PXA-G, and the blue luminous areas PXA-B are arranged may be provided in various combinations according to the display quality characteristics that are required for the display device DD. For example, the luminous areas PXA-R, PXA-G, and PXA-B may be arranged in a pentile configuration (such as PENTILE™) or in a diamond configuration (such as Diamond Pixel™).

The areas of the luminous areas PXA-R, PXA-G, and PXA-B may be different in size from each other. For example, in an embodiment, an area of the green luminous area PXA-G may be smaller than an area of the blue luminous area PXA-B, but embodiments are not limited thereto.

Hereinafter, FIG. 3 to FIG. 6 are each a schematic cross-sectional view of a light emitting element according to an embodiment. The light emitting element ED according to an embodiment may include a first electrode EL1, a hole transport region HTR, an emission layer EML, an electron transport region ETR, and a second electrode EL2.

Figure 3:
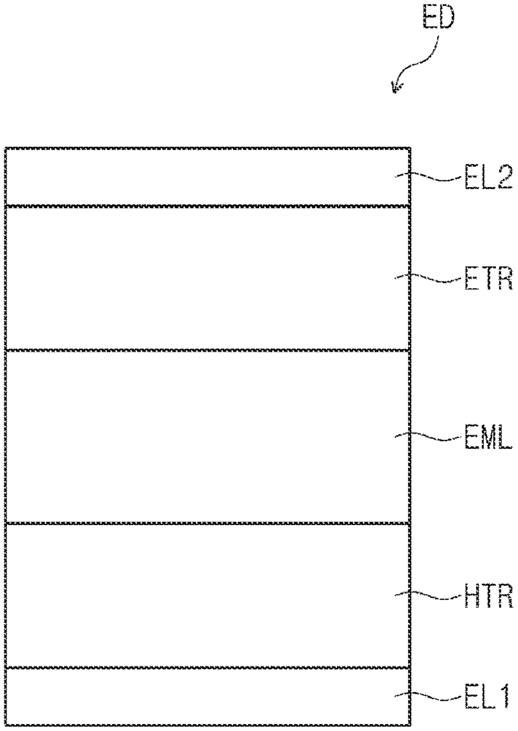
FIG. 3 is a schematic cross-sectional view of a light emitting element according to an embodiment.
Figure 4:
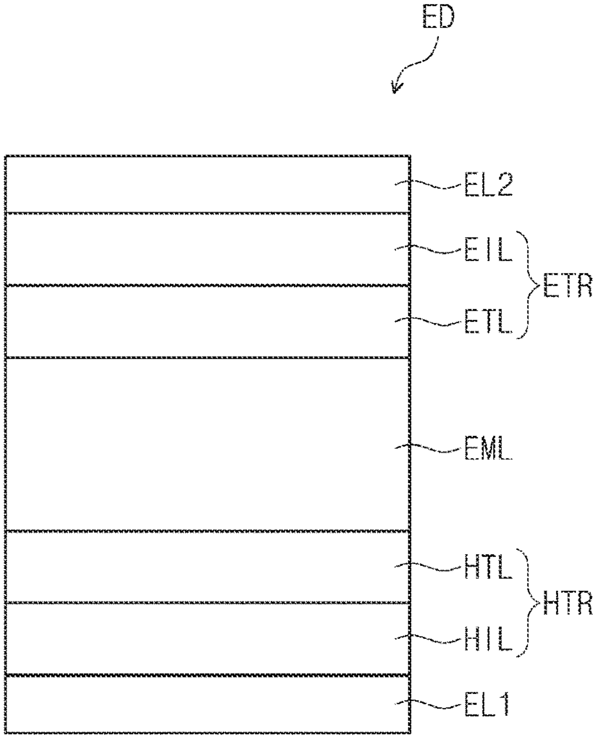
FIG. 4 is a schematic cross-sectional view of a light emitting element according to an embodiment.
Figure 5:
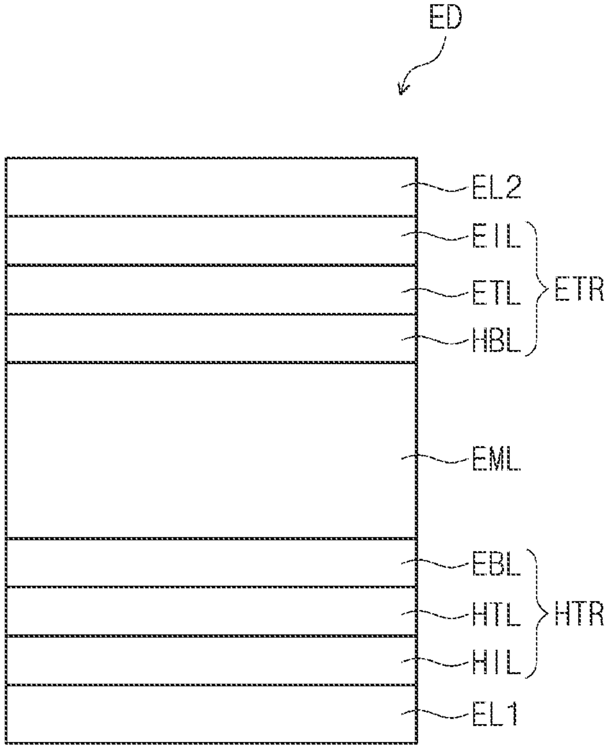
FIG. 5 is a schematic cross-sectional view of a light emitting element according to an embodiment.
Figure 6:
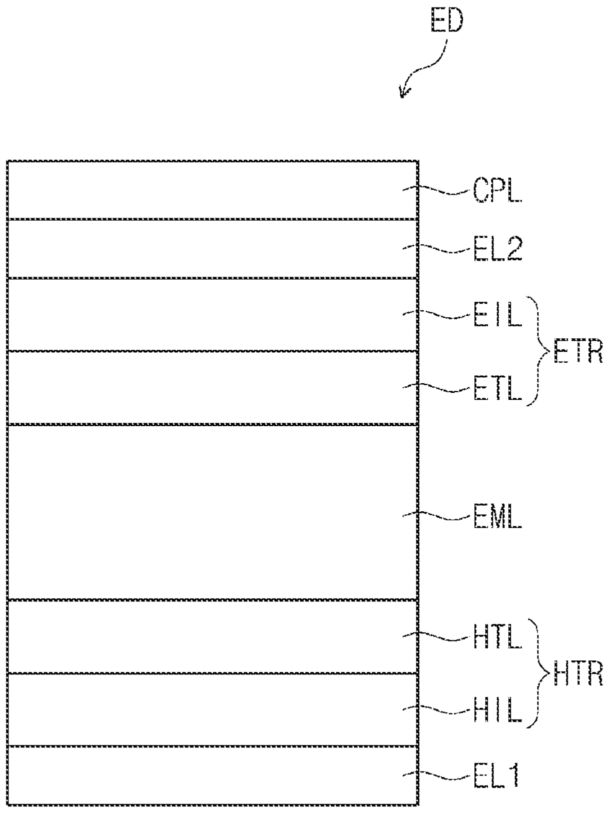
FIG. 6 is a schematic cross-sectional view of a light emitting element according to an embodiment.

In comparison to FIG. 3, FIG. 4 is a schematic cross-sectional view of a light emitting element ED according to an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 is a schematic cross-sectional view of a light emitting element ED according to an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 is a schematic cross-sectional view of a light emitting element ED according to an embodiment, which includes a capping layer CPL disposed on the second electrode EL2.

In the light emitting element ED according to an embodiment, an emission layer EML may include a first compound according to an embodiment. The first compound may include a fused ring core of five rings including three heteroatoms as ring-forming atoms, as a central structure. The three heteroatoms may include a boron atom and a nitrogen atom. A phenyl group may be bonded to the nitrogen atom, and in the phenyl group, an aryl group substituent or a heteroaryl group substituent may be bonded thereto at an ortho position to the nitrogen atom. The first compound may further include at least one anthracenyl group that is directly bonded to the fused ring core. The remaining heteroatom may be an oxygen atom, a sulfur atom, or a nitrogen atom. In an embodiment, the first compound, which includes the substituent bonded to phenyl group at an ortho position to the nitrogen atom, and which includes the anthracenyl group, may contribute to the improvement of efficiency and lifetime of the light emitting element ED. In the specification, the first compound may be referred to as a fused polycyclic compound according to an embodiment.

In the specification, the term "substituted or unsubstituted" may describe a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, a hydrocarbon ring group, an aryl group, and a heterocyclic group. Each of the listed substituents may itself be substituted or unsubstituted. For example, a biphenyl group may be interpreted as an aryl group, or it may be interpreted as a phenyl group substituted with a phenyl group.

In the specification, the term "combined with an adjacent group to form a ring" may be interpreted as a group that is combined with an adjacent group to form a substituted or unsubstituted hydrocarbon ring or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring that is formed by adjacent groups being combined with each other may itself be combined with another ring to form a spiro structure.

In the specification, the term "adjacent group" may be interpreted as a substituent that is substituted for an atom which is directly combined with an atom substituted with a corresponding substituent, as another substituent that is substituted for an atom which is substituted with a corresponding substituent, or as a substituent that is sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other. For example, in 4,5-dimethylphenanthrene, two methyl groups may be interpreted as "adjacent groups" to each other.

In the specification, examples of a halogen atom may include a fluorine atom, a chlorine atom, a bromine atom, or an iodine atom.

In the specification, an alkyl group may be linear, branched, or cyclic. The number of carbon atoms in an alkyl group may be 1 to 60, 1 to 50, 1 to 30, 1 to 20, 1 to 10, or 1 to 6. Examples of an alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., without limitation.

In the specification, an alkenyl group may be a hydrocarbon group including one or more carbon-carbon double bonds in the middle or at a terminus of an alkyl group having 2 or more carbon atoms. An alkenyl group may be linear or branched. The number of carbon atoms is not particularly limited, but may be 2 to 60, 2 to 30, 2 to 20, or 2 to 10. Examples of an alkenyl group may include a vinyl group, a 1-butenyl group, a 1-pentenyl group, a 1,3-butadienyl group, a styrenyl group, a styrylvinyl group, etc., without limitation.

In the specification, an alkynyl group may be a hydrocarbon group including one or more carbon-carbon triple bonds in the middle or at a terminus of an alkyl group having 2 or more carbon atoms. An alkynyl group may be linear or branched. The number of carbon atoms is not particularly limited, but may be 2 to 60, 2 to 30, 2 to 20, or 2 to 10. Examples of an alkynyl group include an ethynyl group, a propynyl group, etc., without limitation.

In the specification, a hydrocarbon ring group may be any functional group or substituent derived from an aliphatic hydrocarbon ring. For example, a hydrocarbon ring group may be a saturated hydrocarbon ring group having 5 to 30, 5 to 20, or 5 to 10 ring-forming carbon atoms.

In the specification, an aryl group may be any functional group or substituent derived from an aromatic hydrocarbon ring. An aryl group may be monocyclic or polycyclic. The number of ring-forming carbon atoms in an aryl group may be 6 to 60, 6 to 30, 6 to 20, or 6 to 15. Examples of an aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., without limitation.

In the specification, a fluorenyl group may be substituted, and two substituents may be combined with each other to form a spiro structure. Examples of a substituted fluorenyl group may include the groups shown below, but embodiments are not limited thereto.

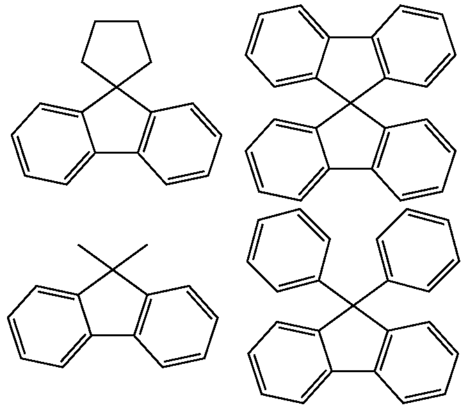

In the specification, a heterocyclic group may be any functional group or substituent derived from a ring including at least one of B, O, N, P, Si, Se, Te, and S as a heteroatom. A heterocyclic group may be an aliphatic heterocyclic group or an aromatic heterocyclic group. An aromatic heterocyclic group may be a heteroaryl group. An aliphatic heterocyclic group and an aromatic heterocyclic group may each independently be monocyclic or polycyclic.

In the specification, a heterocyclic group may include at least one of B, O, N, P, Si, Se, Te, and S as a heteroatom. If a heterocyclic group includes two or more heteroatoms, the two or more heteroatoms may be the same as or different from each other. A heterocyclic group may be monocyclic or polycyclic. A heterocyclic group may be a heteroaryl group. The number of ring-forming carbon atoms in a heterocyclic group may be 2 to 60, 2 to 30, 2 to 20, or 2 to 10.

In the specification, an aliphatic heterocyclic group may include at least one of B, O, N, P, Si, Se, Te, and S as a heteroatom. The number of ring-forming carbon atoms in an aliphatic heterocyclic group may be 2 to 60, 2 to 30, 2 to 20, or 2 to 10. Examples of an aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the specification, a heteroaryl group may include at least one of B, O, N, P, Si, Se, Te, and S as a heteroatom. If a heteroaryl group includes two or more heteroatoms, the two or more heteroatoms may be the same as or different from each other. A heteroaryl group may be monocyclic or polycyclic. The number of ring-forming carbon atoms in a heteroaryl group may be 2 to 60, 2 to 30, 2 to 20, or 2 to 10. Examples of a heteroaryl group may include a thiophene group, a furan group, a pyrrole group, an imidazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isooxazole group, an oxazole group, an oxadiazole group, a thiadiazole group, a phenothiazine group, a dibenzosilole group, a dibenzofuran group, etc., without limitation.

In the specification, the above explanation of an aryl group may be applied to an arylene group, except that an arylene group is a divalent group. The above explanation of a heteroaryl group may be applied to a heteroarylene group, except that a heteroarylene group is a divalent group.

In the specification, a silyl group may be a silicon atom that is bonded to an alkyl group or an aryl group as described above. A silyl group may be an alkyl silyl group or an aryl silyl group. Examples of a silyl group may include a trimethylsilyl group, a triethylsilyl group, a t-butyldimethylsilyl group, ethyldimethylsilyl group, a propyldimethylsilyl group, a triphenylsilyl group, a diphenylsilyl group, a phenylsilyl group, etc., without limitation.

In the specification, the number of carbon atoms in a carbonyl group is not particularly limited, but may be 1 to 40, 1 to 30, or 1 to 20. For example, a carbonyl group may have one of the following structures, but embodiments are not limited thereto.

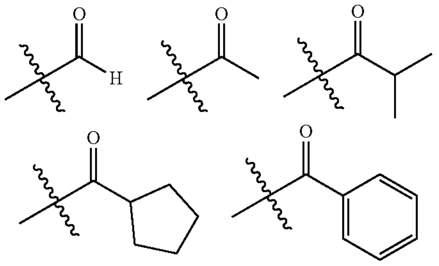

In the specification, the number of carbon atoms in a sulfinyl group or a sulfonyl group is not particularly limited, but may be 1 to 30. A sulfinyl group may be an alkyl sulfinyl group or an aryl sulfinyl group. A sulfonyl group may be an alkyl sulfonyl group or an aryl sulfonyl group.

In the specification, a thio group may be an alkyl thio group or an aryl thio group. A thio group may be a sulfur atom that is bonded to an alkyl group or an aryl group as described above. Examples of a thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the specification, an oxy group may be an oxygen atom that is bonded to an alkyl group or an aryl group as described above. An oxy group may be an alkoxy group or an aryl oxy group. An alkoxy group may be linear, branched, or cyclic. The number of carbon atoms in an alkoxy group is not particularly limited but may be, for example, 1 to 30, 1 to 20 or 1 to 10. Examples of an oxy group may include a methoxy group, an ethoxy group, an n-propoxy group, an isopropoxy group, a butoxy group, a pentyloxy group, a hexyloxy group, an octyloxy group, a nonyloxy group, a decyloxy group, a benzyloxy group, etc. However, embodiments are not limited thereto.

In the specification, a boron group may be a boron atom that is bonded to an alkyl group or an aryl group as described above. The number of carbon atoms in a boron group is not particularly limited, but may be 1 to 30, 1 to 20, or 1 to 10. A boron group may be an alkyl boron group or an aryl boron group. Examples of a boron group may include a dimethylboron group, a diethylboron group, a t-butylmethylboron group, a diphenylboron group, a phenylboron group, or the like, without limitation.

In the specification, the number of carbon atoms in an amine group is not particularly limited, but may be 1 to 30, 1 to 20, or 1 to 10. An amine group may be an alkyl amine group or an aryl amine group. An alkyl amine group is an amine group that is bonded to an alkyl group as described above, and an aryl amine group is an amine group that is bonded to an aryl group as described above. Examples of an amine group may include a methylamine group, a dimethylamine group, a phenylamine group, a diphenylamine group, a naphthylamine group, a 9-methyl-anthracenylamine group, etc., without limitation.

In the specification, an alkyl group in an alkyl thio group, an alkyl sulfinyl group, an alkyl sulfonyl group, an alkoxy group, an alkyl boron group, an alkyl silyl group, or an alkyl amine group may be the same as an example of the alkyl group as described above.

In the specification, an aryl group in an aryl oxy group, an aryl thio group, an aryl sulfinyl group, an aryl sulfonyl group, an aryl boron group, an aryl silyl group, or an aryl amine group may be the same as an example of the aryl group as described above.

In the specification, a direct linkage may be a single bond.

In the specification, the symbols

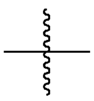

and -• each represent a bond to a neighboring atom in a corresponding formula or moiety.

The light emitting element ED according to an embodiment may include the fused polycyclic compound according to an embodiment. The fused polycyclic compound may be represented by Formula 1.

[Formula 1]

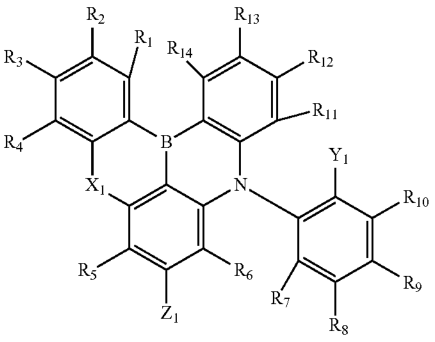

In Formula 1, $X_1$ may be $N(Ar_1)$, O, or S. $X_1$ may be a ring-forming atom in the pentacyclic fused ring core. In Formula 1, $Ar_1$ and $Y_1$ may each independently be a substituted or unsubstituted aryl group of 6 to 30 ring-forming carbon atoms or a substituted or unsubstituted heteroaryl group of 2 to 30 ring-forming carbon atoms. For example, $Ar_1$ may be a substituted or unsubstituted biphenyl group. For example, $Y_1$ may be a substituted or unsubstituted phenyl group. However, these are only examples, and embodiments are not limited thereto.

In Formula 1, at least one of $R_1$ to $R_{14}$ and $Z_1$ may each independently be a group represented by Formula 2. In Formula 1, the remainder of $R_1$ to $R_{14}$ and $Z_1$, which are not a group represented by Formula 2, may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. For example, any one of $R_1$ to $R_{14}$ and $Z_1$ may be a group represented by Formula 2, and the remainder of $R_1$ to $R_{14}$ and $Z_1$ may each independently be a hydrogen atom, a substituted or unsubstituted t-butyl group, a substituted or unsubstituted phenyl group, or a substituted or unsubstituted carbazole group.

In an embodiment, in Formula 1, at least one of $X_1$, $Y_1$, $R_1$ to $R_{14}$, and $Z_1$ may include a deuterium atom, or a substituent including a deuterium atom. For example, at least one of $R_1$ to $R_4$ and $R_{11}$ to $R_{14}$ may include a carbazole group substituted with a deuterium atom. However, these are only examples, and embodiments are not limited thereto.

The group represented by Formula 2 may be a substituted or unsubstituted anthracenyl group. The fused polycyclic compound according to an embodiment may include an anthracenyl group directly bonded to the fused ring core.

[Formula 2]

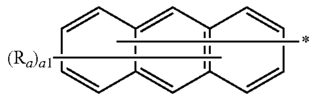

In Formula 2, a1 may be an integer from 0 to 9. If a1 is 2 or more, multiple $R_a$ groups may be the same as each other, or at least one group thereof may be different from the remainder. In Formula 2, $R_a$ may be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. For example, $R_a$ may be a hydrogen atom or a substituted or unsubstituted phenyl group.

In an embodiment, the group represented by Formula 2 may be a group represented by one of Formula 2-A to Formula 2-C. Formula 2-A to Formula 2-C represent cases of Formula 2 wherein the bonding position to Formula 1 and $R_a$ are further defined.

[Formula 2-A]

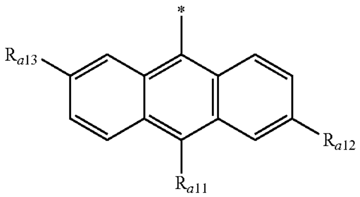

[Formula 2-B]

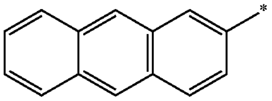

[Formula 2-C]

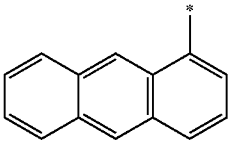

In Formula 2-A, $R_{a11}$ to $R_{a13}$ may each independently be a hydrogen atom, a deuterium atom, or a substituted or unsubstituted aryl group of 6 to 30 ring-forming carbon atoms. For example, in Formula 2-A, $R_{a11}$ to $R_{a13}$ may each be a hydrogen atom. For example, in Formula 2-A, at least one of $R_{a11}$ to $R_{a13}$ may each independently be a substituted or unsubstituted phenyl group.

In an embodiment, a group represented by Formula 2-A may be a group represented by one of Formula 2-A1 to Formula 2-A6. However, these are only examples, and embodiments are not limited thereto.

2-A1

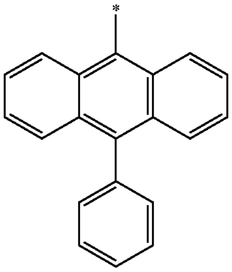

2-A2

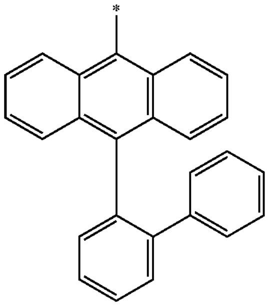

-continued

2-A3

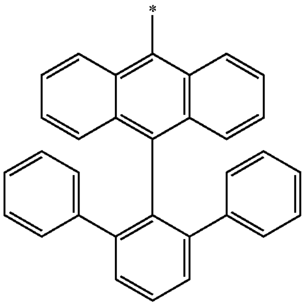

2-A4

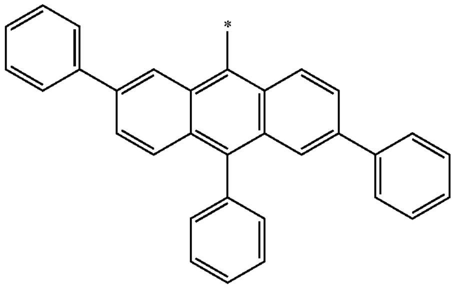

2-A5

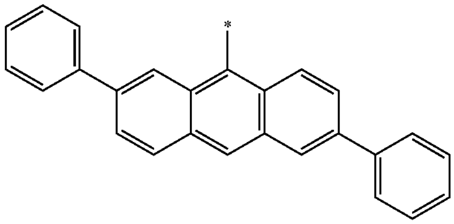

2-A6

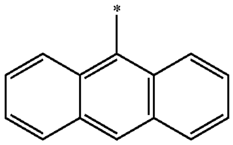

In an embodiment, Formula 1 may be represented by one of Formula 1-A1 to Formula 1-A3. Formula 1-A1 to Formula 1-A3 represent cases of Formula 1 wherein $X_1$ is further defined.

[Formula 1-A1]

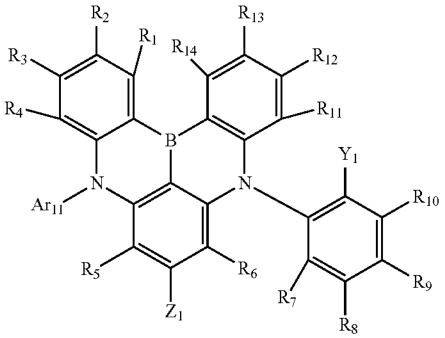

-continued

[Formula 1-A2]

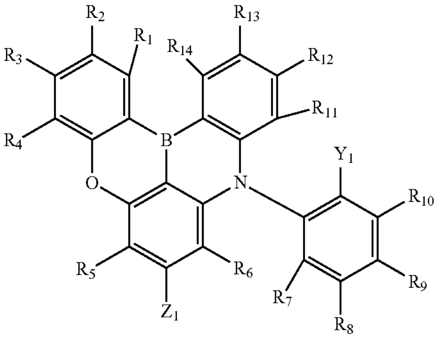

[Formula 1-A3]

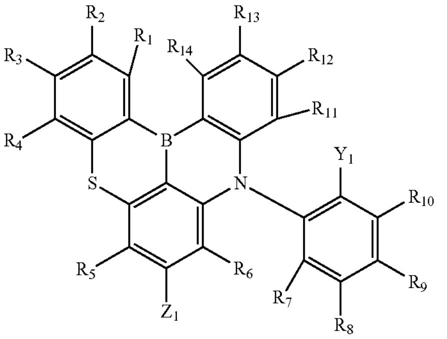

In Formula 1-A1 to Formula 1-A3, $Y_1$, $R_1$ to $R_{14}$, and $Z_1$ are the same as defined in Formula 1. In Formula 1-A1, $Ar_{11}$ may be a substituted or unsubstituted aryl group of 6 to 30 ring-forming carbon atoms. For example, $Ar_{11}$ may be a substituted or unsubstituted phenyl group.

In an embodiment, in Formula 1-A1, $Ar_{11}$ may be a group represented by one of Formula AR-1 to Formula AR-5.

AR-1

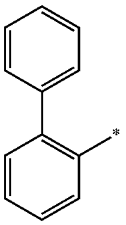

AR-2

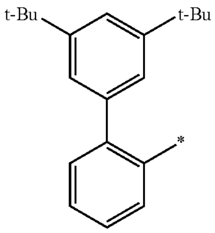

-continued

AR-3

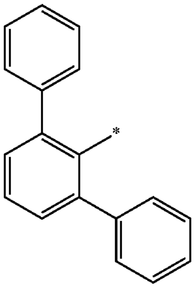

AR-4

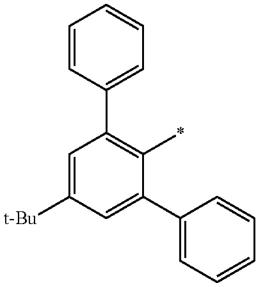

AR-5

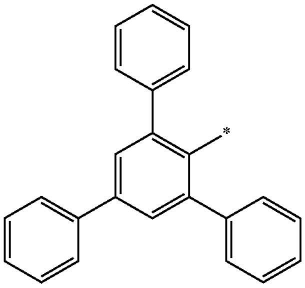

In Formula 1, a phenyl group including $Y_1$ may also be a group represented by one of Formula AR-1 to Formula AR-5. In Formula AR-1 to Formula AR-5, a cyclic group corresponding to $Y_1$ may be an unsubstituted phenyl group or a phenyl group substituted with a t-butyl group. However, these are only examples, and embodiments are not limited thereto.

In an embodiment, Formula 1 may be represented by Formula 1-B. Formula 1-B represents a case of Formula 1 wherein $Y_1$ is a substituted or unsubstituted phenyl group.

[Formula 1-B]

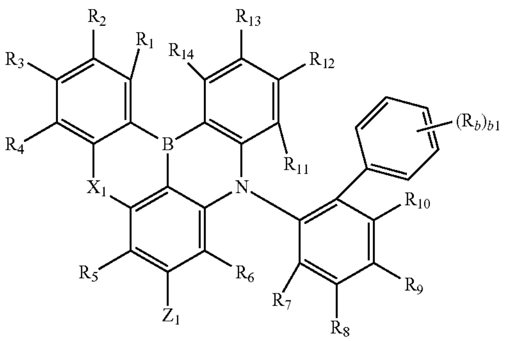

In Formula 1-B, the same contents as those explained in Formula 1 may be applied for $X_1$, $R_1$ to $R_{14}$, and $Z_1$ are the same as defined in Formula 1. In Formula 1-B, b1 may be an integer from 0 to 5. If b1 is 2 or more, multiple $R_b$ groups may be the same as each other, or at least one group thereof may be different from the remainder. In Formula 1-B, $R_b$ may be a hydrogen atom, a deuterium atom, or a substituted or unsubstituted alkyl group of 1 to 20 carbon atoms.

In an embodiment, Formula 1 may be represented by Formula 1-C. Formula 1-C represents a case of Formula 1 where $Z_1$ is a group represented by Formula 2.

[Formula 1-C]

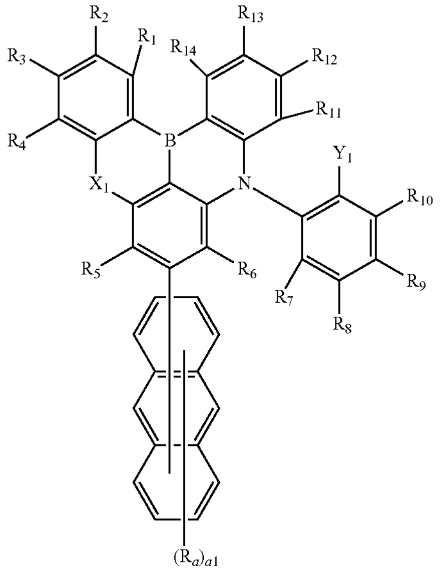

In Formula 1-C, the same contents as those explained in Formula 1 and Formula 2 may be applied for $X_1$, $Y_1$, and $R_1$ to $R_{14}$ are the same as defined in Formula 1, and a1 and $R_a$ are the same as defined in Formula 2. For example, in Formula 1-C, one of $R_1$ to $R_4$ and one of $R_{11}$ to $R_{14}$ may each independently be a substituted or unsubstituted phenyl group or a substituted or unsubstituted carbazole group.

In an embodiment, Formula 1-C may be represented by one of Formula 1-C1 to Formula 1-C3. Formula 1-C1 to Formula 1-C3 represent cases of Formula 1-C wherein the bonding position of an anthracenyl group including $R_a$ is further defined.

[Formula 1-C1]

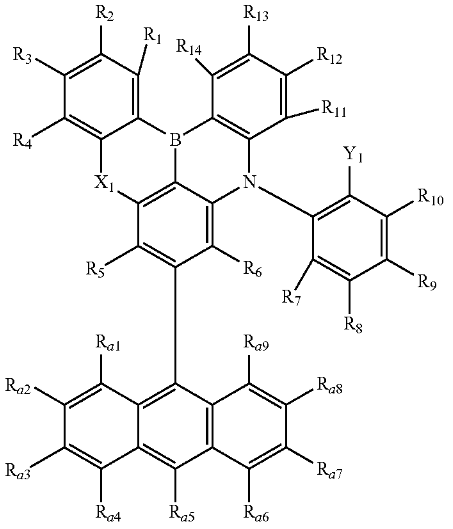

[Formula 1-C2]

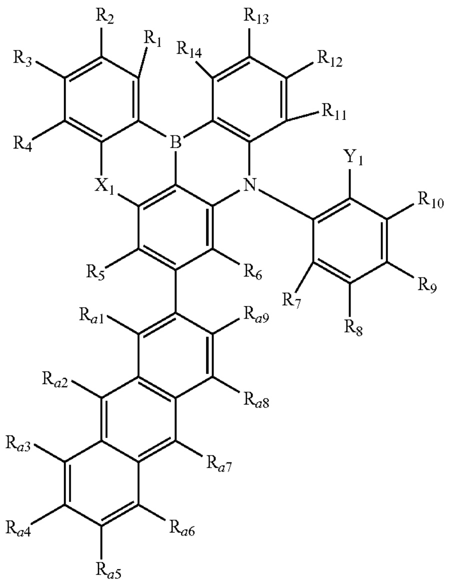

-continued

[Formula 1-C3]

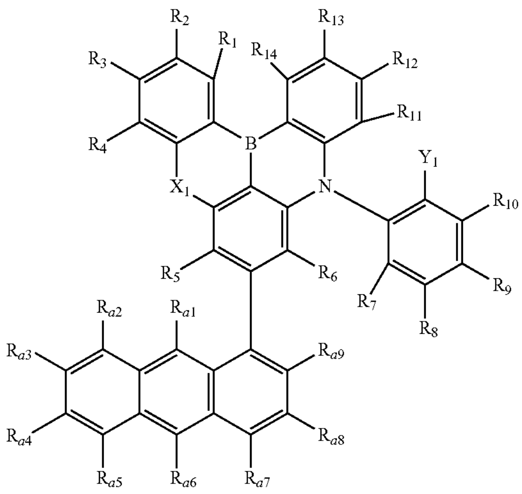

In Formula 1-C1 to Formula 1-C3, $X_1$, $Y_1$, and $R_1$ to $R_{14}$ are the same as defined in Formula 1. In Formula 1-C1 to Formula 1-C3, $R_{a1}$ to $R_{a9}$ may each independently be a hydrogen atom, a deuterium atom, or a substituted or unsubstituted aryl group of 6 to 30 ring-forming carbon atoms.

In an embodiment, Formula 1-C1 may be represented by one of Formula 1-C11 to Formula 1-C13. Formula 1-C11 to Formula 1-C13 represent cases of Formula 1-C1 wherein $R_1$ to $R_4$ and $R_{11}$ to $R_{14}$ are further defined.

[Formula 1-C11]

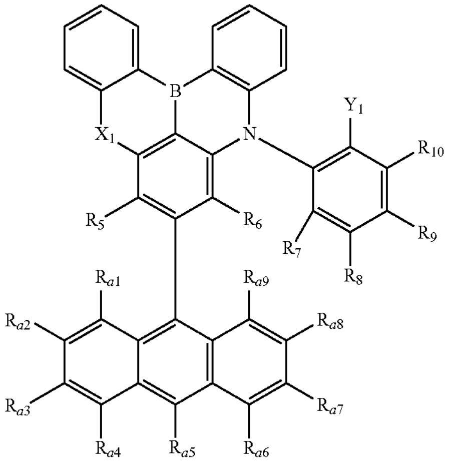

-continued

[Formula 1-C12]

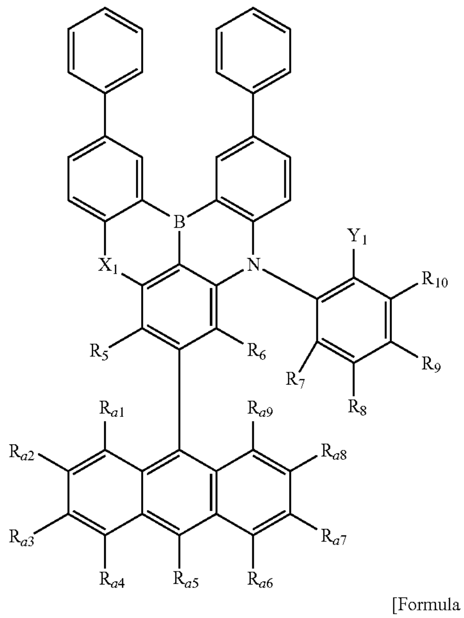

[Formula 1-C13]

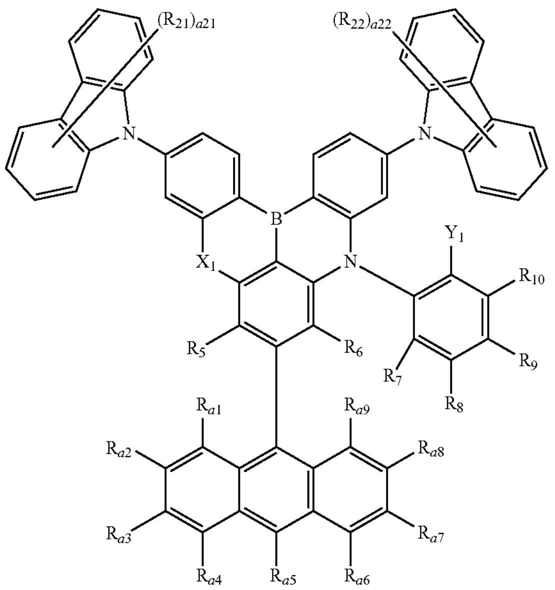

In Formula 1-C11 to Formula 1-C13, $X_1$, $Y_1$, $R_5$ to $R_{10}$, and $R_{a1}$ to $R_{a9}$ are the same as defined in Formula 1-C1. In Formula 1-C13, a21 and a22 may each independently be an integer from 0 to 8. If a21 is 2 or more, multiple $R_{21}$ groups may be the same as each other, or at least one group thereof may be different from the remainder. If a22 is 2 or more, multiple $R_{22}$ groups may be the same as each other, or at least one group thereof may be different from the remainder. In Formula 1-C13, $R_{21}$ and $R_{22}$ may each independently be a hydrogen atom, a deuterium atom, or a substituted or unsubstituted alkyl group of 1 to 20 carbon atoms.

In an embodiment, in Formula 1-C2 and Formula 1-C3, $R_3$ and $R_{12}$ may each independently be a substituted or unsubstituted carbazole group. In an embodiment, Formula 1-C2 may be represented by Formula 1-C21. In an embodiment, Formula 1-C3 may be represented by Formula 1-C31.

[Formula 1-C21]

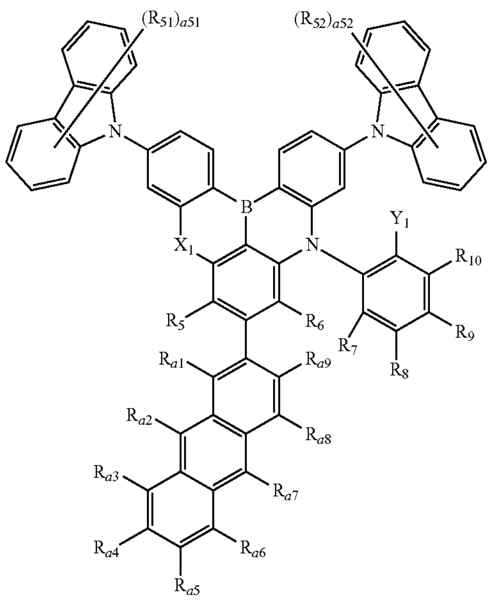

[Formula 1-C31]

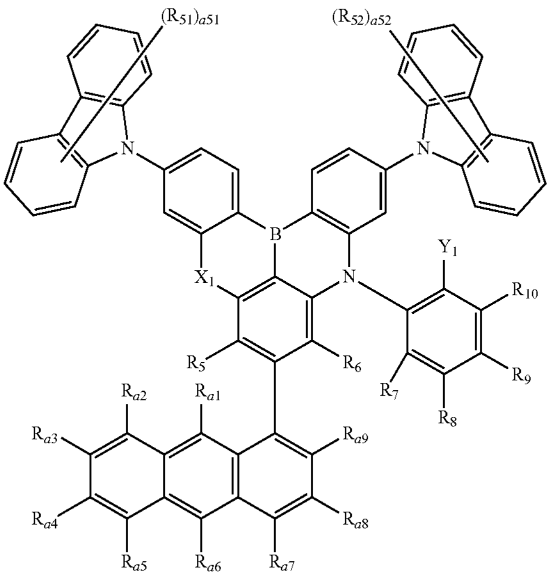

In Formula 1-C21 and Formula 1-C31, a51 to a54 may each independently be an integer from 0 to 8. If a51 is 2 or more, multiple $R_{51}$ groups may be the same as each other, or at least one group thereof may be different from the remainder. If a52 is 2 or more, multiple $R_{52}$ groups may be the same as each other, or at least one group thereof may be different from the remainder. If a53 is 2 or more, multiple $R_{53}$ groups may be the same as each other, or at least one group thereof may be different from the remainder. If a54 is 2 or more, multiple $R_{54}$ groups may be the same as each other, or at least one group thereof may be different from the remainder. In Formula 1-C21 and Formula 1-C31, $R_{51}$ to $R_{54}$ may each independently be a hydrogen atom, a deuterium atom, or a substituted or unsubstituted alkyl group of 1 to 20 carbon atoms.

In an embodiment, the fused polycyclic compound may be any compound selected from Compound Group 1. In an embodiment, in the light emitting element ED, the emission layer EML may include, as a first compound, at least one compound selected from Compound Group 1. In Compound Group 1, D represents a deuterium atom, and tBu represents a t-butyl group. In Compound Group 1, $D_4$ represents substitution with four deuterium atoms.

[Compound Group 1]

1

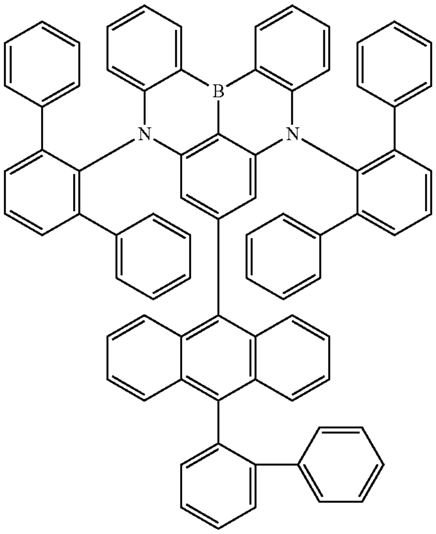

2

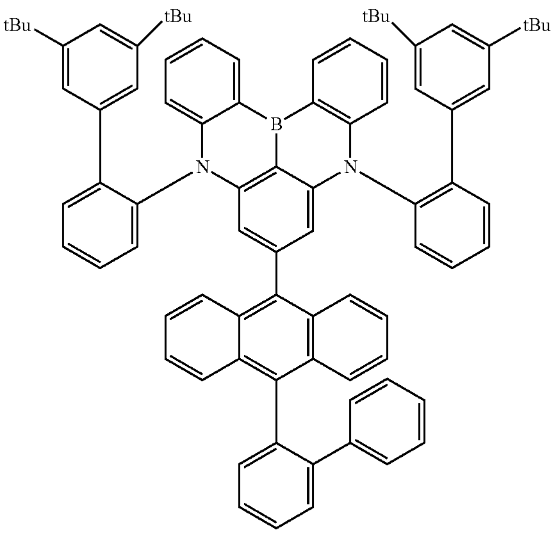

-continued
3
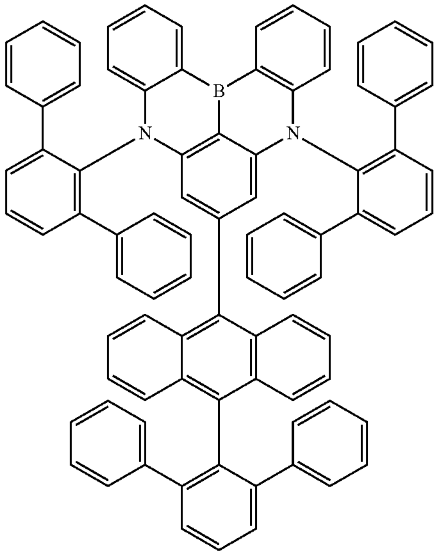
4
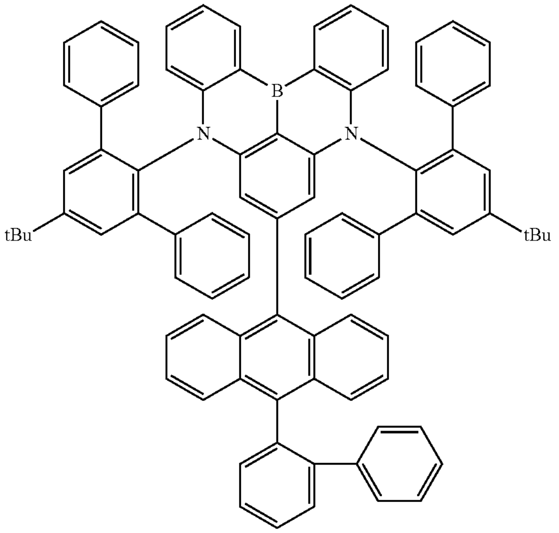
5
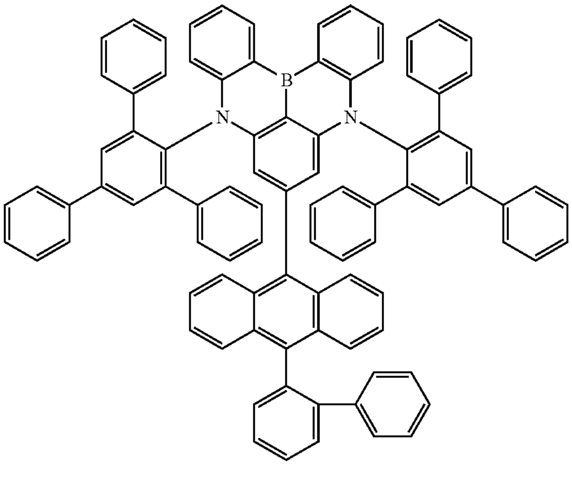
-continued
6
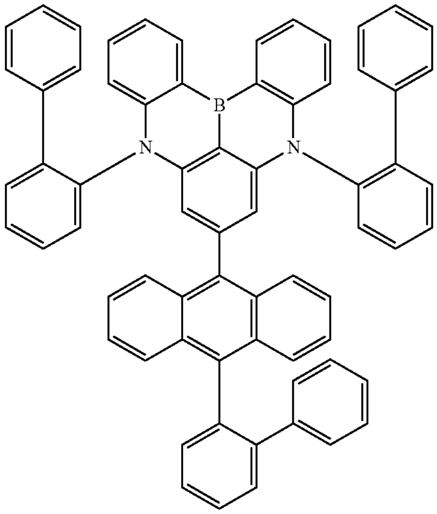
7
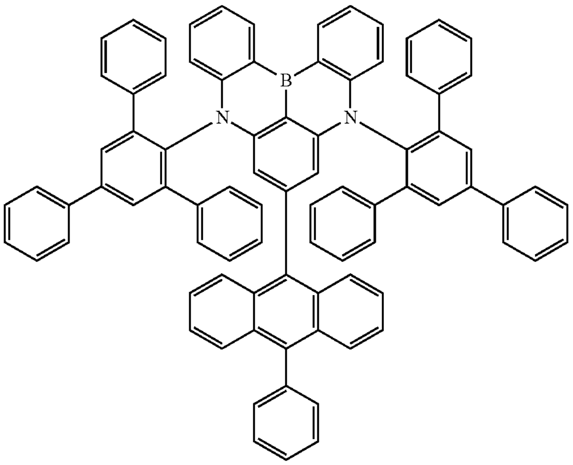
8
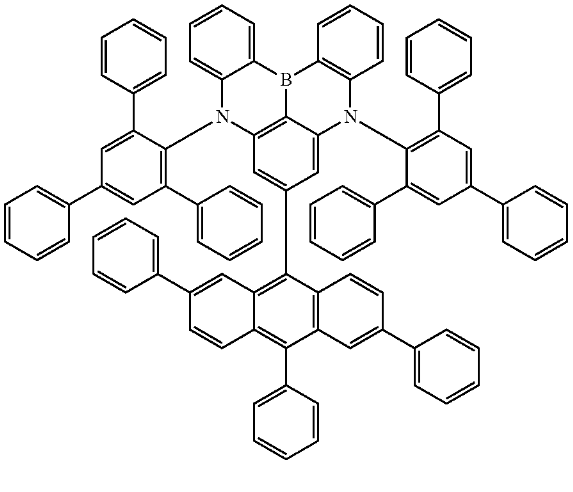

-continued
9
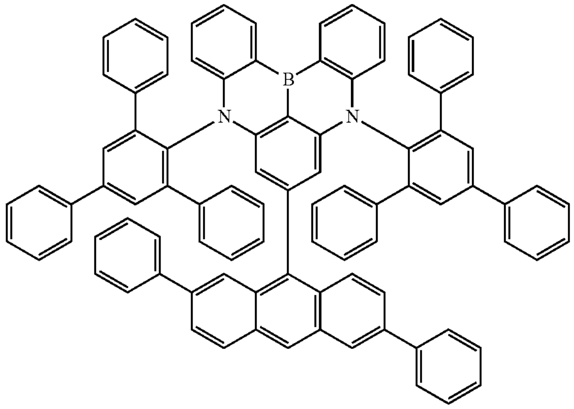
10
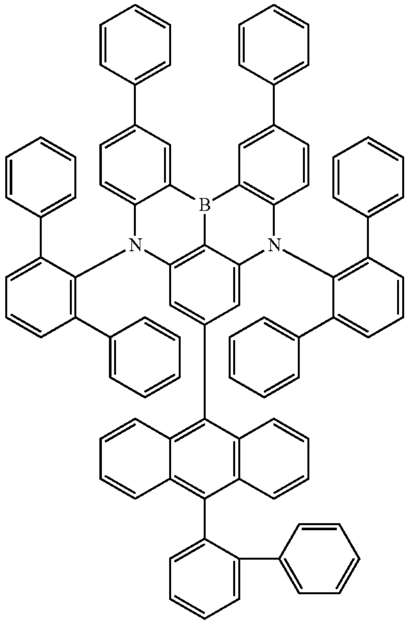
-continued
11
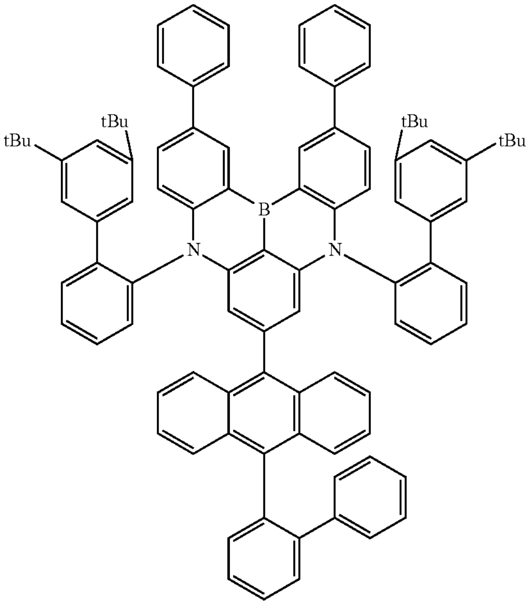
12
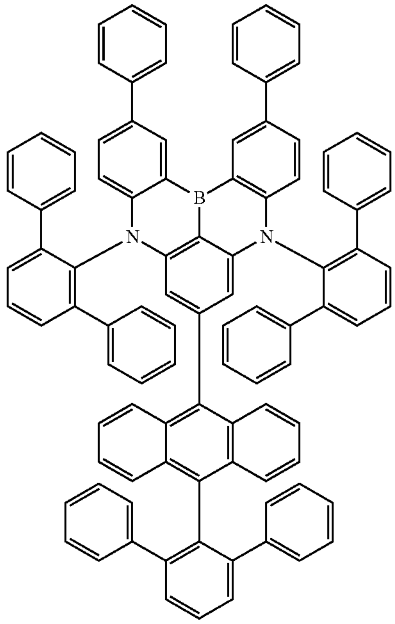

-continued
13
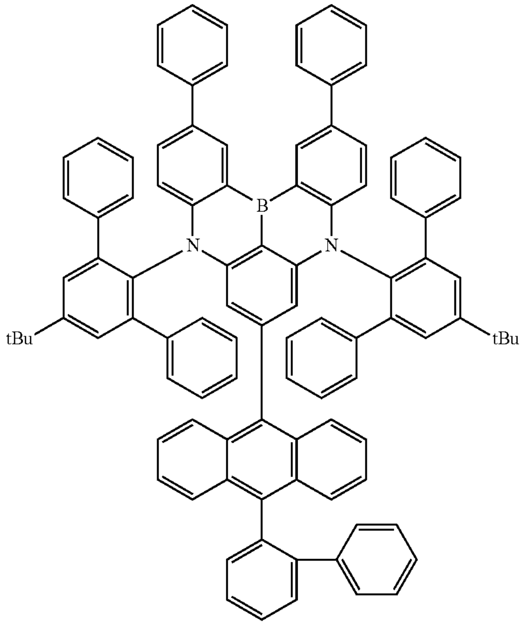
15
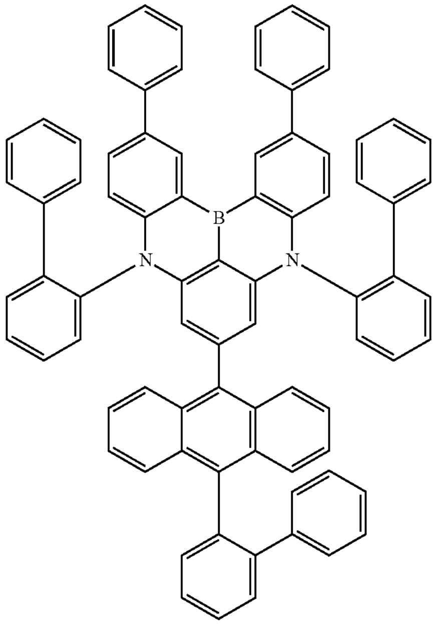
14
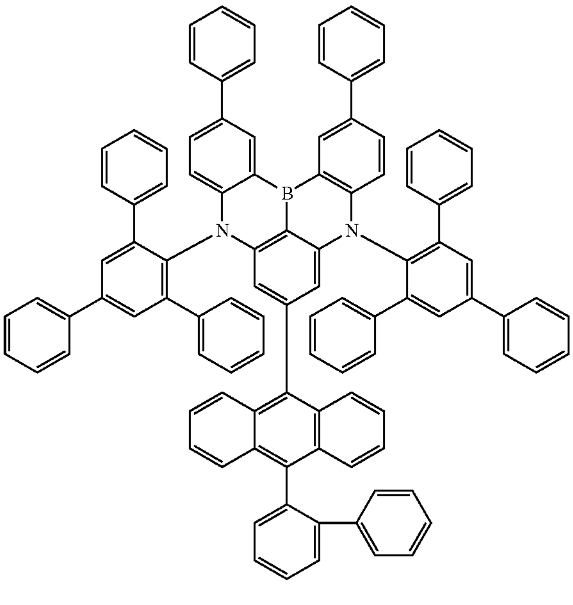
16
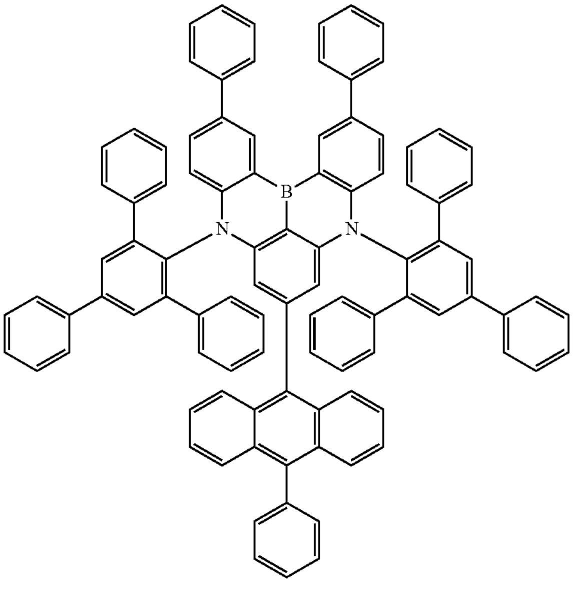

-continued
17
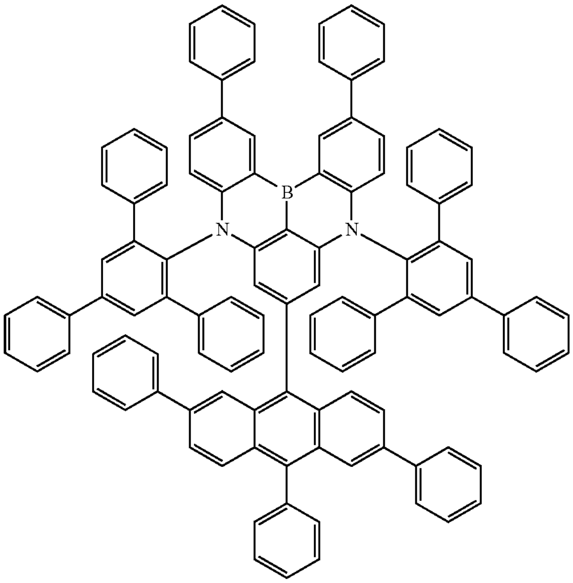
18
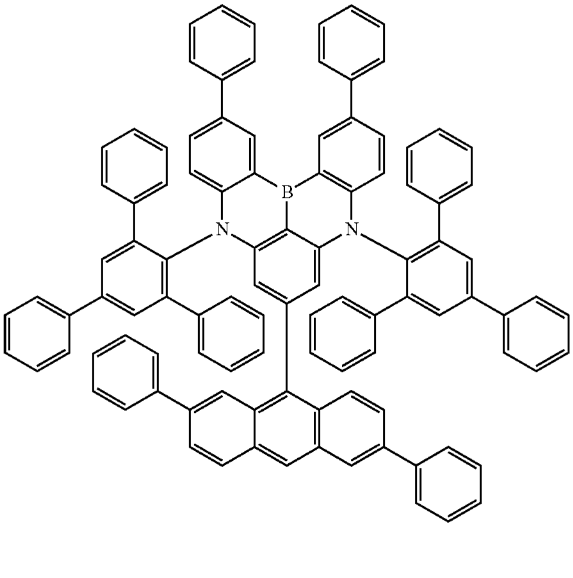
-continued
19
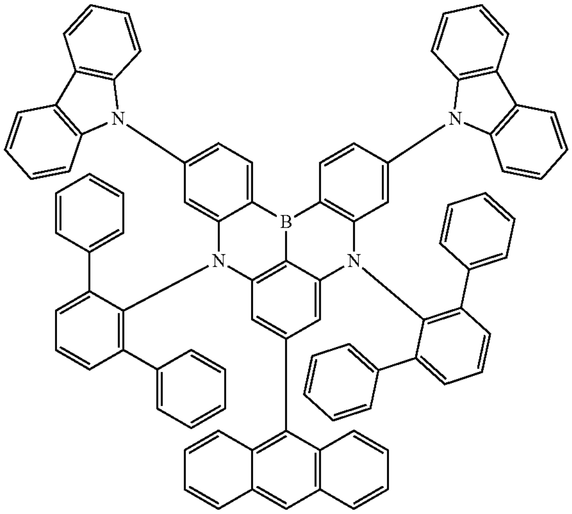
20
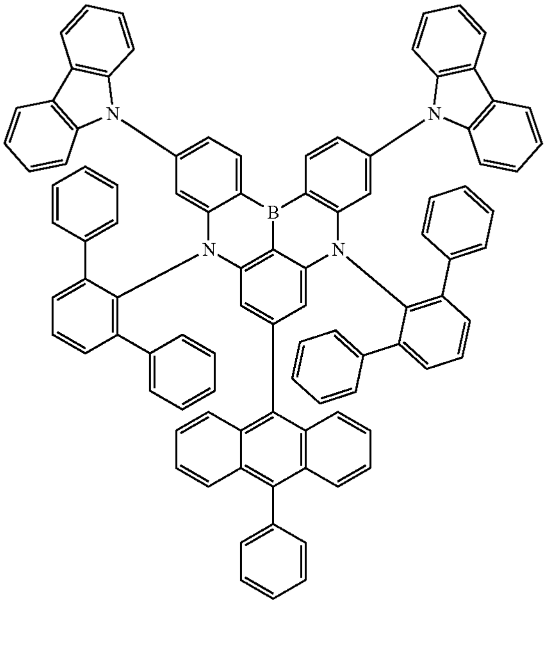

-continued
21
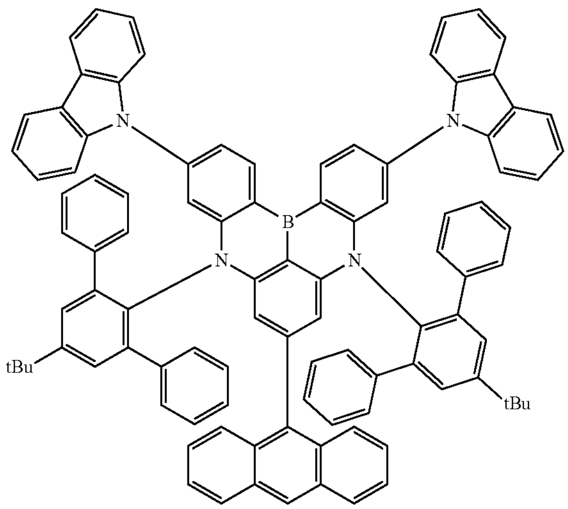
22
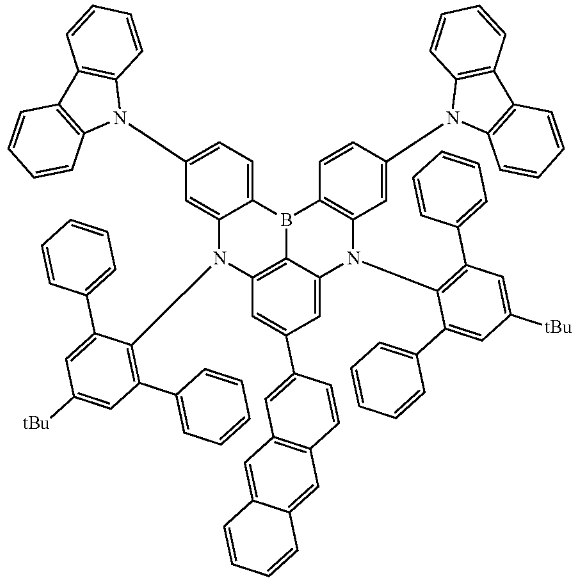
23
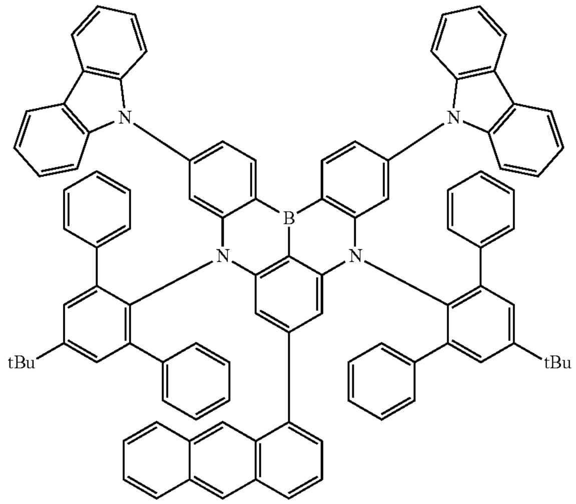
-continued
24
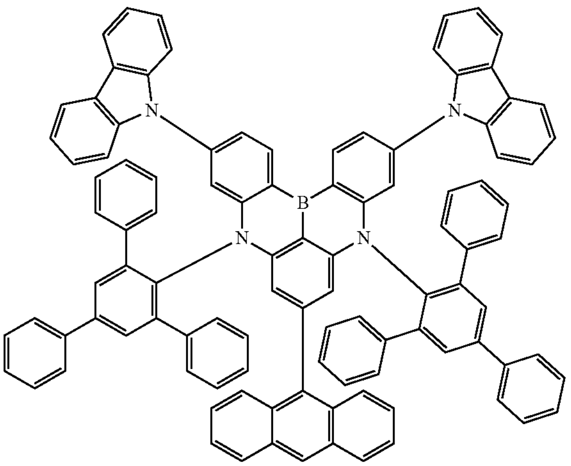
25
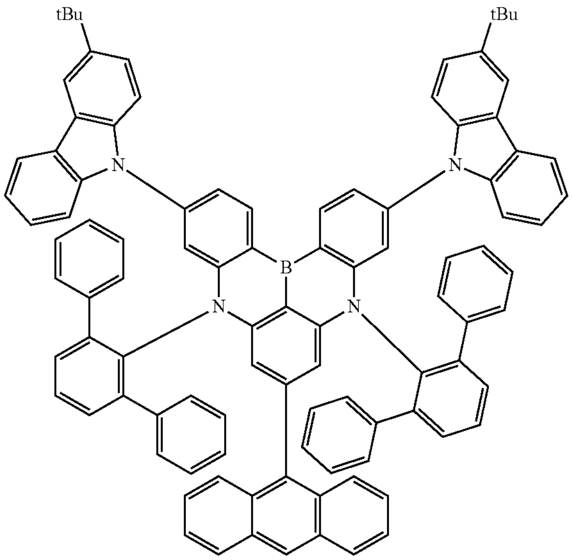

-continued
26
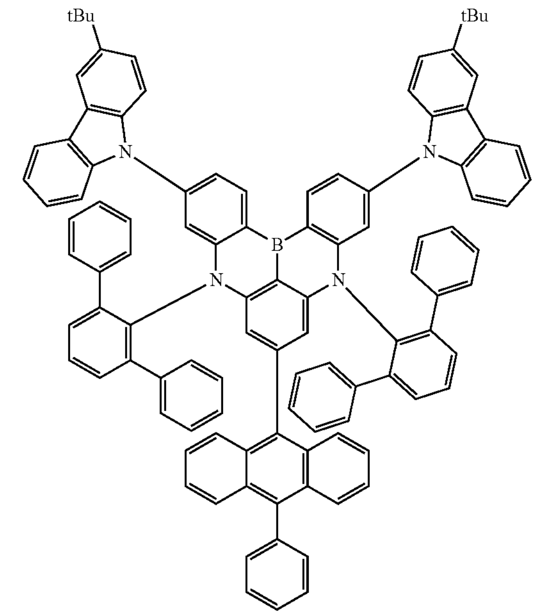
27
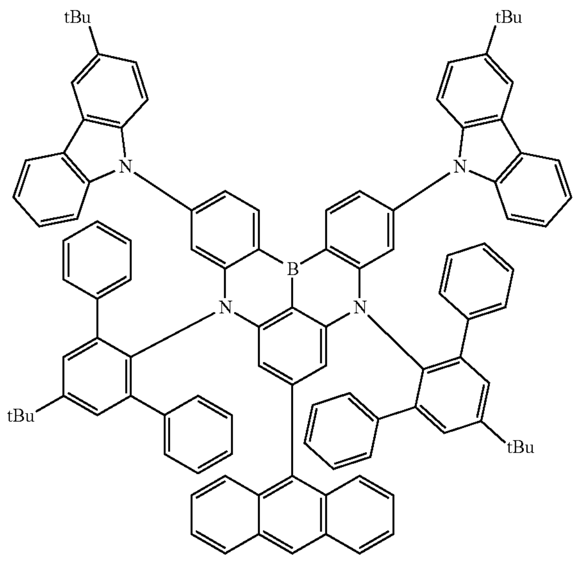
-continued
28
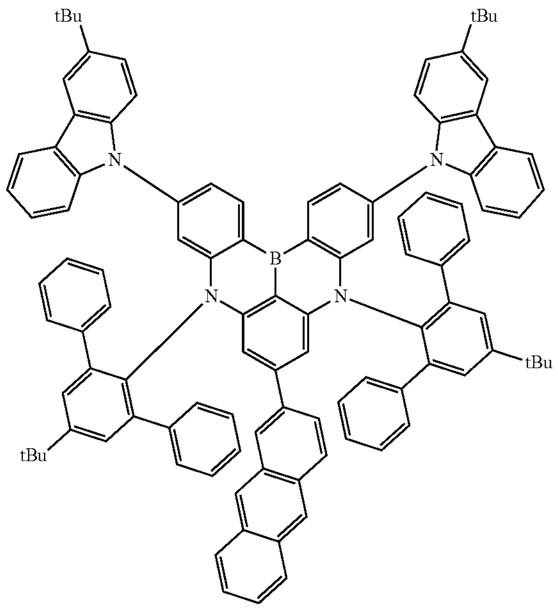
29
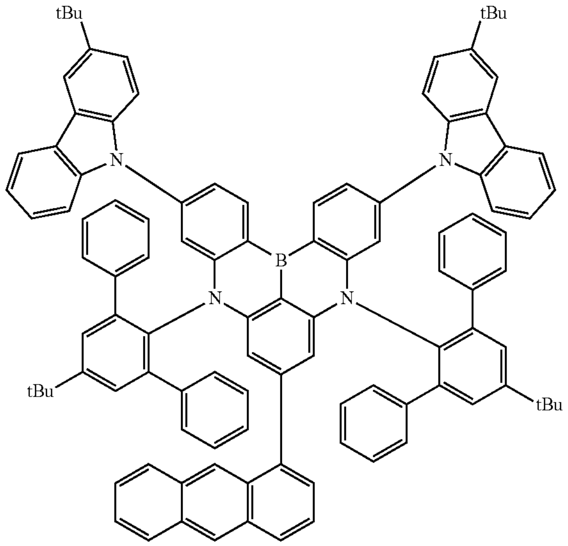

30
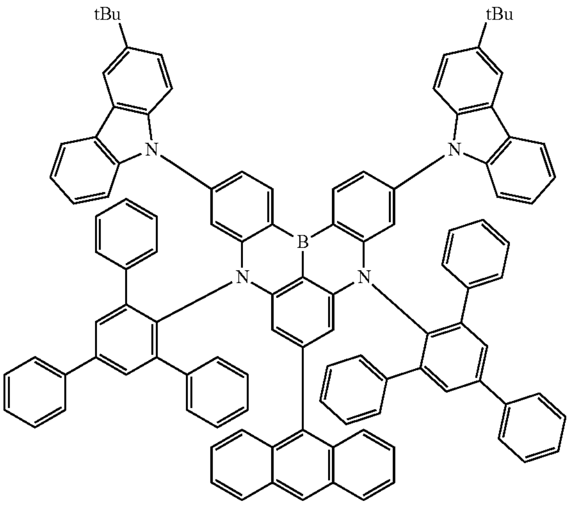
31
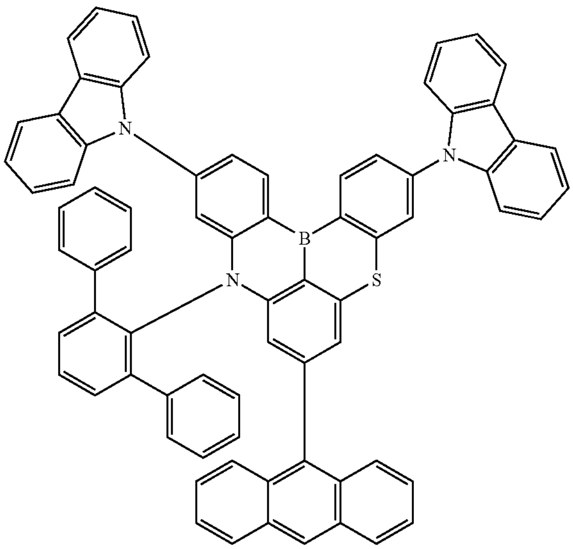
32
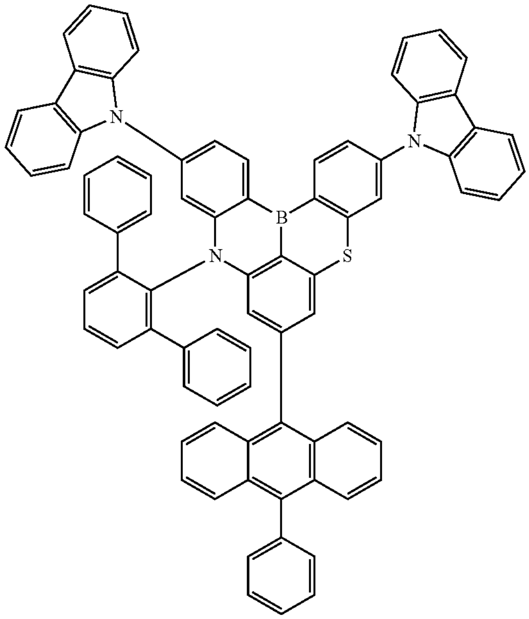
33
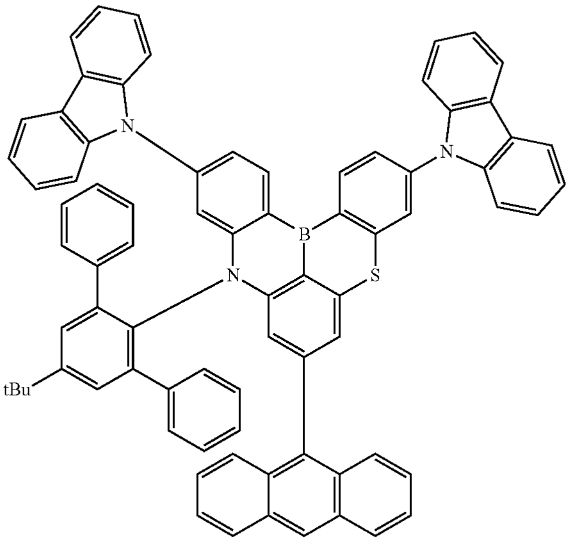

-continued
34
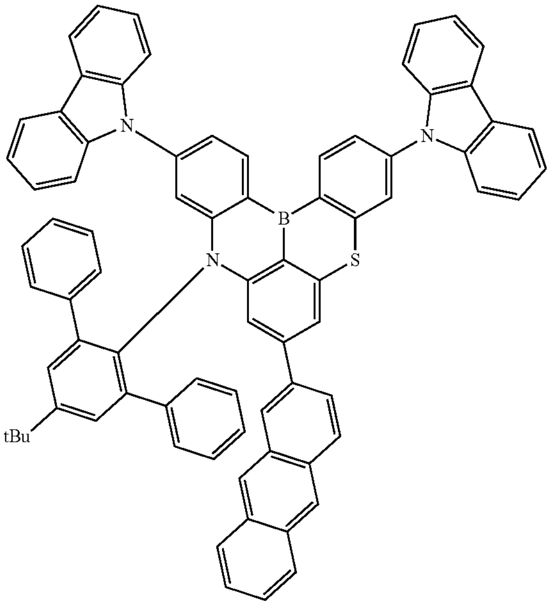
35
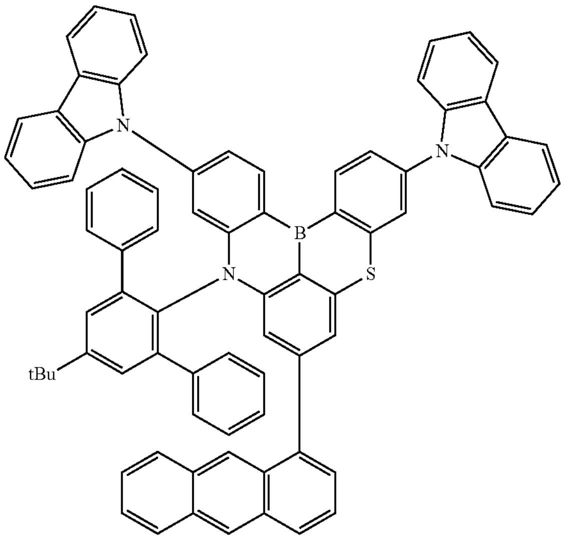
-continued
36
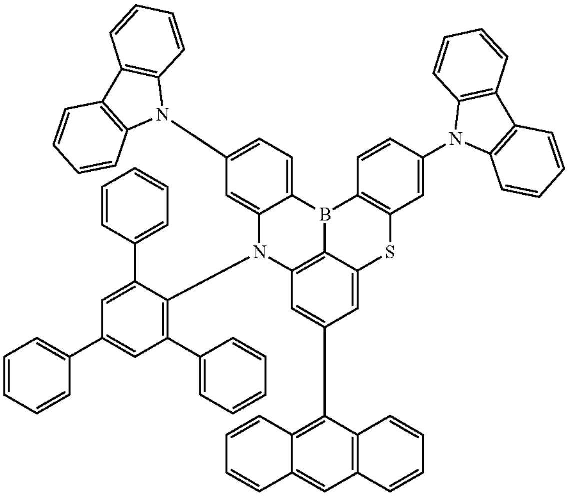
37
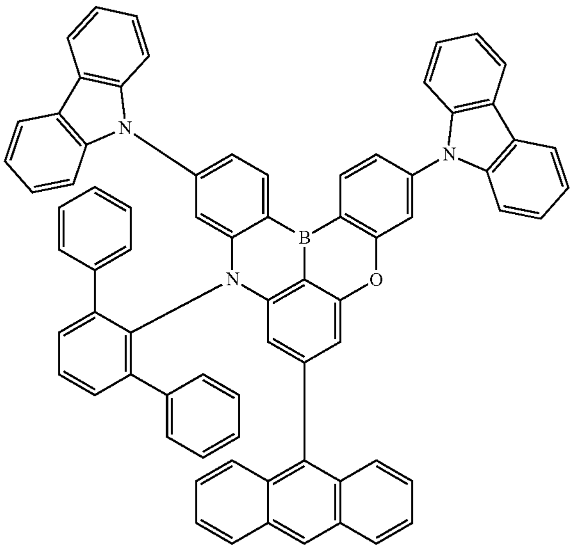

-continued
38
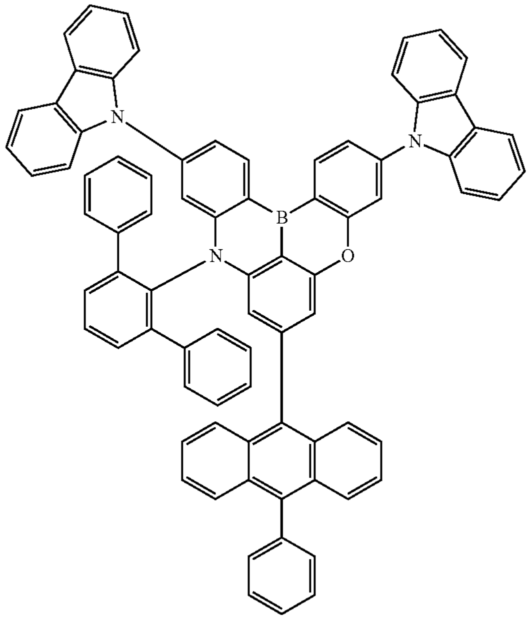
39
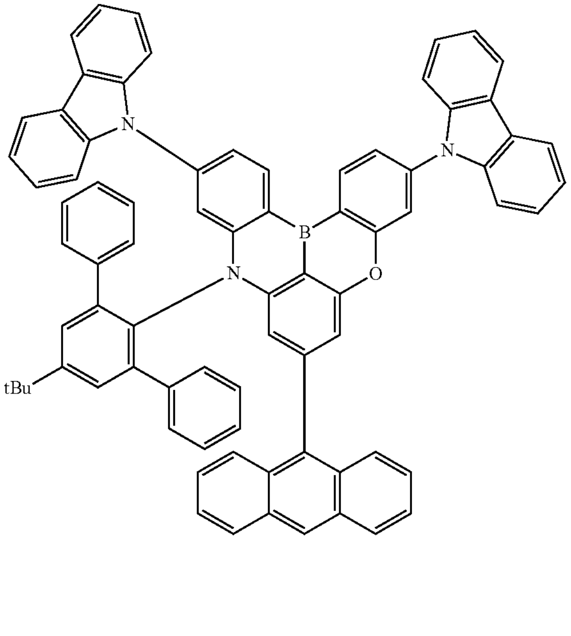
-continued
40
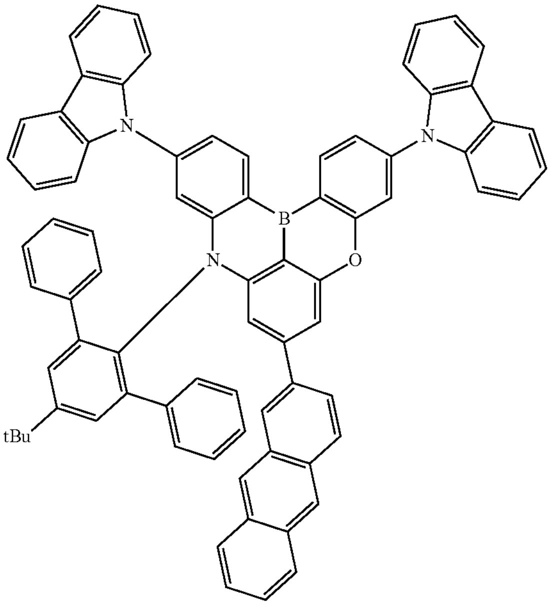
41
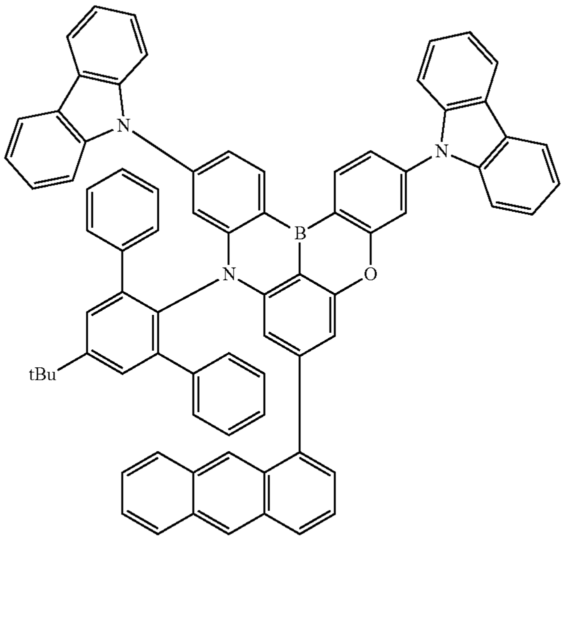

-continued
42
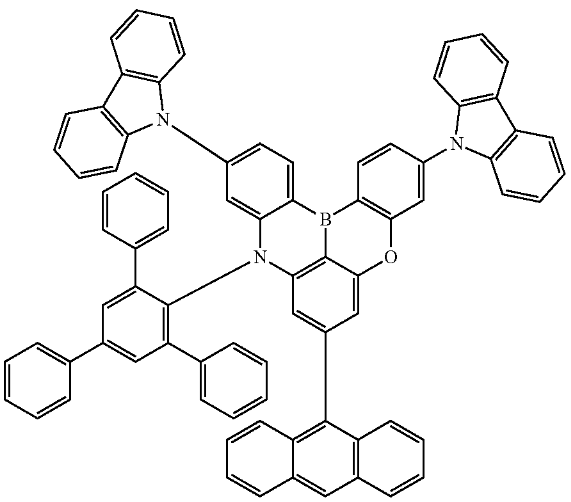
43
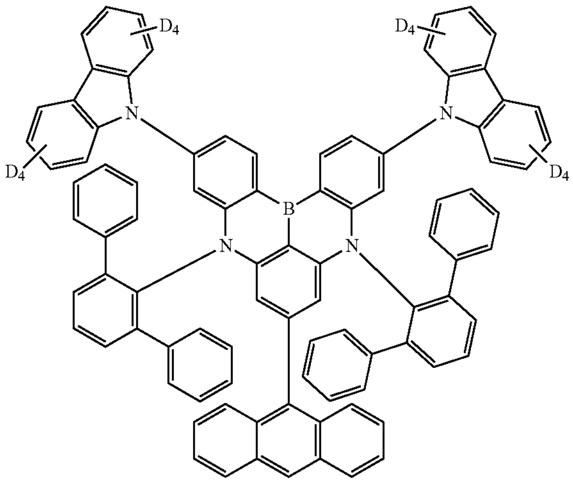
44
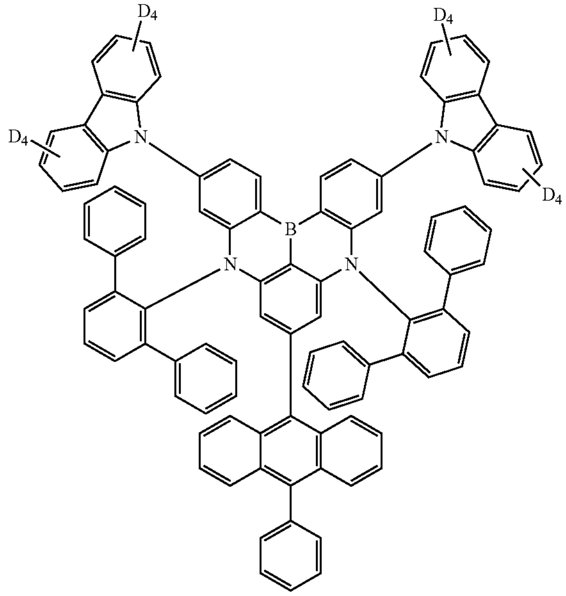
-continued
45
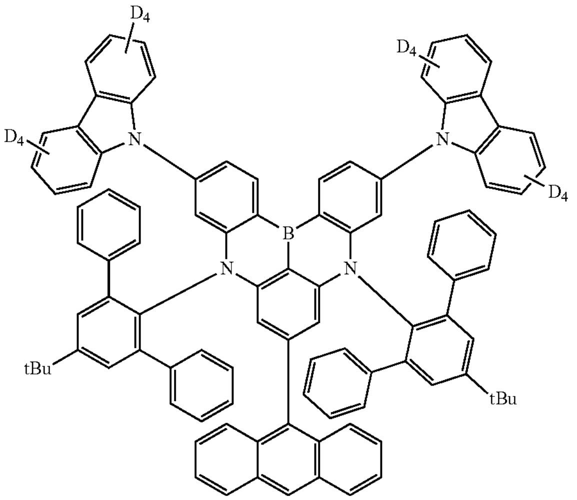
46
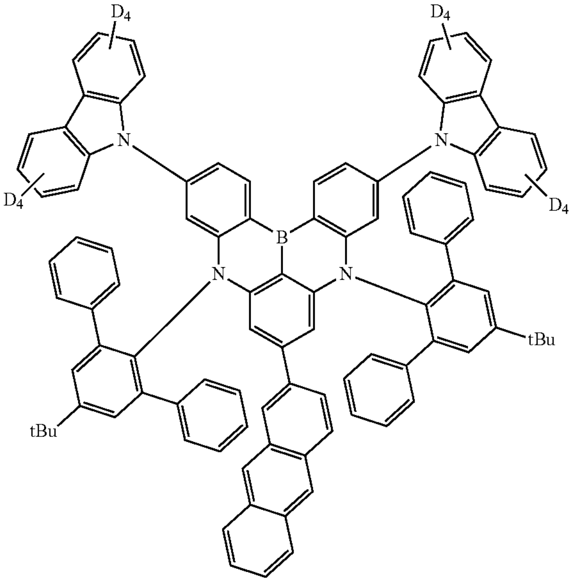
47
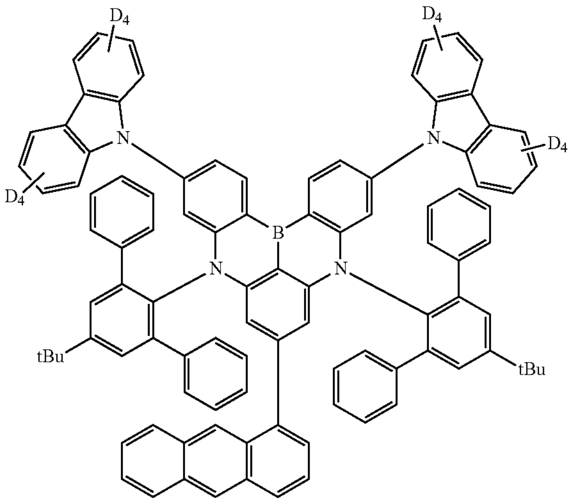

-continued

48

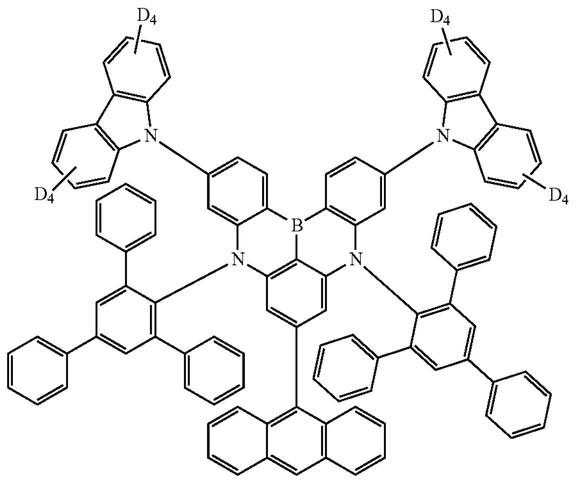

In the light emitting element ED according to an embodiment, an emission layer EML may include the fused polycyclic compound according to an embodiment. The fused polycyclic compound may include a moiety represented by Formula Z1.

[Formula Z1]

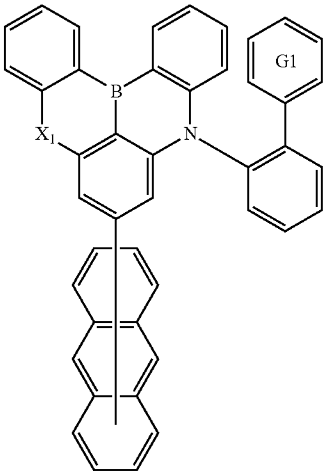

In Formula Z1, $X_1$ is the same as defined in Formula 1. In Formula Z1, G1 represents a substituent of a phenyl group which is directly bonded to a nitrogen atom which is a ring-forming atom of the fused ring core. Substituent G1 may correspond to $Y_1$ of Formula 1, and is depicted as an unsubstituted phenyl group for the convenience of explanation. Substituent G1 is bonded to the phenyl group at an ortho position to the nitrogen atom.

The fused polycyclic compound of an embodiment includes a pentacyclic fused ring core that includes a boron atom and a nitrogen atom as ring-forming atoms, and may contribute to an increase of the lifetime of a light emitting element ED by using a singlet energy level S1 and a triplet energy level T2 of the pentacyclic fused ring core. The fused polycyclic compound may further include an anthracenyl group to improve stability of a light emitting material and may include substituent G1 to contribute to an improvement of efficiency of the light emitting element ED. A lowest triplet energy level T1 of the anthracenyl group has a relatively low value, and a compound that includes an anthracenyl group and does not include substituent G1 may induce Dexter energy transfer according to intermolecular interaction. If Dexter energy transfer is induced by intermolecular interaction of a compound included in an emission layer, the compound may deteriorate, excitons may become extinct, and efficiency and lifetime of the light emitting element may be reduced.

In contrast, the fused polycyclic compound, which further includes substituent G1, intermolecular distance may increase, and light efficiency deterioration by the anthracenyl group may be minimized. Thus, the fused polycyclic compound, which includes an anthracenyl group and substituent G1, has excellent material stability to contribute to the improvement of efficiency and lifetime of the light emitting element ED. The fused polycyclic compound may be included in the light emitting element ED and may contribute to the improvement of efficiency roll-off phenomenon at high luminance.

The fused polycyclic compound of an embodiment may be a dopant having multiple resonance (MR) properties. An emission layer EML which includes a fused polycyclic compound that is an MR type dopant may emit light with a narrow full width at half maximum (FWHM). For example, the fused polycyclic compound may emit light having a FWHM less than or equal to about 34 nm. Accordingly, a light emitting element ED including the fused polycyclic compound may emit light with improved color purity.

The emission layer EML may be a delayed fluorescence emission layer including a host and a dopant. For example, the emission layer EML may emit thermally activated delayed fluorescence (TADF). The fused polycyclic compound according to an embodiment may be a thermally activated delayed fluorescence dopant of an MR type.

The emission layer EML may include the fused polycyclic compound as a dopant. The fused polycyclic compound according to an embodiment may be a thermally activated delayed fluorescence material. The fused polycyclic compound may emit blue light and may have a central wavelength in a range of about 450 nm to about 470 nm.

An emission layer EML may include a host and a dopant. For example, the emission layer EML may include two or more hosts, a sensitizer, and a dopant. The emission layer EML may include a hole transport host and an electron transport host. The emission layer EML may include a phosphorescence sensitizer as the sensitizer.

In the emission layer EML, the hole transport host and the electron transport host may form an exciplex. A triplet energy level of the exciplex formed by the hole transport host and the electron transport host may correspond to a difference between the lowest unoccupied molecular orbital (LUMO) energy level of the electron transport host and the highest occupied molecular orbital (HOMO) energy level of the hole transport host. For example, an absolute value of the triplet energy level (T1) of the exciplex formed by the hole transport host and the electron transport host may be in a range of about 2.4 eV to about 3.0 eV. The triplet energy level of the exciplex may have a value that is smaller than an energy gap of each host material. The exciplex may have a triplet energy level less than or equal to about 3.0 eV, which is an energy gap between the hole transport host and the electron transport host. However, these are only examples, and embodiments are not limited thereto.

If the emission layer EML includes a hole transport host, an electron transport host, a sensitizer, and a dopant, the hole transport host and the electron transport host may form an exciplex, and energy may be transferred from the exciplex to the sensitizer, and from the sensitizer to the dopant to emit light. The sensitizer may be an auxiliary dopant that transfers energy from the hole transport host and the electron transport host to the dopant. The sensitizer may accelerate the delayed fluorescence of the dopant to contribute to an improvement of efficiency of the light emitting element ED. If the delayed fluorescence of the dopant is accelerated, excitons formed in the emission layer EML may not accumulate therein but may rapidly emit light, and deterioration of the light emitting element ED may be reduced. Accordingly, the sensitizer may contribute to an increase of lifetime of the light emitting element ED.

However, this is only an example, and the materials included in the emission layer EML are not limited thereto. For example, the hole transport host and the electron transport host may not form an exciplex. If the hole transport host and the electron transport host do not form exciplex, energy may be transferred from the hole transport host and the electron transport host to the sensitizer, and from the sensitizer to the dopant to emit light.

In an embodiment, the emission layer EML may further include at least one of a second compound, a third compound, and a fourth compound. For example, the emission layer EML may include the fused polycyclic compound, the second compound, and the third compound. As another example, the emission layer EML may include the fused polycyclic compound, the second compound, the third compound, and the fourth compound.

In an embodiment, the emission layer EML may include a second compound represented by Formula HT-1. In an embodiment, the emission layer EML may include the second compound as a hole transport host material.

[Formula HT-1]

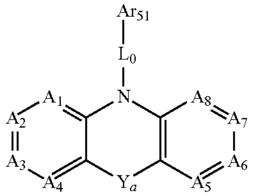

In Formula HT-1, $A_1$ to $A_8$ may each independently be N or $C(R_{91})$. In Formula HT-1, $L_0$ may be a direct linkage, a substituted or unsubstituted arylene group of 6 to 30 ring-forming carbon atoms, or a substituted or unsubstituted heteroarylene group of 2 to 30 ring-forming carbon atoms.

In Formula HT-1, $Y_a$ may be a direct linkage, $C(R_{92})(R_{93})$, or $Si(R_{94})(R_{95})$. In Formula HT-1, $Ar_{51}$ may be a substituted or unsubstituted aryl group of 6 to 30 ring-forming carbon atoms or a substituted or unsubstituted heteroaryl group of 2 to 30 ring-forming carbon atoms. In Formula HT-1, $R_{91}$ to $R_{95}$ may each independently be a hydrogen atom, a deuterium atom, a halogen atom, a cyano group, a substituted or unsubstituted silyl group, a substituted or unsubstituted thio group, a substituted or unsubstituted oxy group, a substituted or unsubstituted amine group, a substituted or unsubstituted boron group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring.

In an embodiment, the second compound represented by Formula HT-1 may be selected from Compound Group 2. In an embodiment, in the light emitting element ED, the second compound may include at least one compound selected from Compound Group 2. In Compound Group 2, D represents a deuterium atom, and Ph represents a phenyl group.

[Compound Group 2]

HT1

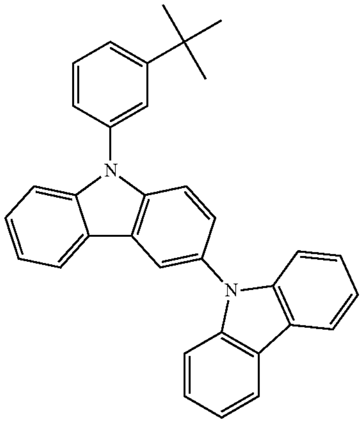

HT2

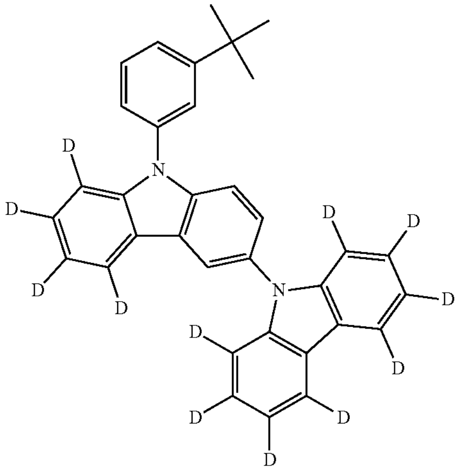

HT3

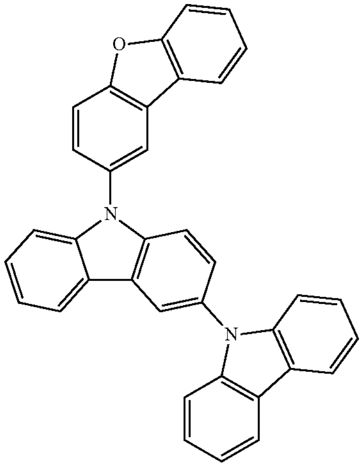

-continued
HT4
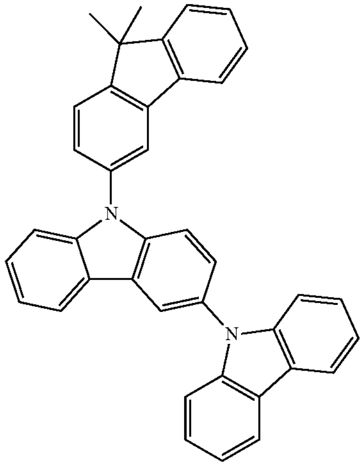
HT5
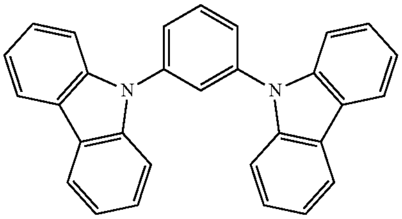
HT6
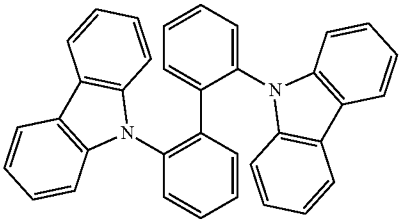
HT7
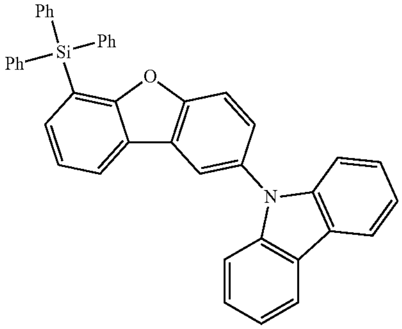
HT8
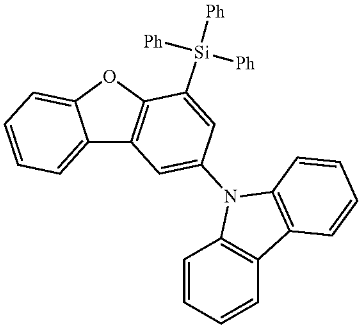
-continued
HT9
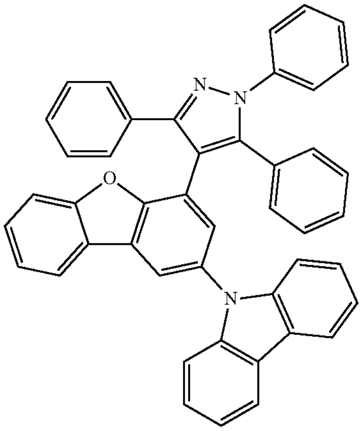
HT10
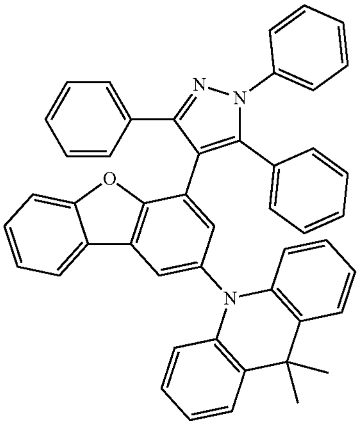
HT11
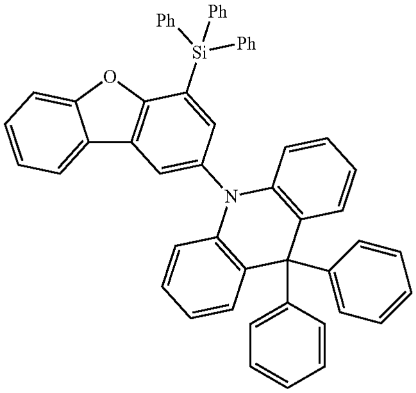
HT12
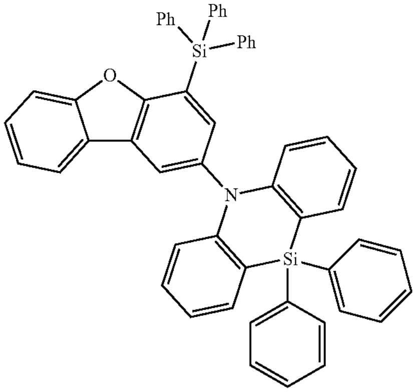

-continued
HT13
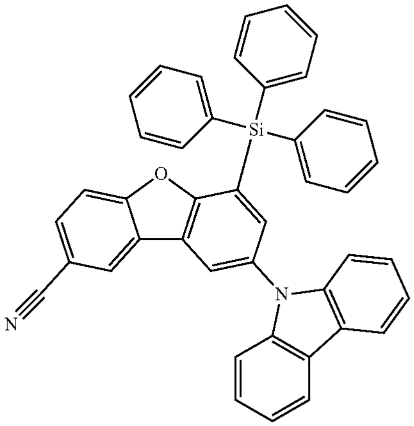
HT14
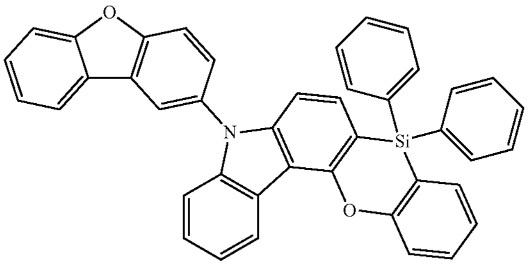
HT15
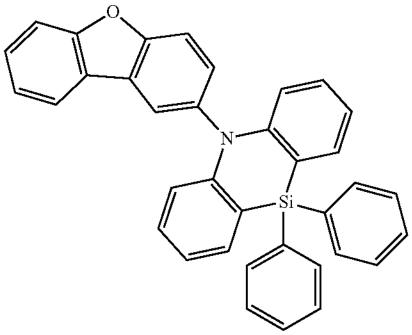
HT16
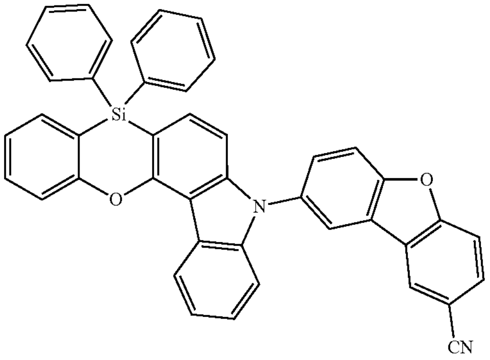
-continued
HT17
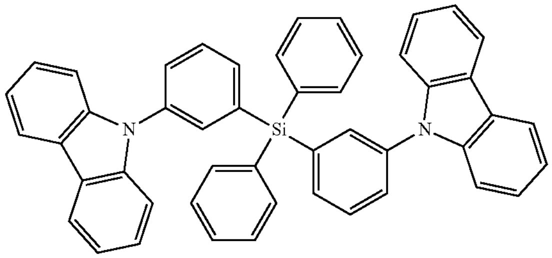
HT18
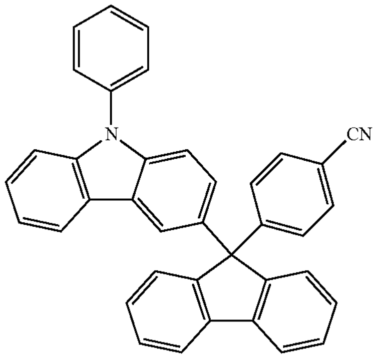
HT19
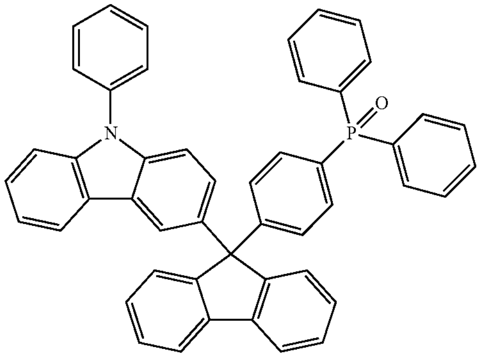
HT20
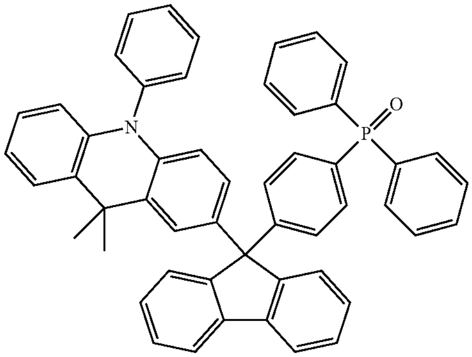
HT21
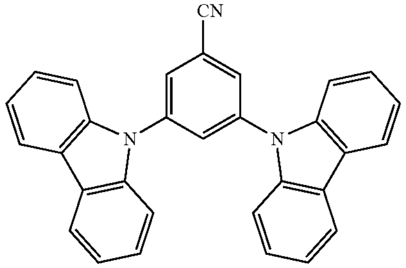

-continued
HT22
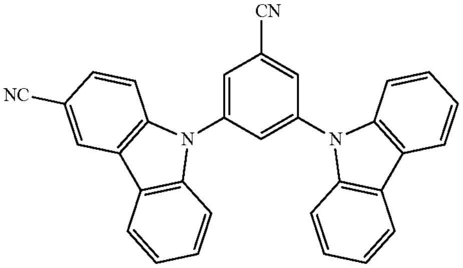
HT23
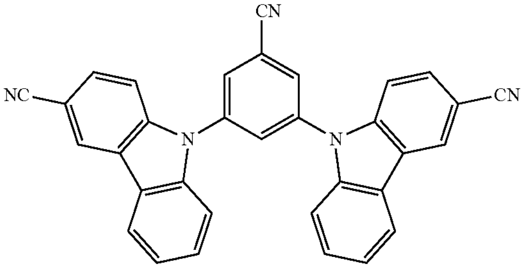
HT24
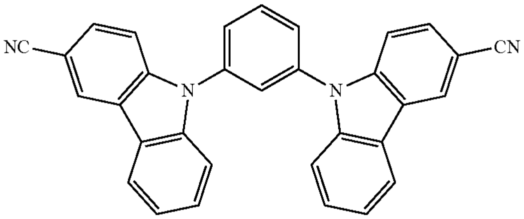
HT25
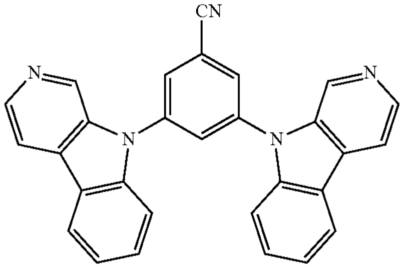
HT26
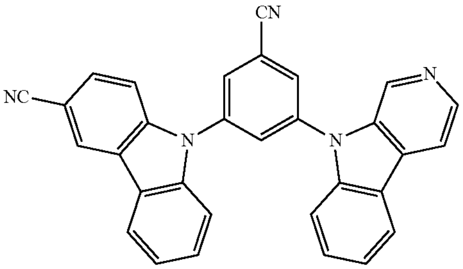
-continued
HT27
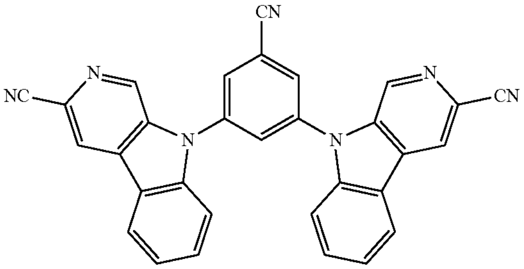
HT28
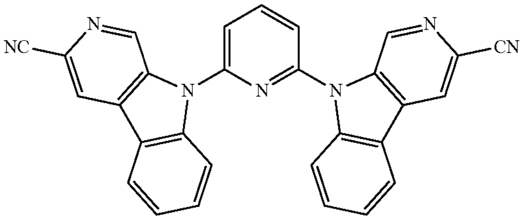
HT29
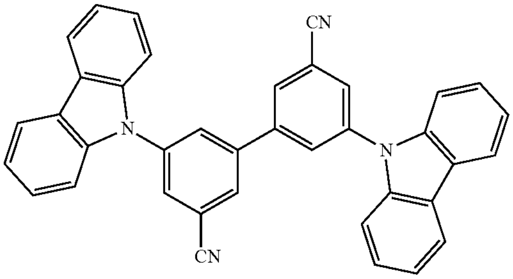
HT30
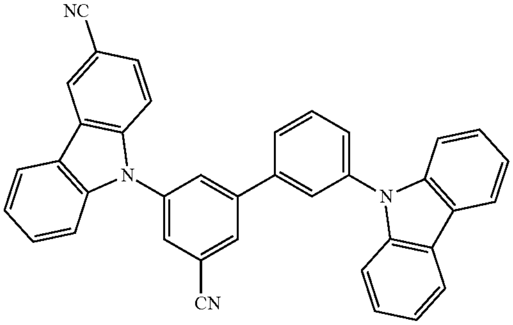
HT31
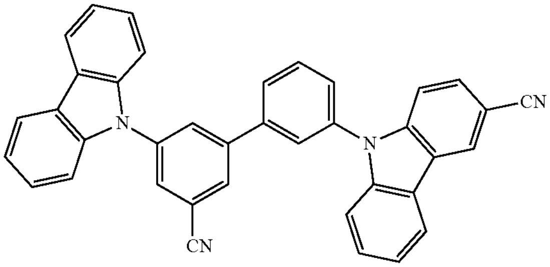

-continued
HT32
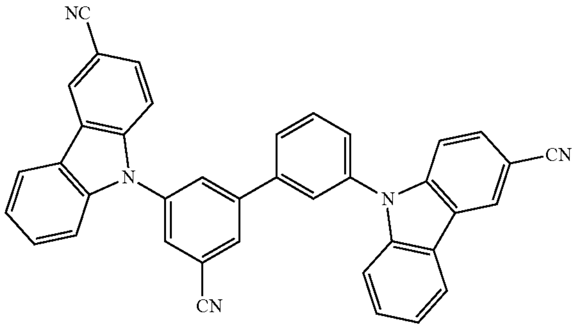
HT33
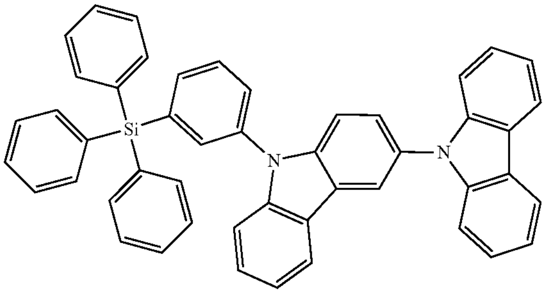
HT34
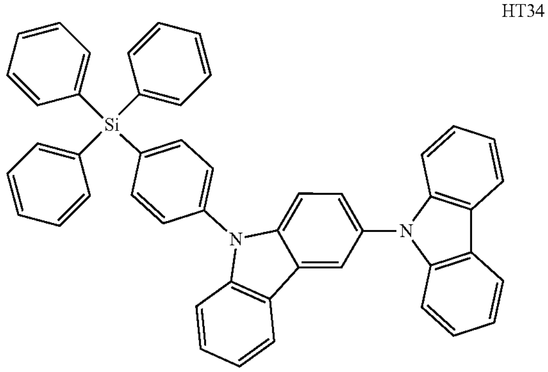
HT35
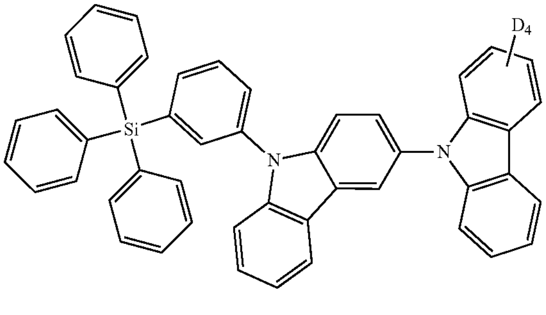
-continued
HT36
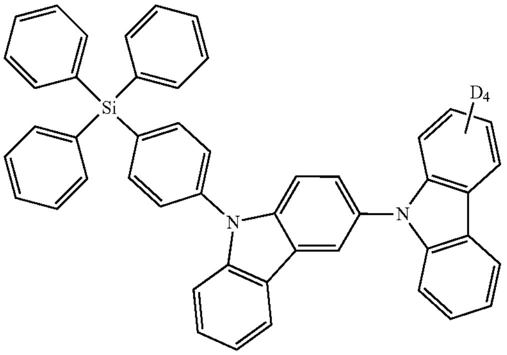
HT37
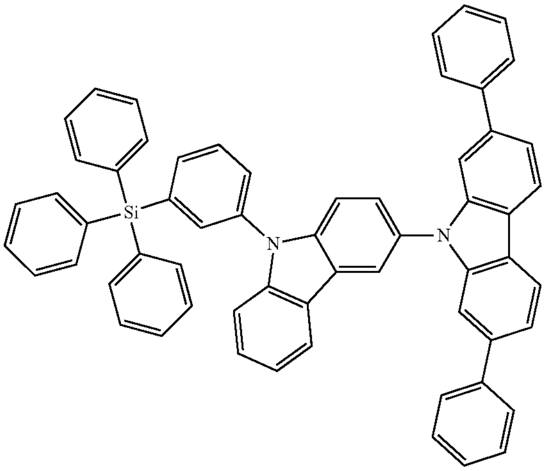
HT38
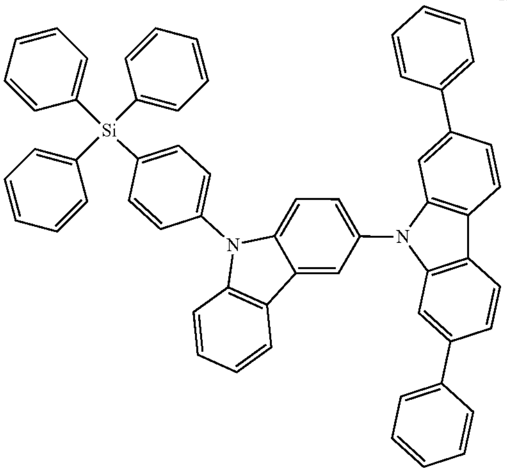

-continued
HT39
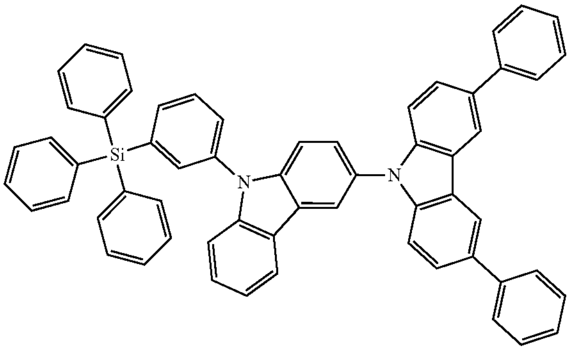
HT40
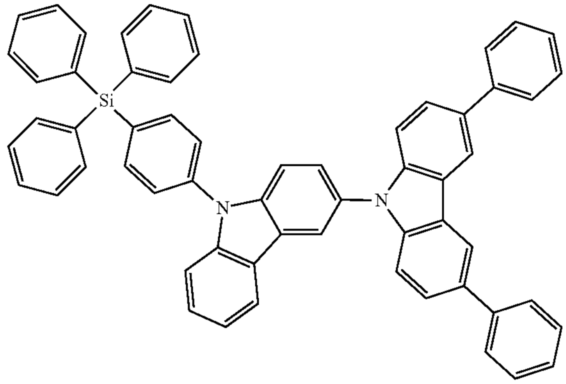
HT41
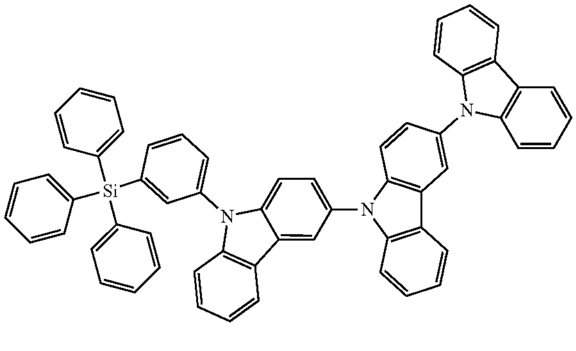
HT42
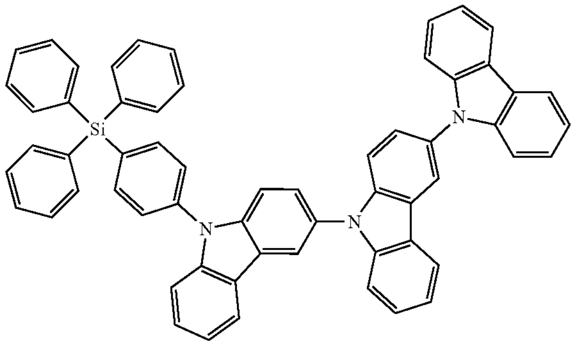
-continued
HT43
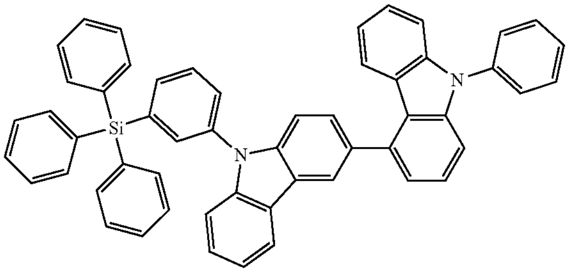
HT44
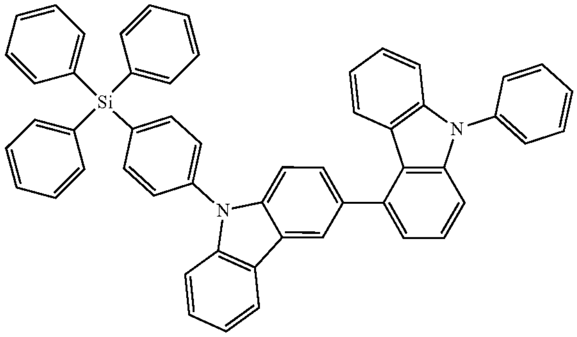
HT45
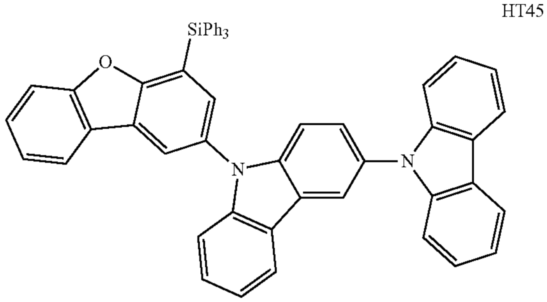
HT46
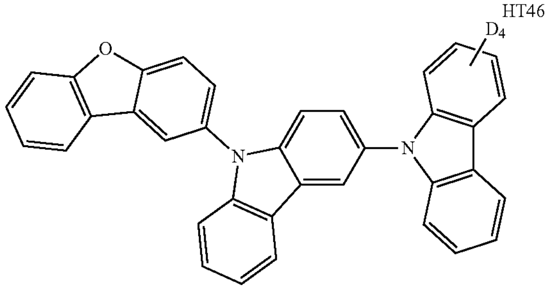
HT47
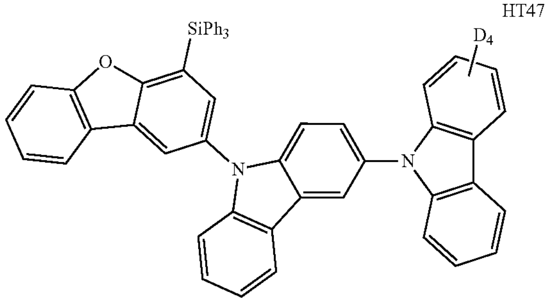

-continued
HT48
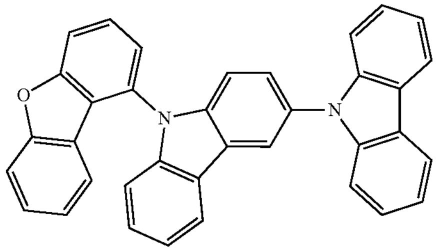
HT49
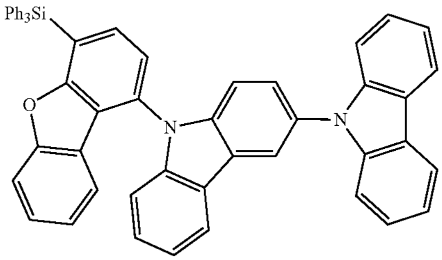
HT50
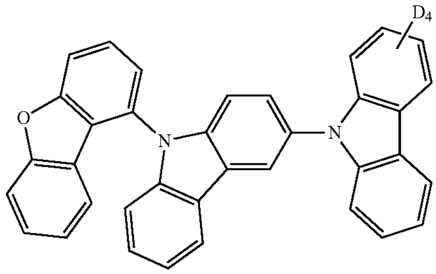
HT51
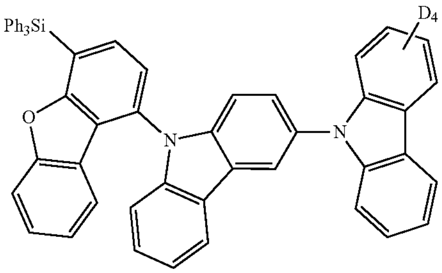
HT52
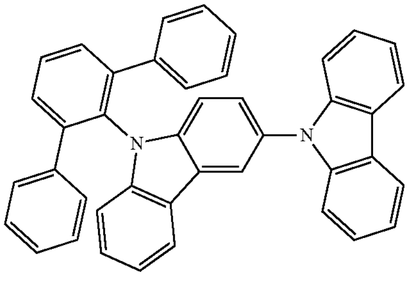
-continued
HT53
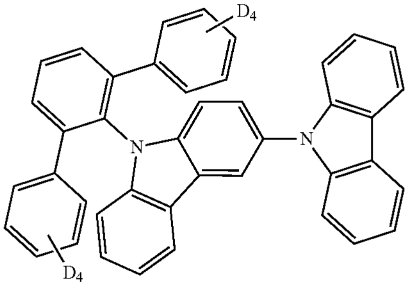
HT54
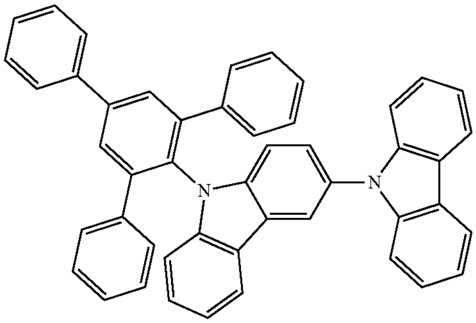
HT55
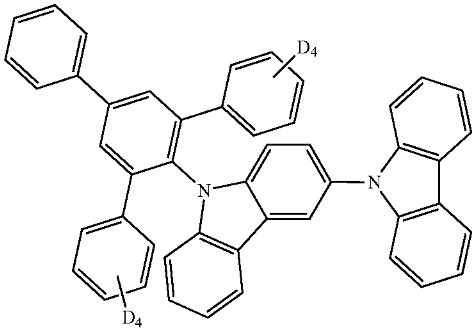
HT56
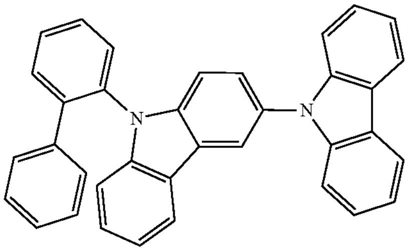
HT57
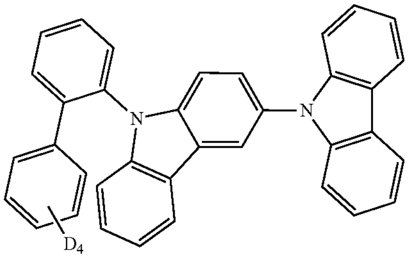

-continued

HT58

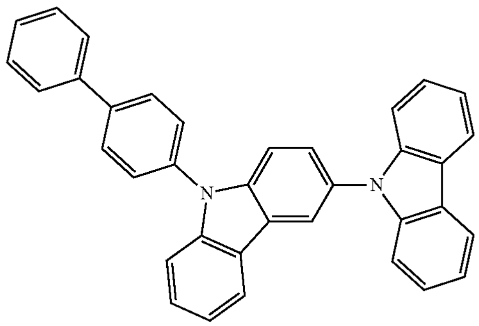

HT59

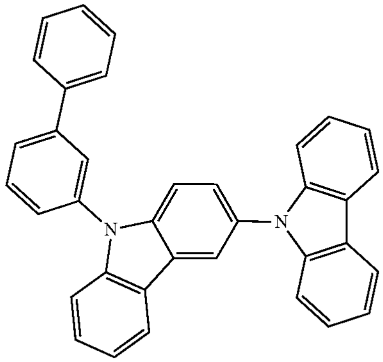

In an embodiment, the emission layer EML may include a third compound represented by Formula ET-1. In an embodiment, the emission layer EML may include the third compound as an electron transport host material.

[Formula ET-1]

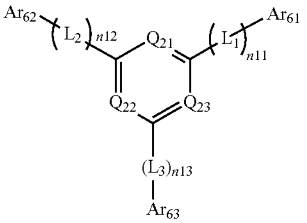

In Formula ET-1, at least one of $Q_{21}$ to $Q_{23}$ may each be N; and the remainder of $Q_{21}$ to Q23 may each independently be $C(R_{81})$. In Formula ET-1, $R_{81}$ may be a hydrogen atom, a deuterium atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

If one of $Q_{21}$ to Q23 is N, the third compound represented by Formula ET-1 may include a pyridine moiety. If any two of $Q_{21}$ to Q23 are each N, the third compound represented by Formula ET-1 may include a pyrimidine moiety. If $Q_{21}$ to Q23 are each N, the third compound represented by Formula ET-1 may include a triazine moiety.

In Formula ET-1, n11 to n13 may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If n11 to n13 are each 2 or more, $L_1$ to $L_3$ may each independently be a substituted or unsubstituted arylene group of 6 to 30 ring forming carbon atoms or a substituted or unsubstituted heteroarylene group of 2 to 30 ring forming carbon atoms.

In Formula ET-1, $Ar_{61}$ to $Ar_{63}$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. For example, $Ar_{61}$ to $Ar_{63}$ may each independently be a substituted or unsubstituted phenyl group or a substituted or unsubstituted carbazole group. However, these are only examples, and embodiments are not limited thereto.

In an embodiment, the third compound represented by Formula ET-1 may be selected from Compound Group 3. In an embodiment, in the light emitting element ED, the third compound may include at least one compound selected from Compound Group 3. In Compound Group 3, D represents a deuterium atom, and Ph represents a phenyl group.

[Compound Group 3]

ETH1

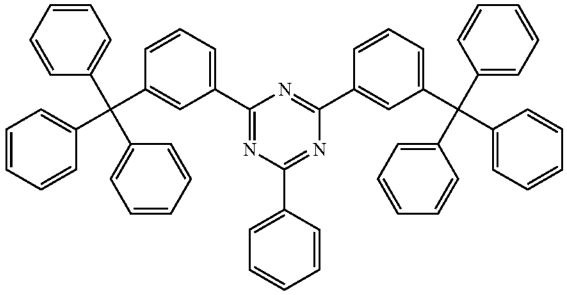

ETH2

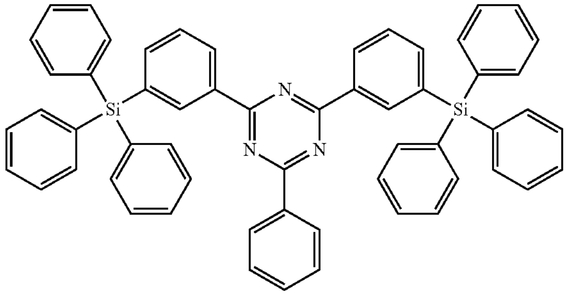

ETH3

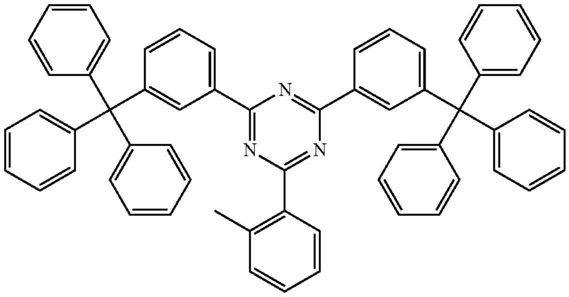

-continued
ETH4
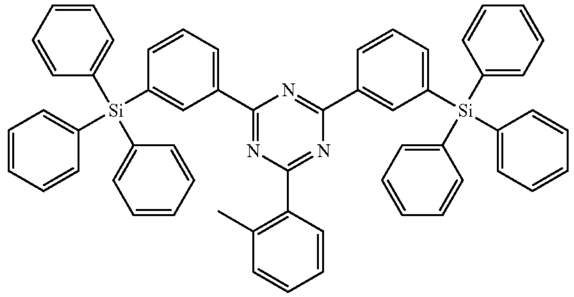
ETH5
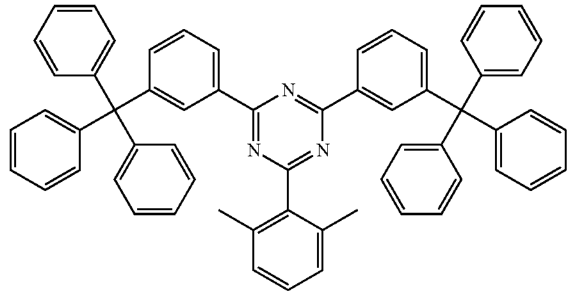
ETH6
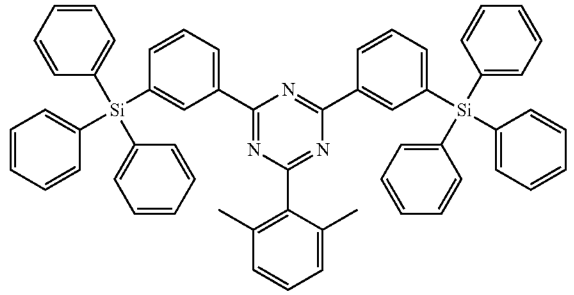
ETH7
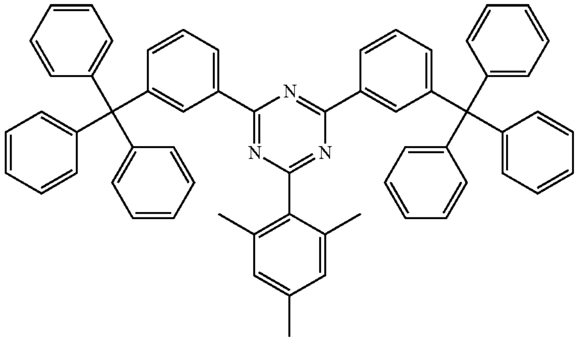
-continued
ETH8
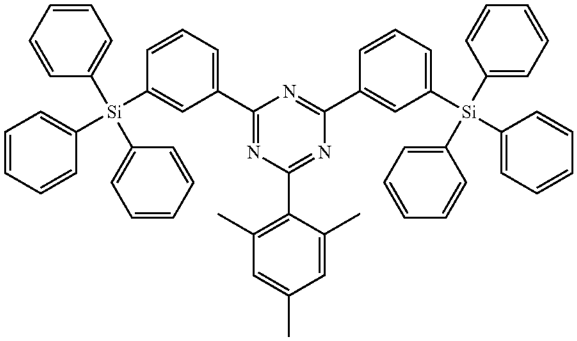
ETH9
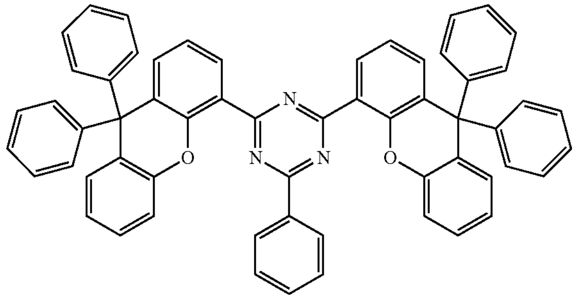
ETH10
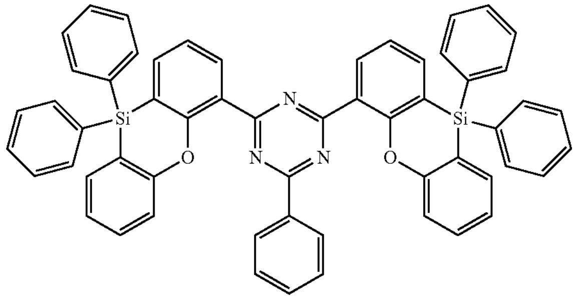
ETH11
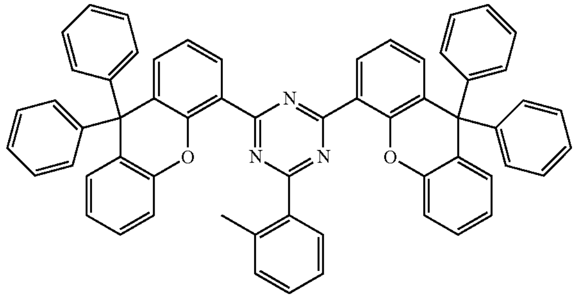

-continued
ETH12
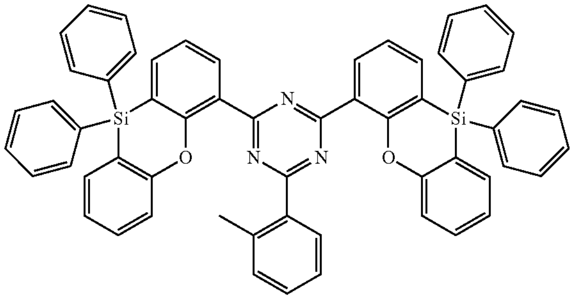
ETH13
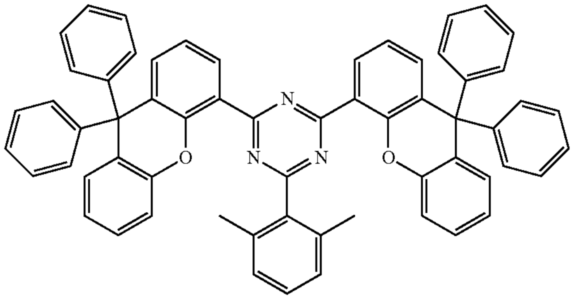
ETH14
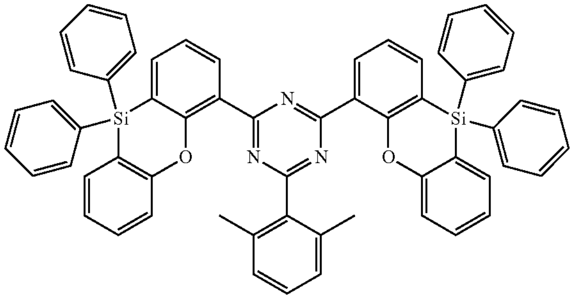
ETH15
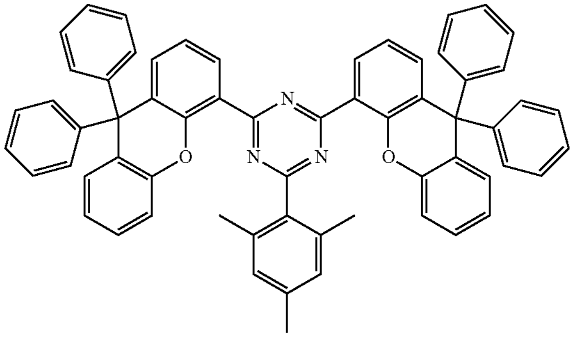
-continued
ETH16
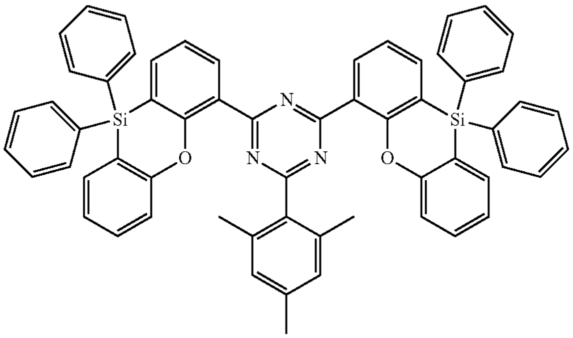
ETH17
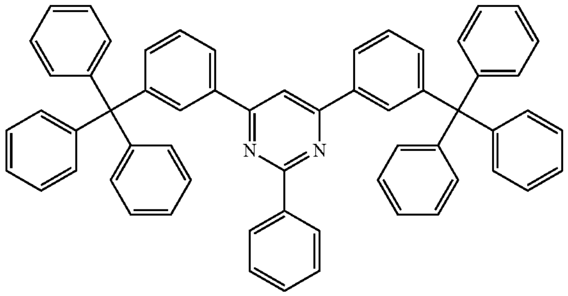
ETH18
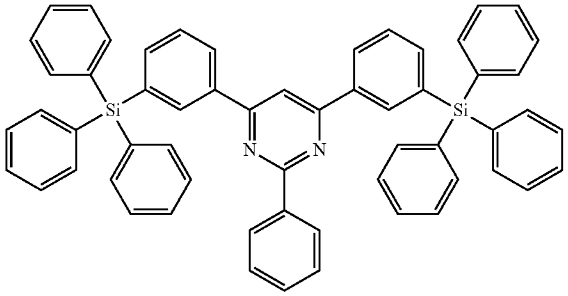
ETH19
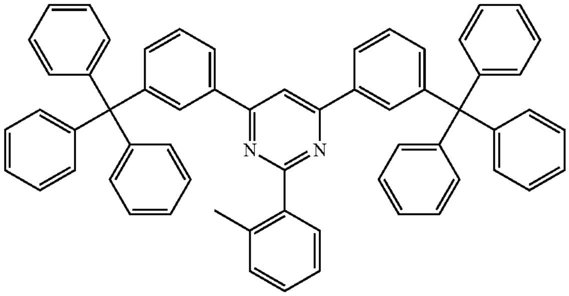
ETH20
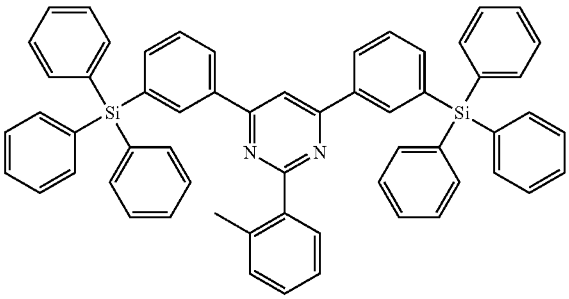

-continued
ETH21
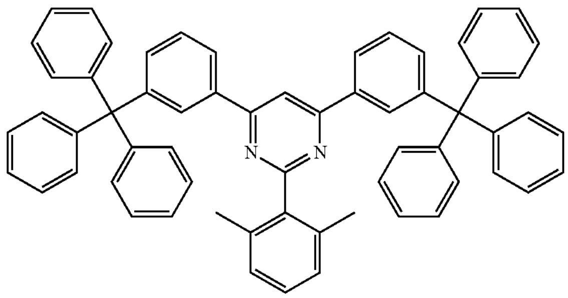
ETH22
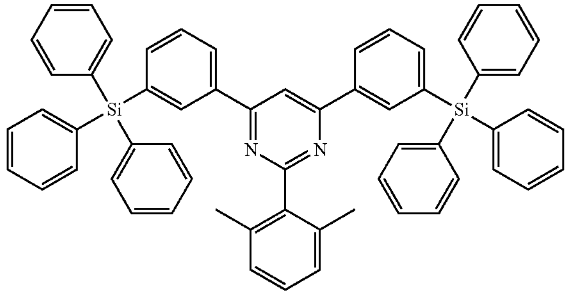
ETH23
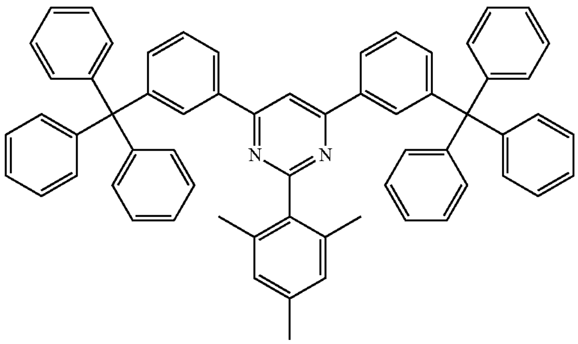
ETH24
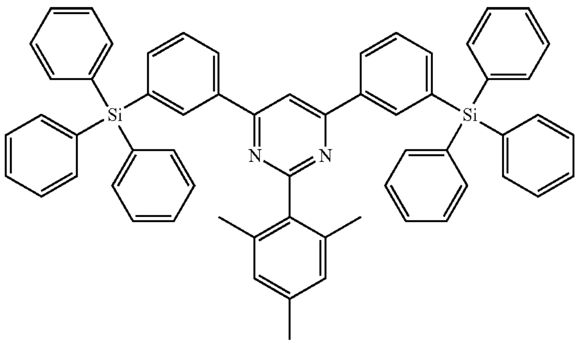
-continued
ETH25
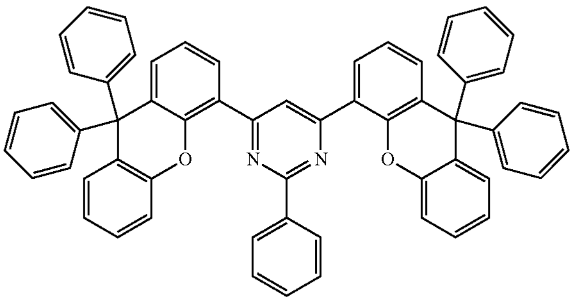
ETH26
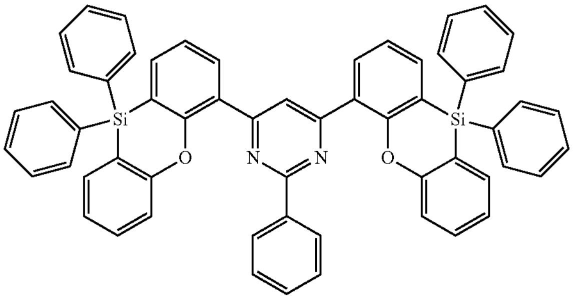
ETH27
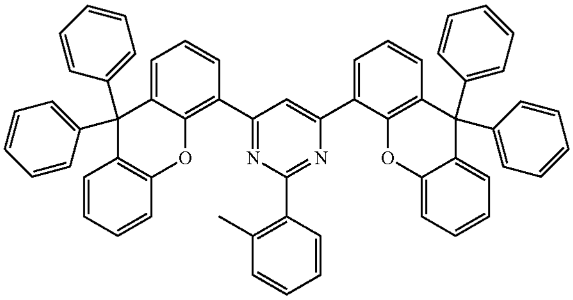
ETH28
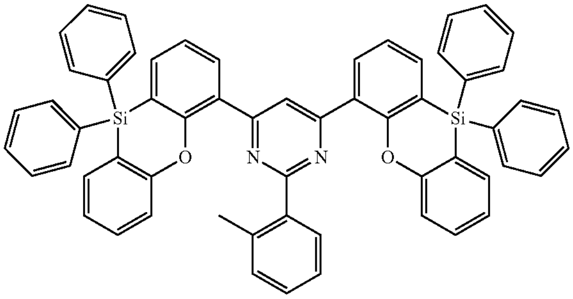
ETH29
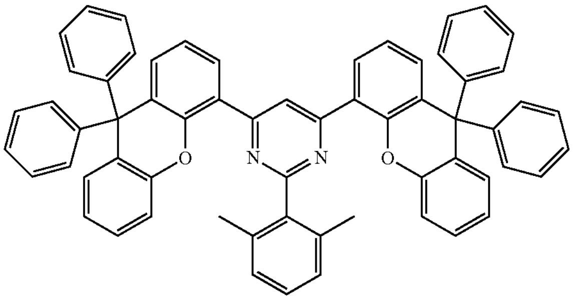

-continued
ETH30
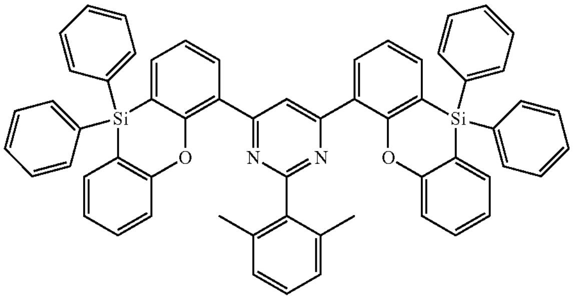
ETH31
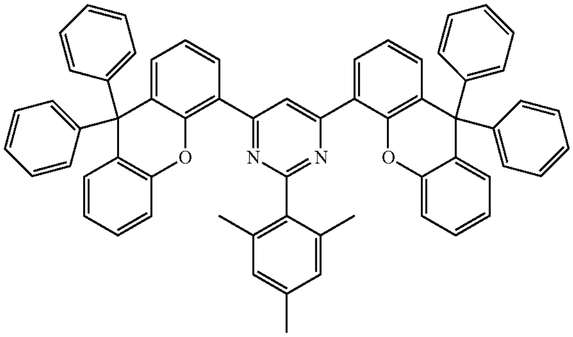
ETH32
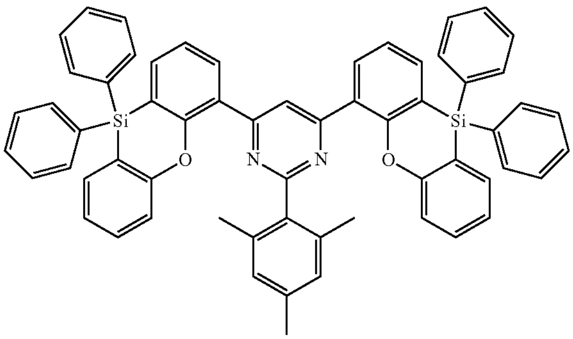
ETH33
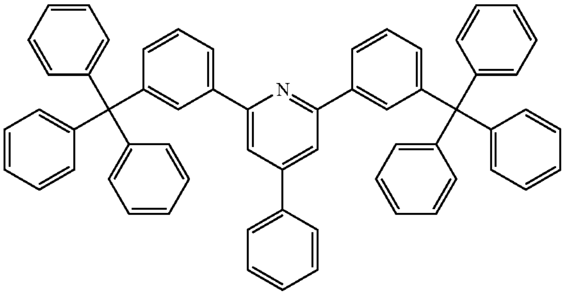
-continued
ETH34
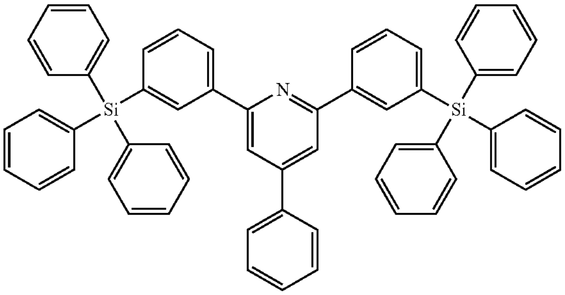
ETH35
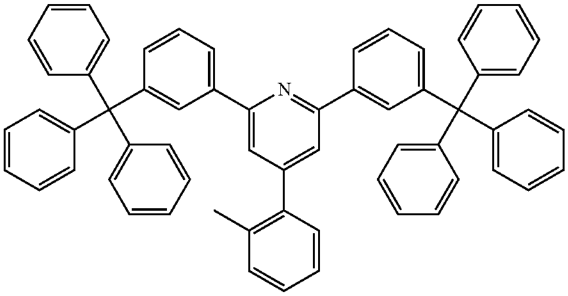
ETH36
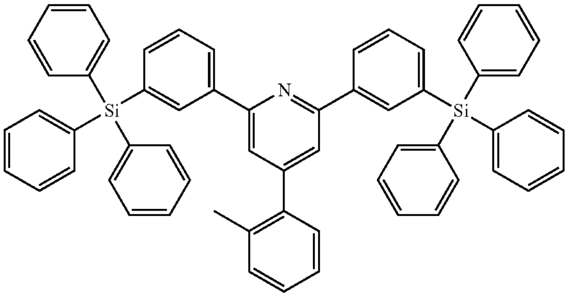
ETH37
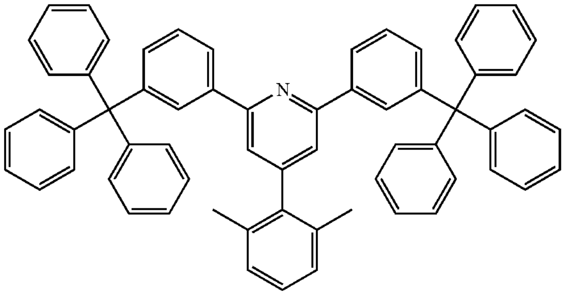
ETH38
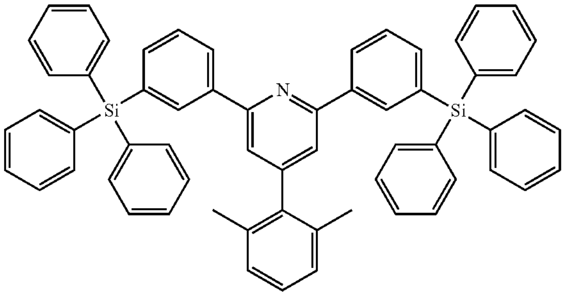

-continued
ETH39
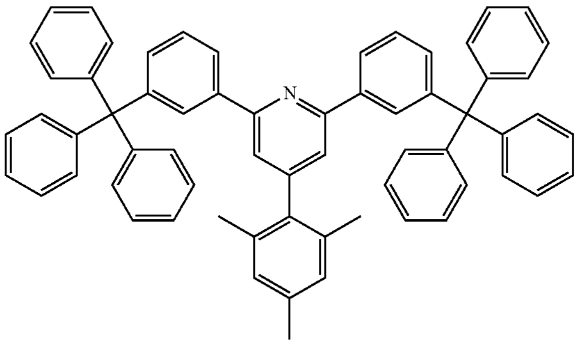
ETH40
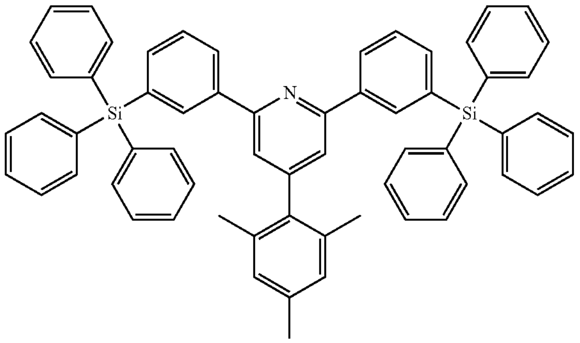
ETH41
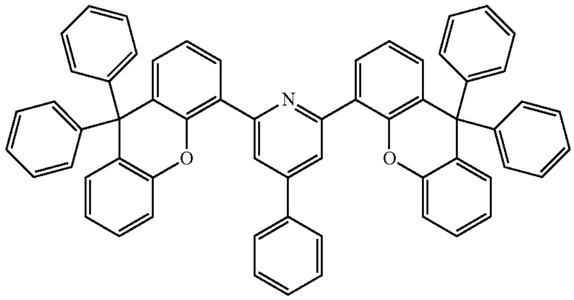
ETH42
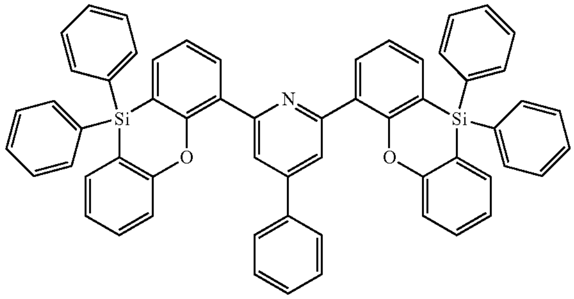
-continued
ETH43
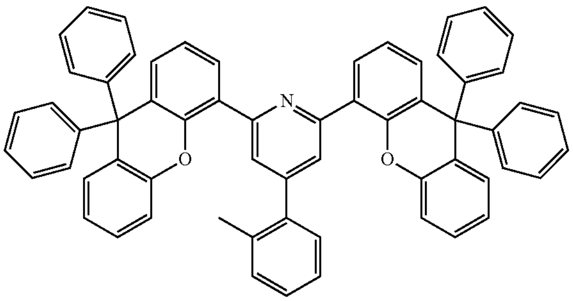
ETH44
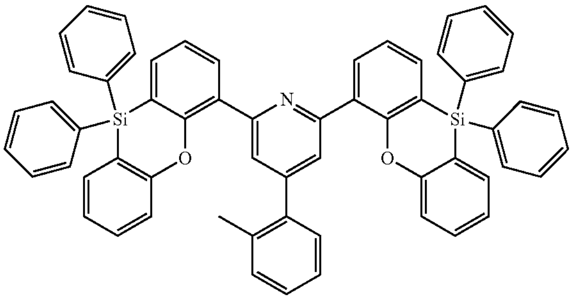
ETH45
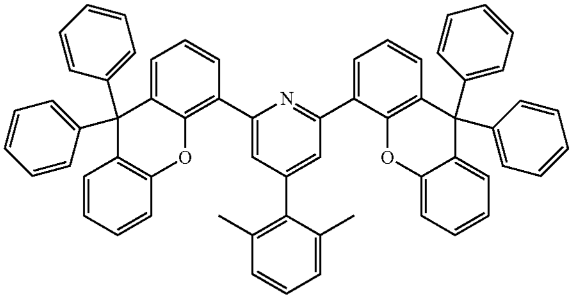
ETH46
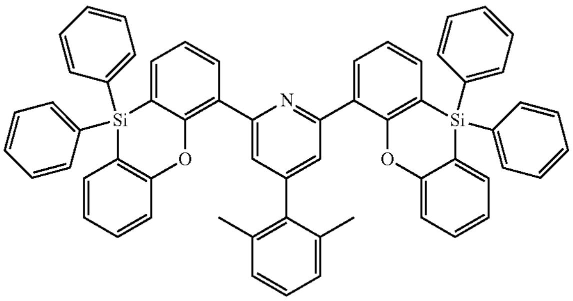

-continued
ETH47
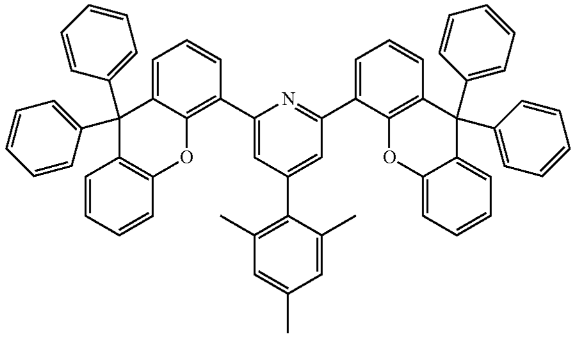
ETH48
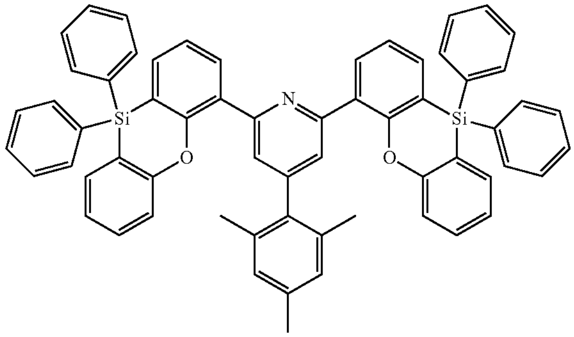
ETH49
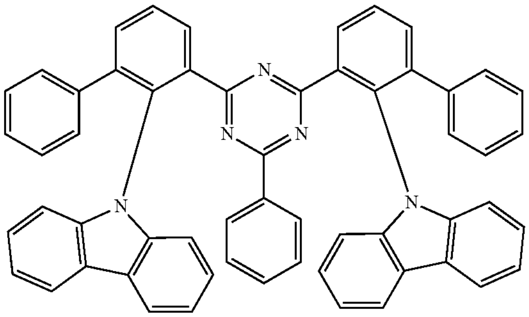
ETH50
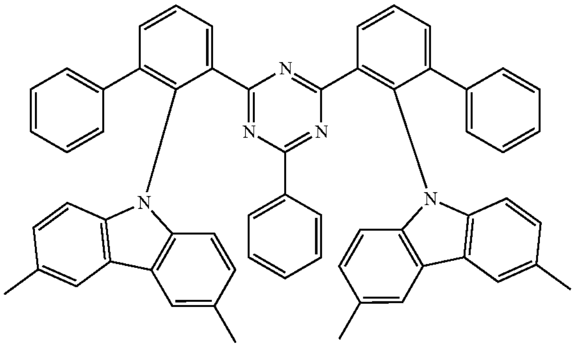
-continued
ETH51
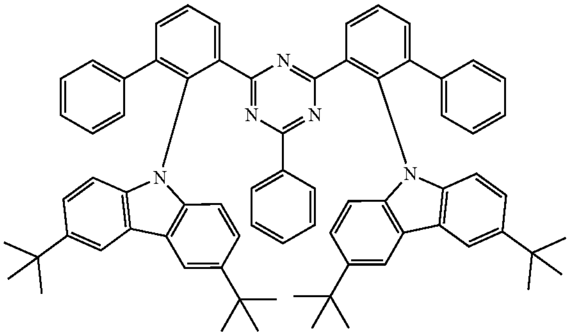
ETH52
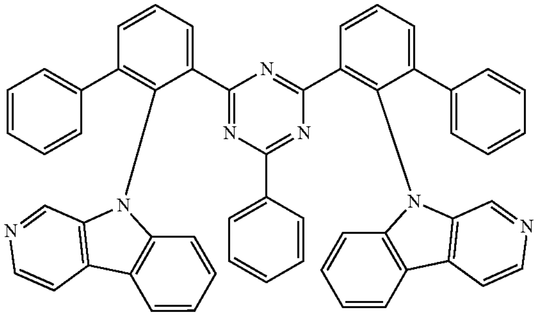
ETH53
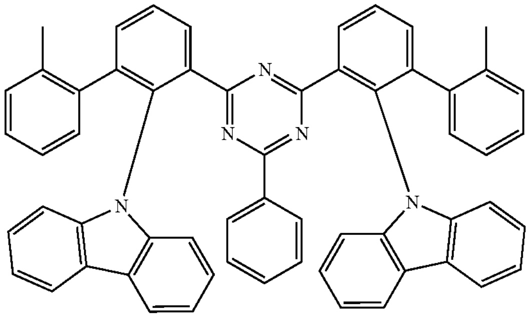
ETH54
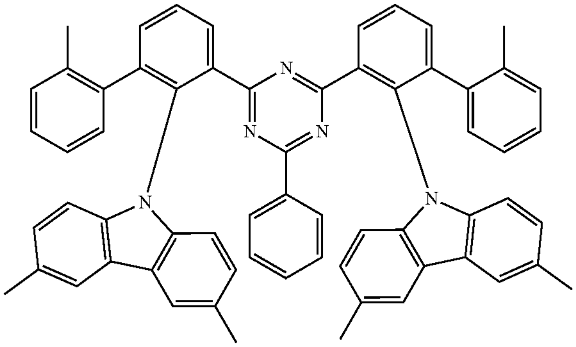

-continued
ETH55
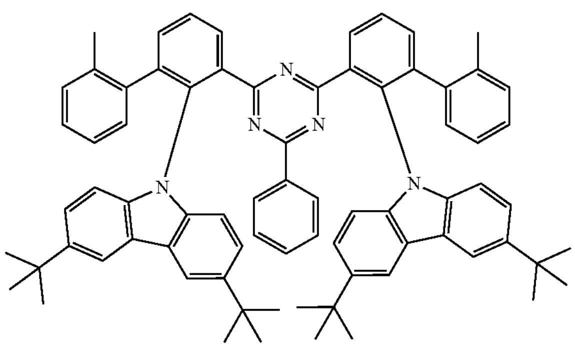
ETH56
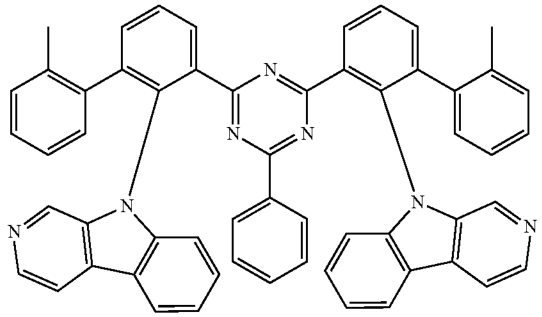
ETH57
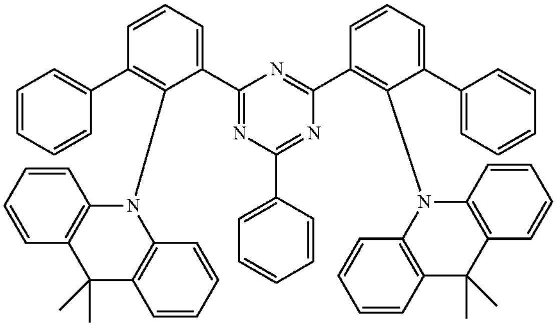
ETH58
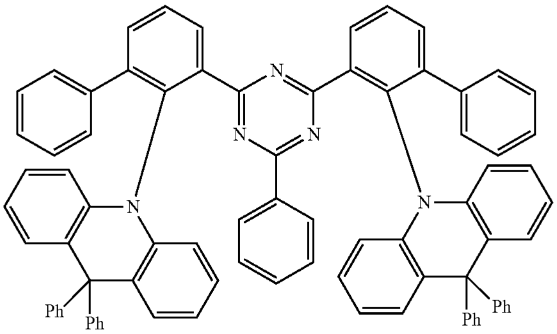
-continued
ETH59
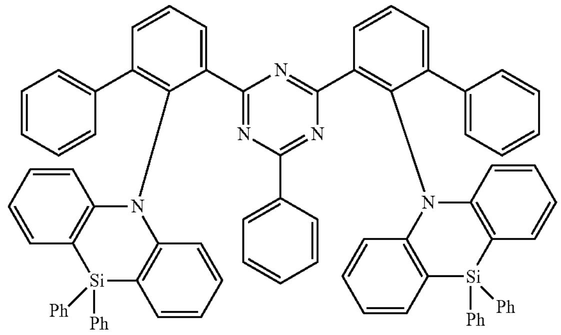
ETH60
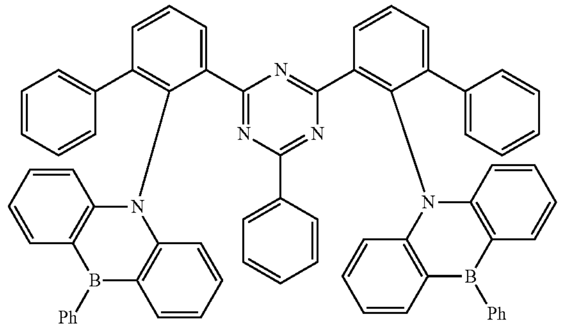
ETH61
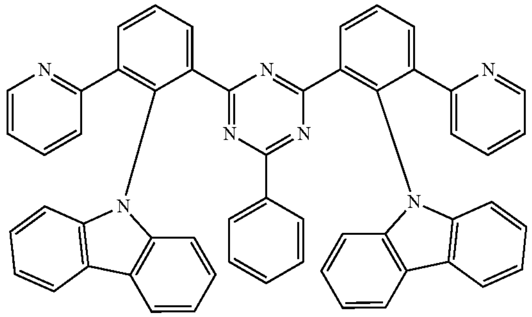
ETH62
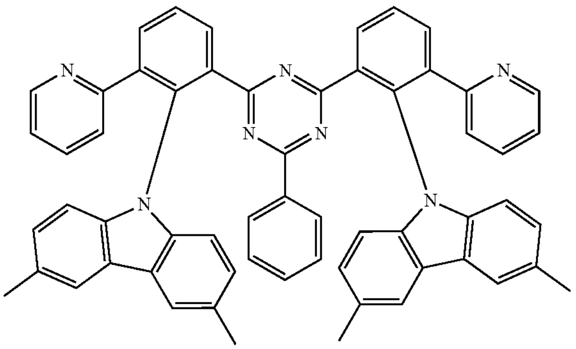

ETH63
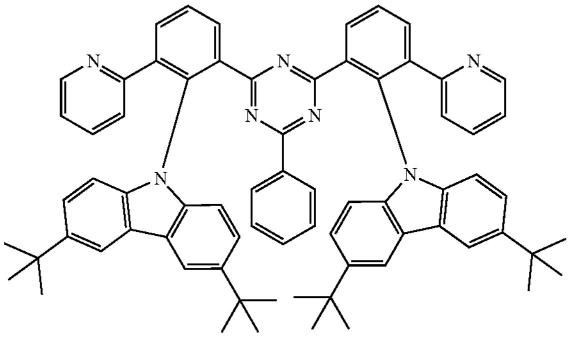
ETH64
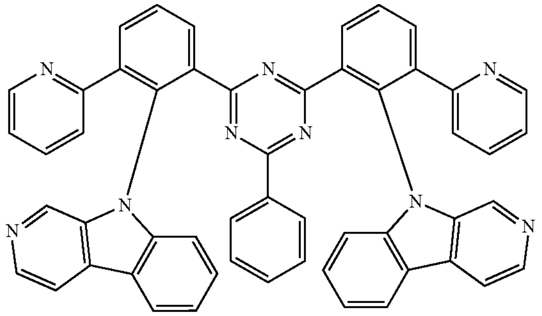
ETH65
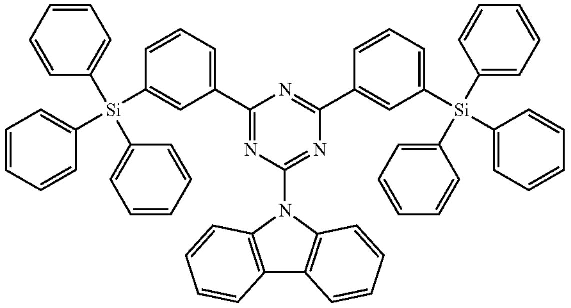
ETH66
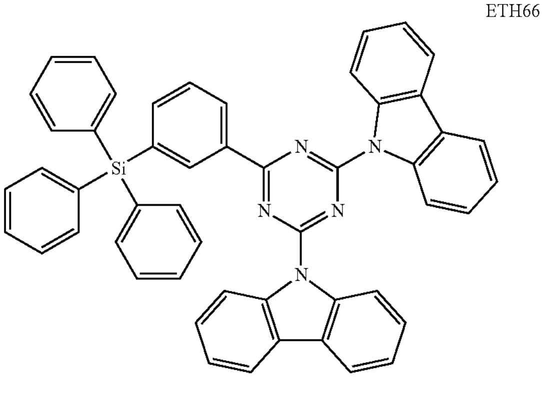
ETH67
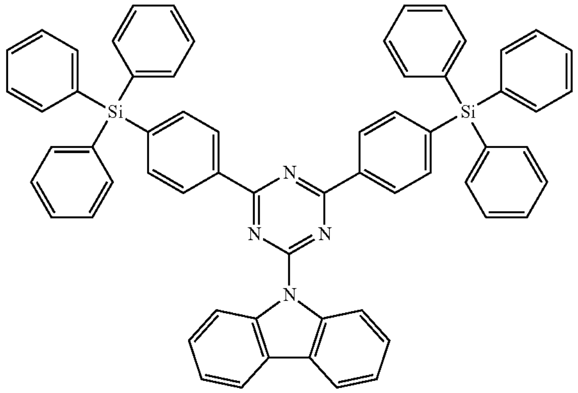
ETH68
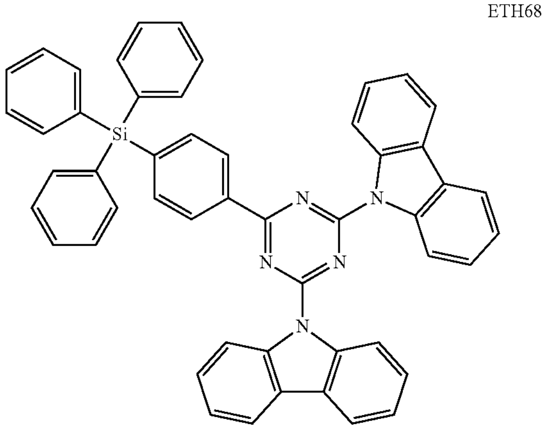
ETH69
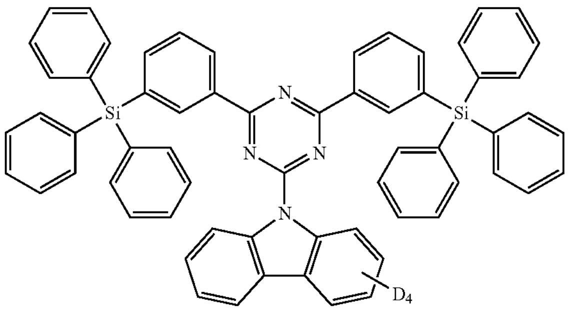
ETH70
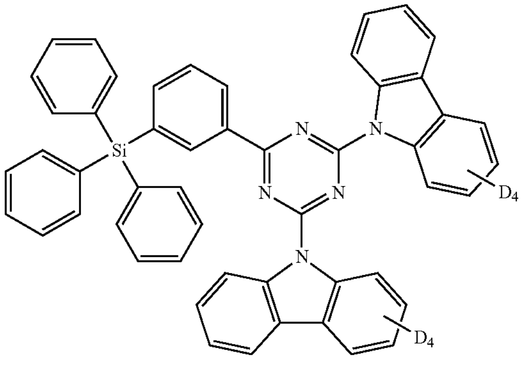

-continued
ETH71
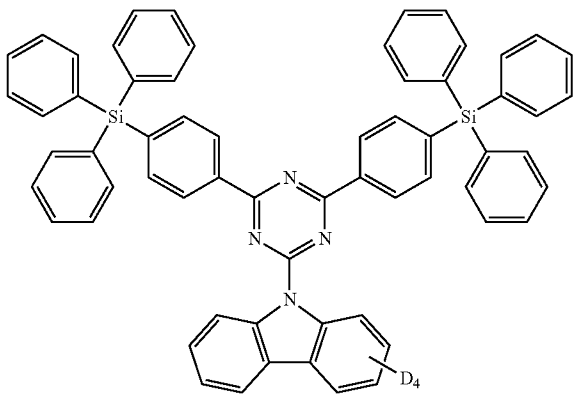
ETH72
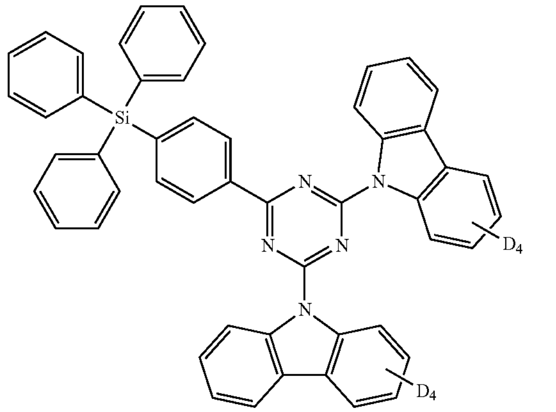
ETH73
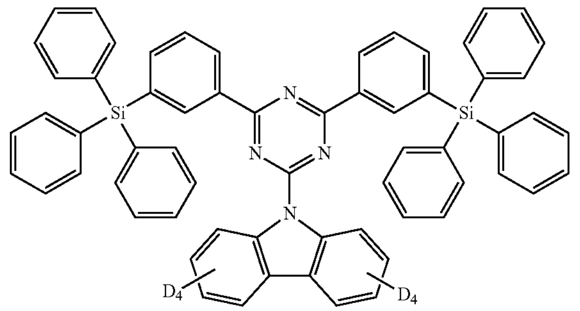
ETH74
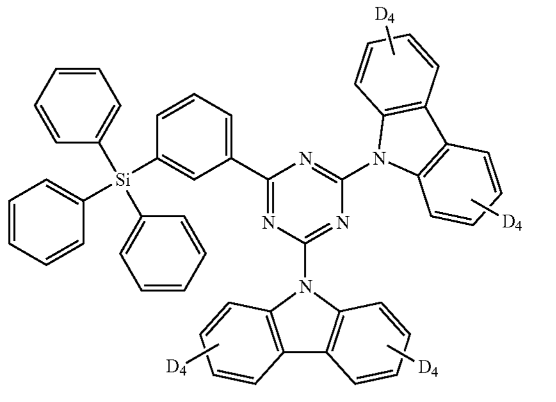
-continued
ETH75
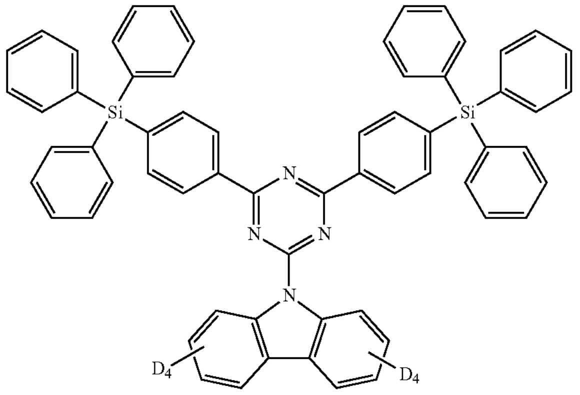
ETH76
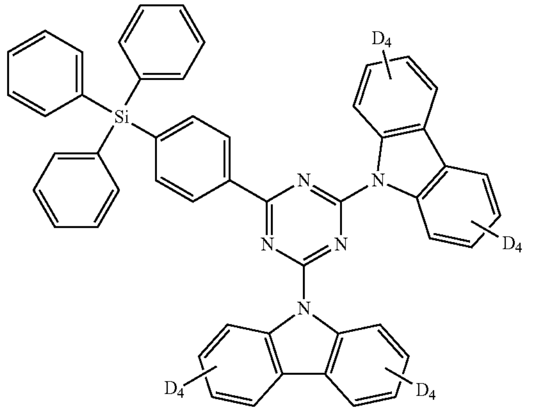
ETH77
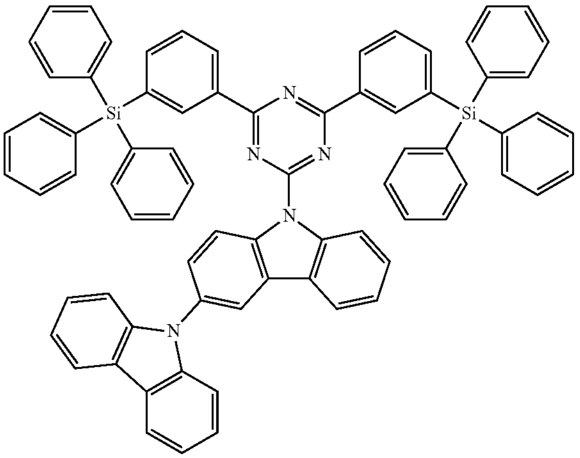

-continued
ETH78
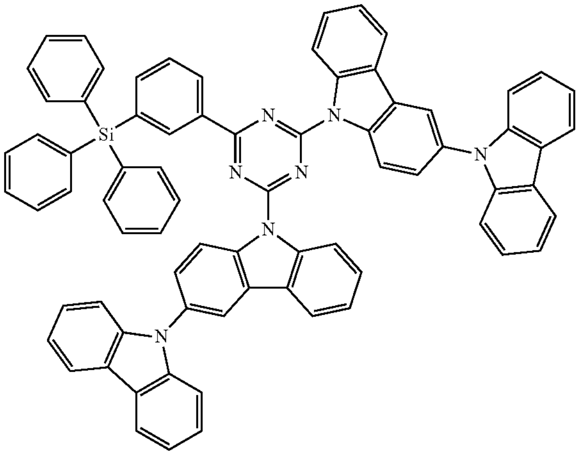
ETH79
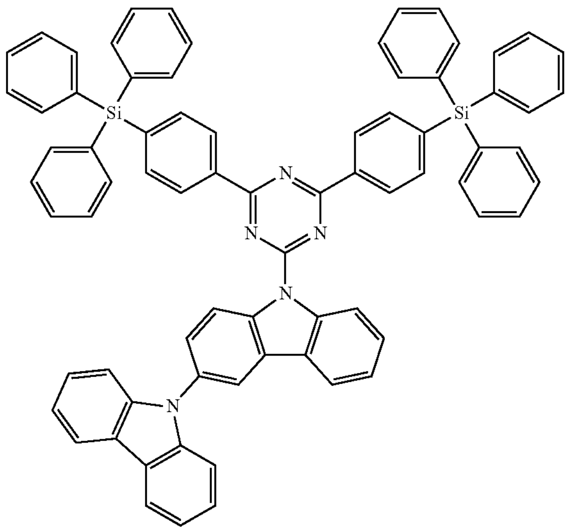
ETH80
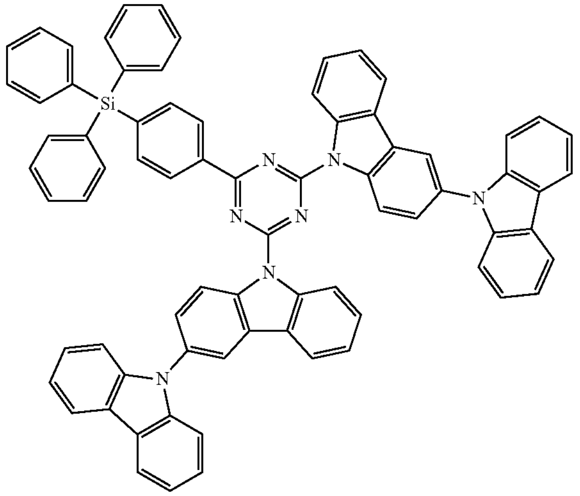
-continued
ETH81
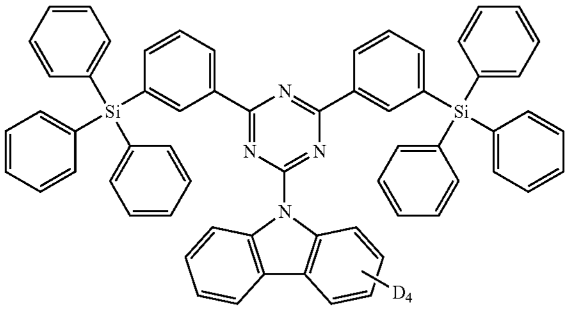
ETH82
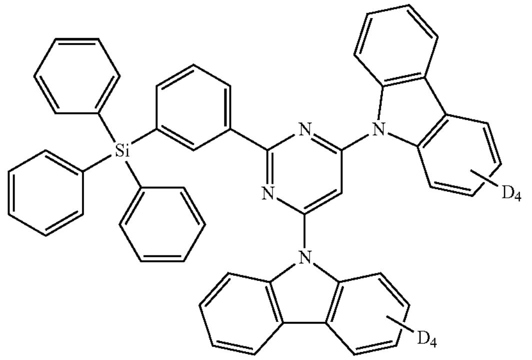
ETH83
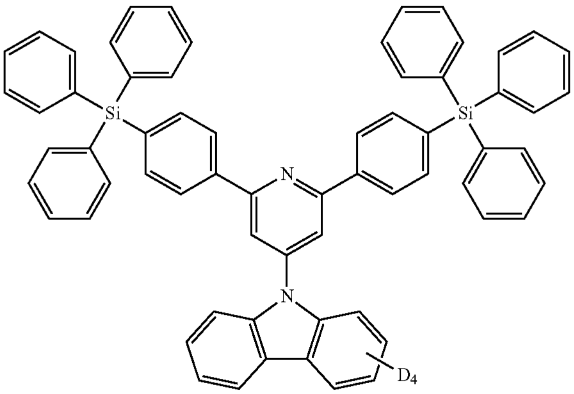
ETH84
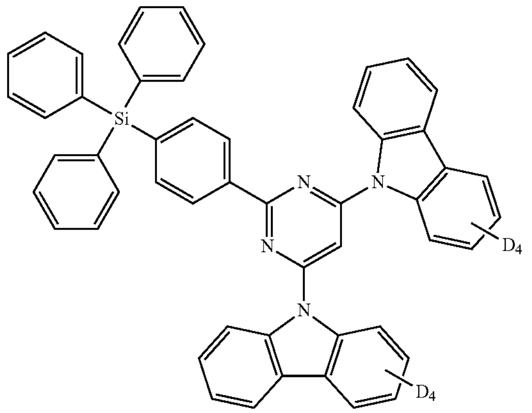

-continued

ETH85

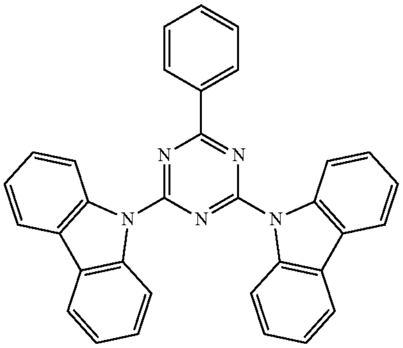

ETH86

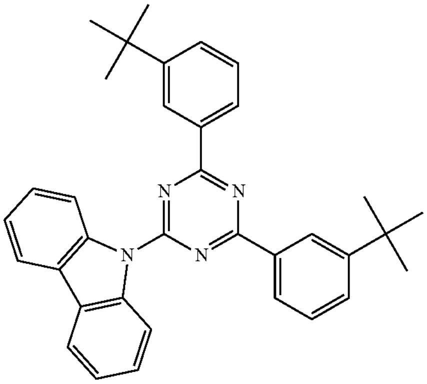

In an embodiment, the emission layer EML may include a fourth compound represented by Formula M-b. In an embodiment, the emission layer EML may include the fourth compound as a phosphorescence dopant material or a sensitizer. For example, the emission layer EML may include the fourth compound as a sensitizer.

[Formula M-b]

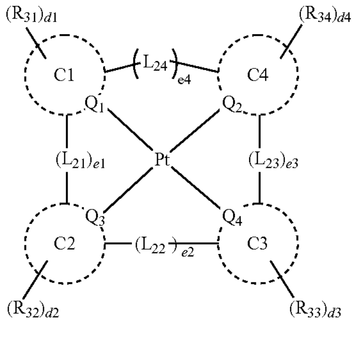

In Formula M-b, $Q_1$ to $Q_4$ may each independently be C or N. In Formula M-b, C1 to C4 may each independently be a substituted or unsubstituted hydrocarbon ring of 5 to 30 ring-forming carbon atoms or a substituted or unsubstituted heterocycle of 2 to 30 ring-forming carbon atoms.

In Formula M-b, el to e4 may each independently be 0 or 1. In Formula M-b, $L_{21}$ to $L_{24}$ may each independently be a direct linkage,

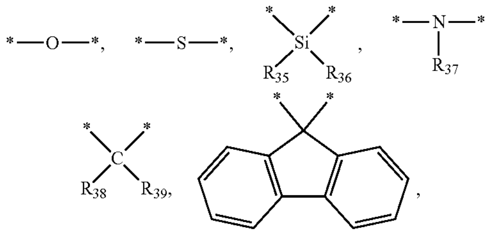

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms.

In Formula M-b, d1 to d4 may each independently be an integer from 0 to 4. If d1 is 2 or more, multiple $R_{31}$ groups may be the same, or at least one group thereof may be different from the remainder. If d2 is 2 or more, multiple $R_{32}$ groups may be the same, or at least one group thereof may be different from the remainder. If d3 is 2 or more, multiple $R_{33}$ groups may be the same, or at least one group thereof may be different from the remainder. If d4 is 2 or more, multiple $R_{34}$ groups may be the same, or at least one group thereof may be different from the remainder. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group from each other to form a ring.

In an embodiment, the fourth compound represented by Formula M-b may be selected from Compound Group 4. In an embodiment, in the light emitting element ED, the fourth compound may include at least one compound selected from Compound Group 4. However, these compounds are only examples, and the compound represented by Formula M-b is not limited to Compound Group 4. In Compound Group 4, D represented a deuterium atom.

[Compound Group 4]

AD-01

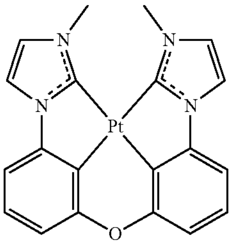

AD-02

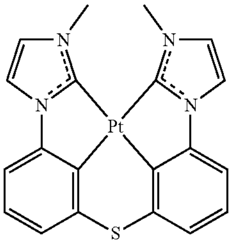

-continued
AD-03
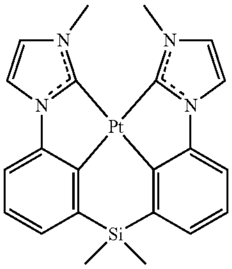
AD-04
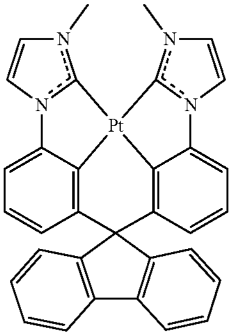
AD-05
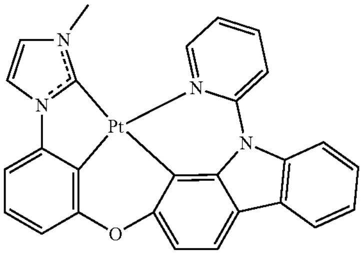
AD-06
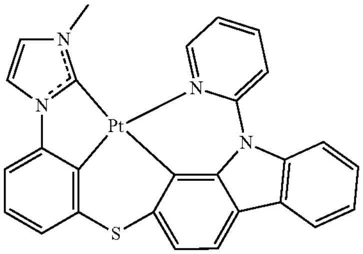
AD-07
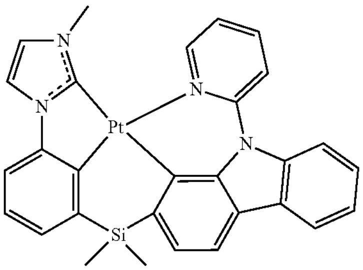
-continued
AD-08
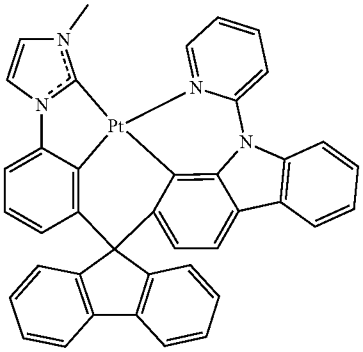
AD-09
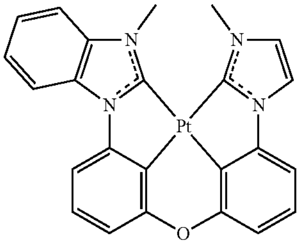
AD-10
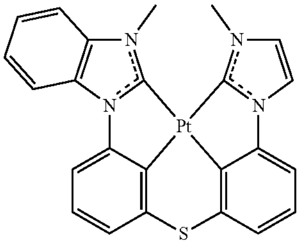
AD-11
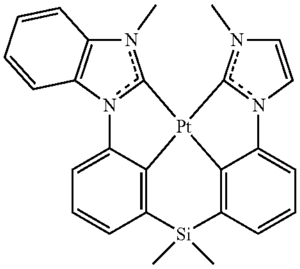
AD-12
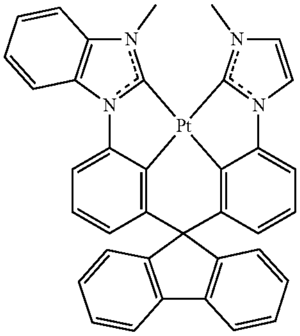

AD-13
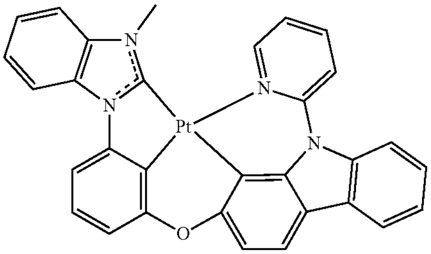
AD-14
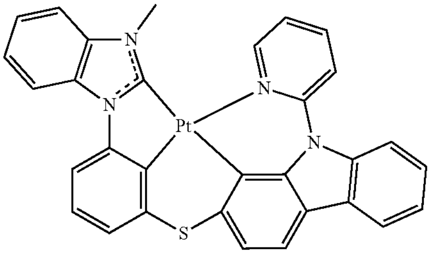
AD-15
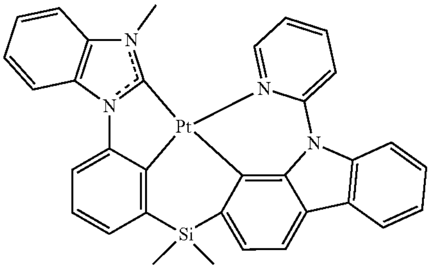
AD-16
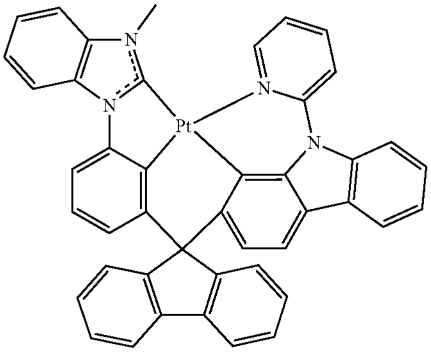
AD-17
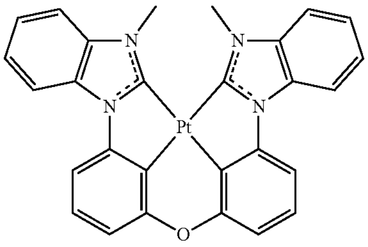
AD-18
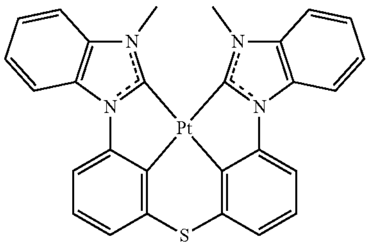
AD-19
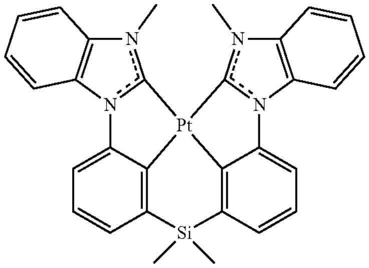
AD-20
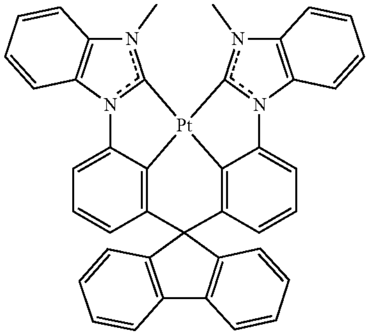
AD-21
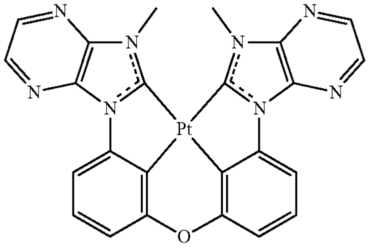
AD-22
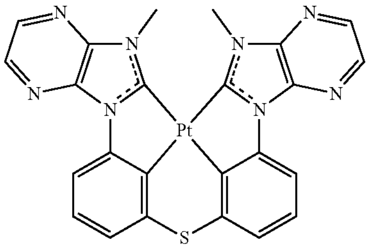

-continued
AD-23
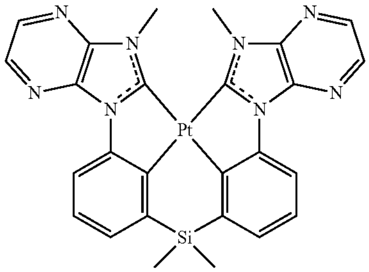
AD-24
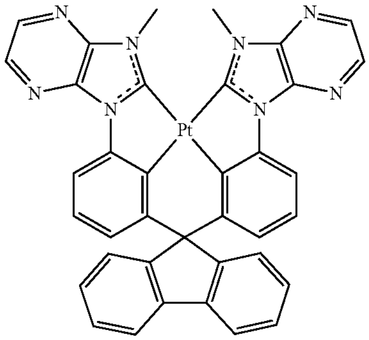
AD-25
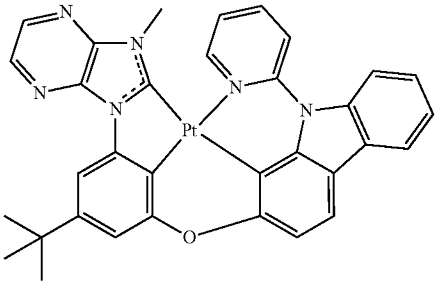
AD-26
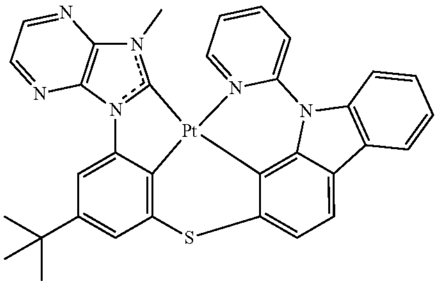
AD-27
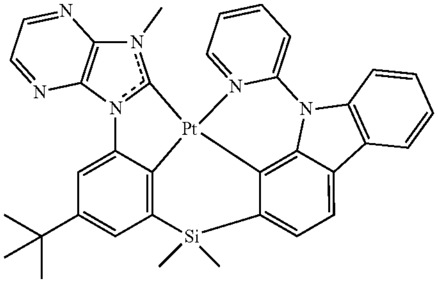
-continued
AD-28
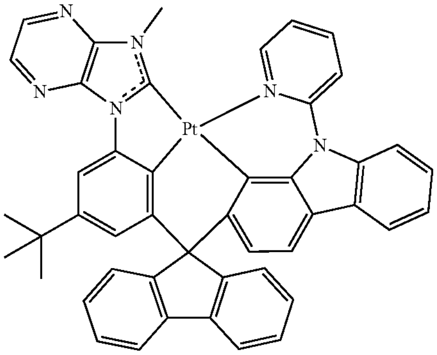
AD-29
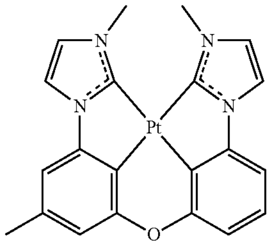
AD-30
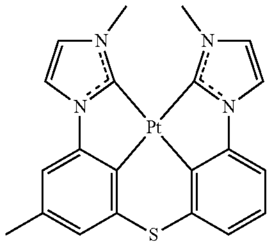
AD-31
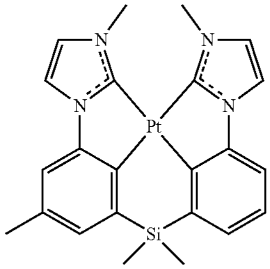
AD-32
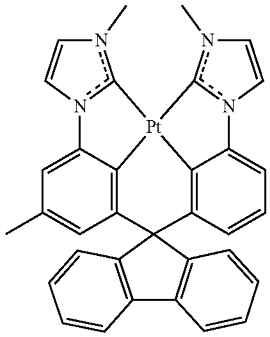

-continued

AD-33

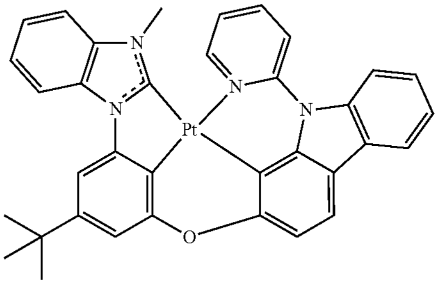

AD-34

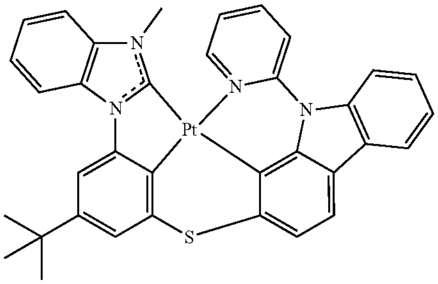

AD-35

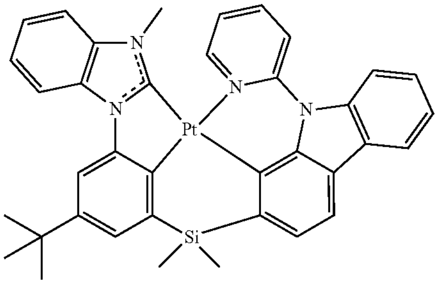

AD-36

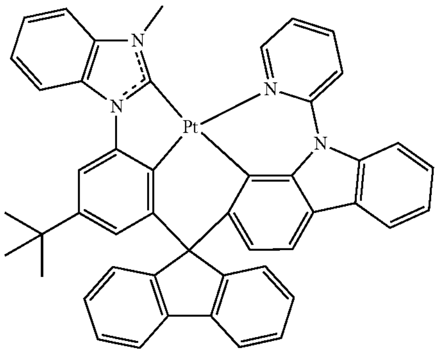

AD-37

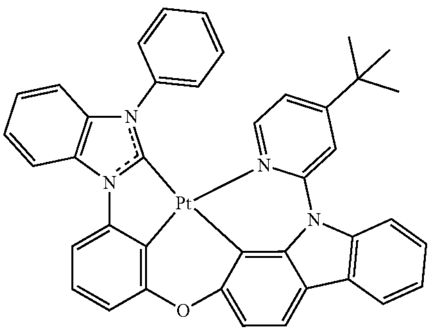

-continued

AD-38

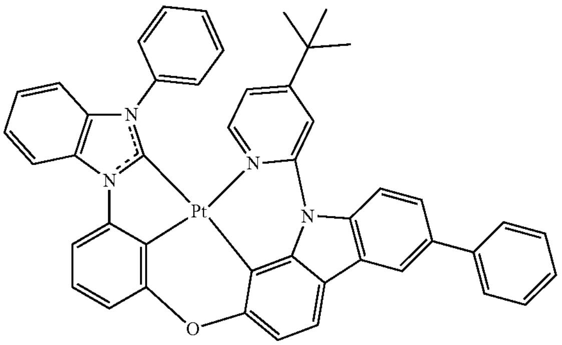

AD-39

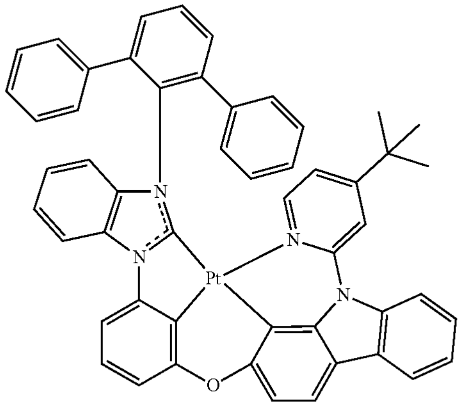

AD-40

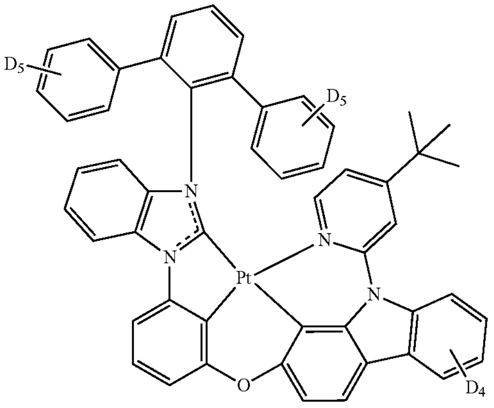

The emission layer EML may have a thickness in a range of about 100 Å to about 1,000 Å. For example, the emission layer EML may have a thickness in a range of about 100 Å to about 300 Å. The emission layer EML may be a layer consisting of a single material, a layer including different materials, or a structure including multiple layers including different materials.

In an embodiment, the emission layer EML may further include an anthracene derivative, a pyrene derivative, a fluoranthene derivative, a chrysene derivative, a dihydrobenzanthracene derivative, or a triphenylene derivative, in addition to the fused polycyclic compound, and the second to fourth compounds. For example, the emission layer EML may include an anthracene derivative or a pyrene derivative.

In an embodiment, the emission layer EML may include a compound represented by Formula E-1. The compound represented by Formula E-1 may be used as a fluorescence host material.

[Formula E-1]

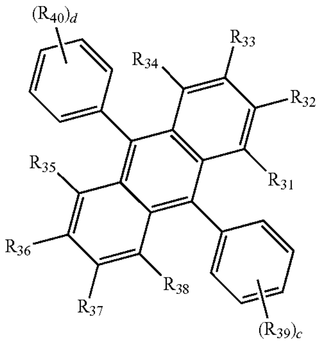

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 2 to 10 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. For example, in Formula E-1, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, c and d may each independently be an integer from 0 to 5. If c is 2 or more, multiple $R_{39}$ groups may be the same as each other, or at least one group thereof may be different from the remainder. If d is 2 or more, multiple $R_{40}$ groups may be the same as each other, or at least one group thereof may be different from the remainder.

In an embodiment, the compound represented by Formula E-1 may be any compound selected from Compound E1 to Compound E19.

E1

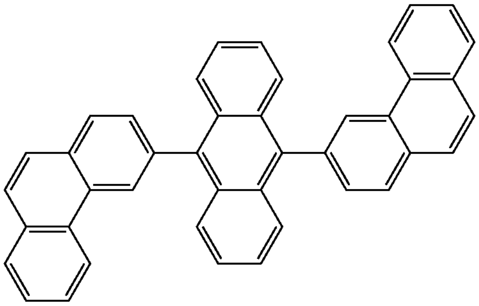

E2

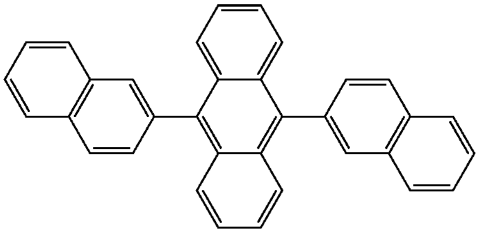

-continued

E3

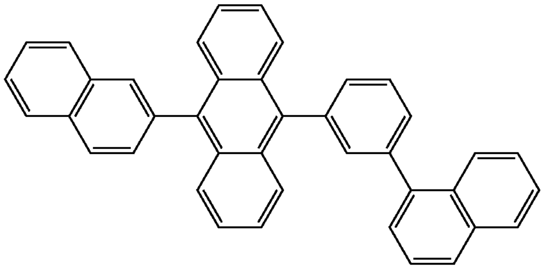

E4

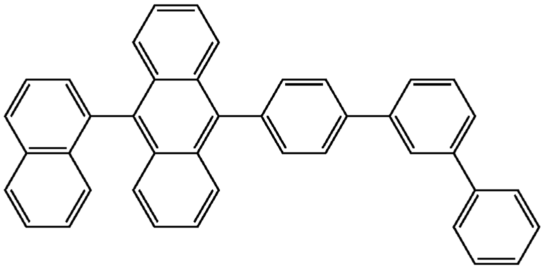

E5

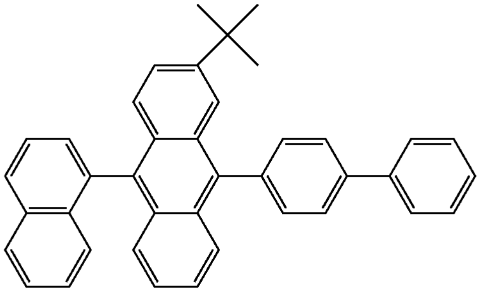

E6

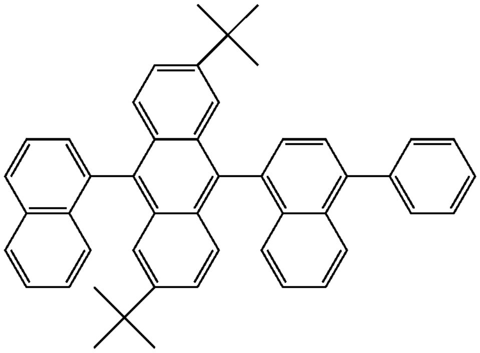

E7

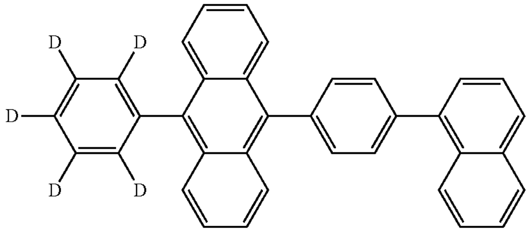

-continued
E8
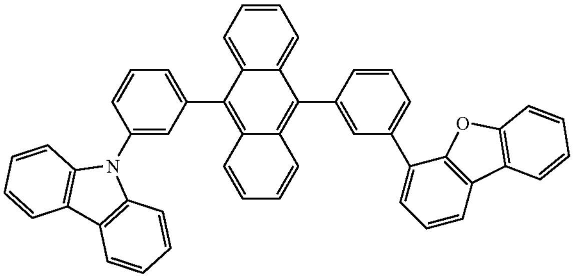
E9
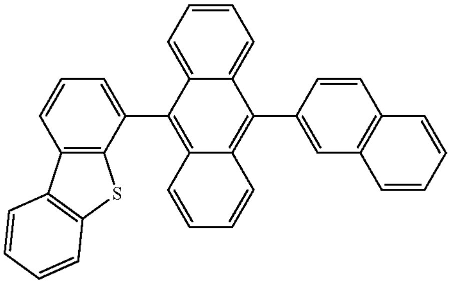
E10
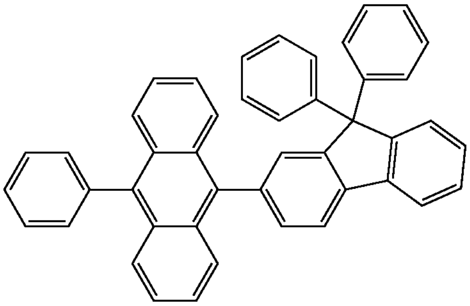
E11
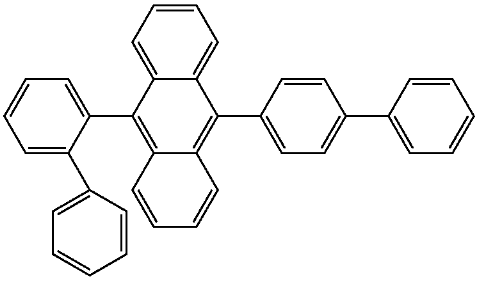
E12
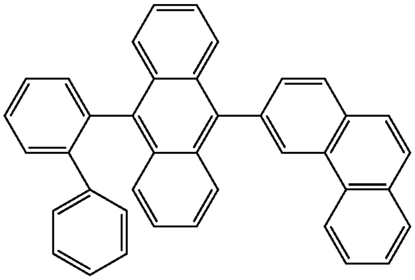
-continued
E13
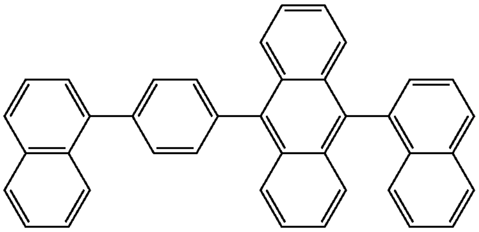
E14
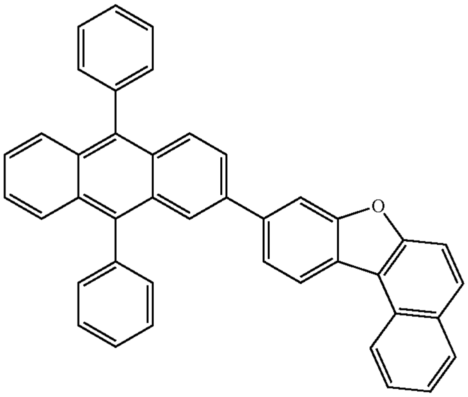
E15
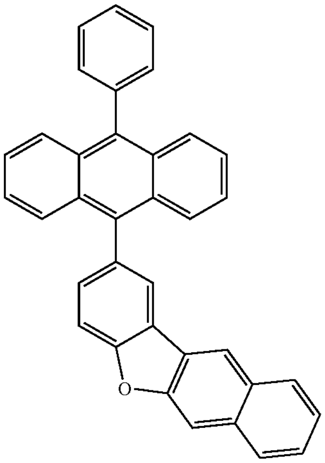
E16
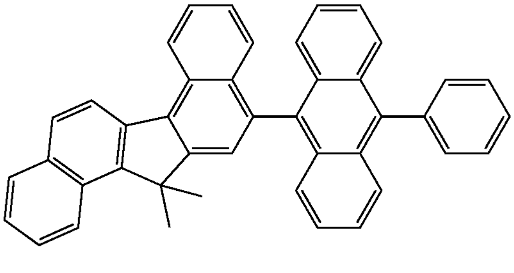

-continued

E17

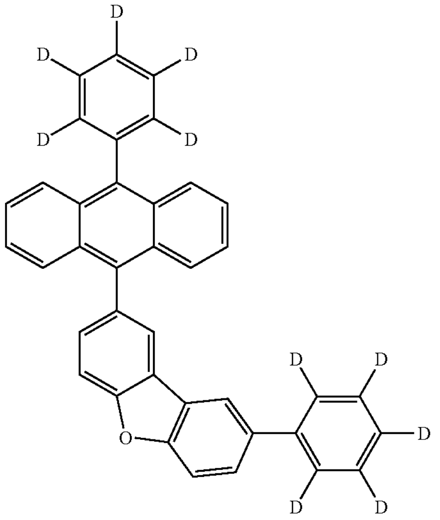

E18

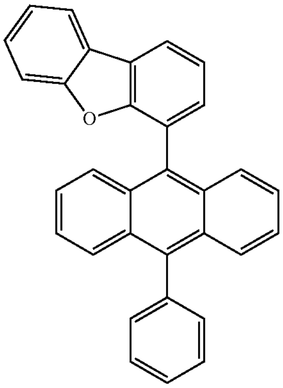

E19

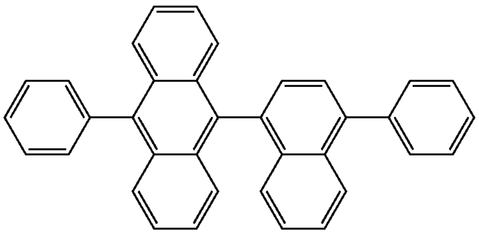

In an embodiment, the emission layer EML may include a compound represented by Formula E-2a or Formula E-2b. The compound represented by Formula E-2a or Formula E-2b may be used as a phosphorescence host material.

[Formula E-2a]

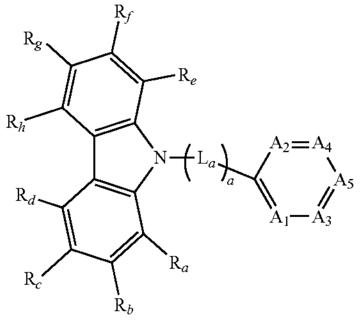

In Formula E-2a, a may be an integer from 0 to 10; and $L_a$ may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple $L_a$ groups may each independently be a substituted or unsubstituted arylene group of 6 to 30 ring-forming carbon atoms or a substituted or unsubstituted heteroarylene group of 2 to 30 ring-forming carbon atoms.

In Formula E-2a, $A_1$ to $A_5$ may each independently be N or $C(R_i)$. In Formula E-2a, $R_a$ to $R_1$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. For example, $R_a$ to $R_i$ may be combined with an adjacent group to form a hydrocarbon ring or a heterocycle including N, O, S, etc. as ring-forming atoms.

In Formula E-2a, two or three of $A_1$ to $A_5$ may each be N, and the remainder of $A_1$ to $A_5$ may each independently be $C(R_i)$.

[Formula E-2b]

$$(\text{Cbz1}-(L_b)_b-\text{Cbz2})$$

In Formula E-2b, Cbz1 and Cbz2 may each independently be an unsubstituted carbazole group, or a carbazole group substituted with an aryl group of 6 to 30 ring-forming carbon atoms. In Formula E-2b, Le may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple Le groups may each independently be a substituted or unsubstituted arylene group of 6 to 30 ring-forming carbon atoms or a substituted or unsubstituted heteroarylene group of 2 to 30 ring-forming carbon atoms.

The compound represented by Formula E-2a or Formula E-2b may be any compound selected from Compound Group E-2. However, the compounds listed in Compound Group E-2 are only examples, and the compound represented by Formula E-2a or Formula E-2b is not limited to Compound Group E-2.

[Compound Group E-2]
E-2-1
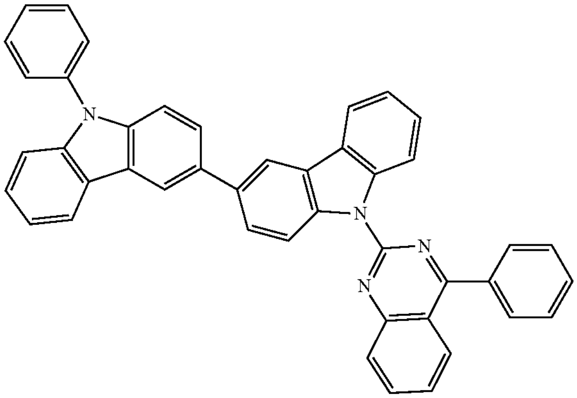
E-2-2
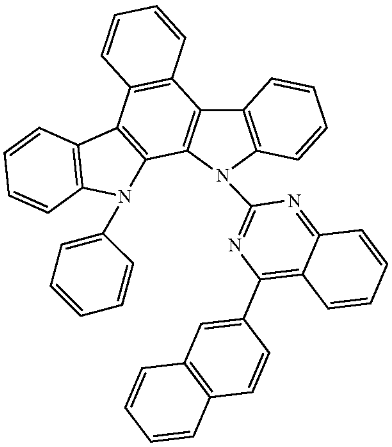
E-2-3
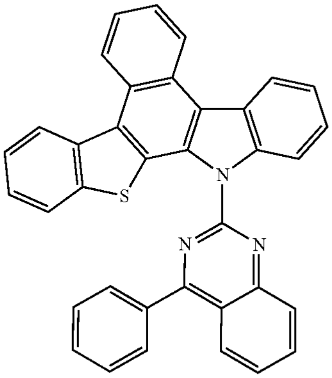
-continued
E-2-4
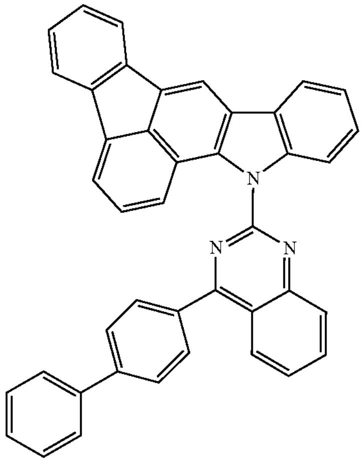
E-2-5
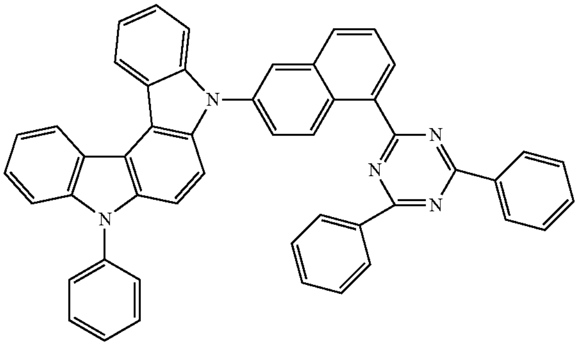
E-2-6
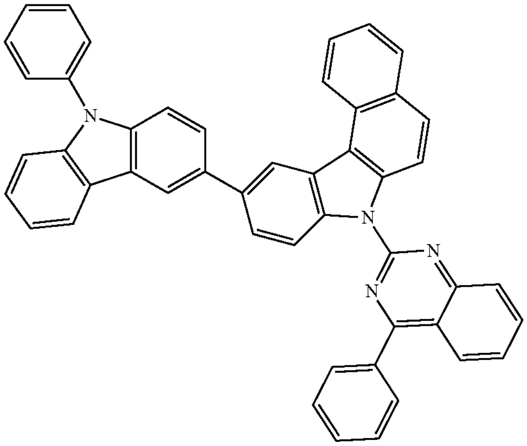

-continued
E-2-7
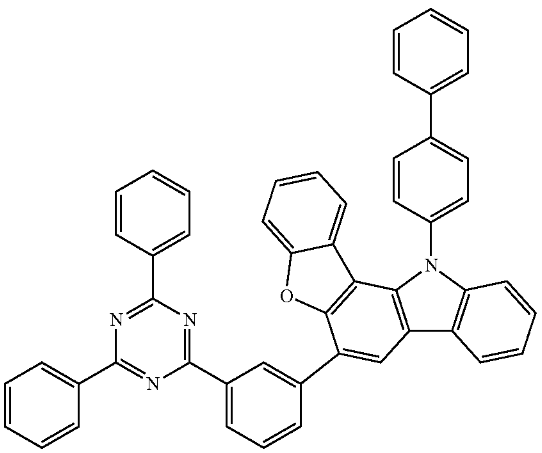
E-2-8
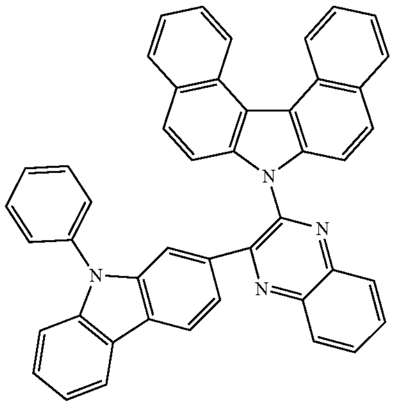
E-2-9
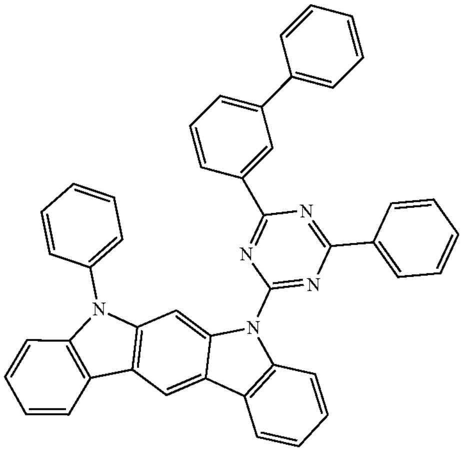
-continued
E-2-10
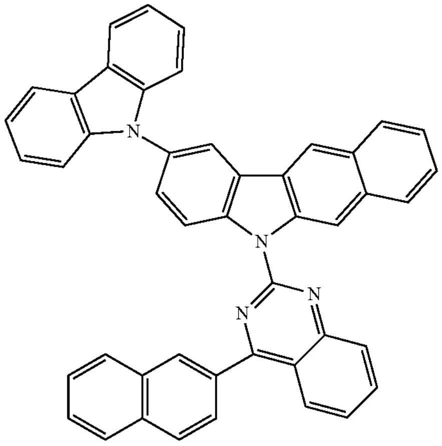
E-2-11
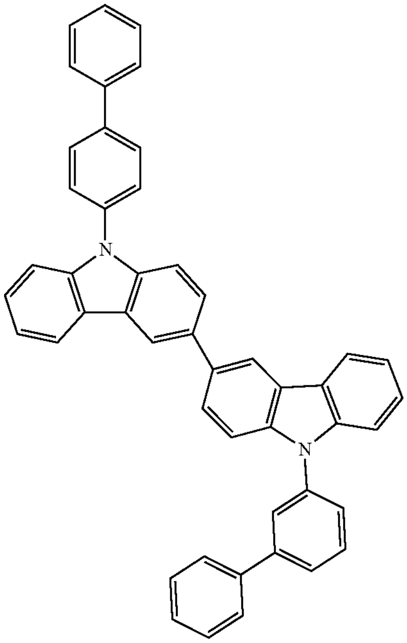
E-2-12
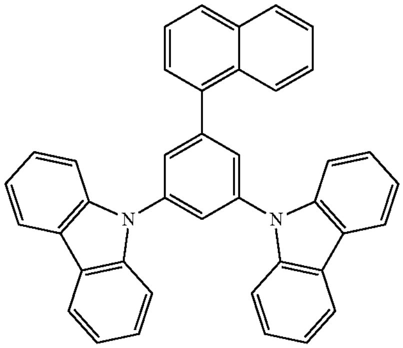

-continued
E-2-13
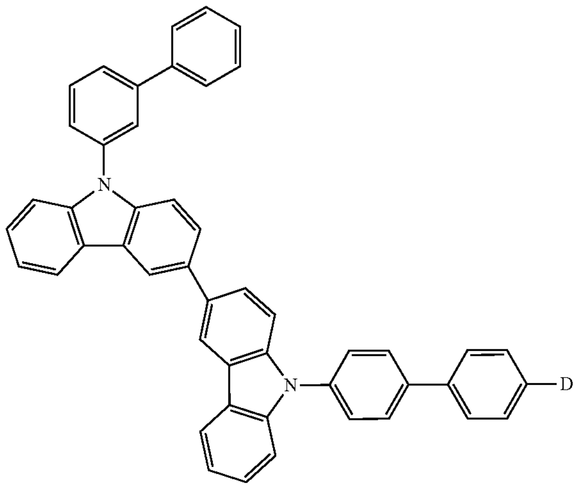
E-2-14
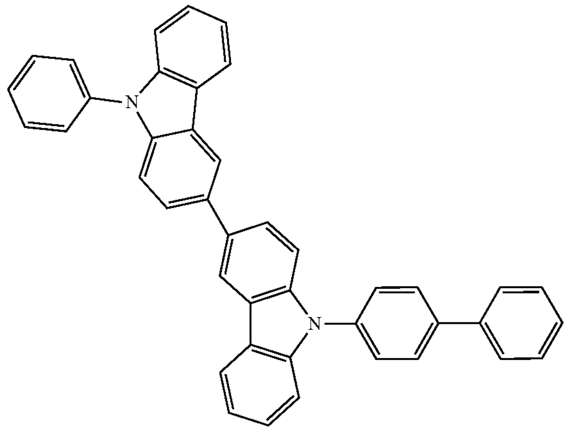
E-2-15
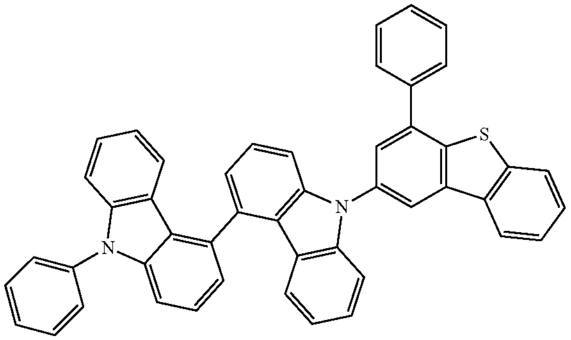
-continued
E-2-16
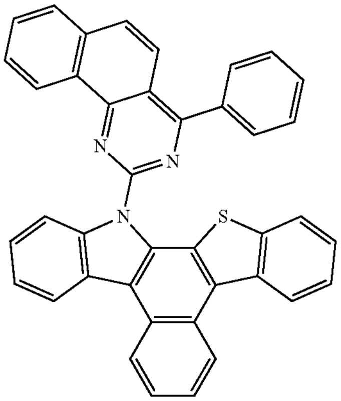
E-2-17
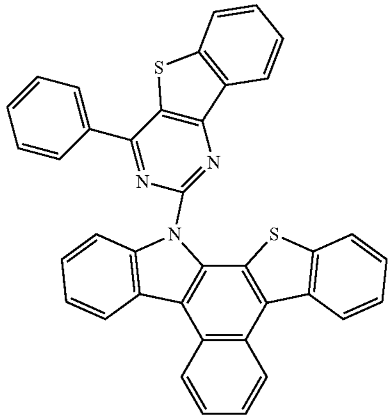
E-2-18
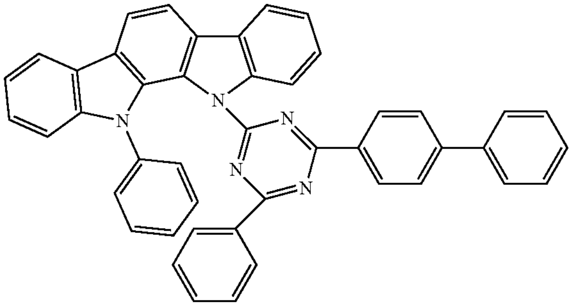
E-2-19
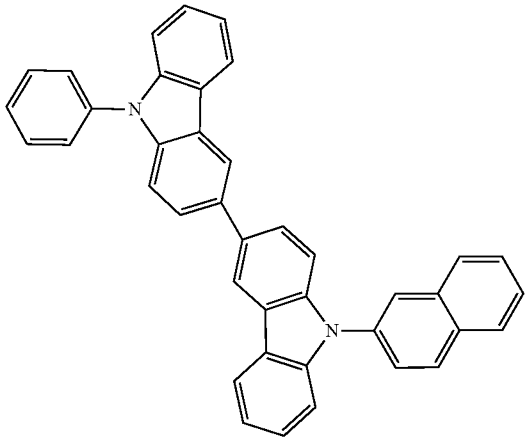

-continued

E-2-20

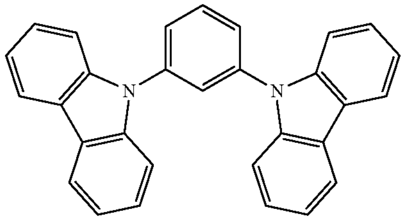

E-2-21

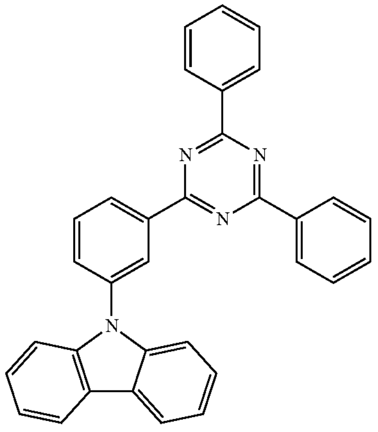

E-2-22

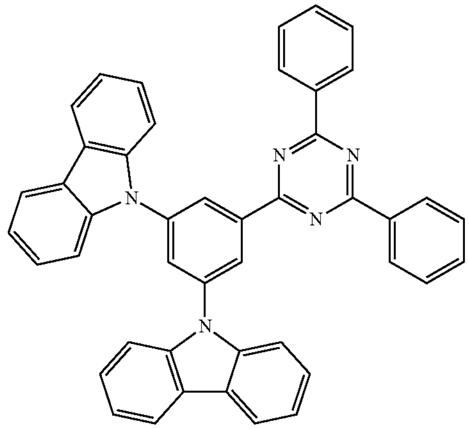

E-2-23

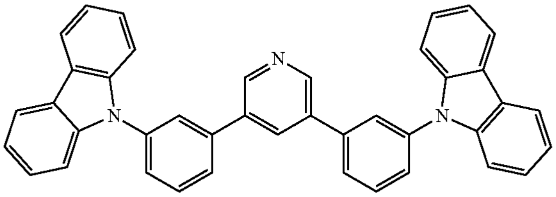

-continued

E-2-24

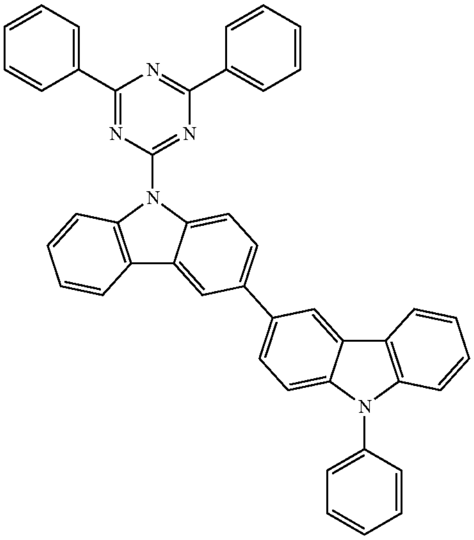

The emission layer EML may further include a material of the related art as a host material. For example, the emission layer EML may include as a host material, at least one of bis-(4-(9H-carbazol-9-yl) phenyl) diphenylsilane (BCPDS), (4-(1-(4-(diphenylamino) phenyl) cyclohexyl) phenyl) diphenyl-phosphine oxide (POPCPA), bis[2-(diphenylphosphino)phenyl]ether oxide (DPEPO), 4,4'-bis(N-carbazolyl)-1,1'-biphenyl (CBP), 3,3'-di(9H-carbazol-9-yl)-1,1'-biphenyl (mCBP), 1,3-bis(carbazol-9-yl)benzene (mCP), 2,8-bis (diphenylphosphoryl)dibenzo[b,d]furan (PPF), 4,4',4"-tris (carbazol-9-yl)-triphenylamine (TCTA), and 1,3,5-tris(1-phenyl-1H-benzo[d]imidazole-2-yl)benzene (TPBi). However, embodiments are not limited thereto. For example, tris(8-hydroxyquinolinato)aluminum ($Alq_3$), 9,10-di(naphthalene-2-yl)anthracene (ADN), 2-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

In an embodiment, the emission layer EML may include a compound represented by Formula M-a. The compound represented by Formula M-a may be used as a phosphorescence dopant material.

[Formula M-a]

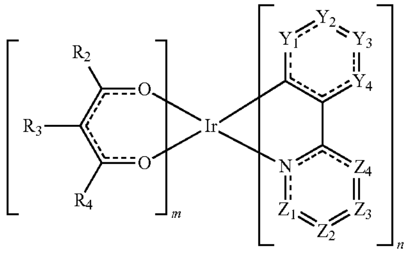

In Formula M-a, $Y_1$ to $Y_4$ and $Z_1$ to $Z_4$ may each independently be $C(R_1)$ or N; and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be any compound selected from Compounds M-a1 to M-a25. However, Compounds M-a1 to M-a25 are only examples, and the compound represented by Formula M-a is not limited to Compounds M-a1 to M-a25.

M-a1

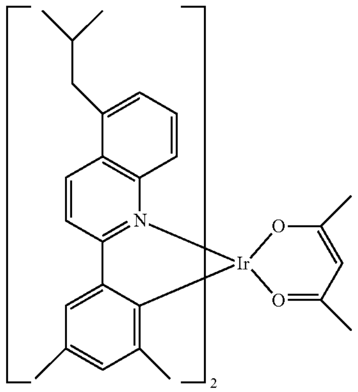

M-a2

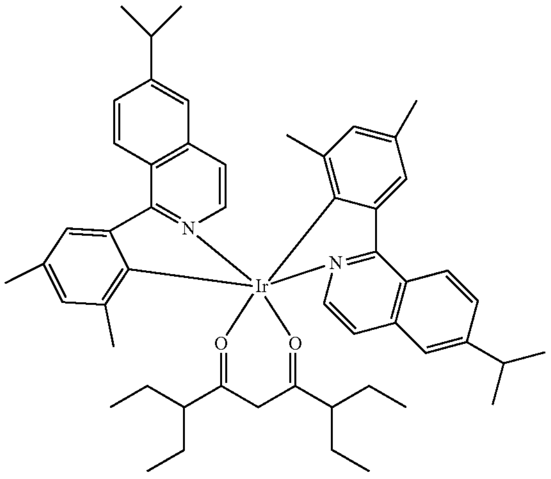

M-a3

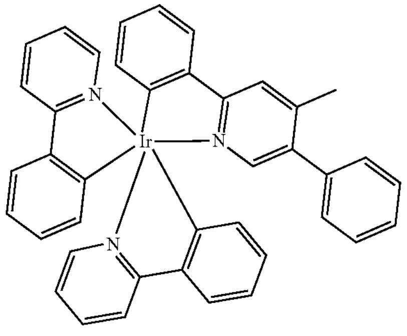

-continued

M-a4

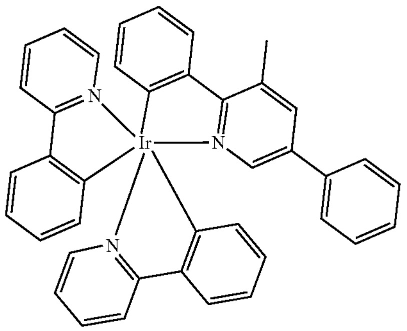

M-a5

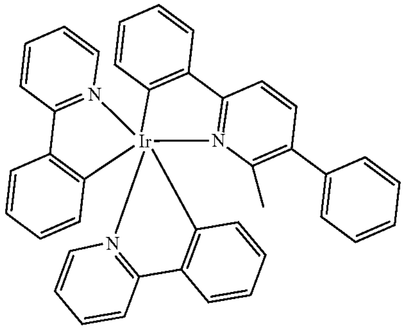

M-a6

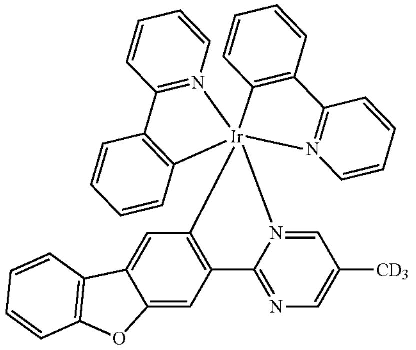

M-a7

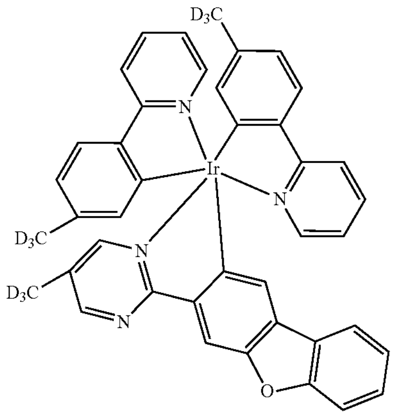

M-a8
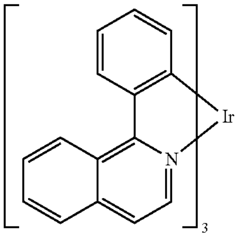
M-a9
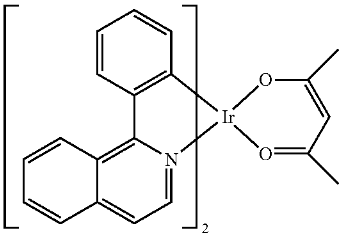
M-a10
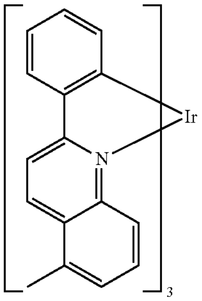
M-a11
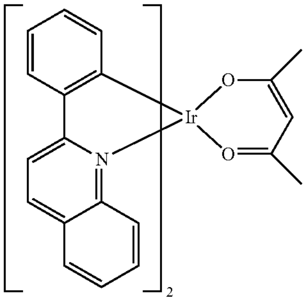
M-a12
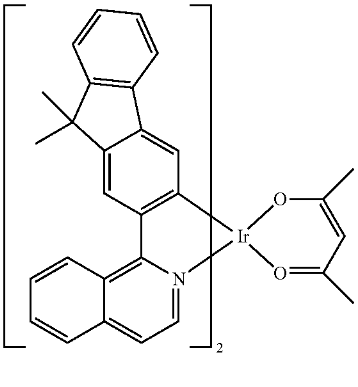
M-a13
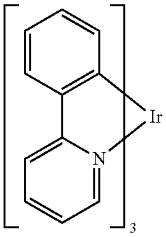
M-a14
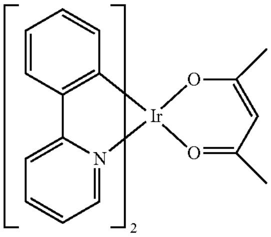
M-a15
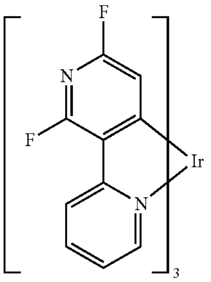
M-a16
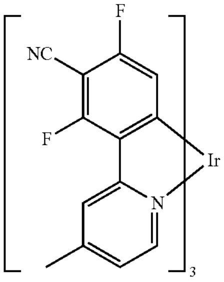
M-a17
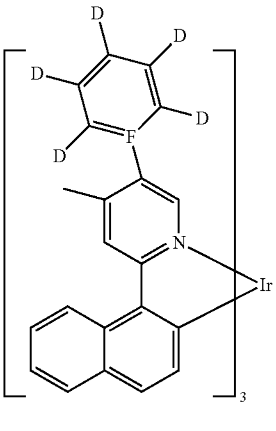

-continued

M-a18

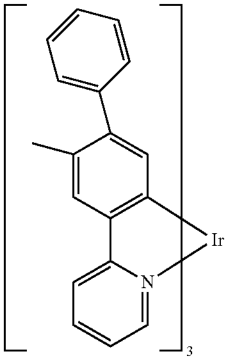

M-a19

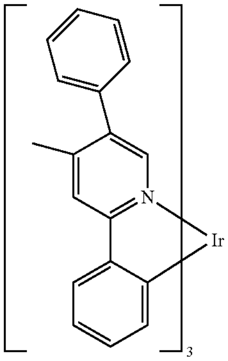

M-a20

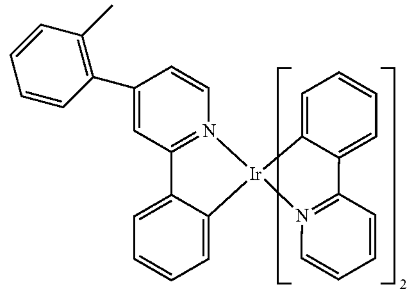

M-a21

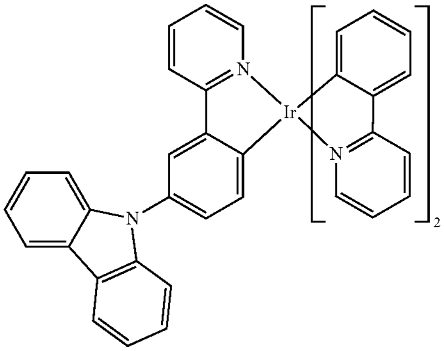

-continued

M-a22

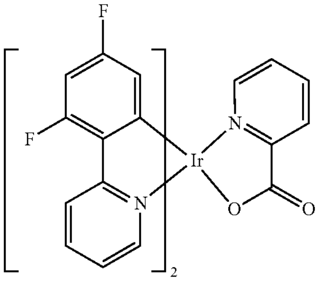

M-a23

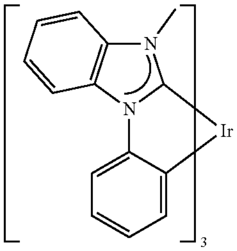

M-a24

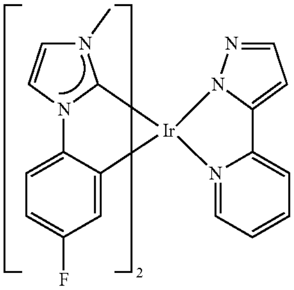

M-a25

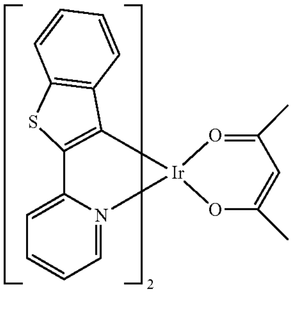

Compound M-a1 and Compound M-a2 may be used as red dopant materials. Compound M-a3 to Compound M-a7 may be used as green dopant materials.

In an embodiment, the emission layer EML may further include a compound represented by one of Formula F-a to Formula F-c. The compound represented by one of Formula F-a to Formula F-c may be used as a fluorescence dopant material.

[Formula F-a]

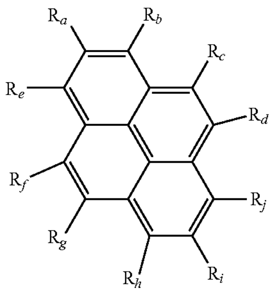

In Formula F-a, two of $R_a$ to $R_j$ may each independently be substituted with a group represented by $*\text{—}NAr_1Ar_2$. The remainder of $R_a$ to $R_j$ which are not substituted with the group represented by $*\text{—}NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group represented by $*\text{—}NAr_1Ar_2$, $Ar_1$ and $Ar_2$ may each independently be a substituted or unsubstituted aryl group of 6 to 30 ring-forming carbon atoms or a substituted or unsubstituted heteroaryl group of 2 to 30 ring-forming carbon atoms. For example, at least one of $Ar_1$ and $Ar_2$ may be a heteroaryl group including O or S as a ring-forming atom.

[Formula F-b]

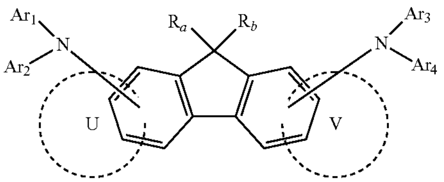

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. In Formula F-b, $Ar_1$ to $Ar_4$ may each independently be a substituted or unsubstituted aryl group of 6 to 30 ring-forming carbon atoms or a substituted or unsubstituted heteroaryl group of 2 to 30 ring-forming carbon atoms.

In Formula F-b, U and V may each independently be a substituted or unsubstituted hydrocarbon ring of 5 to 30 ring-forming carbon atoms or a substituted or unsubstituted heterocycle of 2 to 30 ring-forming carbon atoms. In Formula F-b, the number of rings represented by U and V may each independently be 0 or 1.

If the number of U or V is 1, a fused ring may be present at the part designated by U or V, and if the number of U or V is 0, a fused ring may not be present at the part designated by U or V. If the number of U is 0 and the number of V is 1, or if the number of U is 1 and the number of V is 0, a fused ring having a fluorene core of Formula F-b may be a cyclic compound with four rings. If the number of U and V are each 0, a fused ring having a fluorene core of Formula F-b may be a cyclic compound with three rings. If the number of U and V are each 1, a fused ring having a fluorene core of Formula F-b may be a cyclic compound with five rings.

In an embodiment, the emission layer EML may include, as a dopant material of the related art, a styryl derivative (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene or a derivative thereof (for example, 2,5,8,11-tetra-t-butylperylene (TBP)), pyrene or a derivative thereof (for example, 1,1'-dipyrene, 1,4-dipyrenylbenzene, and 1,4-bis(N,N-diphenylamino)pyrene), etc.

The emission layer EML may further include a phosphorescence dopant material of the related art. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium(III) bis(4,6-difluorophenylpyridinato-N,C2')picolinate (FIrpic), bis(2,4-difluorophenylpyridinato)-tetrakis(1-pyrazolyl)borate iridium(III) (FIr6), or platinum octaethyl porphyrin (PtOEP) may be used as the phosphorescence dopant. However, embodiments are not limited thereto.

In an embodiment, the emission layer EML may include a quantum dot. The quantum dot may be a crystal of a semiconductor compound. The quantum dot may emit light of various emission wavelengths, according to a size of the crystal. The quantum dot may emit light of various emission wavelengths by adjusting an elemental ratio in a quantum dot compound. A diameter of the quantum dot may be, for example, in a range of about 1 nm to about 10 nm. The quantum dot may be synthesized by a chemical bath deposition, an organometal chemical vapor deposition, a molecular beam epitaxy, or a similar process therewith.

Examples of a quantum dot may include: a Group II-VI semiconductor compound; a Group I-II-VI semiconductor compound; a Group II-IV-VI semiconductor compound; a Group I-II-IV-VI semiconductor compound; a Group III-V semiconductor compound; a Group III-VI semiconductor compound; a Group I-III-VI semiconductor compound; a Group IV-VI semiconductor compound; a Group II-IV-V semiconductor compound; a Group IV element or compound; or any combination thereof. In the specification, the term "Group" refers to a group in the IUPAC periodic table.

Examples of a Group II-VI semiconductor compound may include: a binary compound such as CdS, CdSe, CdTe, CdS, ZnS, ZnSe, ZnTe, ZnO, HgS, HgSe, HgTe, MgSe, and MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; a quaternary compound such as CdZnSeS, CdZnSeTe, CdZnSTe, CdHgSeS, CdHgSeTe, CdHgSTe, HgZnSeS, HgZnSeTe, and HgZnSTe; or any combination thereof. In an embodiment, a Group II-VI semiconductor compound may further include a Group I element and/or a Group IV element. Examples of a Group I-II-VI compound may include CuSnS or CuZnS, and examples of a Group II-IV-VI compound may include ZnSnS, etc. Examples of a Group I-II-IV-VI compound may include a quaternary compound selected from the group consisting of $Cu_2ZnSnS_2$, $Cu_2ZnSnS_4$, $Cu_2ZnSnSe_4$, $Ag_2ZnSnS_2$, and mixtures thereof.

Examples of a Group III-V semiconductor compound may include: a binary compound such as GaN, GaP, GaAs, GaSb, AlN, AlP, AlAs, AlSb, InN, InP, InAs, and InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; or any combination thereof. In an embodiment, a Group III-V semiconductor compound may further include a Group II element. Examples of a Group III-V semiconductor compound further including a Group II element may include InZnP, InGaZnP, InAlZnP, etc.

Examples of a Group III-VI group semiconductor compound may include: a binary compound such as GaS, $Ga_2S_3$, GaSe, $Ga_2Se_3$, GaTe, InS, InSe, $In_2Se_3$, and InTe; a ternary compound such as $InGaS_3$, and $InGaSe_3$; or any combination thereof.

Examples of a Group I-III-VI semiconductor compound may include: a ternary compound such as AgInS, $AgInS_2$, $AgInSe_2$, AgGaS, $AgGaS_2$, $AgGaSe_2$, CuInS, $CuInS_2$, $CuInSe_2$, $CuGaS_2$, $CuGaSe_2$, $CuGaO_2$, $AgGaO_2$, and $AgAlO_2$; a quaternary compound such as $AgInGaS_2$, and $AgInGaSe_2$; or any combination thereof.

Examples of a Group IV-VI semiconductor compound may include: a binary compound such as SnS, SnSe, SnTe, PbS, PbSe, and PbTe; a ternary compound such as SnSeS, SnSeTe, SnSTe, PbSeS, PbSeTe, PbSTe, SnPbS, SnPbSe, and SnPbTe; a quaternary compound such as SnPbSSe, SnPbSeTe, and SnPbSTe; or any combination thereof.

Examples of a Group II-IV-V semiconductor compound may include: a ternary compound selected from the group consisting of ZnSnP, $ZnSnP_2$, $ZnSnAs_2$, $ZnGeP_2$, $ZnGeAs_2$, $CdSnP_2$, $CdGeP_2$, $CdGeP_2$; or any combination thereof.

Examples of a Group IV element or compound may include: a single element material such as Si and Ge; a binary compound such as SiC and SiGe; or any combination thereof.

Each element included in a polynary compound, such as a binary compound, a ternary compound, or a quaternary compound, may be present in a particle at a uniform concentration or at a non-uniform concentration. For example, a formula may indicate the elements included in a compound, but the ratio of elements in the compound may be different. For example, $AgInGaS_2$ may mean $AgIn_xGa_{1-x}S_2$ (wherein x is a real number from 0 to 1).

In an embodiment, a quantum dot may have a single structure, in which the concentration of each element included in the quantum dot is uniform, or the quantum dot may have a core-shell structure, in which one quantum dot surrounds another quantum dot. For example, a material included in the core and a material included in the shell may be different from each other.

The shell of the quantum dot may serve as a protection layer that prevents chemical deformation of the core to maintain semiconductor properties and/or may serve as a charging layer that imparts the quantum dot with electrophoretic properties. The shell may be a single layer or a multilayer. In a quantum dot having a core/shell structure, the quantum dot may have a concentration gradient in which the concentration of an element that is present in the shell decreases toward the core.

Examples of a shell of a quantum dot may include a metal oxide, a non-metal oxide, a semiconductor compound, or a combination thereof.

Examples of a metal or non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; a ternary compound such as $MgAl_2O_4$, $CoFe_2O_4$, $NiFe_2O_4$, and $CoMn_2O_4$; or any combination thereof.

Examples of a semiconductor compound may include: a Group III-VI semiconductor compound; a Group II-VI semiconductor compound; a Group III-V semiconductor compound; a Group III-VI semiconductor compound; a Group I-III-VI semiconductor compound; a Group IV-VI semiconductor compound; or any combination thereof, as described herein. Examples of a semiconductor compound may include CdS, CdSe, CdTe, ZnS, ZnSe, ZnTe, ZnSeS, ZnTeS, GaAs, GaP, GaS, GaSe, AgGaS, $AgGaS_2$, GaSb, HgS, HgSe, HgTe, InAs, InP, InGaP, InSb, AlAs, AlP, AlSb, or any combination thereof.

The quantum dot may have a full width at half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Within any of the above ranges, color purity or color reproducibility may be improved. Light emitted through a quantum dot may be emitted in all directions, so that light view angle properties may be improved.

In embodiments, the quantum dot may have a spherical shape, a pyramidal shape, a multi-shape arm, or a cubic shape, or the quantum dot be in the form of a nanoparticle, a nanotube, a nanowire, a nanofiber, a nanoplate particle, etc.

By adjusting the size of a quantum dot or by adjusting the elemental ratio in a quantum dot compound, the energy band gap may be controlled, and various wavelength ranges of light may be obtained from an emission layer EML that includes a quantum dot. Accordingly, a quantum dot as described herein (for example, using quantum dots having different sizes or having different elemental ratios in a quantum dot compound), a light emitting element ED that emits various wavelengths of light may be achieved. For example, a size of a quantum dot or an elemental ratio in a quantum dot compound may be adjusted to emit red light, green light, and/or blue light. For example, quantum dots may be provided as a combination of various emission colors to emit white light.

Referring to FIG. 3 to FIG. 6, the first electrode EL1 may have conductivity. The first electrode EL1 may be formed of a metal material, a metal alloy, or a conductive compound. The first electrode EL1 may be an anode or a cathode. However, embodiments are not limited thereto. In an embodiment, the first electrode EL1 may be a pixel electrode. The first electrode ELI may be a transmissive electrode, a transflective electrode, or a reflective electrode. The first electrode EL1 may include at least one of Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof.

If the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). If the first electrode EL1 is a transflective electrode or a reflective electrode, the first electrode ELI may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, a compound thereof, or a mixture thereof (for example, a mixture of Ag and Mg). In another embodiment, the first electrode EL1 may have a multilayer structure including a reflective layer or a transflective layer formed of the above materials, and a transmissive conductive layer formed of ITO, IZO, ZnO, or ITZO. For example, the first electrode ELI may have a three-layer structure of ITO/Ag/ITO, but embodiments are not limited thereto. In an embodiment, the first electrode EL1 may include the above-described metal materials, combinations of two or more metal materials selected from the above-described metal materials, or oxides of the above-described metal materials. However, embodiments are not limited thereto. A thickness of the first electrode EL1 may be in a range of about 700 Å to about 10,000 Å. For example, the thickness of the first electrode EL1 may be in a range of about 1,000 Å to about 3,000 Å.

The hole transport region HTR may be provided on the first electrode ELI. The hole transport region HTR may include at least one of a hole injection layer HIL, a hole transport layer HTL, a buffer layer (not shown), an emission auxiliary layer (not shown), and an electron blocking layer EBL.

The hole transport region HTR may be a layer consisting of a single material, a layer including different materials, or a structure including multiple layers including different materials. For example, the hole transport region HTR may have a structure of a single layer of a hole injection layer HIL or a hole transport layer HTL, or may have a structure of a single layer formed of a hole injection material and a hole transport material.

In embodiments, the hole transport region HTR may have a structure of a single layer formed of different materials, or may have a structure in which a hole injection layer HIL/hole transport layer HTL, a hole injection layer HTL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in its respective stated order from the first electrode EL1. However, these are only examples, and embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

In the light emitting element ED according to an embodiment, the hole transport region HTR may include a compound represented by Formula H-1.

[Formula H-1]

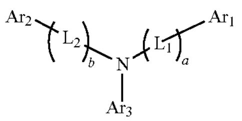

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, a and b may each independently be an integer from 0 to 10. If a or b is 2 or more, multiple $L_1$ groups or multiple $L_2$ groups may each independently be a substituted or unsubstituted arylene group of 6 to 30 ring-forming carbon atoms or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

In an embodiment, a compound represented by Formula H-1 may be a monoamine compound. In another embodiment, a compound represented by Formula H-1 may be a diamine compound in which at least one of $Ar_1$ to $Ar_3$ includes an amine group as a substituent. In yet another embodiment, a compound represented by Formula H-1 may be a carbazole-based compound in which at least one of $Ar_1$ and $Ar_2$ includes a substituted or unsubstituted carbazole group, or may be a fluorene-based compound in which at least one of $Ar_1$ and $Ar_2$ includes a substituted or unsubstituted fluorene group.

The compound represented by Formula H-1 may be any compound selected from Compound Group H. However, the compounds listed in Compound Group H are only examples, and the compound represented by Formula H-1 is not limited to Compound Group H.

[Compound Group H]

H-1-1

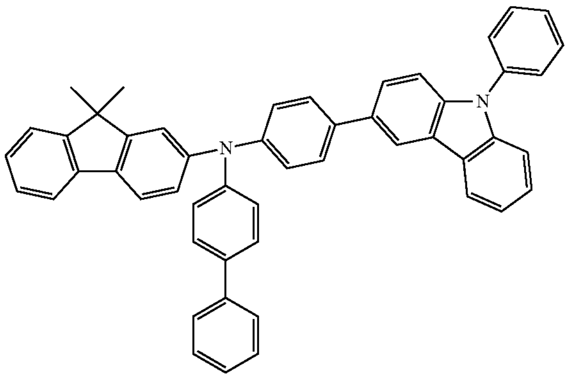

H-1-2

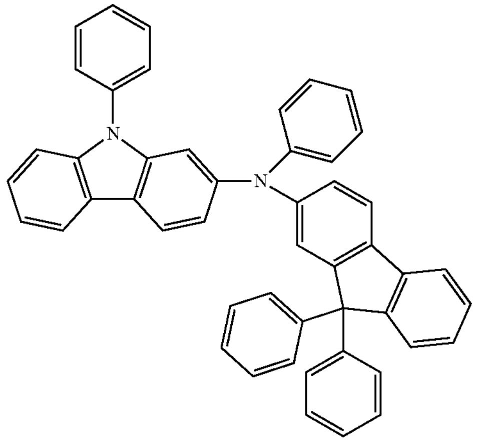

H-1-3
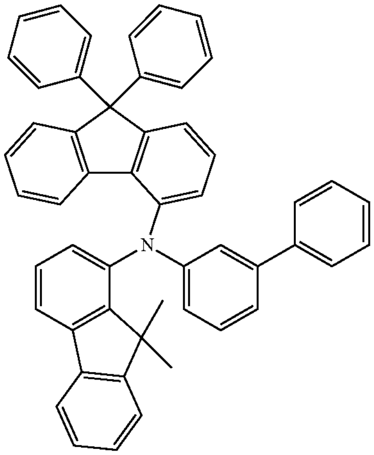
H-1-4
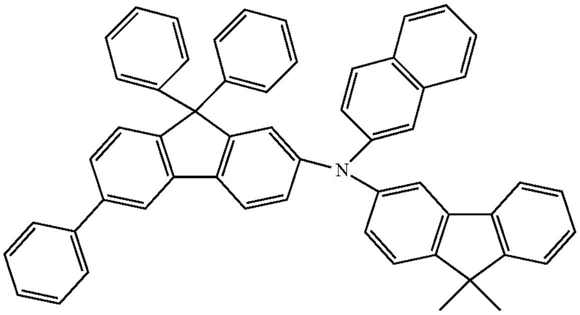
H-1-5
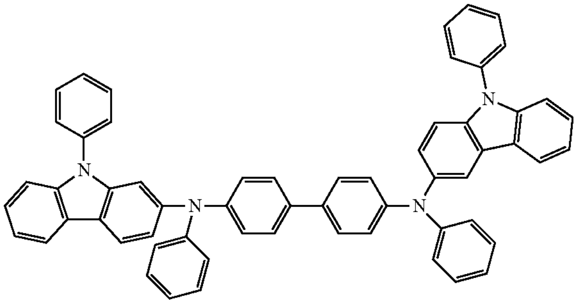
H-1-6
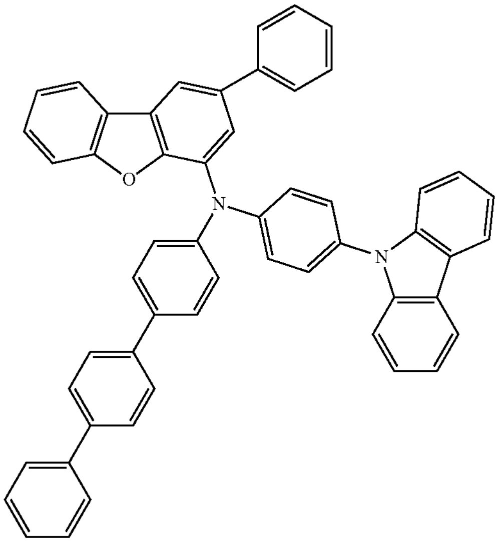
H-1-7
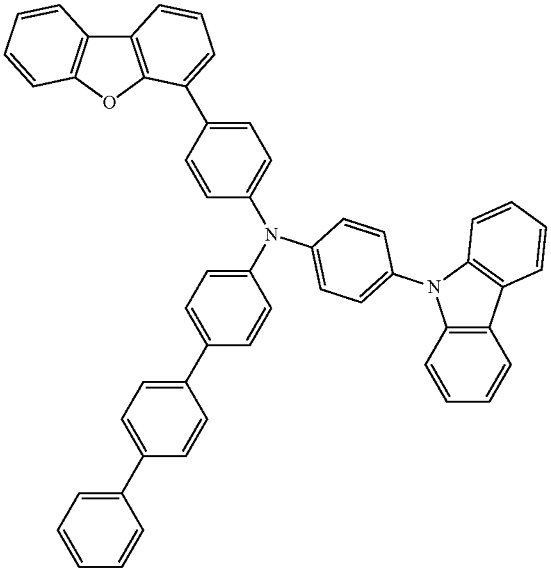
H-1-8
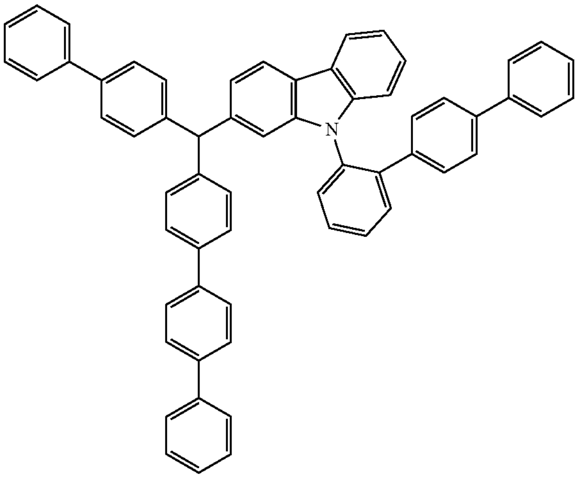

-continued
H-1-9
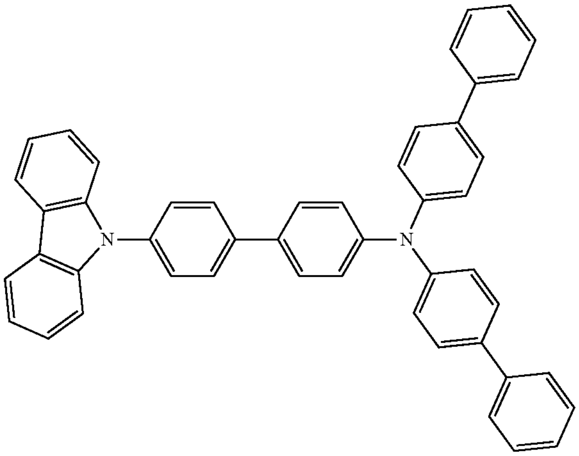
H-1-10
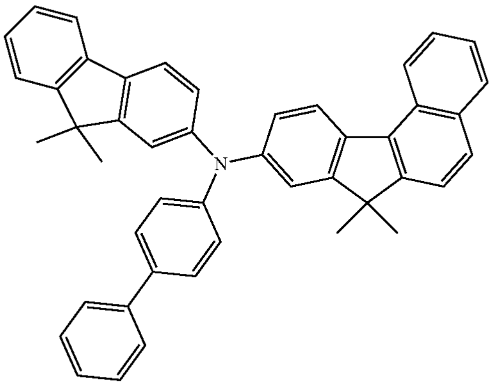
H-1-11
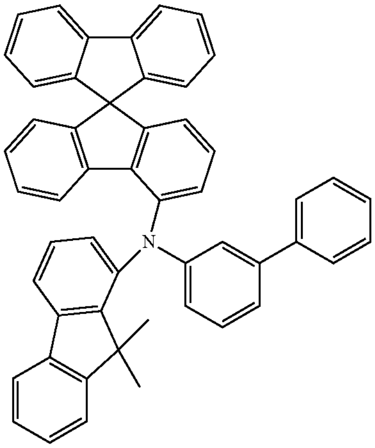
-continued
H-1-12
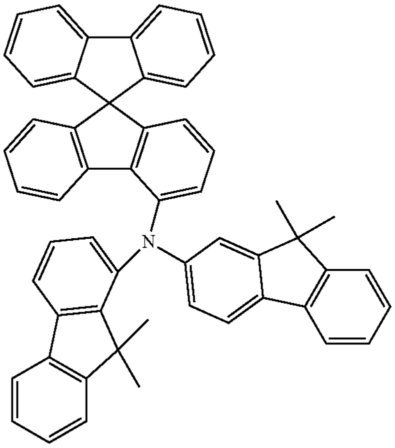
H-1-13
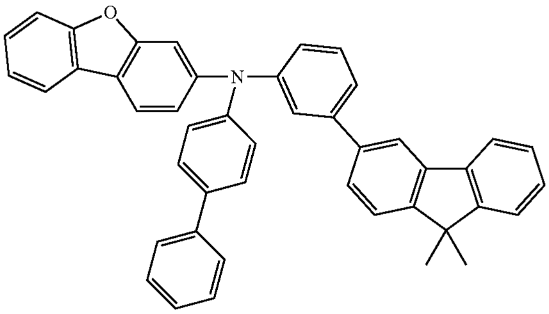
H-1-14
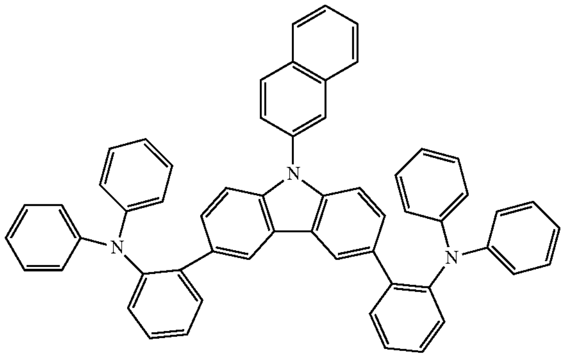
H-1-15
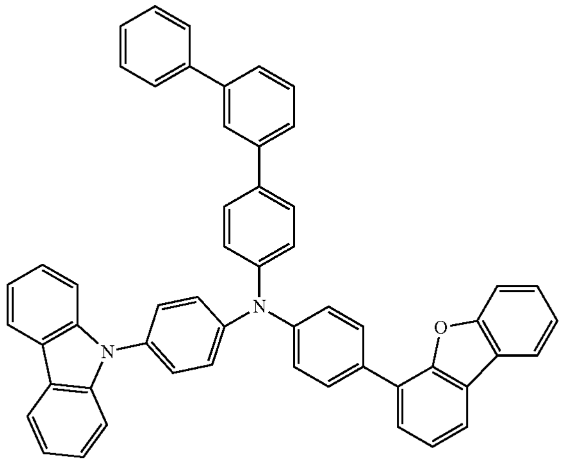

-continued

H-1-16

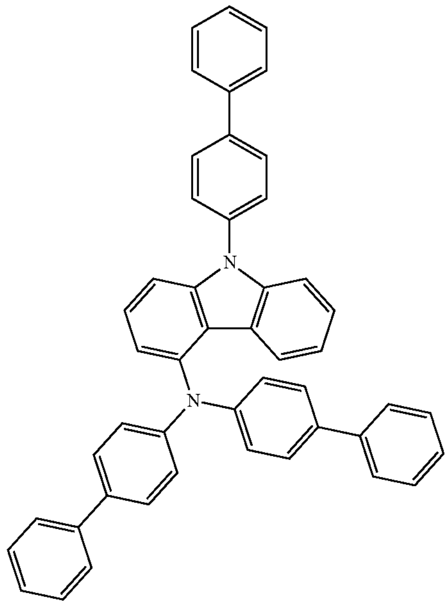

H-1-17

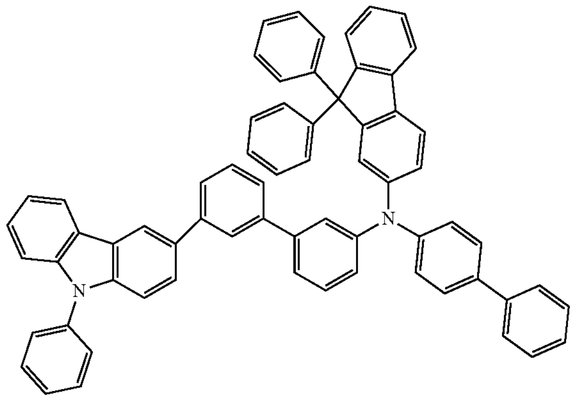

H-1-18

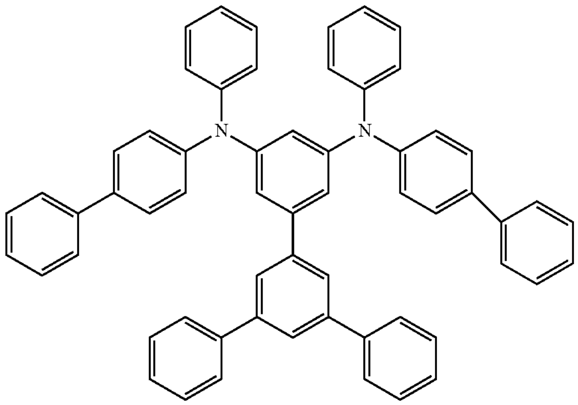

-continued

H-1-19

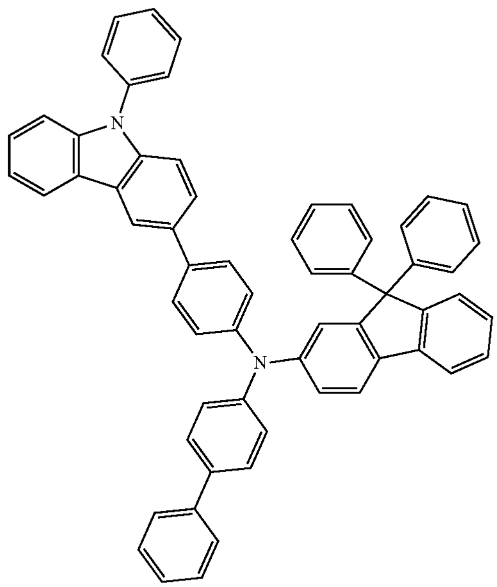

The hole transport region HTR may include a phthalocyanine compound such as copper phthalocyanine, N',N-([1,1'-biphenyl]-4,4'-diyl)bis(N-phenyl-N4,N4-di-m-tolyl-benzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N-(2-naphthyl)-N-phenylamino]-triphenylamine (2-TNATA), poly(3,4-ethylenedioxythiophene)/poly(4-styrene sulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h] quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), or 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, and an electron blocking layer EBL.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of a metal halide compound, a quinone derivative, a metal oxide, and cyano group-containing compound, without limitation.

For example, the p-dopant may include metal halide compounds such as CuI and RbI, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, cyano group-containing compounds such as dipyrazino[2,3-f: 2',3'-h] quinoxaline-2,3,6,7,10,11-hexacarbonitrile (HAT-CN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., without limitation.

As described above, the hole transport region HTR may further include at least one of a buffer layer (not shown) and an electron blocking layer EBL, in addition to the hole injection layer HIL and the hole transport layer HTL. The buffer layer (not shown) may compensate for a resonance distance according to a wavelength of light emitted from an emission layer EML and may increase light emission efficiency. A material which may be included in the hole transport region HTR may be used as a material included in the buffer layer (not shown). The electron blocking layer EBL may prevent the injection of electrons from the electron transport region ETR to the hole transport region HTR.

A thickness of the hole transport region HTR may be in a range of about 50 Å to about 15,000 Å. For example, the thickness of the hole transport region HTR may be in a range of about 100 Å to about 10,000 Å. For example, the thickness of the hole transport region HTR may be in a range of about 100 Å to about 5,000 Å. In case where the hole transport region HTR includes a hole injection layer HIL, a thickness of the hole injection region HIL may be in a range of about 30 Å to about 1,000 Å. In case where the hole transport region HTR includes a hole transport layer HTL, a thickness of the hole transport layer HTL may be in a range of about 30 Å to about 1,000 Å. In case where the hole transport region HTR includes an electron blocking layer EBL, a thickness of the electron blocking layer EBL may be in a range of about 10 to about 1,000. If the thicknesses of the hole transport region HTR, the hole injection layer HIL, the hole transport layer HTL and the electron blocking layer EBL satisfy the above-described ranges, satisfactory hole transport properties may be achieved without a substantial increase of driving voltage.

In the light emitting element ED according to an embodiment as shown in each of FIG. 3 to FIG. 6, the electron transport region ETR may be provided on the emission layer EML. The electron transport region ETR may include at least one of a hole blocking layer HBL, an electron transport layer ETL, and an electron injection layer EIL. However, embodiments are not limited thereto.

The electron transport region ETR may be a layer consisting of a single material, a layer including different materials, or a structure including multiple layers including different materials.

For example, the electron transport region ETR may have a single layer structure of an electron injection layer EIL or an electron transport layer ETL, or may have a single layer structure formed of an electron injection material and an electron transport material. In embodiments, the electron transport region ETR may have a single layer structure formed of different materials, or may have a structure in which an electron transport layer ETL/electron injection layer EIL, or a hole blocking layer HBL/electron transport layer ETL/electron injection layer EIL are stacked in its respective stated order from the emission layer EML, but embodiments are not limited thereto. A thickness of the electron transport region ETR may be in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method. The electron transport region ETR may include a compound represented by Formula ET-1, as described above.

The electron transport region ETR may include an anthracene-based compound. However, embodiments are not limited thereto. The electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato)aluminum (BAlq), berylliumbis(benzoquinolin-10-olate ($Bebg_2$), 9,10-di(naphthalen-2-yl)anthracene (ADN), 1,3-bis[3,5-di(pyridin-3-yl)phenyl]benzene (BmPyPhB), or a mixture thereof, without limitation.

In an embodiment, the electron transport region ETR may include at least one of Compounds ET1 to ET36.

ET1

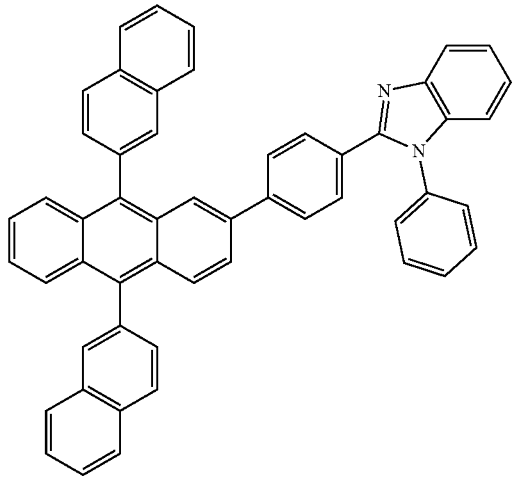

-continued
ET2
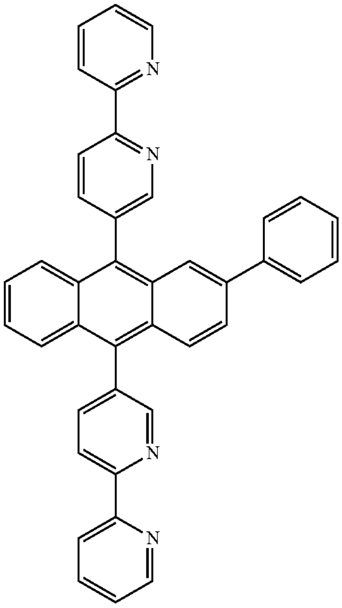
ET3
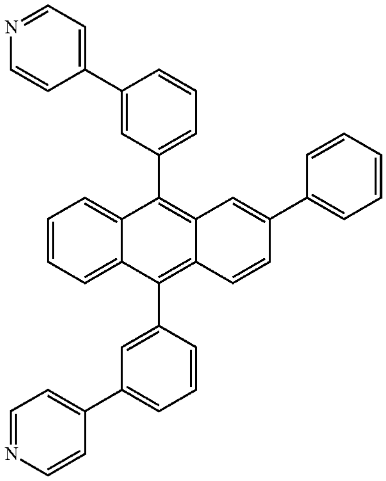
ET4
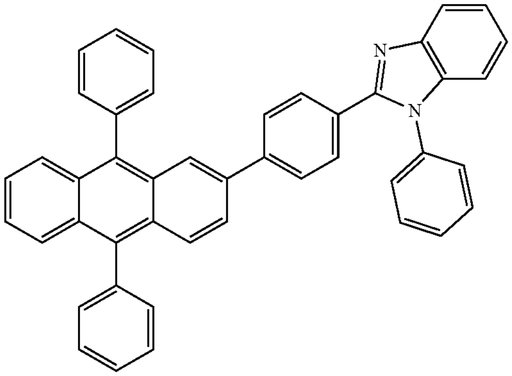
-continued
ET5
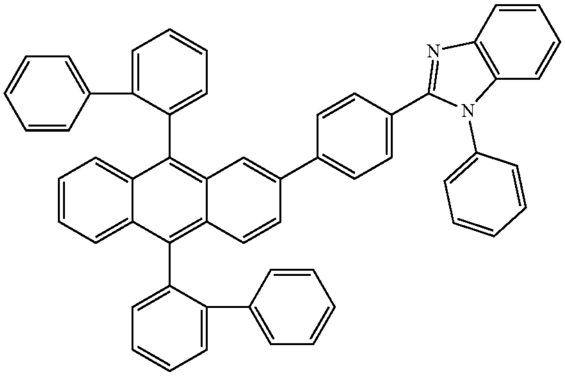
ET6
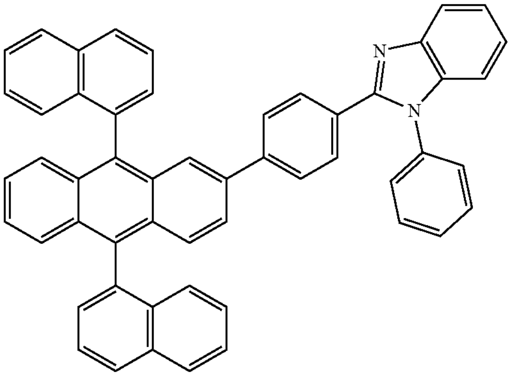
ET7
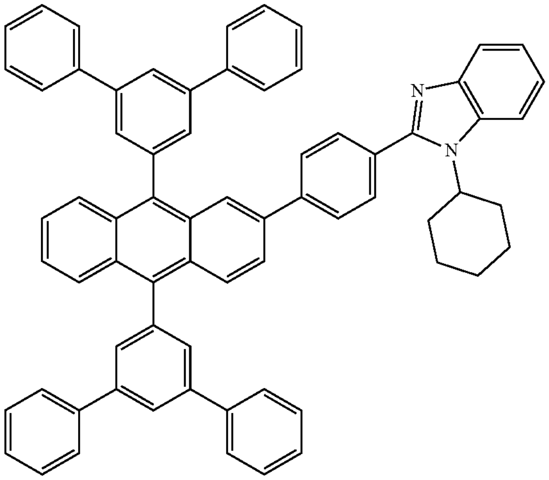

-continued
ET8
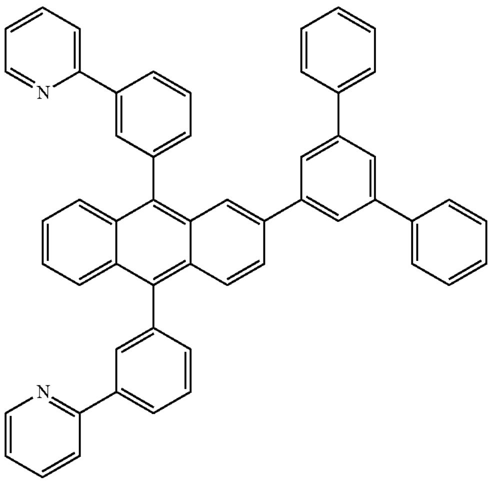
ET9
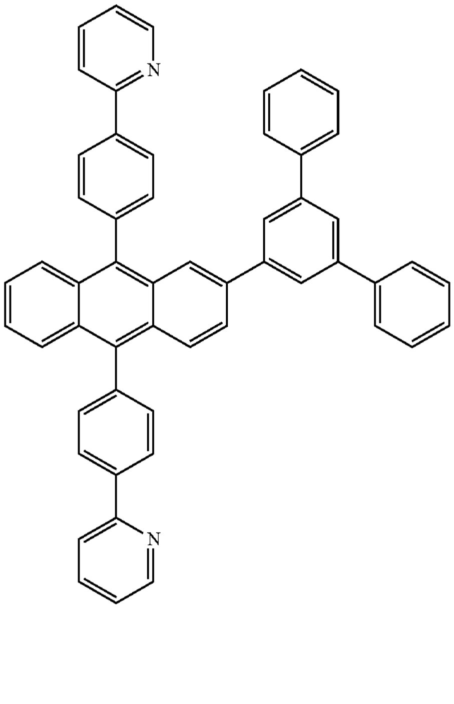
-continued
ET10
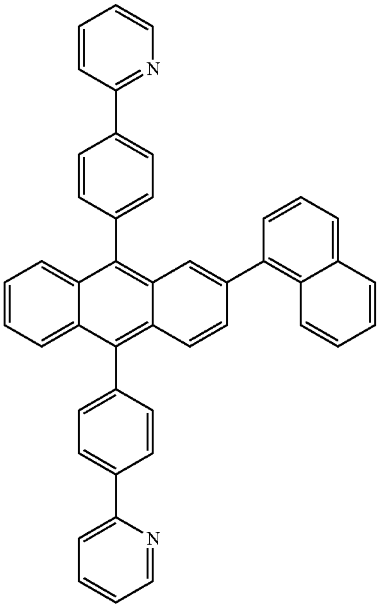
ET11
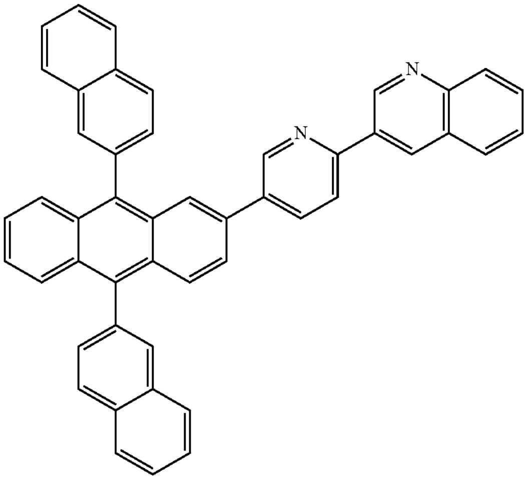
ET12
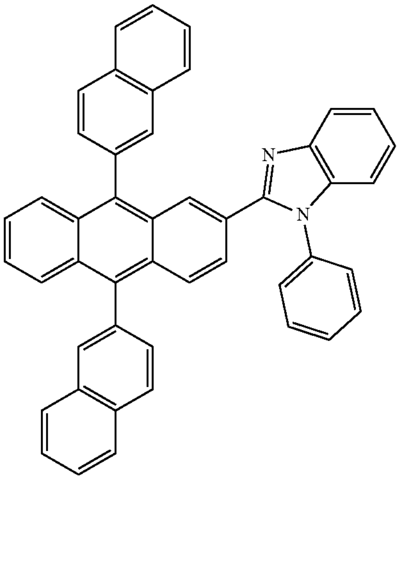

-continued
ET13
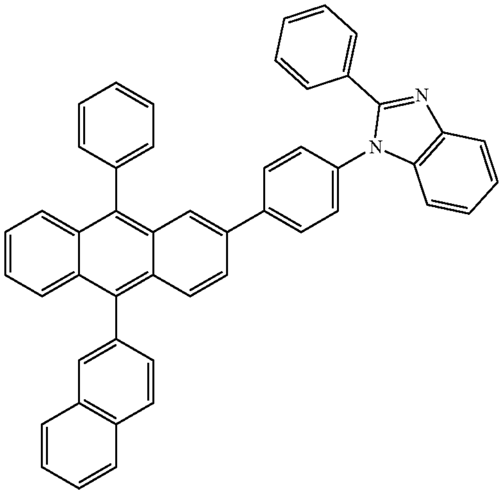
ET14
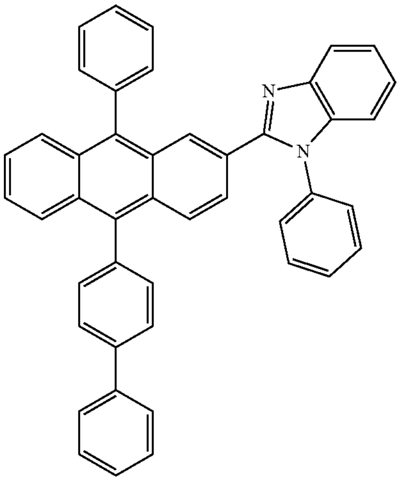
ET15
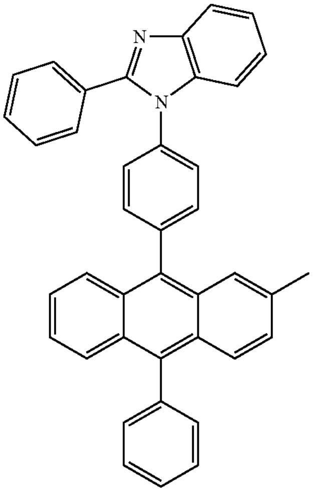
-continued
ET16
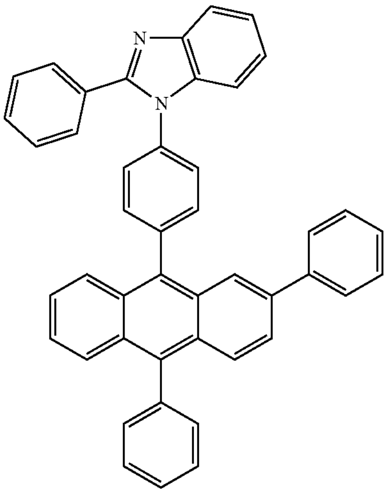
ET17
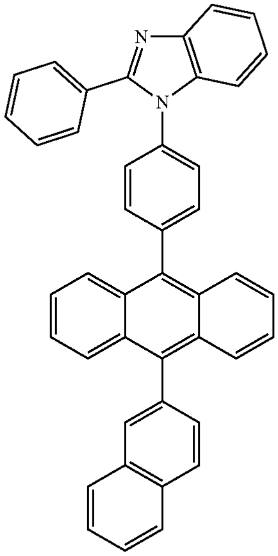
ET18
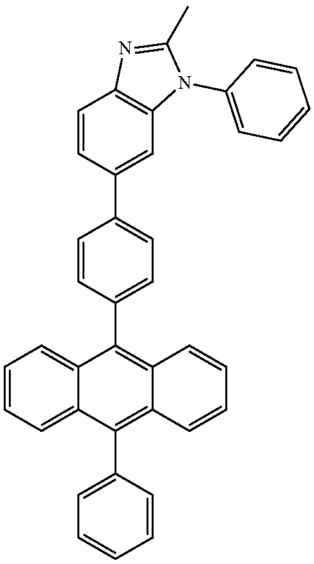

-continued
ET19
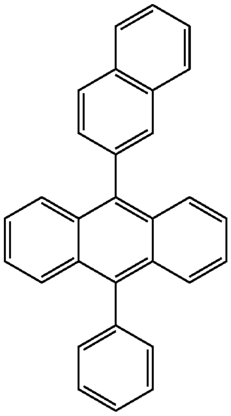
ET20
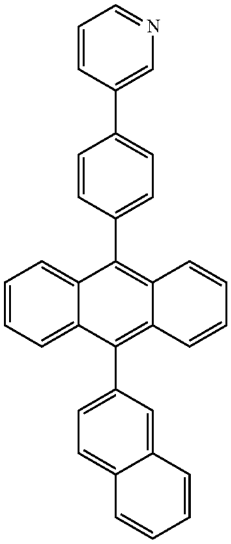
ET21
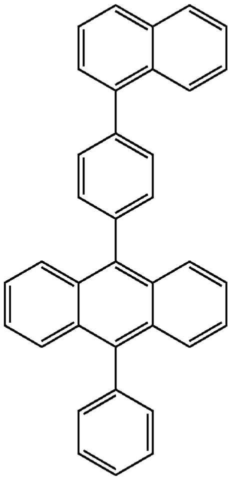
-continued
ET22
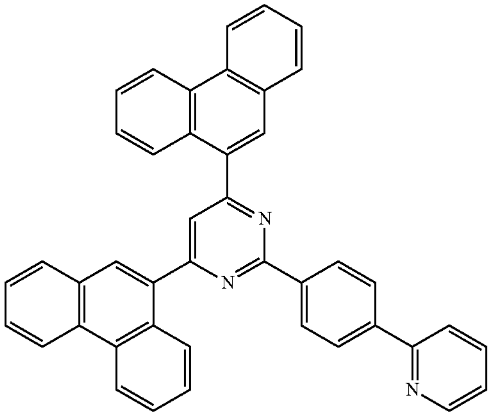
ET23
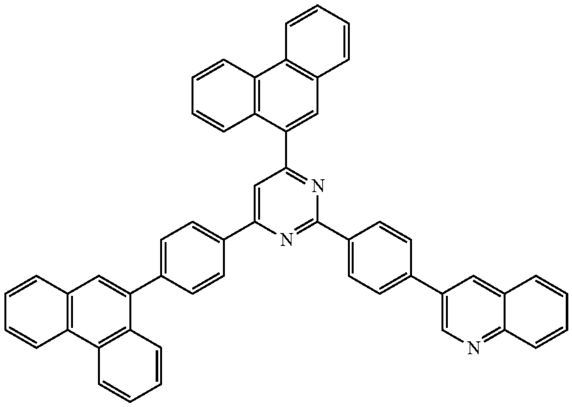
ET24
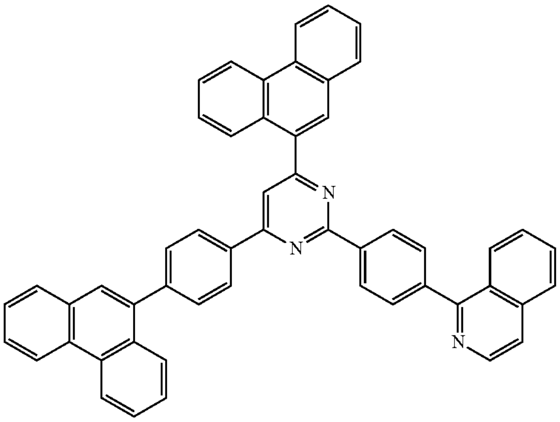

-continued
ET25
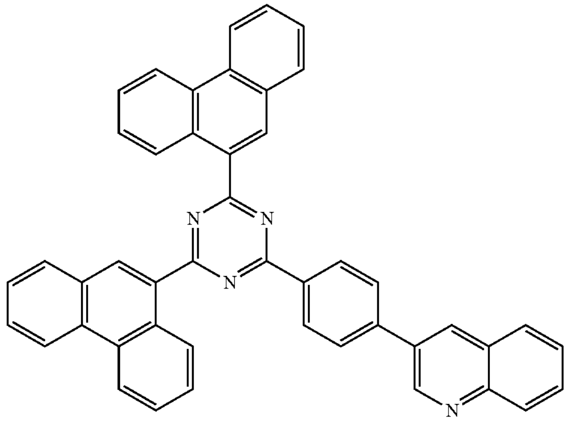
ET26
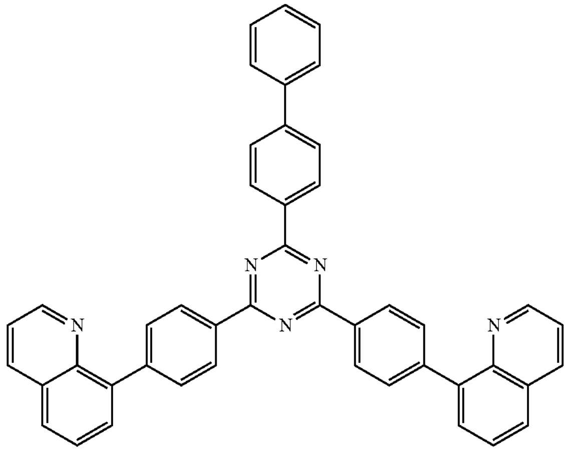
ET27
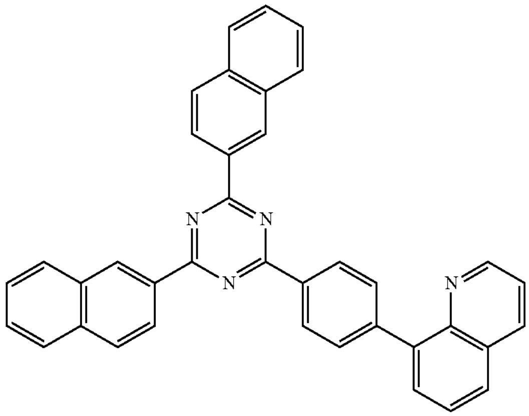
-continued
ET28
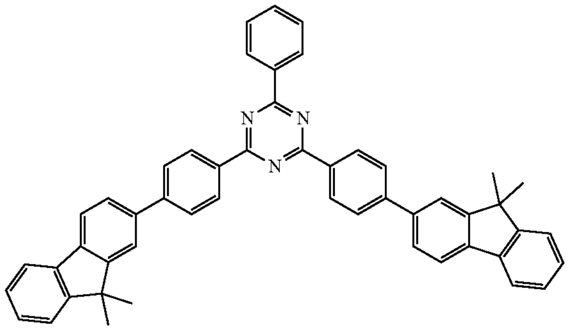
ET29
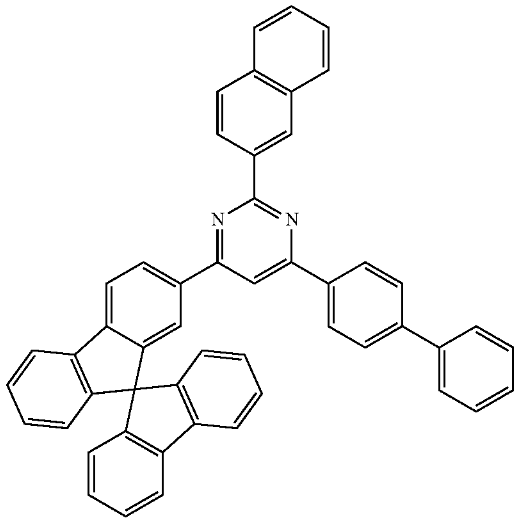
ET30
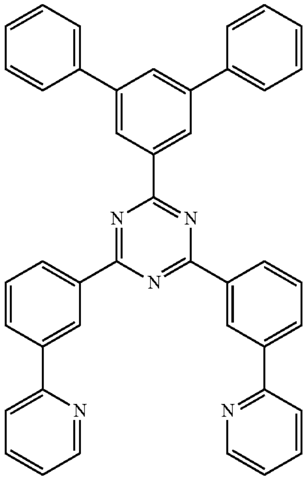

-continued

ET31

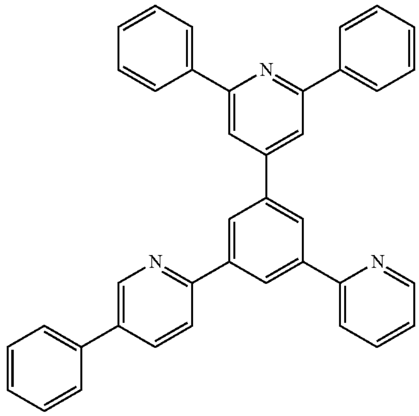

ET32

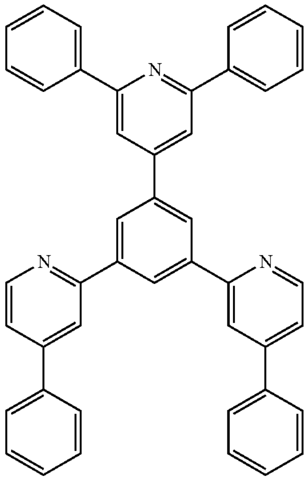

ET33

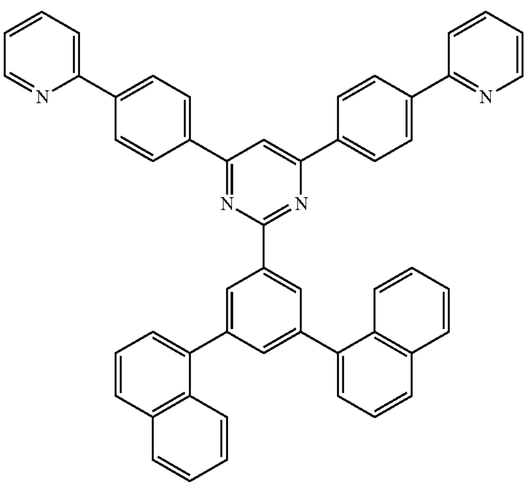

-continued

ET34

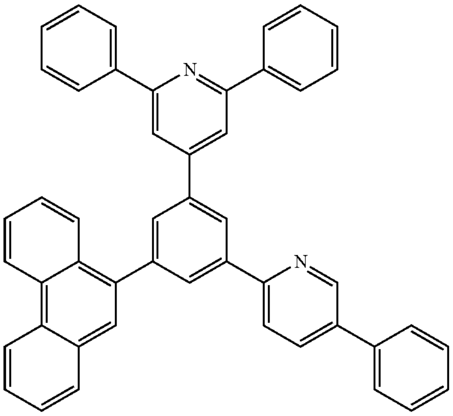

ET35

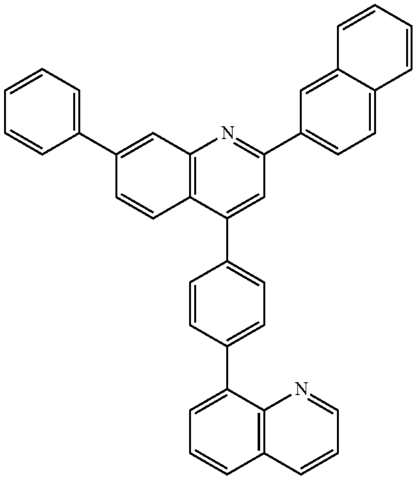

ET36

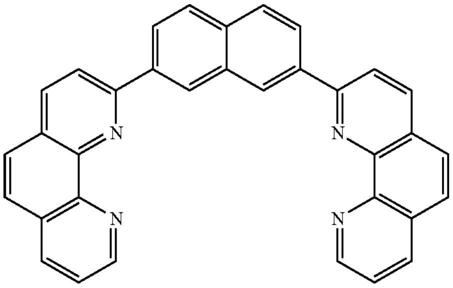

In an embodiment, the electron transport region ETR may include: a metal halide such as LiF, NaCl, CsF, RbCl, RbI, CuI, and KI; a lanthanide metal such as Yb; or a co-deposited material of a metal halide and a lanthanide metal. For example, the electron transport region ETR may include KI:Yb, RbI:Yb, LiF:Yb, etc., as a co-deposited material. The electron transport region ETR may include a metal oxide such as $Li_2O$ and BaO, or 8-hydroxy-lithium quinolate (Liq). However, embodiments are not limited thereto. The electron transport region ETR may also be formed of a mixture material of an electron transport material and an insulating organometallic salt. The organometallic salt may be a material having an energy band gap equal to or greater than about 4 eV. For example, the organometallic salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), diphenyl(4-(triphenylsilyl)phenyl)phosphine oxide (TSPO1) or 4,7-diphenyl-1,10-phenanthroline (Bphen), in addition to the aforementioned materials. However, embodiments are not limited thereto.

The electron transport region ETR may include the compounds of the electron transport region in at least one of an electron injection layer EIL, an electron transport layer ETL, and a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without a substantial increase of driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without inducing a substantial increase of driving voltage.

The second electrode EL2 may be provided on the electron transport region ETR. The second electrode EL2 may be a common electrode. The second electrode EL2 may be a cathode or an anode, but embodiments are not limited thereto. For example, if the first electrode ELI is an anode, the second cathode EL2 may be a cathode, and if the first electrode ELI is a cathode, the second electrode EL2 may be an anode. The second electrode EL2 may include Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof.

The second electrode EL2 may be a transmissive electrode, a transflective electrode, or a reflective electrode. If the second electrode EL2 is a transmissive electrode, the second electrode EL2 may include a transparent metal oxide, such as ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (for example, AgMg, AgYb, or MgYb). In an embodiment, the second electrode EL2 may have a multilayered structure including a reflective layer or a transflective layer formed of the above-described materials and a transparent conductive layer formed of ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to an auxiliary electrode, resistance of the second electrode EL2 may decrease.

In an embodiment, the light emitting element ED may further include a capping layer CPL disposed on the second electrode EL2. The capping layer CPL may be a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as SiON, $SiN_x$, $SiO_y$, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol-9-yl) triphenylamine (TCTA), etc., or may include an epoxy resin, or an acrylate such as methacrylate. In an embodiment, a capping layer CPL may include at least one of Compounds P1 to P5, but embodiments are not limited thereto.

P1

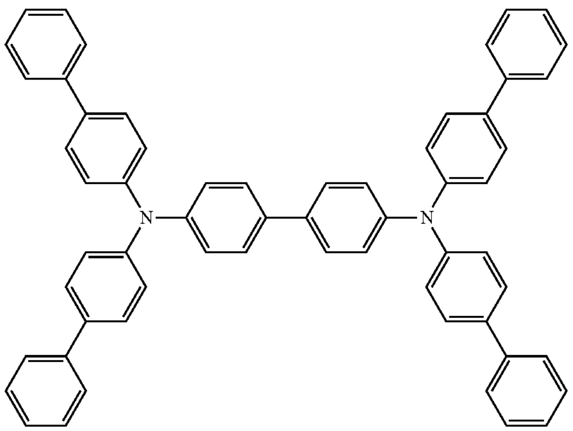

P2

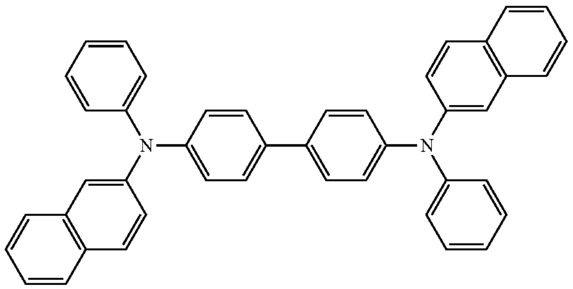

P3

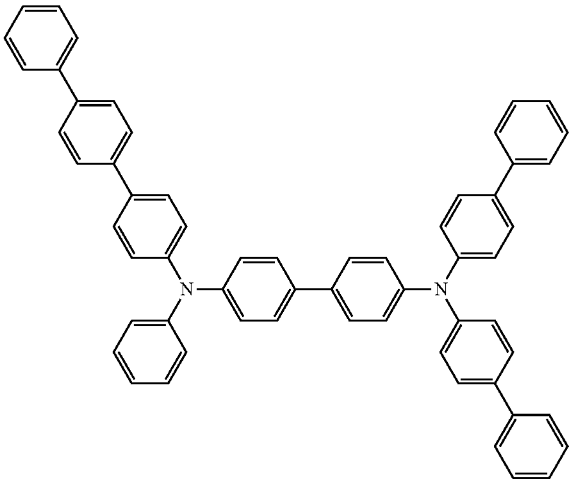

-continued

P4

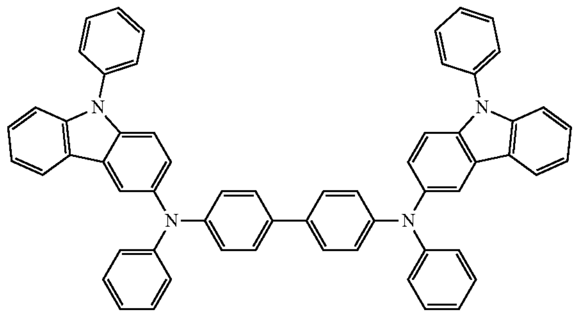

P5

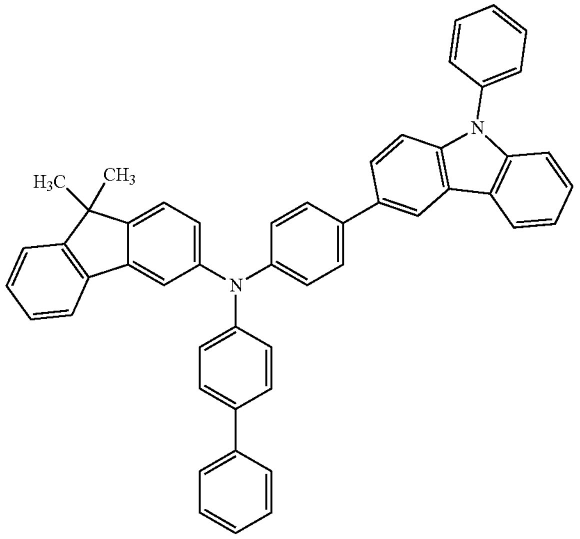

A refractive index of the capping layer CPL may be equal to or greater than about 1.6. For example, the refractive index of the capping layer CPL may be equal to or greater than about 1.6, with respect to light in a wavelength range of about 550 nm to about 660 nm.

FIG. 7 to FIG. 10 are each a schematic cross-sectional view of a display device according to an embodiment. In the descriptions of the display devices according to embodiments as shown in FIG. 7 to FIG. 10, the features which have been described above with respect to FIG. 1 to FIG. 6 will not be explained again, and the differing features will be explained.

Figure 7:
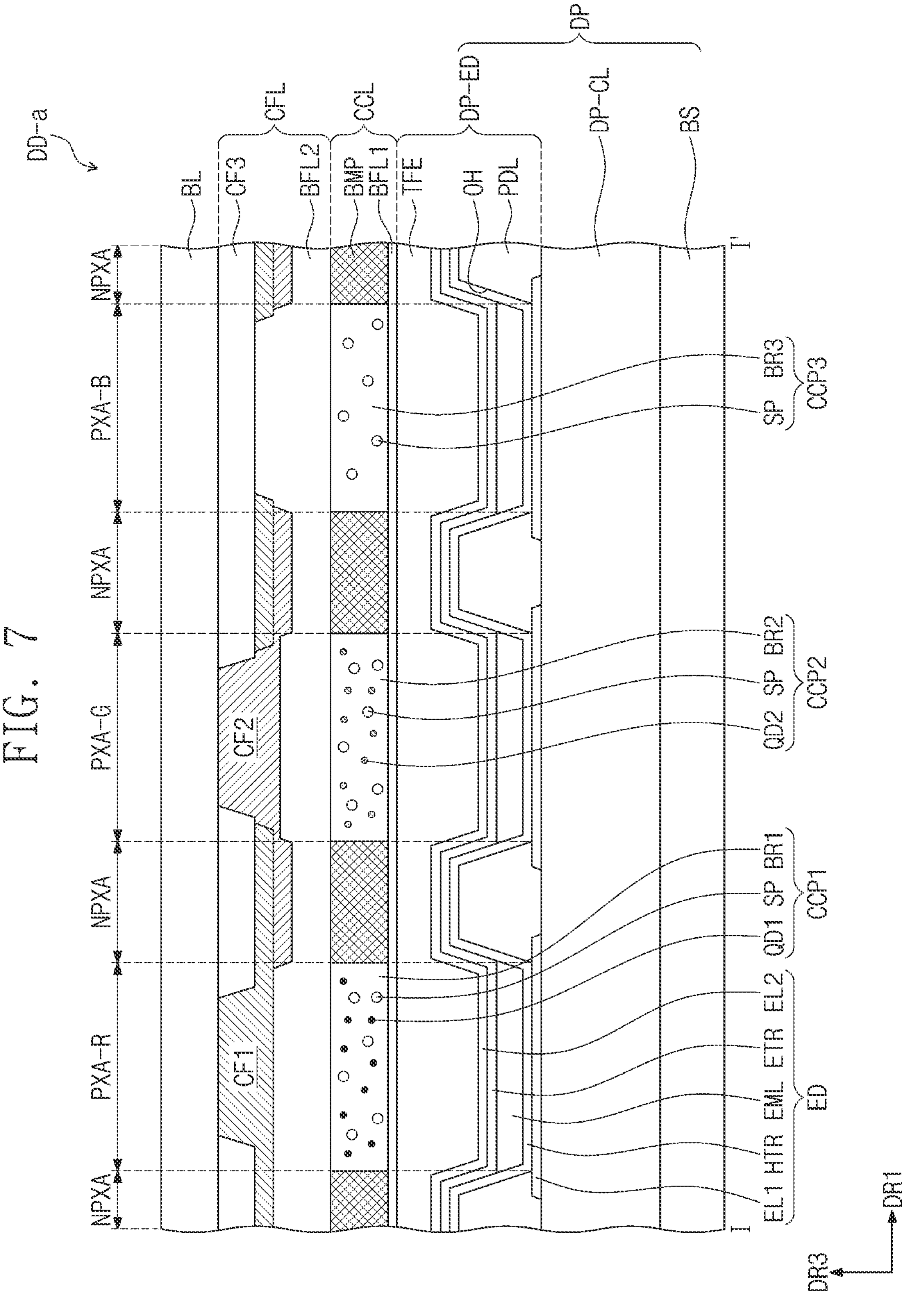
FIG. 7 is a schematic cross-sectional view of a display device according to an embodiment.

Referring to FIG. 7, a display device DD-a according to an embodiment may include a display panel DP including a display element layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display element layer DP-ED, and the display element layer DP-ED may include a light emitting element ED.

The light emitting element ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The light emitting element ED shown in FIG. 7 may include a fused polycyclic compound according to an embodiment. Accordingly, the light emitting element ED may show high efficiency and long-life characteristics. In embodiments, a structure of the light emitting element ED shown in FIG. 7 may be the same as a structure of a light emitting element ED according to one of FIG. 3 to FIG. 6 as described above.

Referring to FIG. 7, the emission layer EML may be disposed in an opening OH defined in a pixel definition layer PDL. For example, the emission layer EML, which is separated by the pixel definition layer PDL and correspondingly provided to each of the luminous areas PXA-R, PXA-G, and PXA-B, may emit light in a same wavelength region. In the display device DD-a, the emission layer EML may emit blue light. Although not shown in the drawings, in an embodiment, the emission layer EML may be provided as a common layer for each of the luminous areas PXA-R, PXA-G, and PXA-B.

The light controlling layer CCL may be disposed on the display panel DP. The light controlling layer CCL may include a light converter. The light converter may be a quantum dot or a phosphor. The light converter may convert the wavelength of a provided light and emit the resulting light. For example, the light controlling layer CCL may be a layer including a quantum dot or a layer including a phosphor.

The light controlling layer CCL may include light controlling parts CCP1, CCP2, and CCP3. The light controlling parts CCP1, CCP2, and CCP3 may be spaced apart from one another.

Referring to FIG. 7, a partition pattern BMP may be disposed between the light controlling parts CCP1, CCP2, and CCP3, which are spaced apart from each other, but embodiments are not limited thereto. In FIG. 7, it is shown that the partition pattern BMP does not overlap the light controlling parts CCP1, CCP2, and CCP3, but the edges of the light controlling parts CCP1, CCP2, and CCP3 may overlap at least a portion of the partition pattern BMP.

The light controlling layer CCL may include a first light controlling part CCP1 including a first quantum dot QD1 that converts first color light provided from the light emitting element ED into second color light, a second light controlling part CCP2 including a second quantum dot QD2 that converts first color light into third color light, and a third light controlling part CCP3 that transmits first color light.

In an embodiment, the first light controlling part CCP1 may provide red light, which is the second color light, and the second light controlling part CCP2 may provide green light, which is the third color light. The third light controlling part CCP3 may transmit and provide blue light, which is the first color light provided from the light emitting element ED. For example, the first quantum dot QD1 may be a red quantum dot, and the second quantum dot QD2 may be a green quantum dot. The quantum dots QD1 and QD2 may each be a quantum dot as described above.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include one of $TiO_2$, ZnO, $Al_2O_3$, $SiO_2$, or hollow silica, or may be a mixture of two or more materials selected from $TiO_2$, ZnO, $Al_2O_3$, $SiO_2$, and hollow silica.

The first light controlling part CCP1, the second light controlling part CCP2, and the third light controlling part CCP3 may each include base resins BR1, BR2, and BR3, in which the quantum dots QD1 and QD2 and the scatterer SP are dispersed. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer SP dispersed in the third base resin BR3.

The base resins BR1, BR2, and BR3 are mediums in which the quantum dots QD1 and QD2 and the scatterer SP are dispersed, and may include various resin compositions which may be generally referred to as a binder. For example, the base resins BR1, BR2, and BR3 may be acrylic resins, urethane-based resins, silicone-based resins, epoxy-based resins, etc. The base resins BR1, BR2, and BR3 may each be a transparent resin. In an embodiment, the first base resin BR1, the second base resin BR2, and the third base resin BR3 may be the same as or different from each other.

The light controlling layer CCL may include a barrier layer BFL1. The barrier layer BFL1 may block the penetration of moisture and/or oxygen (hereinafter, will be referred to as "humidity/oxygen"). The barrier layer BFL1 may block the light controlling parts CCP1, CCP2, and CCP3 from exposure to humidity/oxygen. The barrier layer BFL1 may cover the light controlling parts CCP1, CCP2, and CCP3. The color filter layer CFL may further include a barrier layer BFL2.

The barrier layers BFL1 and BFL2 may each independently include at least one inorganic layer. For example, the barrier layers BFL1 and BFL2 may each independently include an inorganic material. For example, the barrier layers BFL1 and BFL2 may each independently include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film securing light transmittance. The barrier layers BFL1 and BFL2 may each independently further include an organic layer. The barrier layers BFL1 and BFL2 may each be formed of a single layer or of multiple layers.

In the display device DD-a, the color filter layer CFL may be disposed on the light controlling layer CCL. In an embodiment, the color filter layer CFL may be disposed directly on the light controlling layer CCL. For example, the barrier layer BFL2 may be omitted.

The color filter layer CFL may include filters CF1, CF2, and CF3. The color filter layer CFL may include a first filter CF1 that transmits second color light, a second filter CF2 that transmits third color light, and a third filter CF3 that transmits first color light. The first to third filters CF1, CF2, and CF3 may be disposed to respectively correspond to the red luminous area PXA-R, the green luminous area PXA-G, and the blue luminous area PXA-B.

For example, the first filter CF1 may be a red filter, the second filter CF2 may be a green filter, and the third filter CF3 may be a blue filter. The filters CF1, CF2, and CF3 may each include a polymeric photosensitive resin and a pigment or dye. The first filter CF1 may include a red pigment or dye, the second filter CF2 may include a green pigment or dye, and the third filter CF3 may include a blue pigment or dye.

However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may be provided as one body, without distinction.

Although not shown in the drawings, the color filter layer CFL may further include a light blocking part (not shown). The light blocking part (not shown) may be a black matrix. The light blocking part (not shown) may include an organic light blocking material or an inorganic light blocking material, each including a black pigment or black dye. The light blocking part (not shown) may prevent light leakage, and may separate the boundaries between adjacent filters CF1, CF2, and CF3.

A base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

Figure 8:
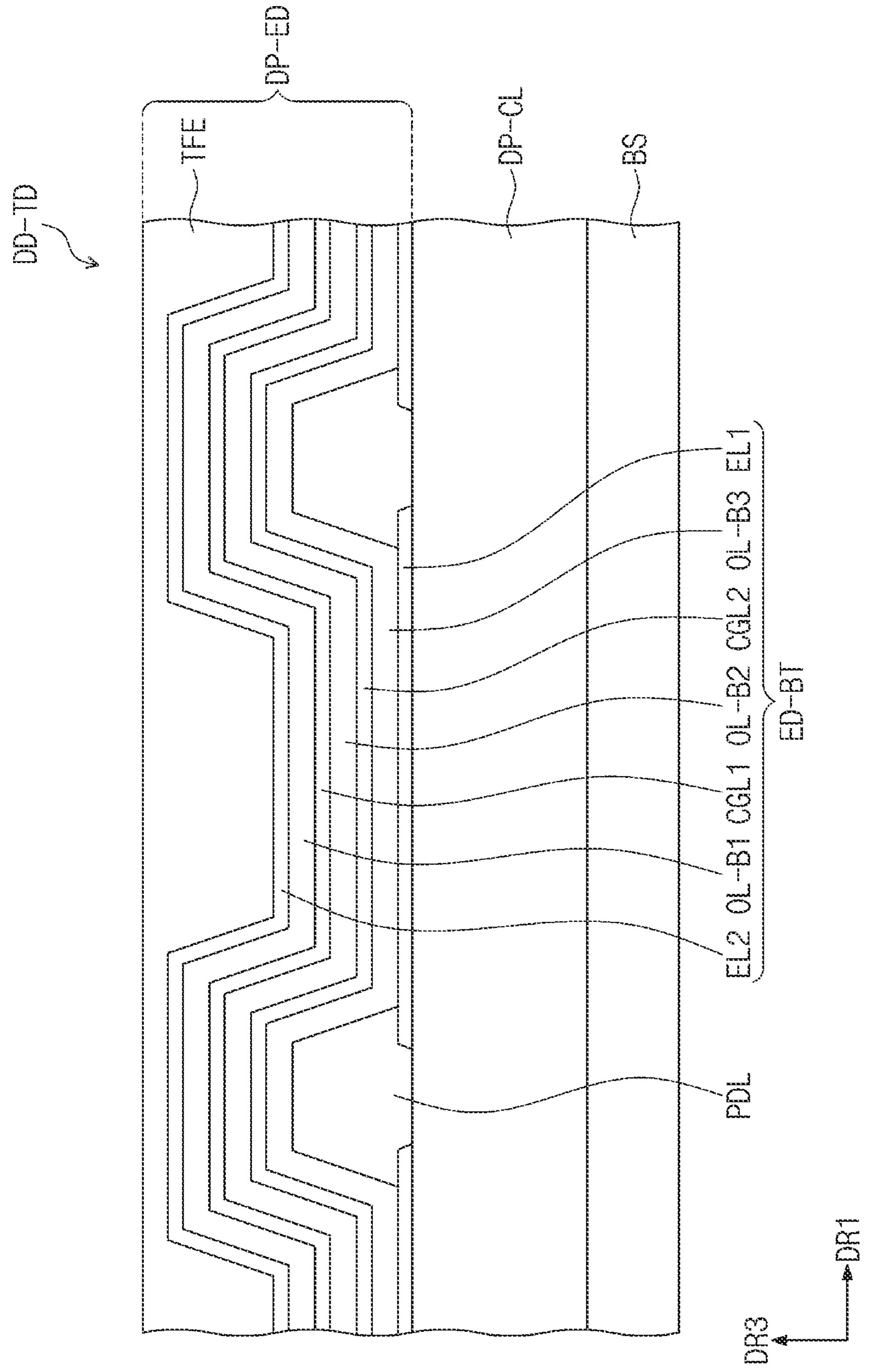
FIG. 8 is a schematic cross-sectional view of a display device according to an embodiment.

FIG. 8 is a schematic cross-sectional view of a part of a display device according to an embodiment. FIG. 8 shows an embodiment of a part corresponding to the display panel DP in FIG. 7. In a display device DD-TD according to an embodiment, the light emitting element ED-BT may include light emitting structures OL-B1, OL-B2, and OL-B3. The light emitting element ED-BT may include a first electrode EL1 and a second electrode EL2 which face each other, and the light emitting structures OL-B1, OL-B2, and OL-B3, which are stacked in a thickness direction between the first electrode ELI and the second electrode EL2. At least one of the light emitting structures OL-B1, OL-B2, and OL-B3 may include the fused polycyclic compound according to an embodiment. Accordingly, the light emitting element ED-BT may show high efficiency and long-life characteristics.

The light emitting structures OL-B1, OL-B2, and OL-B3 may each include an emission layer EML (FIG. 7), and a hole transport region HTR and an electron transport region ETR disposed with the emission layer EML (FIG. 7) therebetween. Thus, the light emitting element ED-BT included in the display device DD-TD may be a light emitting element having a tandem structure and including multiple emission layers.

In an embodiment shown in FIG. 8, light emitted from the light emitting structures OL-B1, OL-B2, and OL-B3 may each be blue light. However, embodiments are not limited thereto, and the light emitted from the light emitting structures OL-B1, OL-B2, and OL-B3 may have wavelength regions that are different from each other. For example, the light emitting element ED-BT that includes the light emitting structures OL-B1, OL-B2, and OL-B3, which emit light in different wavelength regions, may emit white light.

Charge generating layers CGL1 and CGL2 may each be disposed between neighboring structures among the light emitting structures OL-B1, OL-B2, and OL-B3. Charge generating layers CGL1 and CGL2 may each independently include a p-type charge generating layer and/or an n-type charge generating layer.

Figure 9:
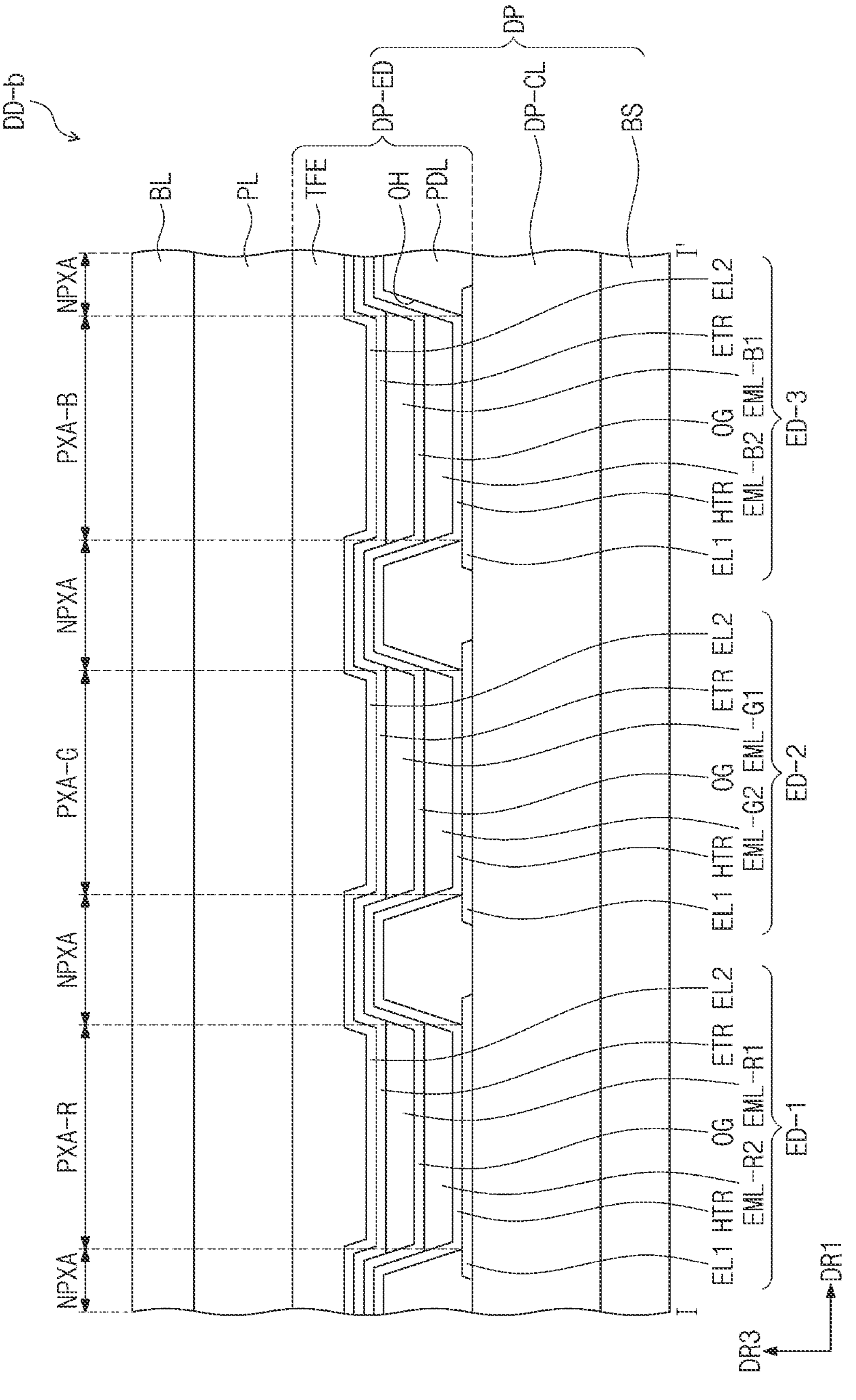
FIG. 9 is a schematic cross-sectional view of a display device according to an embodiment.

Referring to FIG. 9, a display device DD-b according to an embodiment may include light emitting elements ED-1, ED-2, and ED-3, which each include two emission layers that are stacked. In comparison to the display device DD shown in FIG. 2, the embodiment shown in FIG. 9 is different at least in that the first to third light emitting elements ED-1, ED-2, and ED-3 each include two emission layers that are stacked in a thickness direction. In each of the first to third light emitting elements ED-1, ED-2, and ED-3, the two emission layers may emit light in a same wavelength region. At least one of the first to third light emitting elements ED-1, ED-2, and ED-3 shown in FIG. 9 may include the fused polycyclic compound according to an embodiment and may show high efficiency and long-life characteristics.

The first light emitting element ED-1 may include a first red emission layer EML-$R_1$ and a second red emission layer EML-$R_2$. The second light emitting element ED-2 may include a first green emission layer EML-G1 and a second green emission layer EML-G2. The third light emitting element ED-3 may include a first blue emission layer EML-B1 and a second blue emission layer EML-B2. An emission auxiliary part OG may be disposed between the first red emission layer EML-$R_1$ and the second red emission layer EML-$R_2$, between the first green emission layer EML-G1 and the second green emission layer EML-G2, and between the first blue emission layer EML-B1 and the second blue emission layer EML-B2.

The emission auxiliary part OG may be a single layer or a multilayer. The emission auxiliary part OG may include a charge generating layer. For example, the emission auxiliary part OG may include an electron transport region (not shown), a charge generating layer (not shown), and a hole transport region (not shown), which may be stacked in that order. The emission auxiliary part OG may be provided as a common layer for all of the first to third light emitting elements ED-1, ED-2, and ED-3. However, embodiments are not limited thereto, and the emission auxiliary part OG may be provided by being patterned in the openings OH defined in the pixel definition layer PDL.

The first red emission layer EML-$R_1$, the first green emission layer EML-G1, and the first blue emission layer EML-B1 may each be disposed between the emission auxiliary part OG and the electron transport region ETR. The second red emission layer EML-$R_2$, the second green emission layer EML-G2, and the second blue emission layer EML-B2 may each be disposed between the hole transport region HTR and the emission auxiliary part OG.

For example, the first light emitting element ED-1 may include the first electrode ELI, the hole transport region HTR, the second red emission layer EML-$R_2$, the emission auxiliary part OG, the first red emission layer EML-$R_1$, the electron transport region ETR, and the second electrode EL2, which are stacked in that order. The second light emitting element ED-2 may include the first electrode ELI, the hole transport region HTR, the second green emission layer EML-G2, the emission auxiliary part OG, the first green emission layer EML-G1, the electron transport region ETR, and the second electrode EL2, which are stacked in that order. The third light emitting element ED-3 may include the first electrode EL1, the hole transport region HTR, the second blue emission layer EML-B2, the emission auxiliary part OG, the first blue emission layer EML-B1, the electron transport region ETR, and the second electrode EL2, which are stacked in that order.

An optical auxiliary layer PL may be disposed on a display element layer DP-ED. The optical auxiliary layer PL may include a polarization layer. The optical auxiliary layer PL may be disposed on a display panel DP and may control light that is reflected light at the display panel DP from an external light. Although not shown in the drawings, in an embodiment, the optical auxiliary layer PL may be omitted from the display device DD-b.

Figure 10:
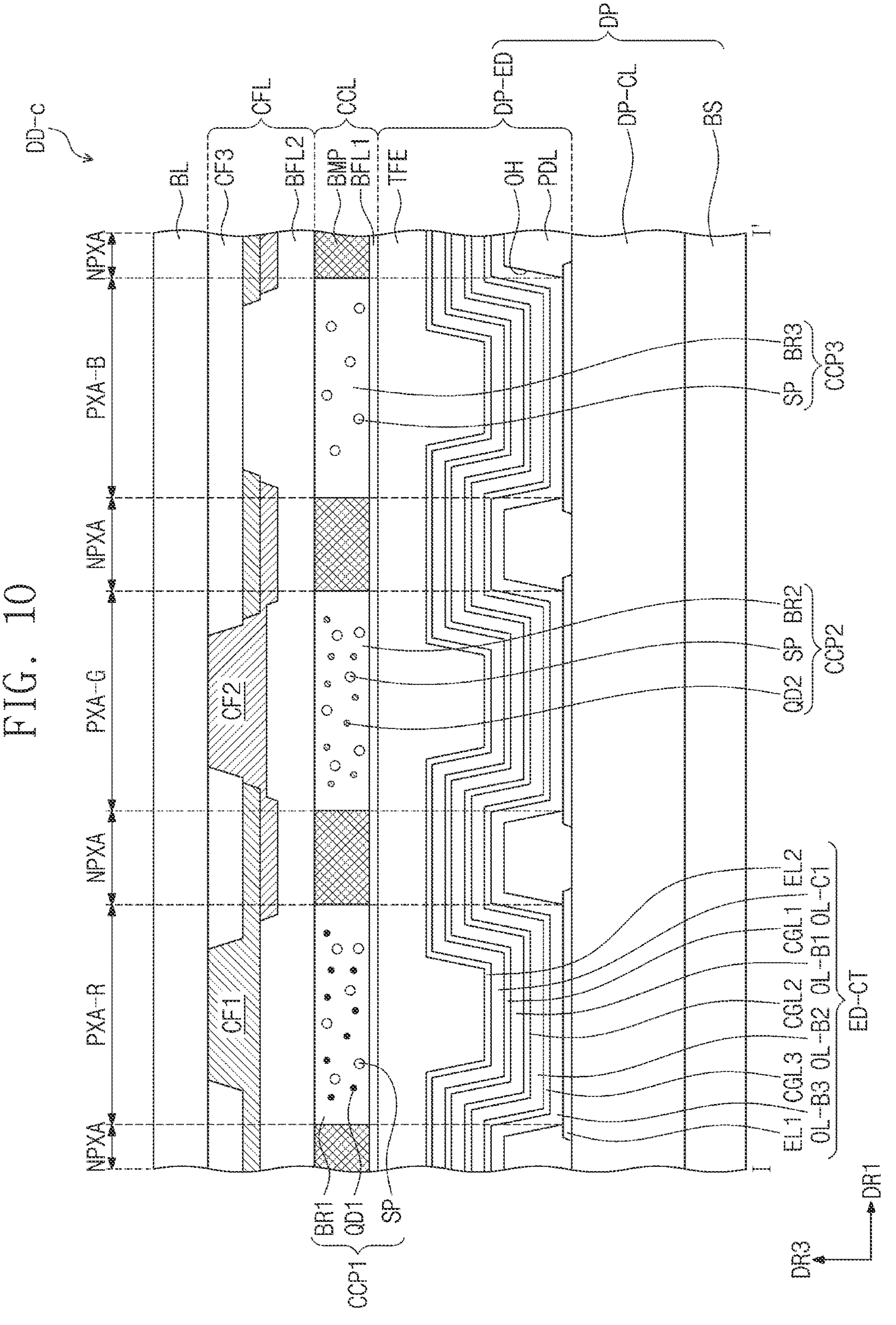
FIG. 10 is a schematic cross-sectional view of a display device according to an embodiment.

In contrast to FIG. 8 and FIG. 9, FIG. 10 shows a display device DD-c that is different at least in that it includes four light emitting structures OL-B1, OL-B2, OL-B3, and OL-C1. A light emitting element ED-CT may include a first electrode EL1 and a second electrode EL2 which face each other, and first to fourth light emitting structures OL-B1, OL-B2, OL-B3, and OL-C1 that are stacked in a thickness direction between the first electrode EL1 and the second electrode EL2. At least one of the first to fourth light emitting structures OL-B1, OL-B2, OL-B3, and OL-C1 may include the fused polycyclic compound according to an embodiment. Accordingly, the light emitting element ED-CT may show high efficiency and long-life characteristics.

Among the four light emitting structures, the first to third light emitting structures OL-B1, OL-B2, and OL-B3 may each emit blue light, and the fourth light emitting structure OL-C1 may emit green light. However, embodiments are not limited thereto, and the first to fourth light emitting structures OL-B1, OL-B2, OL-B3, and OL-C1 may emit light having different wavelengths from each other.

Charge generating layers CGL1, CGL2, and CGL3 may be disposed between neighboring light emitting structures among the first to fourth light emitting structures OL-B1, OL-B2, OL-B3, and OL-C1. Charge generating layers CGL1, CGL2, and CGL3 may each independently include a p-type charge generating layer and/or an n-type charge generating layer.

Figure 11:
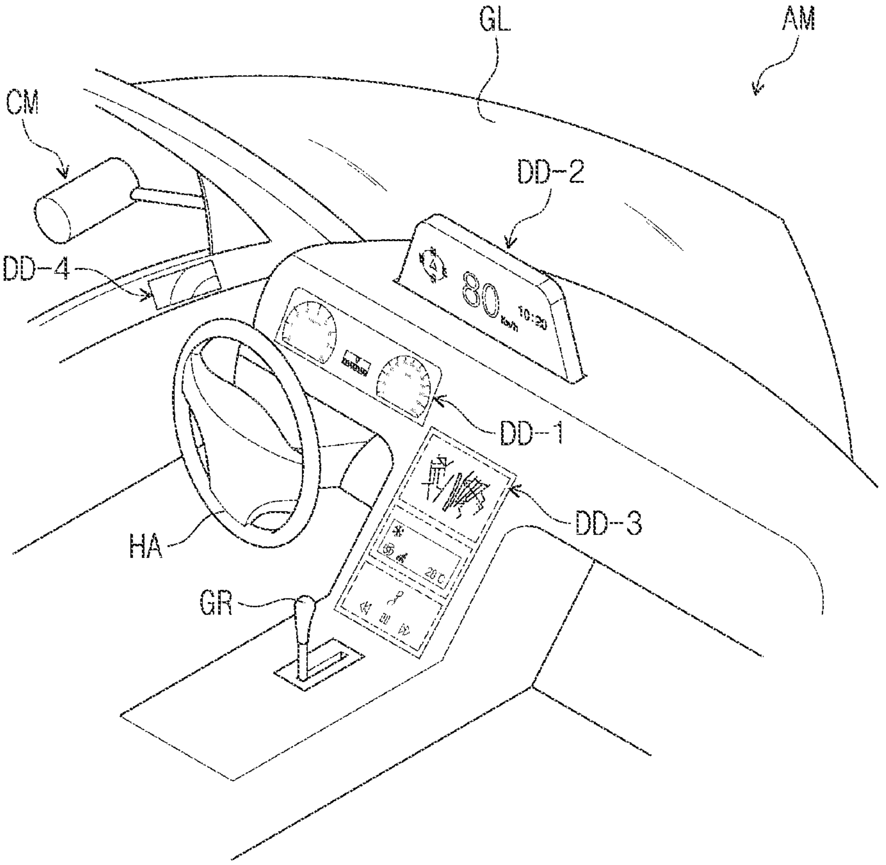
FIG. 11 is a schematic diagram of an interior of a vehicle in which display devices are disposed, according to an embodiment.

FIG. 11 is a schematic diagram of a vehicle AM in which first to fourth display devices DD-1, DD-2, DD-3, and DD-4 are disposed. At least one of the first to fourth display devices DD-1, DD-2, DD-3, and DD-4 may have a structure according to one of the display devices DD, DD-TD, DD-a, DD-b, and DD-c, as explained with reference to FIGS. 1, 2, and 7 to 10.

In FIG. 11, a vehicle AM is shown as an automobile, but this is only an example, and the first to fourth display devices DD-1, DD-2, DD-3, and DD-4 may be disposed in various other transportation means such as bicycles, motorcycles, trains, ships, and airplanes. In an embodiment, at least one of the first to fourth display devices DD-1, DD-2, DD-3, and DD-4 may have a structure according to one of the display devices DD, DD-TD, DD-a, DD-b, and DD-c, and may be employed in personal computers, laptop computers, personal digital terminals, game consoles, portable electronic devices, televisions, monitors, external billboards, or the like. However, these are merely presented as examples, and at least one of the first to fourth display devices DD-1, DD-2, DD-3, and DD-4 may be employed in other electronic equipment.

At least one of the first to fourth display devices DD-1, DD-2, DD-3, and DD-4 may each independently include a light emitting element ED according to an embodiment as described in reference to FIG. 3 to FIG. 6. The light emitting element ED may include the fused polycyclic compound according to an embodiment. At least one of the first to fourth display devices DD-1, DD-2, DD-3, and DD-4 may include a light emitting element ED including the fused polycyclic compound according to an embodiment, thereby showing improved display efficiency and display lifetime.

Referring to FIG. 11, the vehicle AM may include a steering wheel HA and a gearshift GR for the operation of the vehicle AM, and a front window GL that is disposed so as to face a driver.

A first display device DD-1 may be disposed in a first region that overlaps the steering wheel HA. For example, the first display device DD-1 may be a digital cluster that displays first information of the vehicle AM. The first information may include a first scale that indicates a driving speed of the vehicle AM, a second scale that indicates an engine speed (for example, revolutions per minute (RPM)), and images showing a fuel level. The first scale and the second scale may each be represented by digital images.

A second display device DD-2 may be disposed in a second region facing a driver's seat and overlapping the front window GL. The driver's seat may be a seat where the steering wheel HA is disposed. For example, the second display device DD-2 may be a head up display (HUD) that shows second information of the vehicle AM. The second display device DD-2 may be optically transparent. The second information may include digital numbers that indicates a driving speed of the vehicle AM and may further include information, such as the current time. Although not shown in the drawings, in an embodiment, the second information of the second display device DD-2 may be projected and displayed on the front window GL.

A third display device DD-3 may be disposed in a third region that is adjacent to the gearshift GR. For example, the third display device DD-3 may be a center information display (CID) for an automobile which shows third information and may be disposed between a driver's seat and a passenger seat. The passenger seat may be a seat that is spaced apart from the driver's seat, with the gearshift GR disposed therebetween. The third information may include information on road conditions (for example, navigation information), on music or radio that is playing, on a dynamic or still image this is displayed, on a temperature in the vehicle AM, or the like.

A fourth display device DD-4 may be disposed in a fourth region that is spaced apart from the steering wheel HA and the gearshift GR and is adjacent to a side of the vehicle AM. For example, the fourth display device DD-4 may be a digital side-view mirror that shows fourth information. The fourth display device DD-4 may display an image of the exterior of the vehicle AM, which may be taken by a camera module CM disposed outside the vehicle AM.

The fourth information may include an external image of the vehicle AM.

The first to fourth information as described above are only presented as examples, and the first to fourth display devices DD-1, DD-2, DD-3, and DD-4 may further display information about the interior and exterior of the vehicle AM. The first to fourth information may include information that is different from each other. However, embodiments are not limited thereto, and a portion of the first to fourth information may include a same information.

Hereinafter, a fused polycyclic compound according to an embodiment and a light emitting element according to an embodiment will be explained with reference to the Examples and the Comparative Examples. The Examples explained below are only provided as illustrations to assist in understanding the disclosure, and the scope thereof is not limited thereto.

Examples

1. Synthesis of Fused Polycyclic Compounds

A synthesis method of the fused polycyclic compound according to an embodiment will be explained by illustrating the synthesis methods of Compounds 19, 16, 32, and 38. The synthesis methods of the fused polycyclic compounds as explained below are provided only as examples, and the synthesis methods of the fused polycyclic compound according to an embodiment is not limited to the Examples below.

(1) Synthesis of Compound 19

[Synthesis scheme of Compound 19]

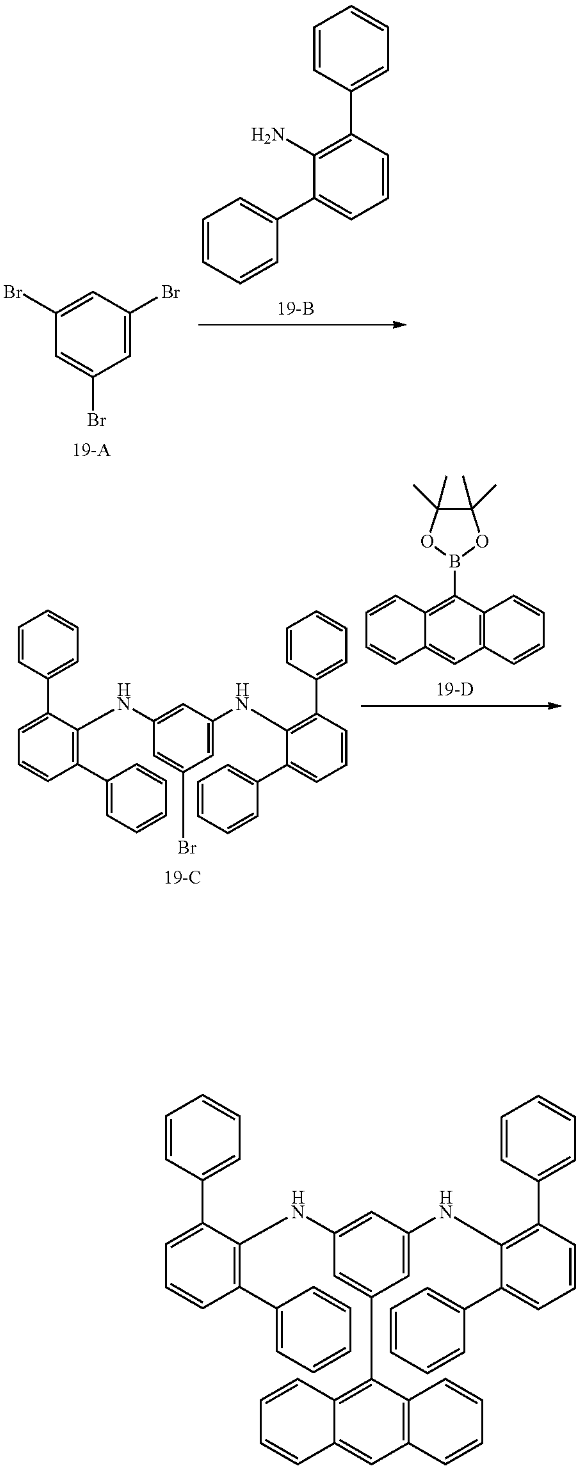

19-A
19-B
19-C
19-D
19-E

-continued
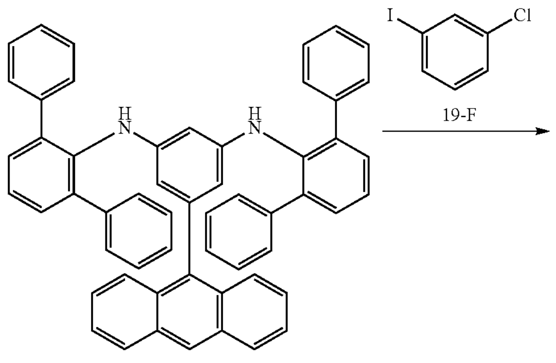
19-E
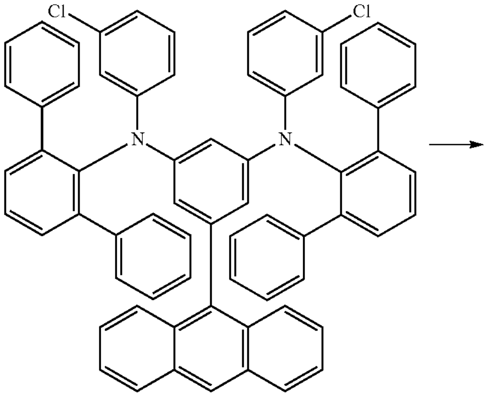
19-G
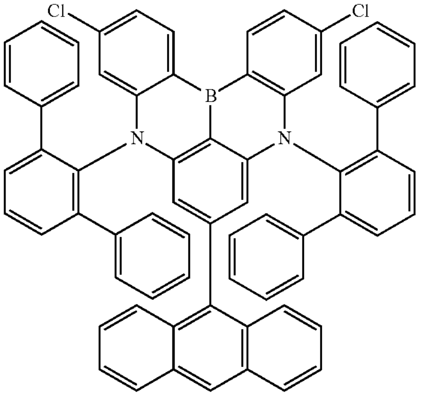
19-H
-continued
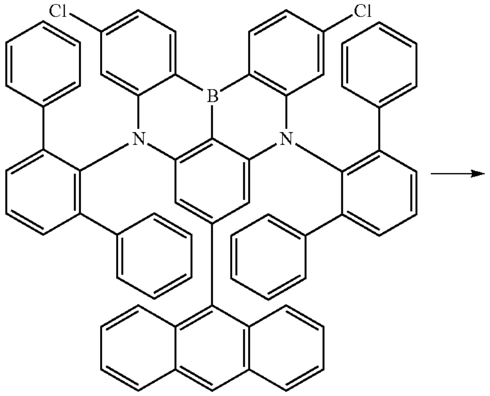
19-H
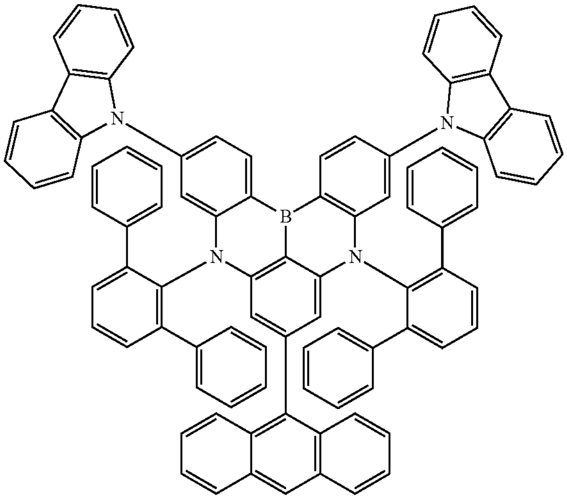
19
Compound 19 according to an embodiment may be synthesized by, for example, the steps of Reactions 1 to 5.
[Reaction 1]
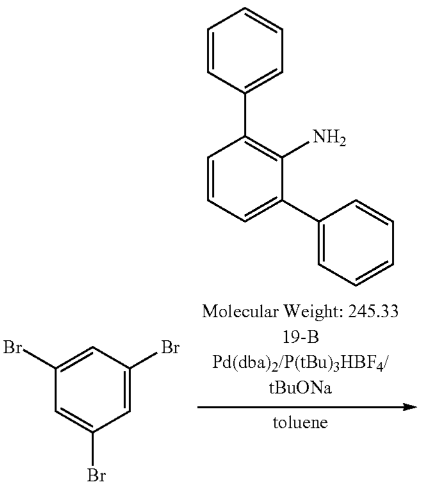
Molecular Weight:
314.80
19-A -continued

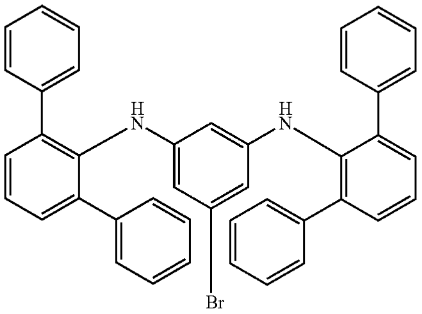

Molecular Weight: 643.61
19-C

Raw Material 19-A (20.0 g, 68.4 mmol), Raw Material 19-B (41.3 g, 137 mmol), $Pd(dba)_2$ (3.93 g, 6.84 mmol), $P(tBu)_3HBF_4$ (0.99 g, 3.42 mmol), and tBuONa (6.57 g, 68.4 mmol) were added to 925 ml of toluene, and heated and stirred at about 110° C. for about 6 hours. Water was added to the reaction solution, celite filtration and layer separation were performed, and an organic layer was concentrated. Through purification using silica gel column chromatography, Compound 19-C was obtained.

[Reaction 2]

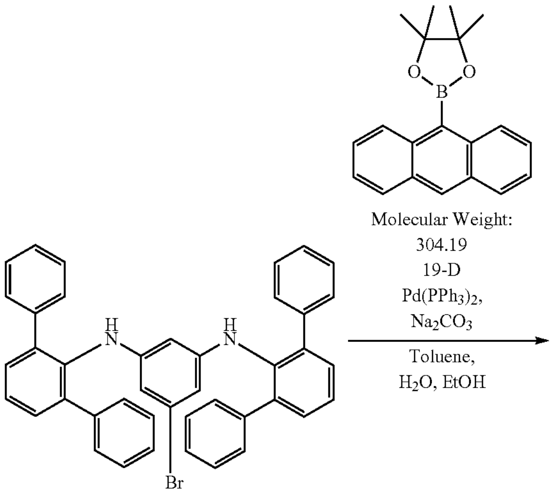

Molecular Weight: 643.61
19-C

-continued

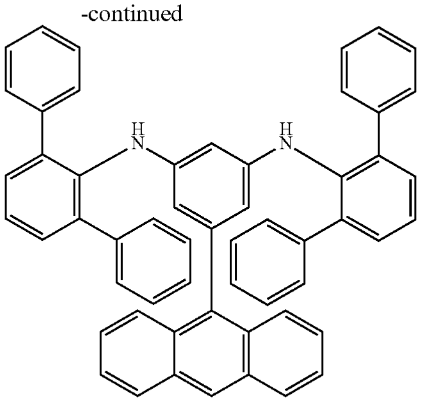

Molecular Weight: 740.93
19-E

Raw Material 19-C (10.0 g, 15.5 mmol), Raw Material 19-D (4.72 g, 15.5 mmol), $Pd(PPh_3)_2$ (0.36 g, 0.31 mmol), and $Na_2CO_3$ (4.93 g, 46.5 mmol) were added to 500 ml of toluene, 250 ml of water and 125 ml of EtOH, and heated and stirred at about 110° C. for about 6 hours. Water was added to the reaction solution, celite filtration and layer separation were performed, and an organic layer was concentrated. Through purification using silica gel column chromatography, Compound 19-E was obtained.

[Reaction 3]

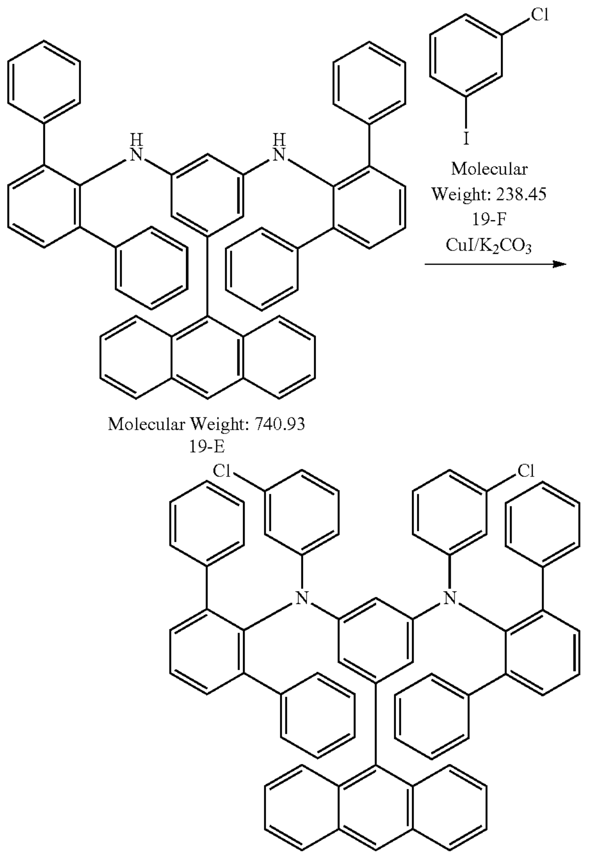

Molecular Weight: 962.01
19-G

Compound 19-E (15.0 g, 20.5 mmol), Raw Material 19-F (24.6 g, 103 mmol), CuI (3.90 g, 20.5 mmol), and $K_2CO_3$ (14.2 g, 103 mmol) were added, and heated and stirred at about 180° C. for about 12 hours. Water was added to the reaction solution, celite filtration and layer separation were performed, and an organic layer was concentrated. Through purification using silica gel column chromatography, Compound 19-G was obtained.

[Reaction 4]

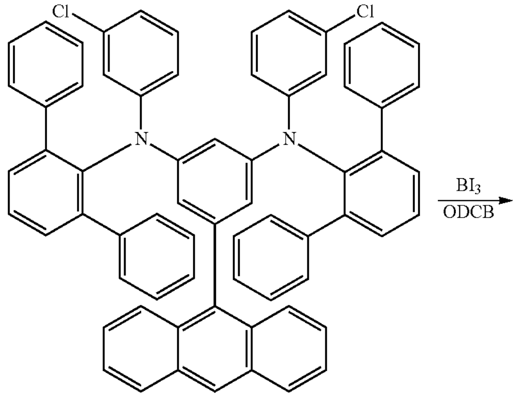

Molecular Weight: 962.01
19-G

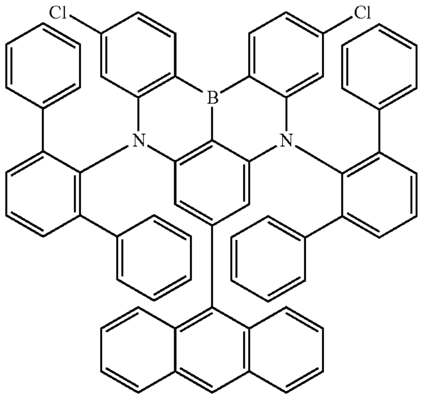

Molecular Weight: 969.80
19-H

Compound 19-G (20.0 g, 21 mmol), $BI_3$ (16.4 g, 42 mmol), and 80 ml of ODCB were added, and heated and stirred at about 160° C. for about 12 hours. Water was added to the reaction solution, celite filtration and layer separation were performed, and an organic layer was concentrated. Through purification using silica gel column chromatography, Compound 19-H was obtained.

[Reaction 5]

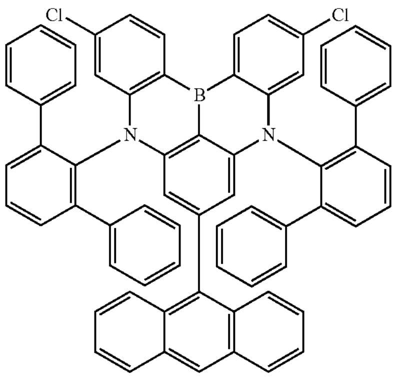

Molecular Weight: 969.80
19-H

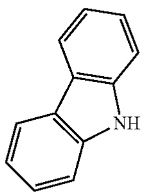

Molecular Weight:
167.21
19-I
Pd(dba)2/
P(tBu)3HBF4/
tBuONa
toluene

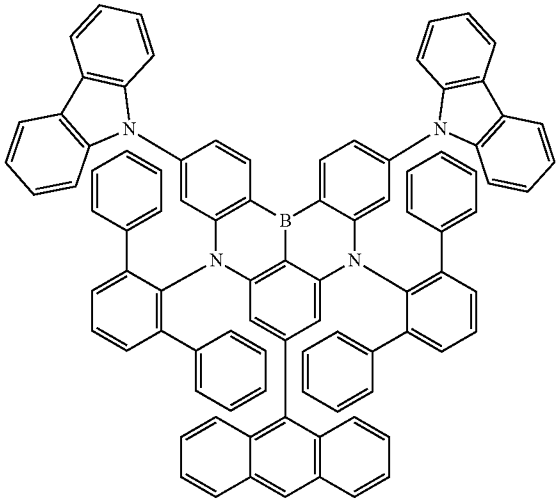

Molecular Weight: 1231.29
19

Compound 19-H (2.00 g, 2.08 mmol), Raw Material 19-I (1.12 g, 4.16 mmol), $Pd(dba)_2$ (0.12 g, 0.21 mmol), $P(tBu)_3HBF_4$ (0.03 g, 0.11 mmol), and tBuONa (0.40 g, 4.16 mmol) were added to 92 ml of toluene, and heated and stirred at about 110° C. for about 6 hours. Water was added to the reaction solution, celite filtration and layer separation were performed, and an organic layer was concentrated. Through purification using silica gel column chromatography, Compound 19 was obtained.

(2) Synthesis of Compound 16
[Synthesis scheme of Compound 16]
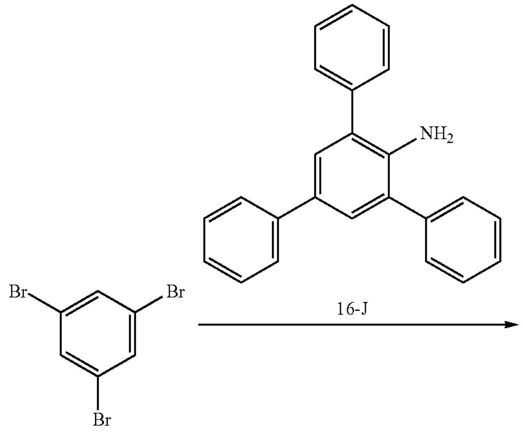
16-I
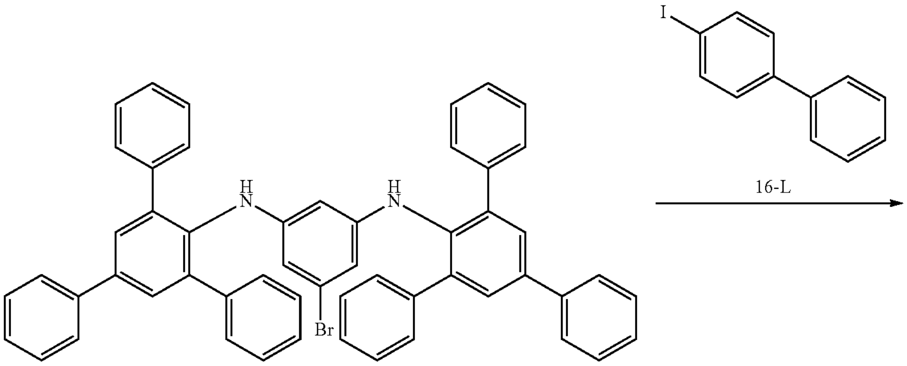
16-K
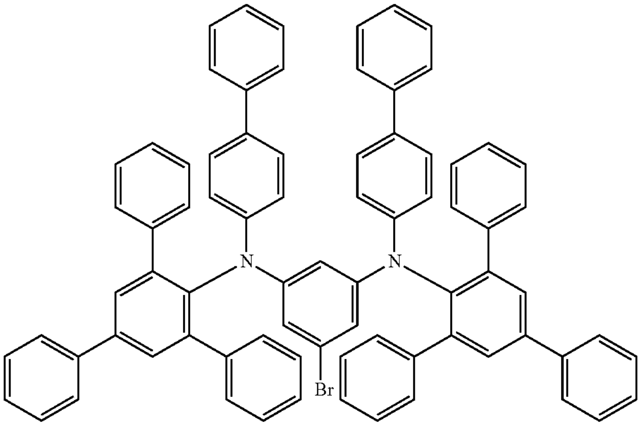
16-M -continued
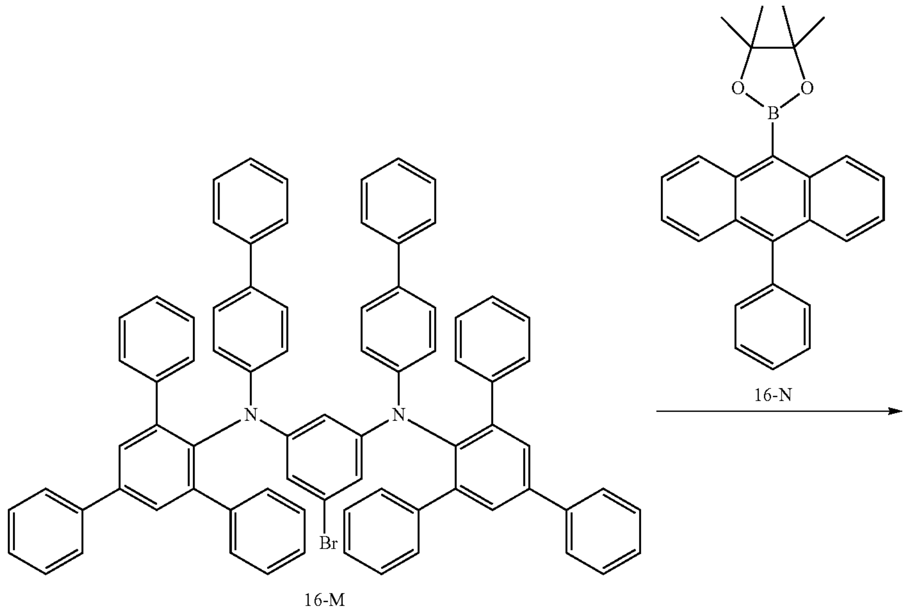
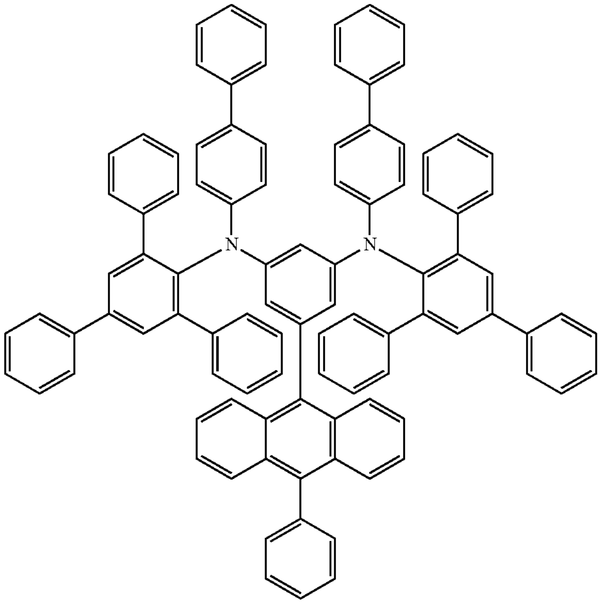
16-O -continued
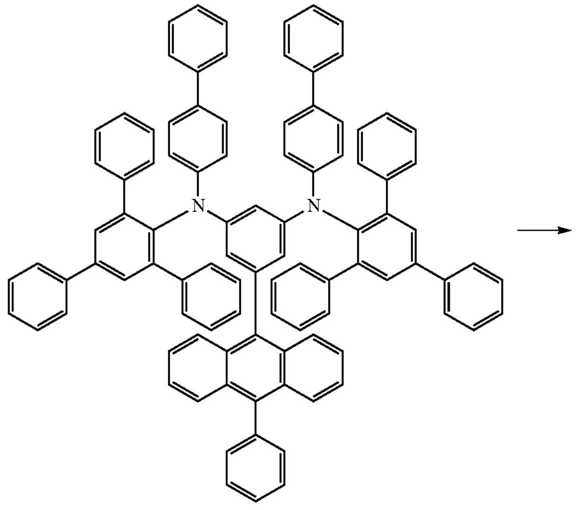
16-O
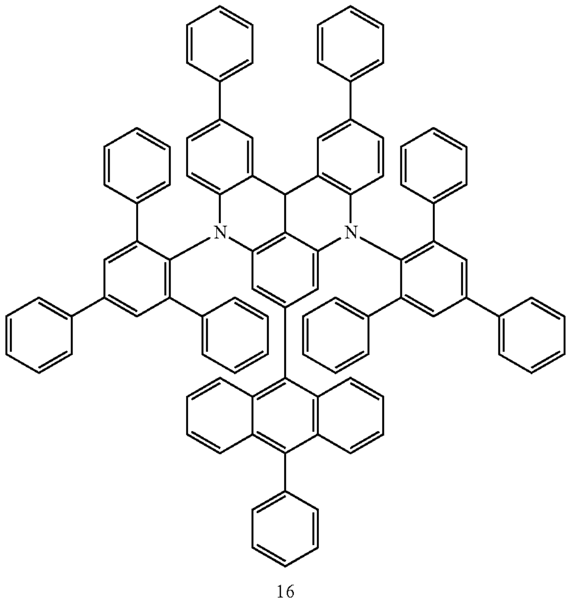
16

Compound 16 according to an embodiment may be synthesized by, for example, the steps of Reactions 6 to 9.
[Reaction 6]
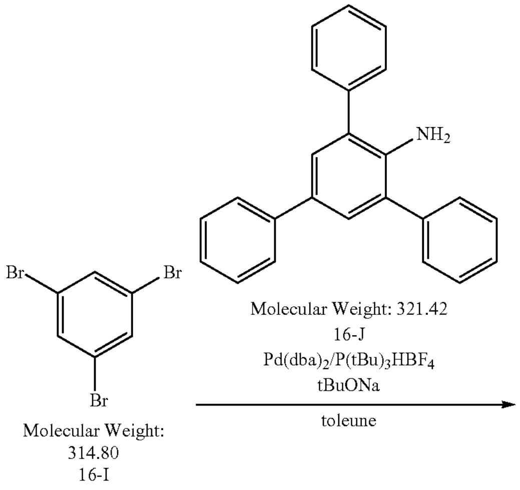
-continued
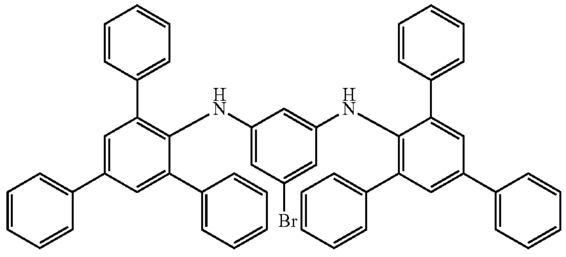
Molecular Weight: 795.80
16-K
Synthesis was performed under the same conditions as Reaction 1 to obtain Compound 16-K.
[Reaction 7]
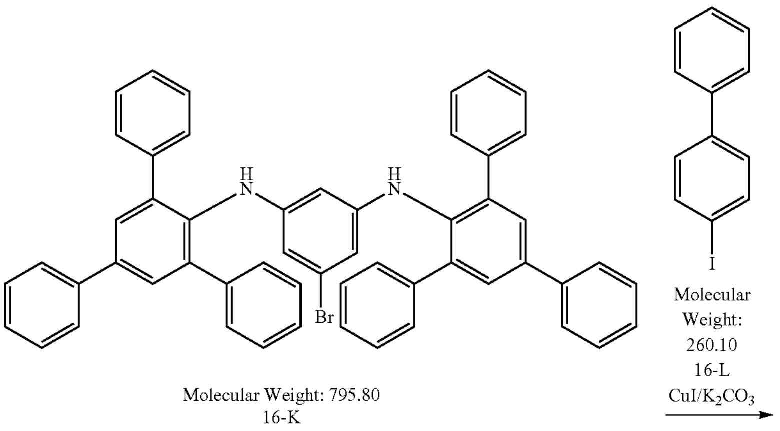
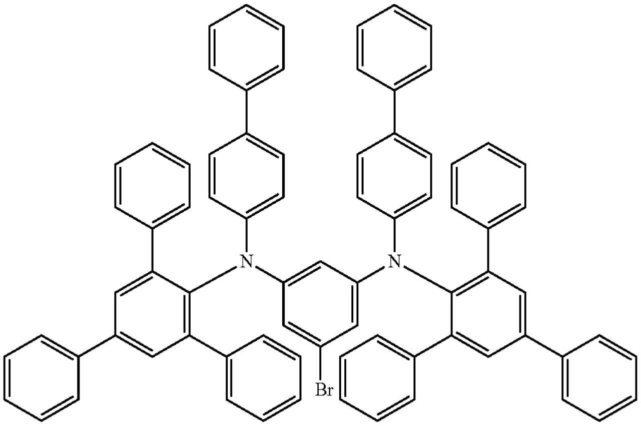
Molecular Weight: 1100.19
16-M Synthesis was performed under the same conditions as Reaction 3 to obtain Compound 16-M.
[Reaction 8]
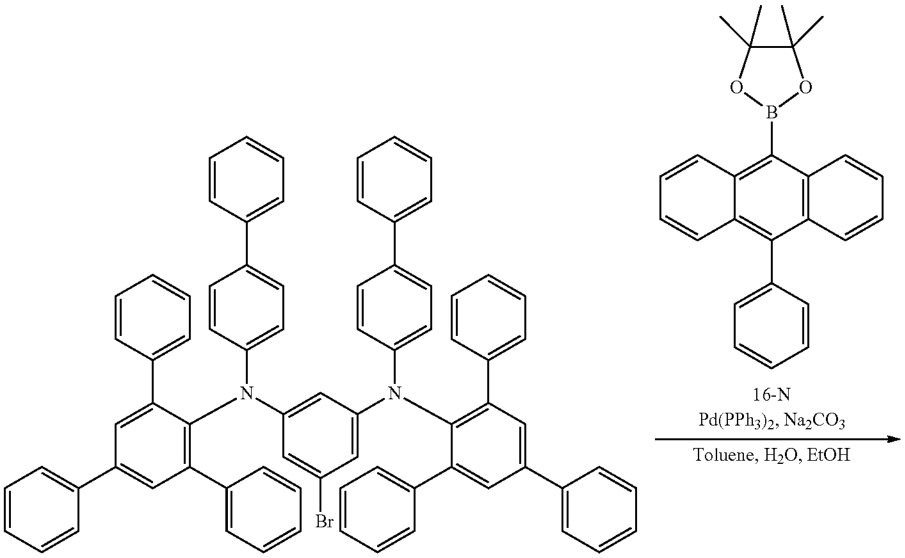
Molecular Weight: 1100.19
16-M
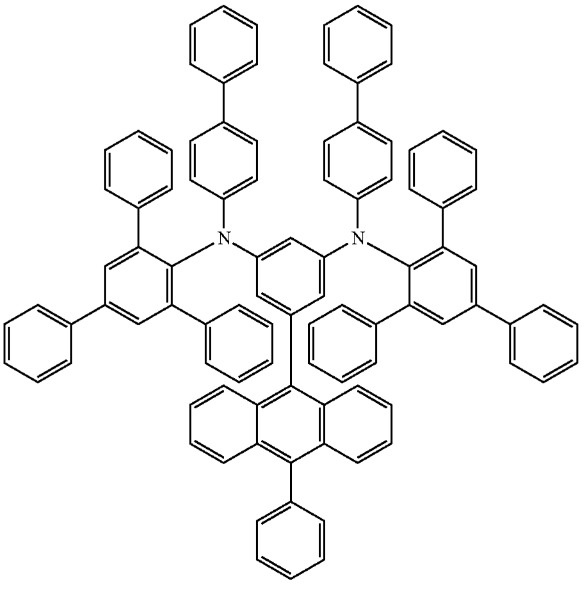
Molecular Weight: 1273.60
16-O Synthesis was performed under the same conditions as Reaction 2 to obtain Compound 16-O.
[Reaction 9]
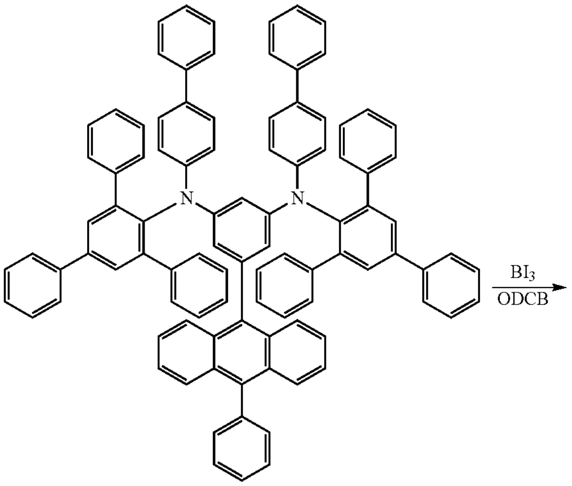
Molecular Weight: 1273.60
16-O
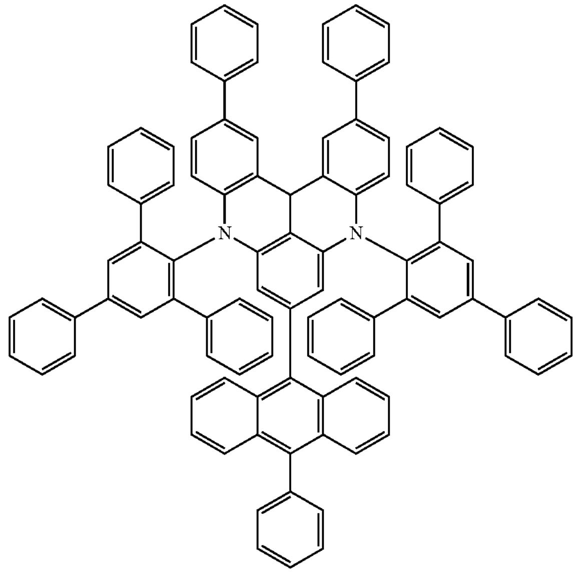
Molecular Weight: 1281.39
16
Synthesis was performed under the same conditions as Reaction 4 to obtain Compound 16.
(3) Synthesis of Compound 32
[Synthesis scheme of Compound 32]
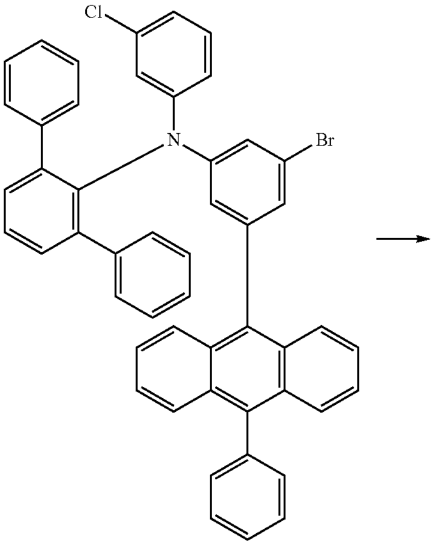
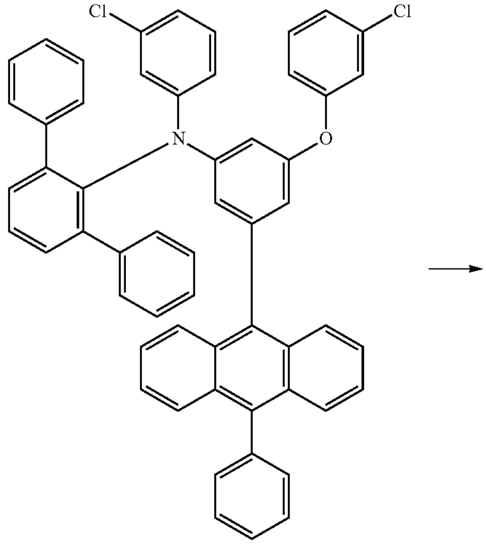

-continued
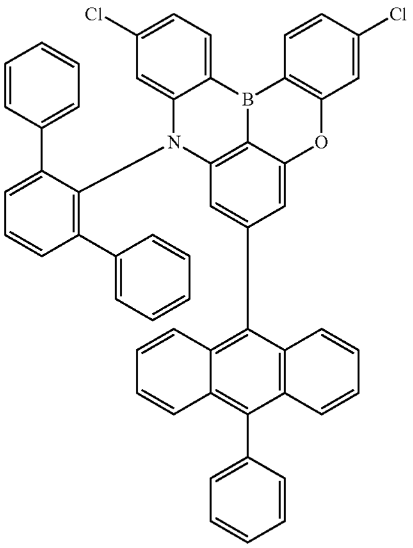
-continued
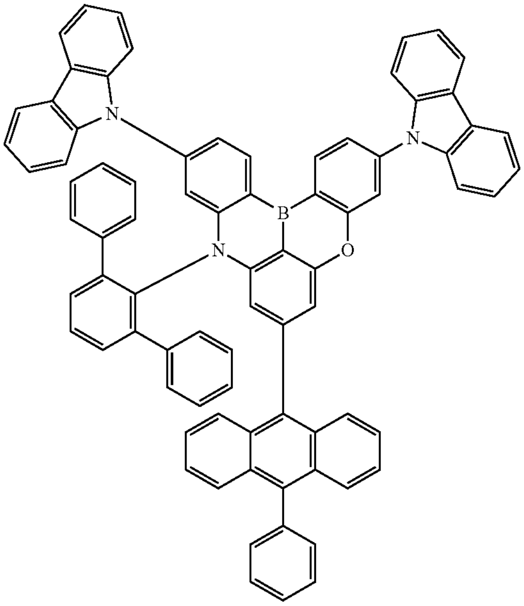
32
Compound 32 according to an embodiment may be synthesized by, for example, the
[Reaction 10]
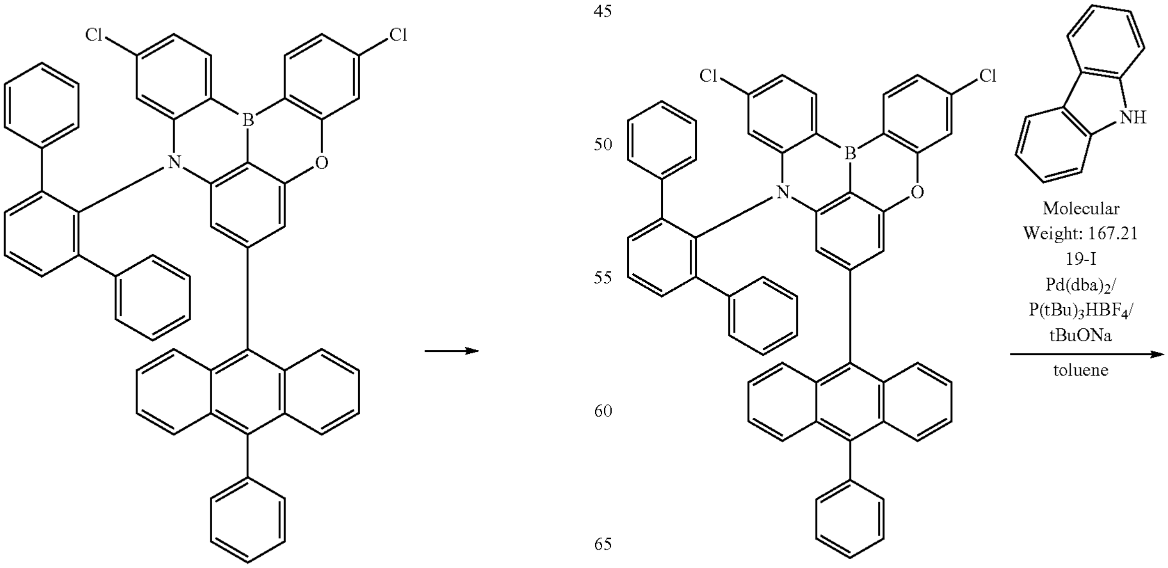

-continued
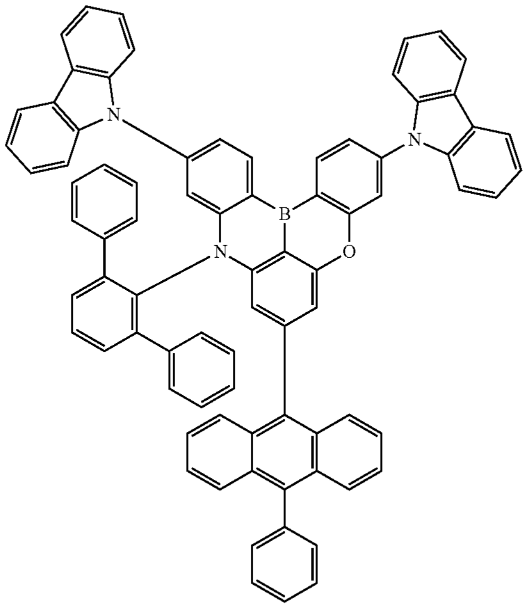
32
Synthesis was performed under the same conditions as Reaction 5 to obtain Compound 32.
(4) Synthesis of Compound 38
-continued
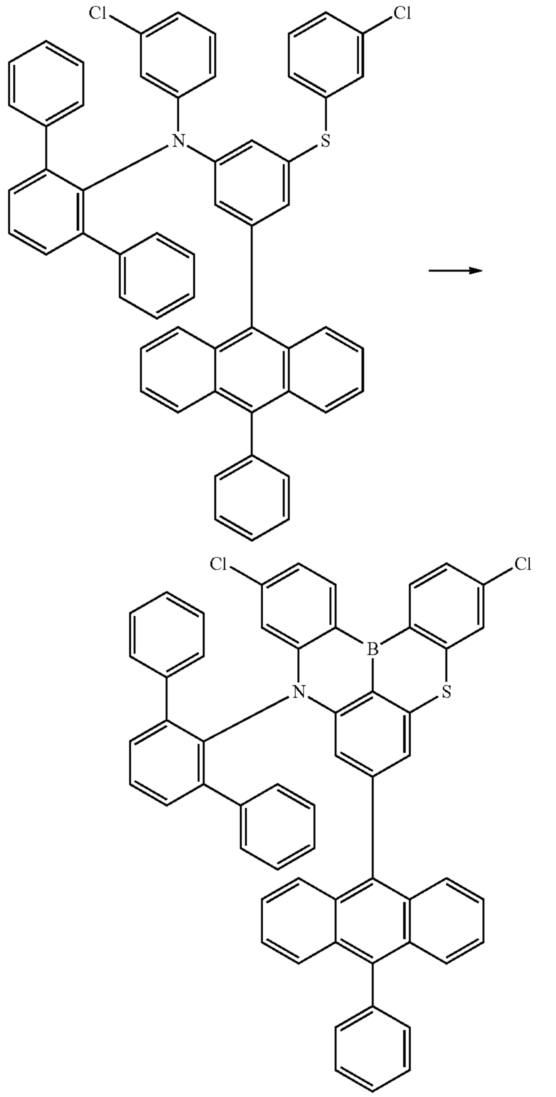
[Synthesis scheme of Compound 38]
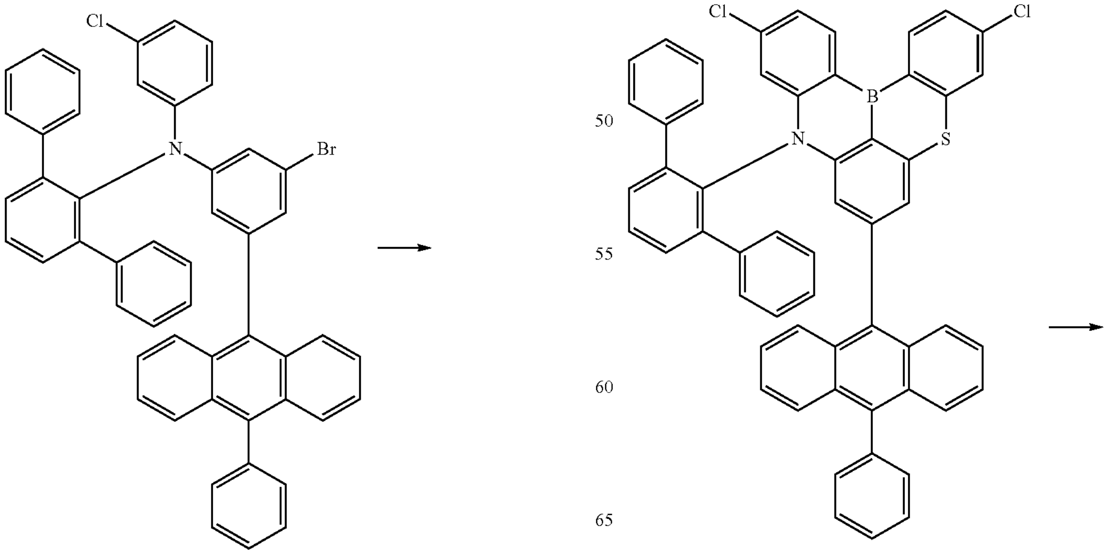

-continued

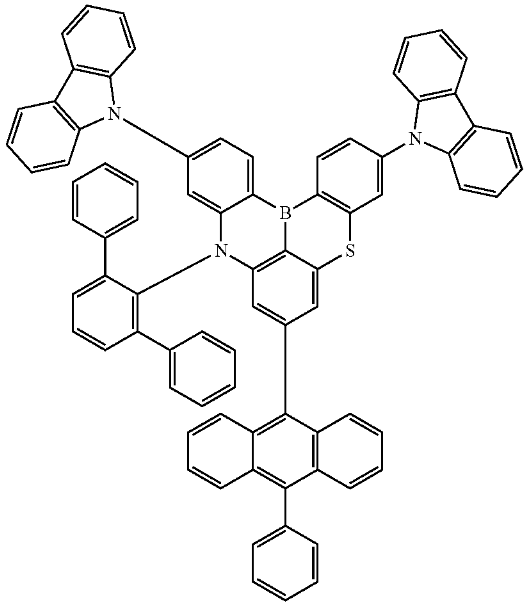

38

Compound 38 according to an embodiment may be synthesized by, for example, the step of Reaction 11.

[Reaction 11]

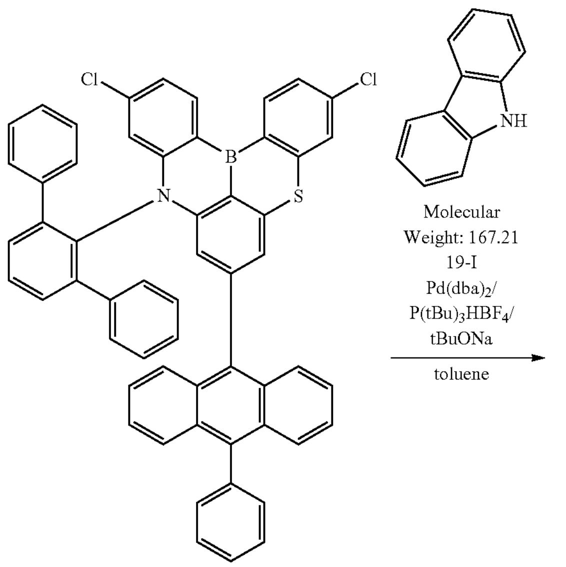

-continued

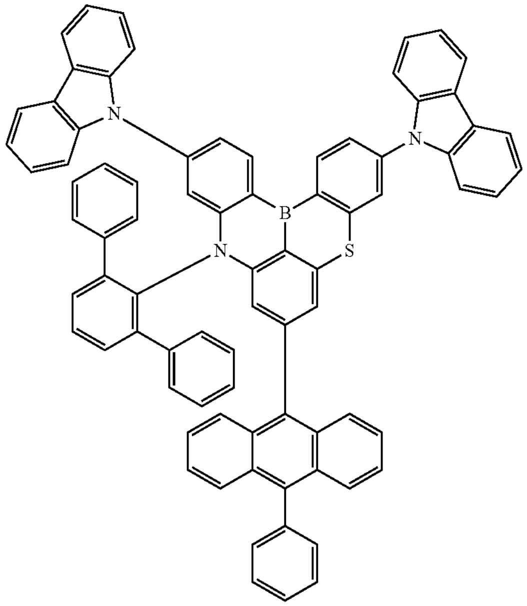

38

Synthesis was performed under the same conditions as Reaction 5 to obtain Compound 38.

2. Manufacture and Evaluation of Light Emitting Elements (1) Manufacture of Light Emitting Elements Light emitting elements including the Example Compounds or the Comparative Example Compounds in emission layers were manufactured by a method described below. Light emitting elements of Example 1 to Example 4 were manufactured using Compounds 19, 16, 32, and 38, respectively, as the dopant materials of an emission layer. The light emitting elements of Comparative Examples 1 to 6 were manufactured using Comparative Compounds $X_1$ to $X_6$, respectively, as the dopant materials of an emission layer.

On a glass substrate, ITO with a thickness of about 1,500 Å was patterned, washed using ultrapure water, cleansed by ultrasonic waves, exposed to UV for about 30 seconds and treated with ozone. HAT-CN was deposited to a thickness of about 100, α-NPD was deposited to a thickness of about 800 Å, and mCP was deposited to a thickness of about 50 Å to form a hole transport region.

An Example Compound or a Comparative Example Compound were co-deposited with m-CBP at a weight ratio of about 1:99 to form an emission layer with a thickness of about 200 Å. In Examples 1 to 4, Compounds 19, 16, 32, and 38 were co-deposited with mCBP, respectively, and in Comparative Examples 1 to 6, Comparative Compounds $X_1$ to $X_6$ were co-deposited with mCBP, respectively.

On the emission layer, a layer with a thickness of about 300 Å was formed of TPBi, and a layer with a thickness of about 5 Å was formed of LiF to form an electron transport region. A second electrode with a thickness of about 1,000 Å was formed of aluminum (Al). The hole transport region, the emission layer, the electron transport region, and the second electrode were each formed using a vacuum deposition apparatus.

(Example Compounds)
16
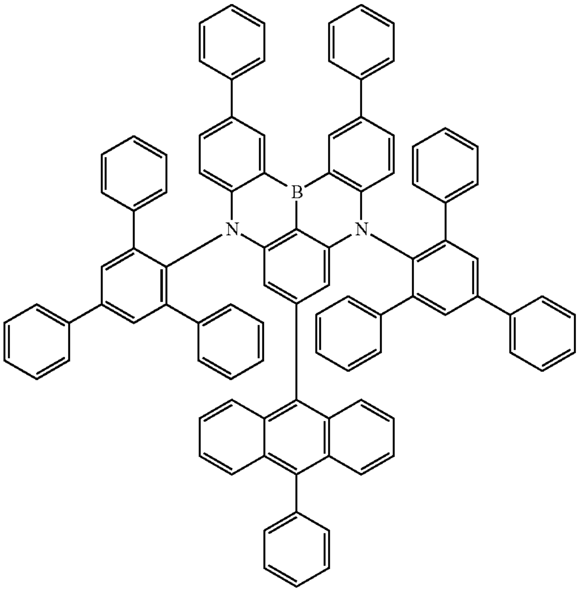
19
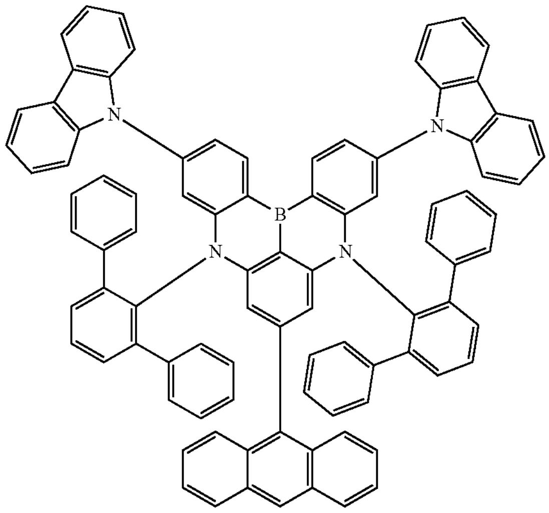
-continued
32
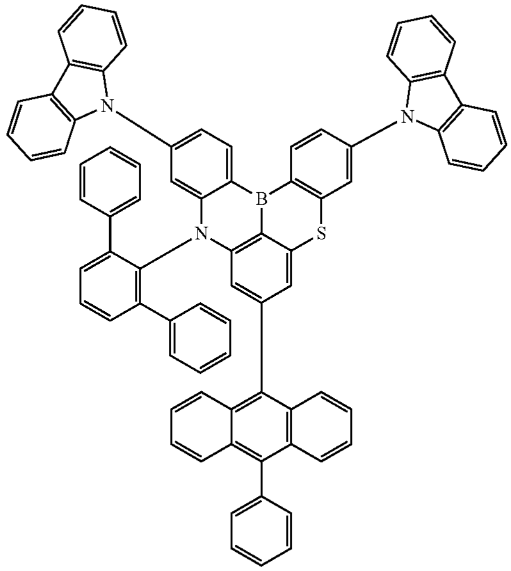
38
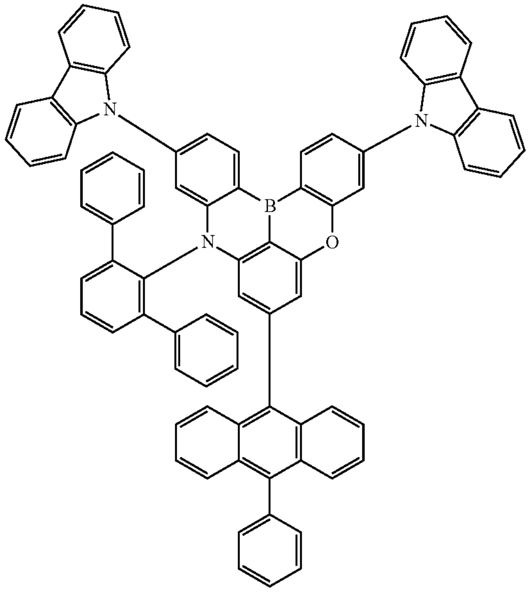
(Comparative Compounds)
X1
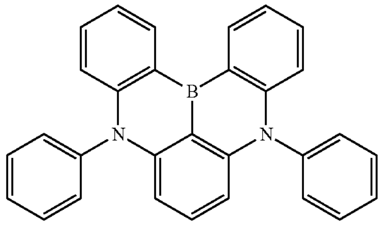

-continued

X2

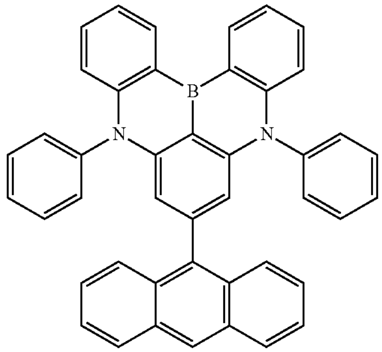

X3

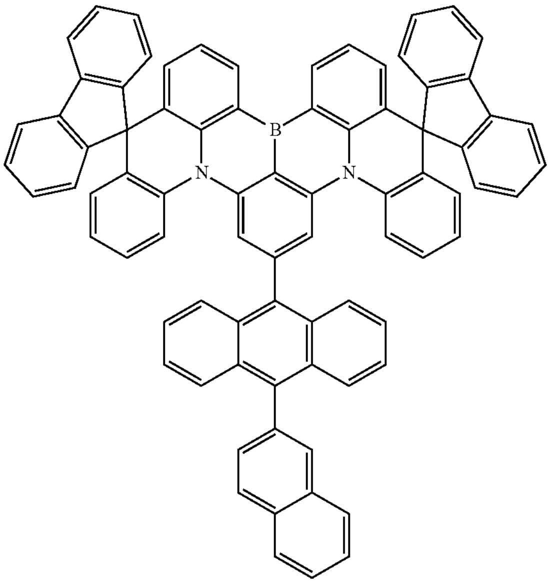

X4

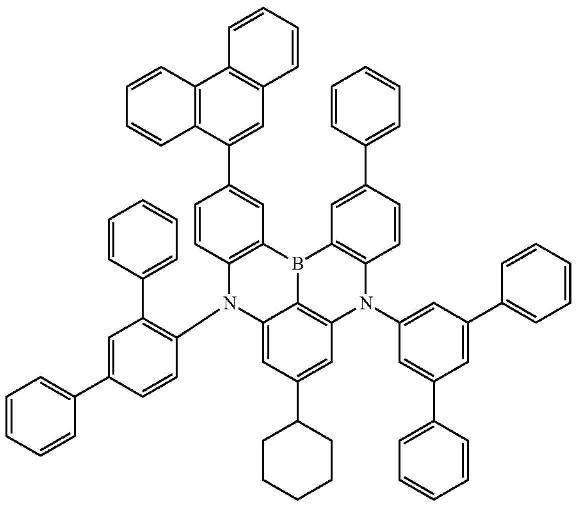

-continued

X5

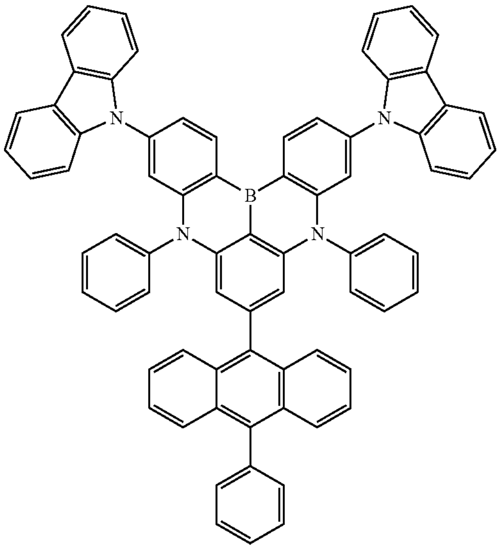

X6

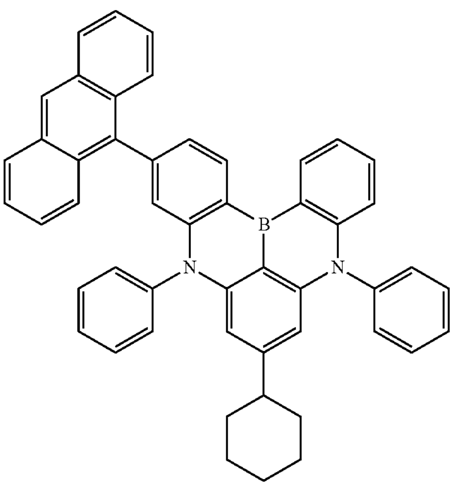

(2) Evaluation of Light Emitting Elements

In Table 1, the properties of the light emitting elements of the Examples and Comparative Examples are evaluated and shown. With respect to the light emitting elements of the Examples and the Comparative Examples, a full width at half maximum, a maximum emission wavelength ($\lambda_{max}$), roll-off, external quantum efficiency ($EQE_{max,\ 1000unit}$) and lifetime ($LT_{50}$) were evaluated. The full width at half maximum, maximum emission wavelength ($\lambda_{max}$), roll-off, external quantum efficiency ($EQE_{max,\ 1000unit}$) and lifetime ($LT_{50}$) were evaluated using a spectroradiometer (manufacturer: TOPCON, apparatus name: SR-3AR). The maximum emission wavelength ($\lambda_{max}$) represents a wavelength showing the maximum value on an emission spectrum, the external quantum efficiency ($EQE_{max,\ 1000unit}$) is represented based on a luminance of about 1,000 cd/m$^2$. The lifetime ($LT_{50}$) was obtained by measuring time consumed for reducing initial luminance to half and showing a relative value on the basis of 1 of the half-life of the light emitting element of Comparative Example 1. The roll-off represents the reduction ratio of efficiency at high luminance and was evaluated based on a luminance of about 1 cd/m$^2$ and a luminance of about 1,000 cd/m$^2$. The roll-off was computed from Equation 1.

$$R_0 = [(E_1 - E_2)/E_1] \times 100\% \quad \text{[Equation 1]}$$

In Equation 1, $E_1$ is external quantum efficiency at a luminance of about 1 cd/m$^2$, $E_2$ is external quantum efficiency at a luminance of about 1 cd/m$^2$, and $R_0$ is a roll-off value.

TABLE 1

| Element manufacturing example | Dopant | Full width at half maximum (nm) | $\lambda_{max}$ (nm) | Roll-off (%) | $EQE_{max,\ 1000\ nit}$ (%) | Lifetime ($LT_{50}$) |
|---|---|---|---|---|---|---|
| Example 1 | Compound 19 | 23 | 464 | 27.8 | 14.2 | 1.6 |
| Example 2 | Compound 16 | 24 | 465 | 28.9 | 13.2 | 1.7 |
| Example 3 | Compound 32 | 32 | 463 | 30.5 | 12.3 | 1.1 |
| Example 4 | Compound 38 | 34 | 455 | 31.5 | 11.3 | 1.1 |
| Comparative Example 1 | Comparative Compound X1 | 32 | 462 | 32.0 | 11.2 | 1.0 |
| Comparative Example 2 | Comparative Compound X2 | 34 | 465 | 42.0 | 7.8 | 1.2 |
| Comparative Example 3 | Comparative Compound X3 | 33 | 475 | 50.0 | 5.5 | 0.7 |
| Comparative Example 4 | Comparative Compound X4 | 34 | 473 | 48.0 | 5.8 | 0.9 |
| Comparative Example 5 | Comparative Compound X5 | 33 | 468 | 40.0 | 8.4 | 1.3 |
| Comparative Example 6 | Comparative Compound X6 | 34 | 474 | 52.0 | 5.0 | 0.5 |

Referring to Table 1, it could be found that the light emitting elements of Examples 1 to 4 showed long lifetime when compared to the light emitting elements of Comparative Examples 1 to 4 and 6. It could be found that the light emitting elements of Examples 1 to 4 showed high efficiency when compared to the light emitting elements of Comparative Examples 1 to 6. It could be found that the light emitting elements of Examples 1 to 4 showed reduced ratios of efficiency reduction (roll-off) at high luminance when compared to the light emitting elements of Comparative Examples 1 to 6.

The light emitting elements of Examples 1 to 4 include Compounds 19, 16, 32, and 38, respectively, and Compounds 19, 16, 32, and 38 each include a pentacyclic fused ring core and each include an anthracenyl group bonded to the central structure. Compounds 19, 16, 32, and 38 each further include a substituent (corresponding to $Y_1$ of Formula 1) that is bonded to a phenyl group that itself is bonded to a ring-forming nitrogen atom of the fused ring core, and the substituent is bonded to the phenyl group at an ortho position to the nitrogen atom of the fused ring core. Compounds 19, 16, 32, and 38 are fused polycyclic compounds according to embodiments. Accordingly, it could be found that the light emitting element including the fused polycyclic compound according to an embodiment shows high efficiency and long-life characteristics.

Light emitted from the light emitting elements of Examples 1 and 2 show a full width at half maximum less than or equal to about 24 nm. It could be found that the light emitting elements of Examples 1 and 2 show a narrow full width at half maximum, and may emit light with excellent color purity.

The light emitting element of Comparative Example 1 includes Comparative Compound X1, the light emitting element of Comparative Example 2 includes Comparative Compound X2, and the light emitting element of Comparative Example 6 includes Comparative Compound X6. Comparative Compounds X1, X2, and X6 are not substituted with a phenyl group that is bonded to a nitrogen atom and do not include a substituent that is bonded to a phenyl group at an ortho position to a nitrogen atom. Comparative Compound X1 does not include an anthracenyl group. Accordingly, it is considered that the light emitting elements of Comparative Examples 1, 2, and 6 show relatively low efficiency and short lifetime, and have high reduction ratios of efficiency at high luminance.

The light emitting element of Comparative Example 5 includes Comparative Compound X5, and Comparative Compound X5 is not substituted with a phenyl group that is bonded to a nitrogen atom and does not include a substituent that is bonded to a phenyl at an ortho position to a nitrogen atom. Accordingly, it is considered that the light emitting element of Comparative Example 5 shows relatively low efficiency and a high reduction ratio of efficiency at high luminance.

The light emitting elements of Examples 1 to 4, Comparative Example 1, Comparative Example 2, and Comparative Example 5 have a maximum emission wavelength in a range of about 450 nm to about 470 nm. When compared to the light emitting elements of Examples 1 to 4, Comparative Example 1, Comparative Example 2, and Comparative Example 5, it could be found that the light emitting elements of Comparative Examples 3, 4, and 6 show longer maximum emission wavelengths. The light emitting element of Comparative Example 3 includes Comparative Compound X3, and Comparative Compound X3 includes a fused ring structure of nine rings wherein a portion of the fused ring structure constitute a fluorene moiety. The light emitting element of Comparative Example 4 includes Comparative Compound X4, and Comparative Compound X4 includes a fused ring structure of five rings but does not include an anthracenyl group and includes a cyclohexyl group. The light emitting element of Comparative Example 6 includes Comparative Compound X6 and a cyclohexyl group. Accordingly, the light emitting elements of Comparative Examples 3, 4, and 6 show longer maximum emission wavelengths.

Comparative Compound X3 including a fluorene moiety and Comparative Compounds X4 and X6 including a cyclohexyl group are electrochemically unstable and show degraded stability of materials. Accordingly, it is considered that the light emitting elements of Comparative Examples 3, 4, and 6 show relatively short lifetime and low efficiency.

The light emitting element according to an embodiment may include an emission layer between a first electrode and a second electrode. The emission layer may include the fused polycyclic compound according to an embodiment. The fused polycyclic compound may include a pentacyclic fused ring core that includes a boron atom and a nitrogen atom as ring-forming atoms. A substituted phenyl group may be bonded to the ring-forming nitrogen atom, and the substituent may be bonded to the phenyl group at an ortho position to the ring-forming nitrogen atom. An anthracenyl group may be directly bonded to the pentacyclic fused ring core. Accordingly, the light emitting element including the fused polycyclic compound may show high efficiency and long-life characteristics.

The light emitting element according to an embodiment includes the fused polycyclic compound according to an embodiment and may show high efficiency and long-life characteristics.

The fused polycyclic compound according to an embodiment may contribute to the improvement of the light efficiency and the lifetime of a light emitting element.

Embodiments have been disclosed herein, and although terms are employed, they are used and are to be interpreted in a generic and descriptive sense only and not for the purposes of limitation. In some instances, as would be apparent to one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light emitting element, comprising:

a first electrode;

a second electrode disposed on the first electrode; and an emission layer disposed between the first electrode and the second electrode, and comprising a first compound represented by Formula 1:

[Formula 1]

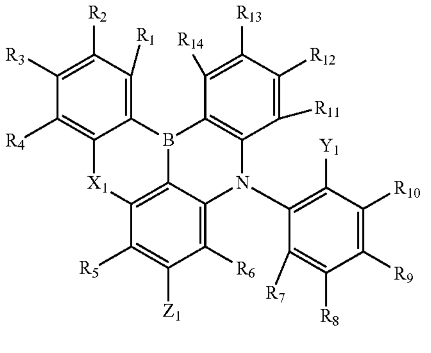

wherein in Formula 1, $X_1$ is $N(Ar_1)$, O, or S, $Ar_1$ and $Y_1$ are each independently a substituted or unsubstituted aryl group of 6 to 30 ring-forming carbon atoms or a substituted or unsubstituted heteroaryl group of 2 to 30 ring-forming carbon atoms, at least one of $R_1$ to $R_{14}$ and $Z_1$ is each independently a group represented by Formula 2, and the remainder of $R_1$ to $R_{14}$ and $Z_1$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms;

[Formula 2]

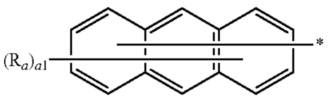

wherein in Formula 2, a1 is an integer from 0 to 9, and $R_a$ is a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

2. The light emitting element of claim 1, wherein the emission layer further comprises at least one of a second compound represented by Formula HT-1, a third compound represented by Formula ET-1, and a fourth compound represented by Formula M-b:

[Formula HT-1]

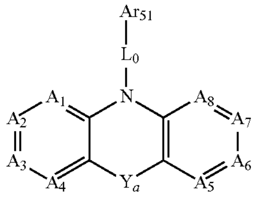

wherein in Formula HT-1, $A_1$ to $A_8$ are each independently N or $C(R_{91})$, $L_0$ is a direct linkage, a substituted or unsubstituted arylene group of 6 to 30 ring-forming carbon atoms, or a substituted or unsubstituted heteroarylene group of 2 to 30 ring-forming carbon atoms, $Y_a$ is a direct linkage, $C(R_{92})(R_{93})$, or $Si(R_{94})(R_{95})$, $Ar_{51}$ is a substituted or unsubstituted aryl group of 6 to 30 ring-forming carbon atoms or a substituted or unsubstituted heteroaryl group of 2 to 30 ring-forming carbon atoms, and $R_{91}$ to $R_{95}$ are each independently a hydrogen atom, a deuterium atom, a halogen atom, a cyano group, a substituted or unsubstituted silyl group, a substituted or unsubstituted thio group, a substituted or unsubstituted oxy group, a substituted or unsubstituted amine group, a substituted or unsubstituted boron group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring;

[Formula ET-1]

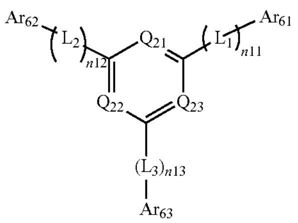

wherein in Formula ET-1, at least one of $Q_{21}$ to $Q_{23}$ is each N, the remainder of $Q_{21}$ to $Q_{23}$ are each independently C($R_{81}$), $R_{81}$ is a hydrogen atom, a deuterium atom, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, n11 to n13 are each independently an integer from 0 to 10, $L_1$ to Ls are each independently a direct linkage, a substituted or unsubstituted arylene group of 6 to 30 ring-forming carbon atoms, or a substituted or unsubstituted heteroarylene group of 2 to 30 ring-forming carbon atoms, and $Ar_{61}$ to Ares are each independently a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms;

[Formula M-b]

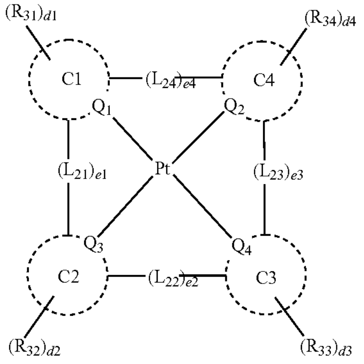

wherein in Formula M-b, $Q_1$ to $Q_4$ are each independently C or N, $C_1$ to $C_4$ are each independently a substituted or unsubstituted hydrocarbon ring of 5 to 30 ring-forming carbon atoms or a substituted or unsubstituted heterocycle of 2 to 30 ring-forming carbon atoms, e1 to e4 are each independently 0 or 1, $L_{21}$ to $L_{24}$ are each independently a direct linkage,

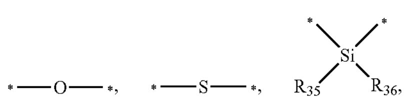

-continued

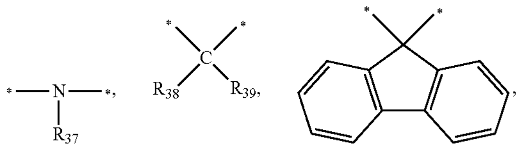

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, d1 to d4 are each independently an integer from 0 to 4, and $R_{31}$ to $R_{39}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring.

3. The light emitting element of claim 1, wherein the first compound is represented by one of Formula 1-A1 to Formula 1-A3:

[Formula 1-A1]

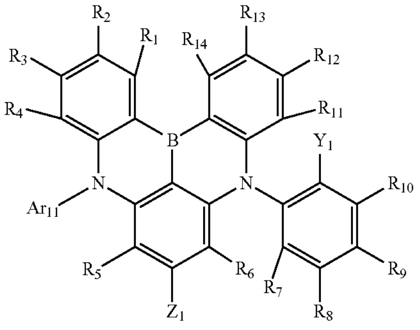

[Formula 1-A2]

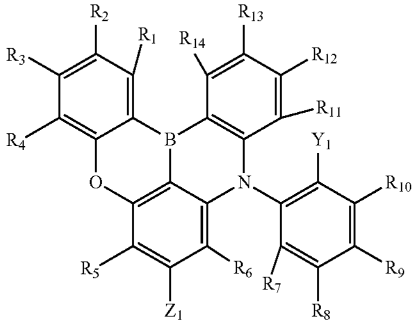

-continued

[Formula 1-A3]

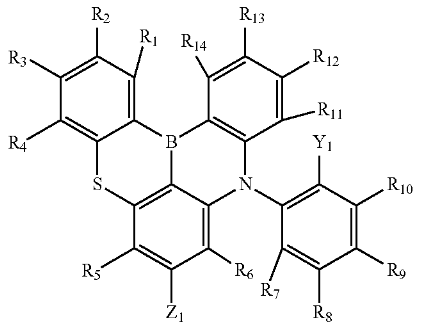

wherein in Formula 1-A1, $Ar_{11}$ is a substituted or unsubstituted aryl group of 6 to 30 ring-forming carbon atoms, and wherein in Formula 1-A1 to Formula 1-A3, $Y_1$, $R_1$ to $R_{14}$, and $Z_1$ are the same as defined in Formula 1.

4. The light emitting element of claim 3, wherein in Formula 1-A1, $Ar_{11}$ is a group represented by one of Formula AR-1 to Formula AR-5:

AR-1

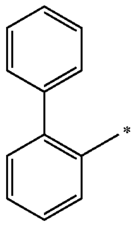

AR-2

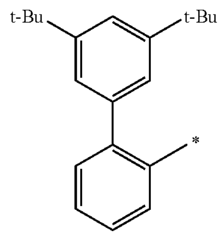

AR-3

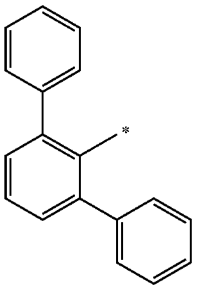

-continued

AR-4

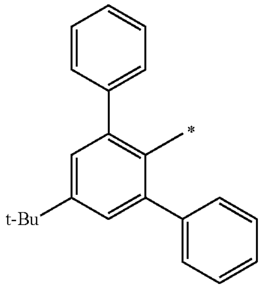

AR-5

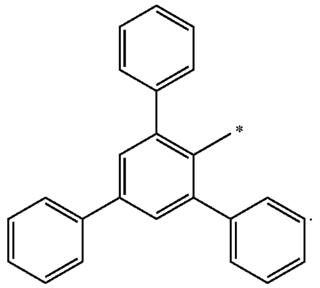

5. The light emitting element of claim 1, wherein the first compound is represented by Formula 1-B:

[Formula 1-B]

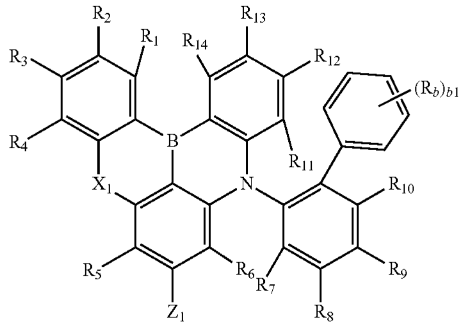

wherein in Formula 1-B, b1 is an integer from 0 to 5, $R_b$ is a hydrogen atom, a deuterium atom, or a substituted or unsubstituted alkyl group of 1 to 20 carbon atoms, and $X_1$, $R_1$ to $R_{14}$, and $Z_1$ are the same as defined in Formula 1.

6. The light emitting element of claim 1, wherein the group represented by Formula 2 is a group represented by one of Formula 2-A to Formula 2-C:

[Formula 2-A]

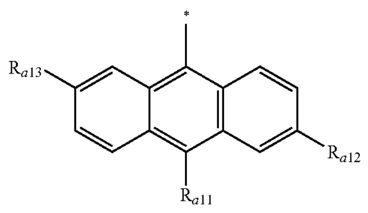

-continued

[Formula 2-B]

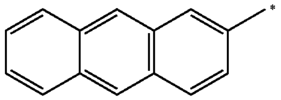

[Formula 2-C]

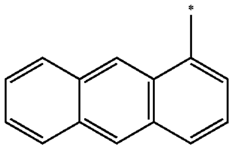

wherein in Formula 2-A, $R_{a11}$ to $R_{a13}$ are each independently a hydrogen atom, a deuterium atom, or a substituted or unsubstituted aryl group of 6 to 30 ring-forming carbon atoms.

7. The light emitting element of claim 1, wherein the first compound is represented by Formula 1-C:

[Formula 1-C]

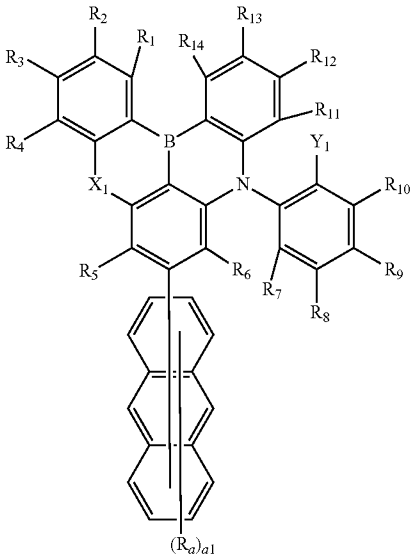

wherein in Formula 1-C, $X_1$, $Y_1$, and $R_1$ to $R_{14}$ are the same as defined in Formula 1, and a1 and $R_a$ are the same as defined in Formula 2.

8. The light emitting element of claim 7, wherein the first compound is represented by one of Formula 1-C1 to Formula 1-C3:

[Formula 1-C1]

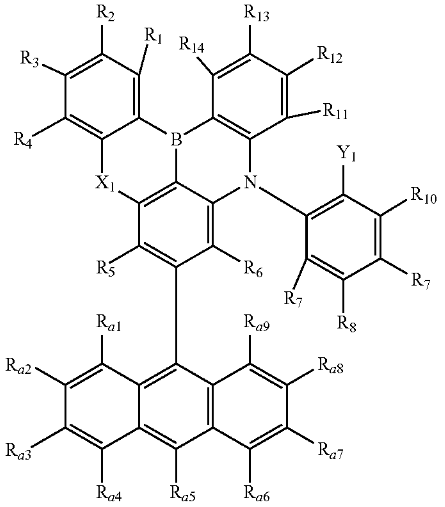

[Formula 1-C2]

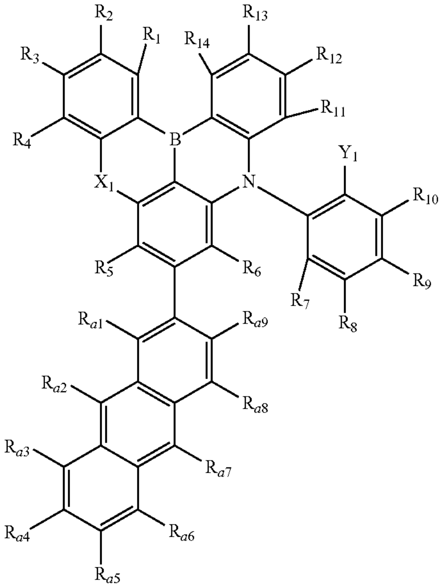

-continued

[Formula 1-C3]

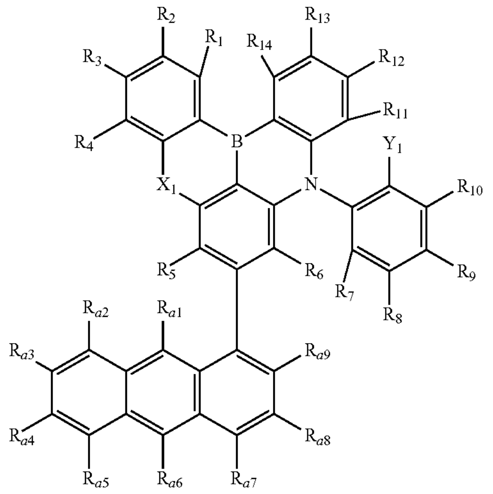

wherein in Formula 1-C1 to Formula 1-C3, $R_{a1}$ to $R_{a9}$ are each independently a hydrogen atom, a deuterium atom, or a substituted or unsubstituted aryl group of 6 to 30 ring-forming carbon atoms, and $X_1$, $Y_1$, and $R_1$ to $R_{14}$ are the same as defined in Formula 1.

9. The light emitting element of claim 8, wherein the first compound represented by Formula 1-C1 is represented by one of Formula 1-C11 to Formula 1-C13:

[Formula 1-C11]

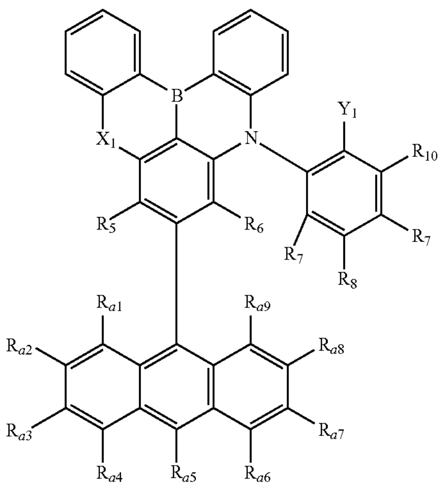

-continued

[Formula 1-C12]

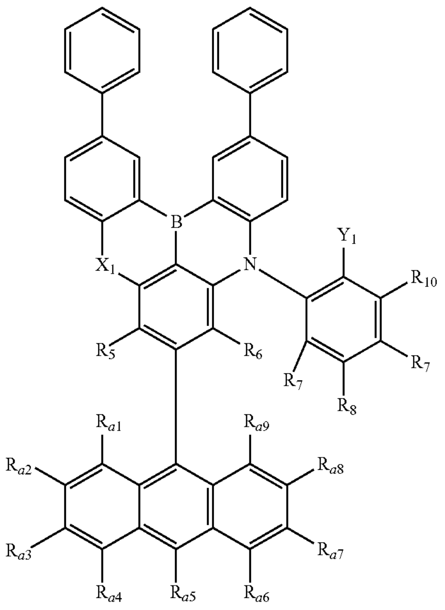

[Formula 1-C13]

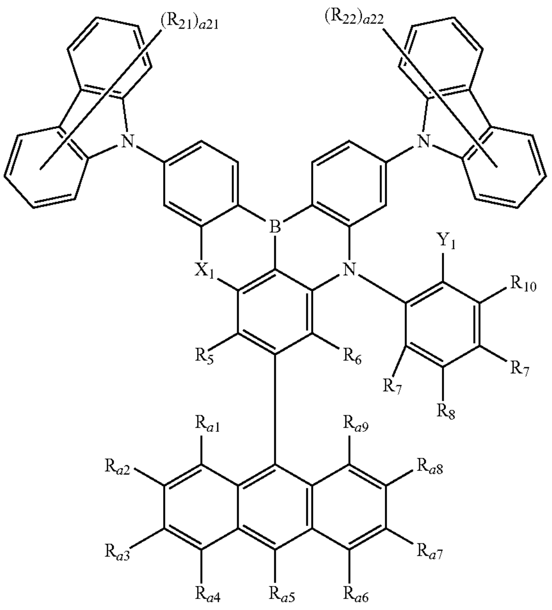

wherein in Formula 1-C13, a21 and a22 are each independently an integer from 0 to 8, and $R_{21}$ and $R_{22}$ are each independently a hydrogen atom, a deuterium atom, or a substituted or unsubstituted alkyl group of 1 to 20 carbon atoms, and wherein in Formula 1-C11 to Formula 1-C13, $X_1$, $Y_1$, $R_5$ to $R_{10}$, and $R_{a1}$ to $R_{a9}$ are the same as defined in Formula 1-C1.

10. The light emitting element of claim 1, wherein in Formula 1, at least one of $X_1$, $Y_1$, $R_1$ to $R_{14}$, and $Z_1$ comprises a deuterium atom, or a substituent comprising a deuterium atom.

11. The light emitting element of claim 1, wherein the first compound includes at least one compound selected from Compound Group 1:

[Compound Group 1]
1
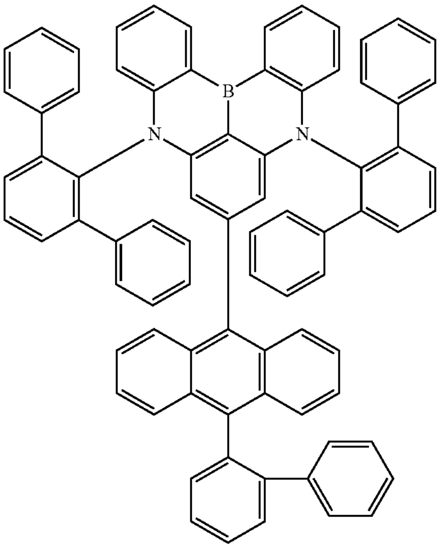
2
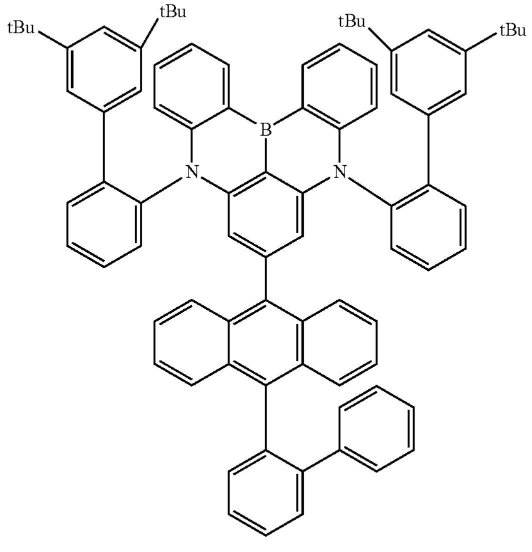
-continued
3
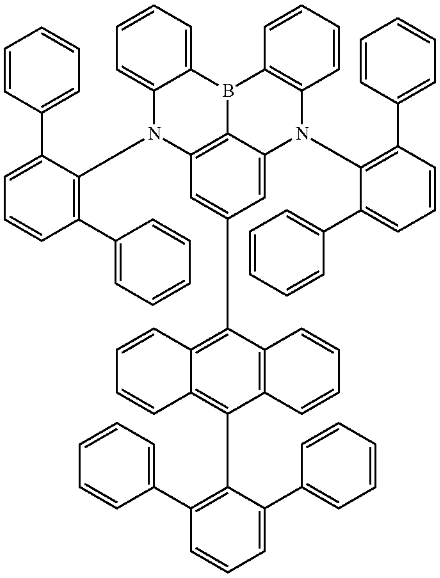
4
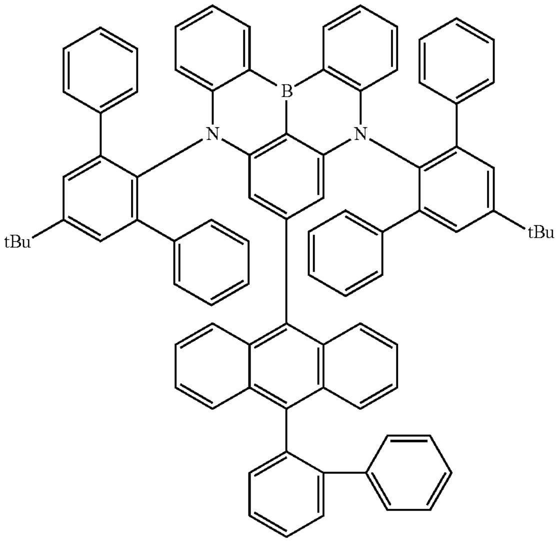
5
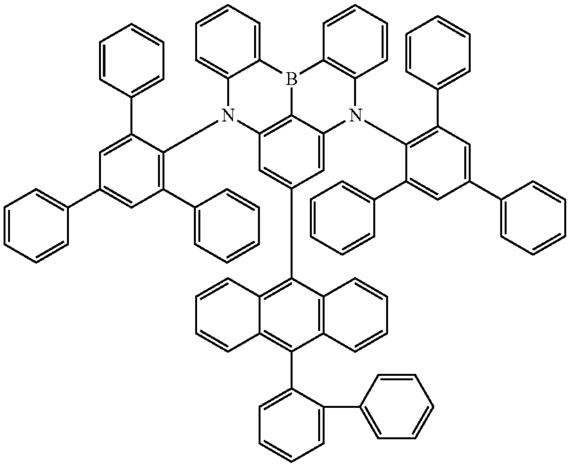

-continued
6
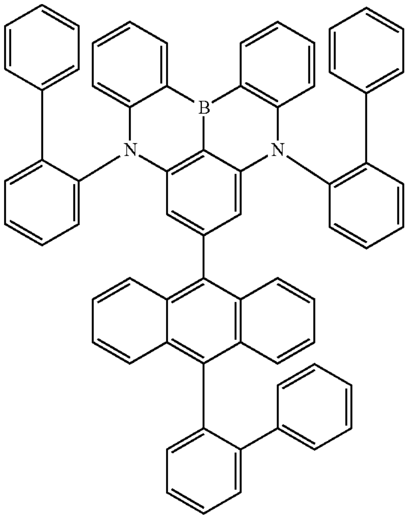
7
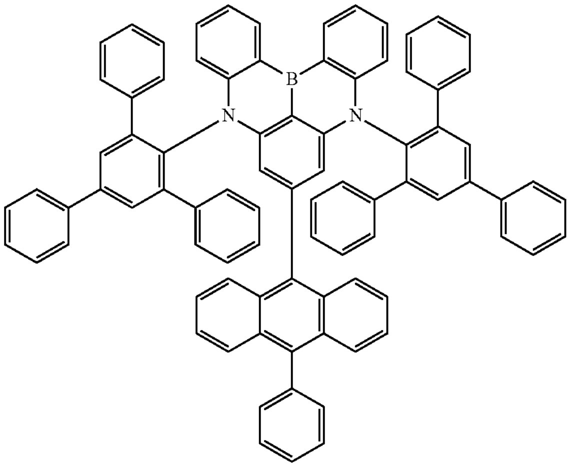
8
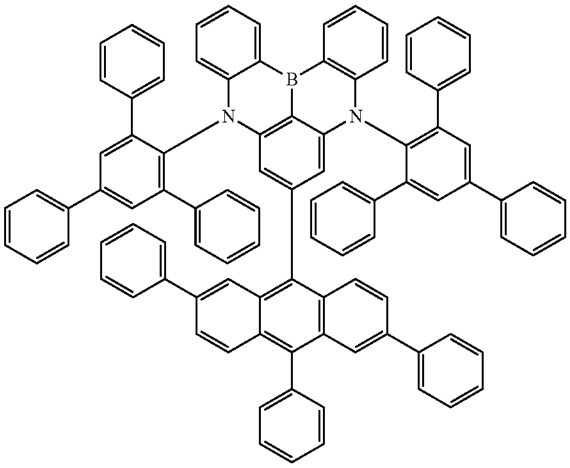
-continued
9
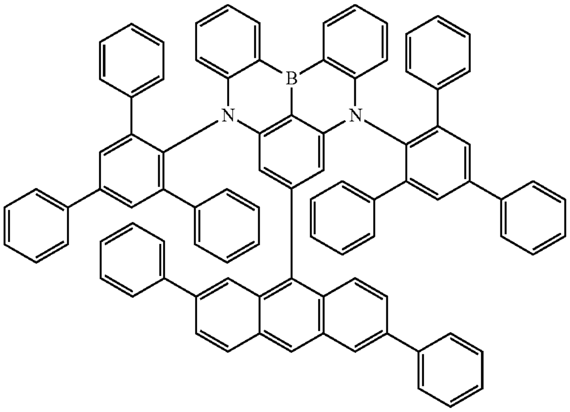
10
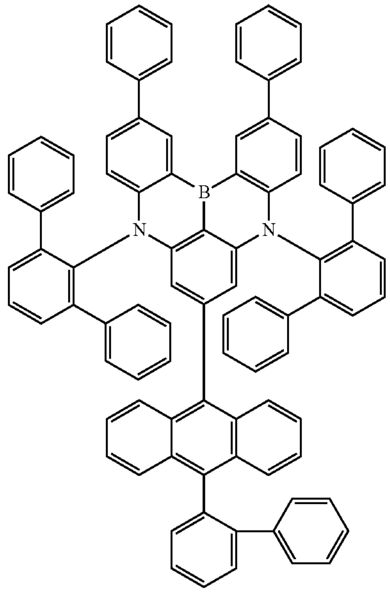
11
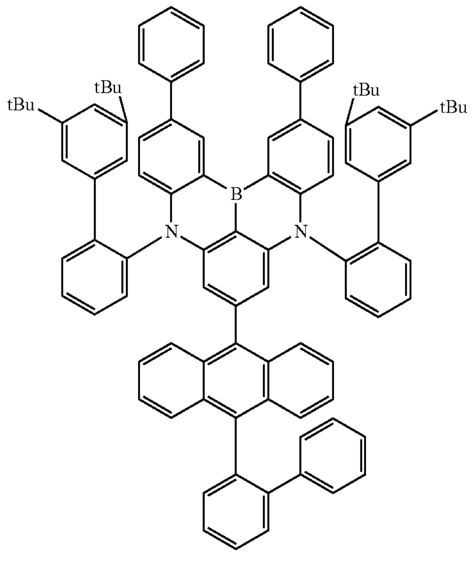

-continued
12
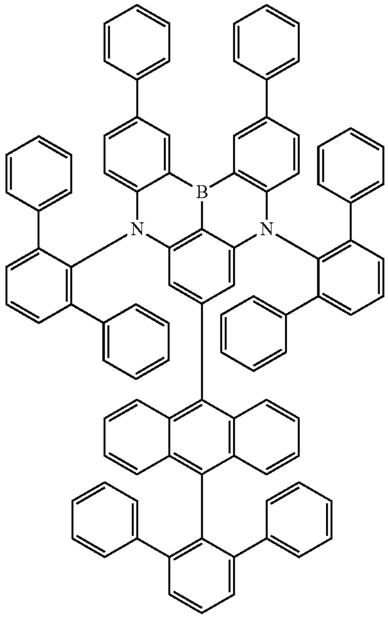
13
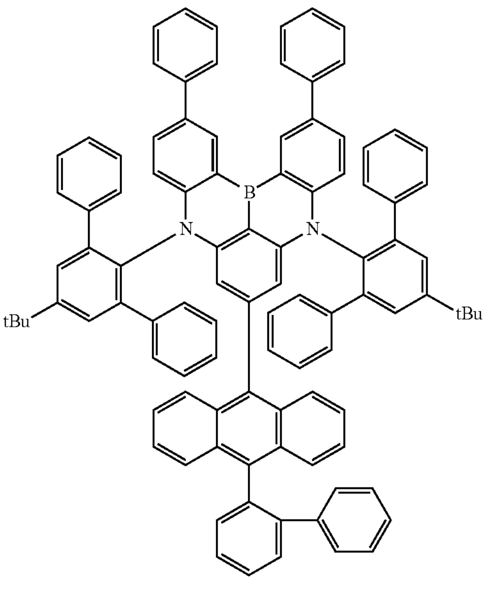
-continued
14
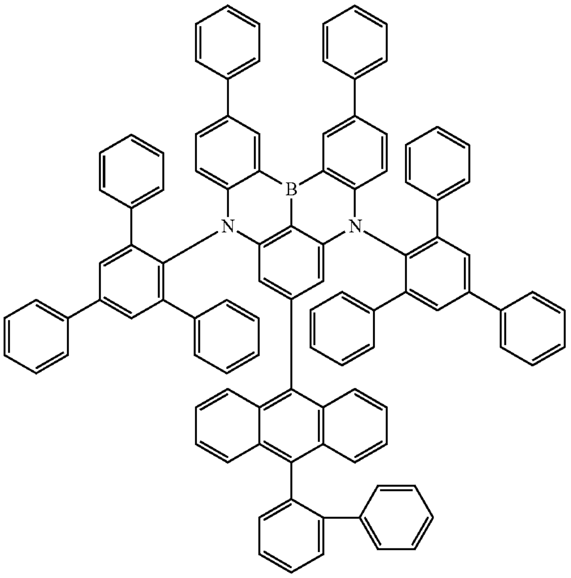
15
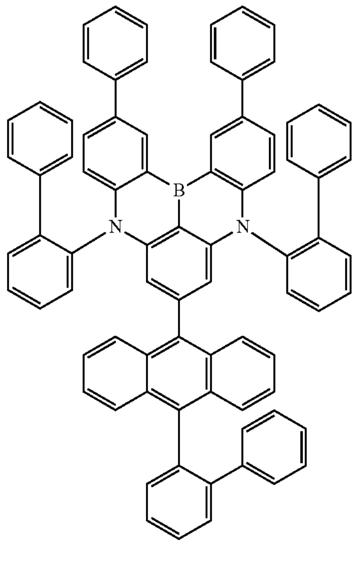

-continued
16
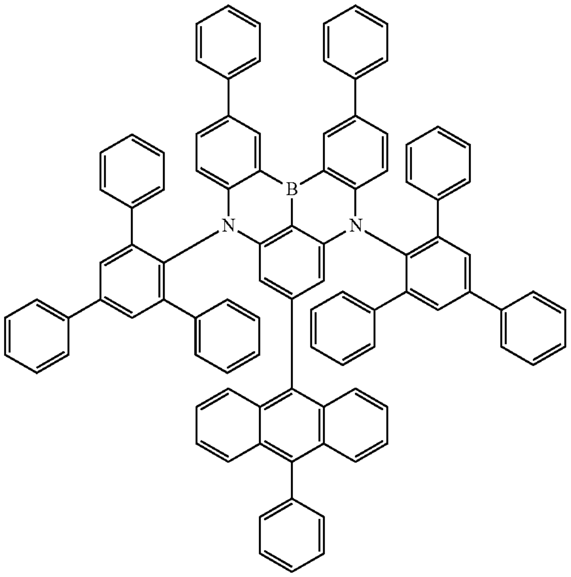
17
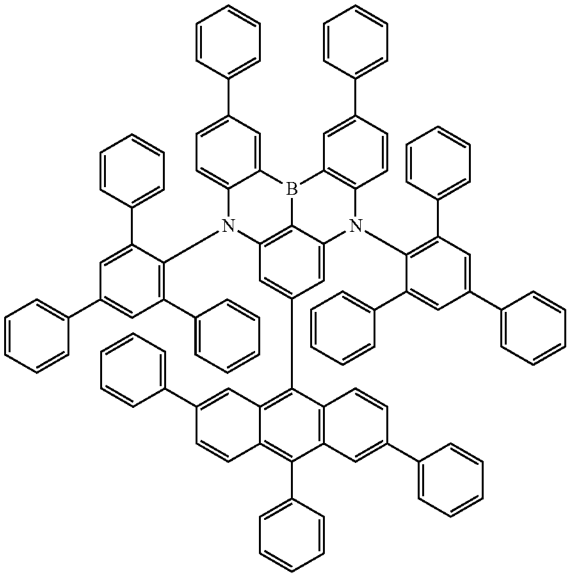
-continued
18
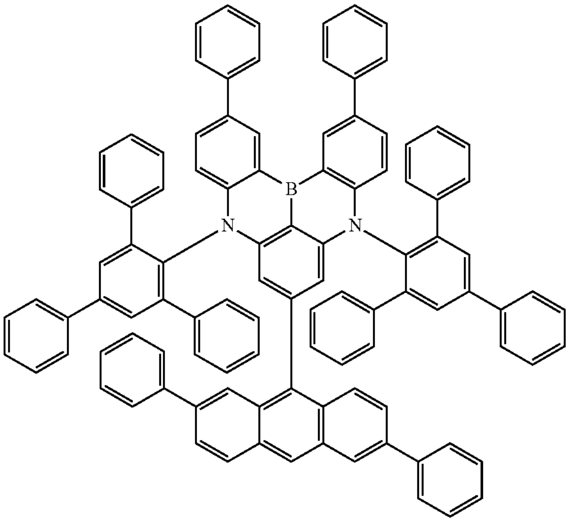
19
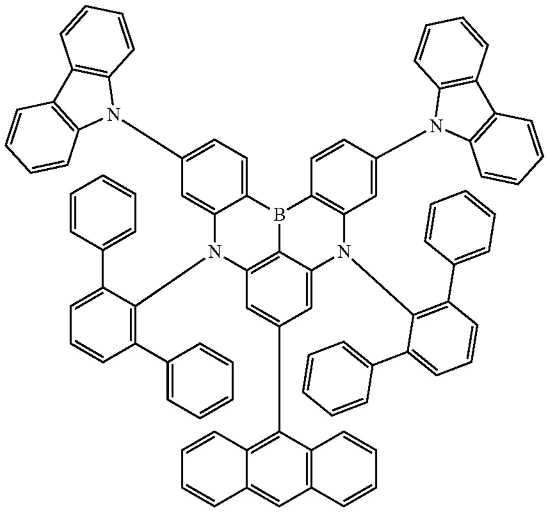

-continued
20
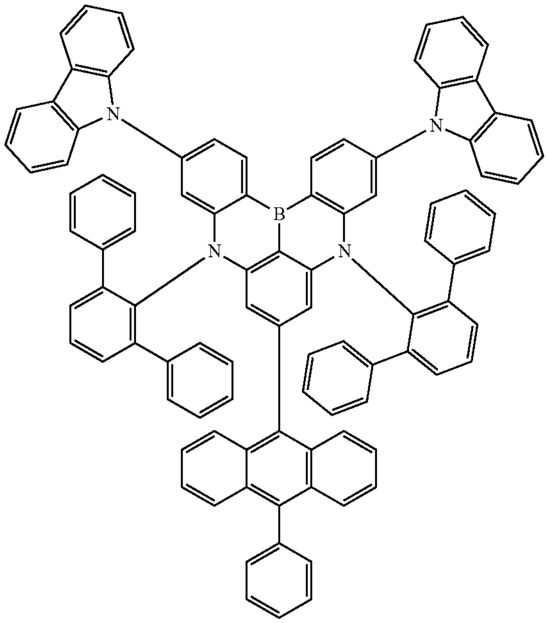
21
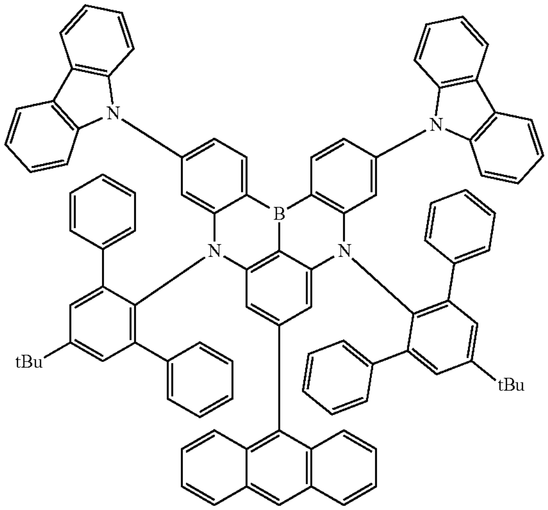
-continued
22
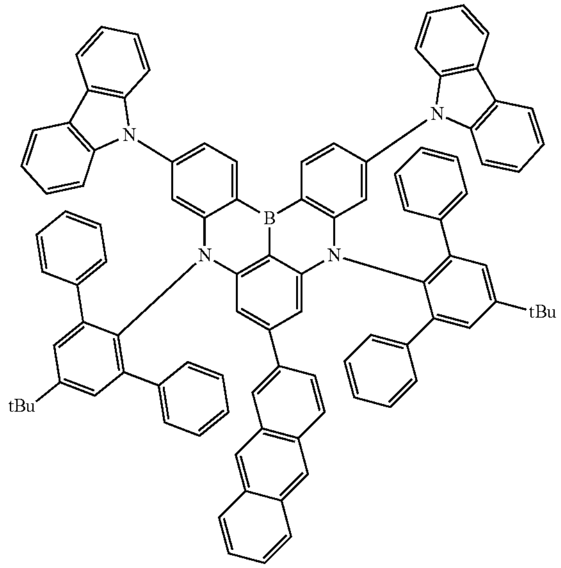
23
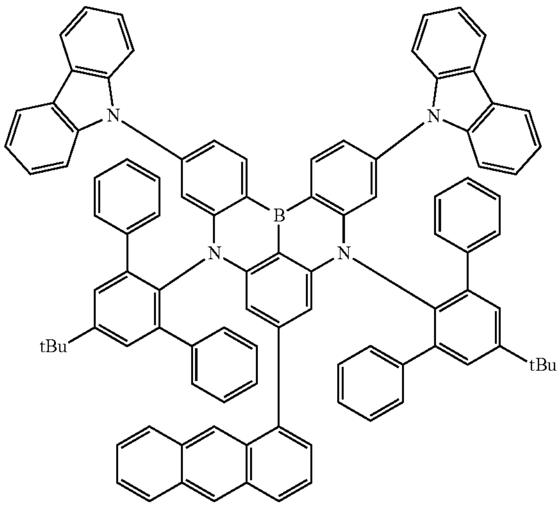
24
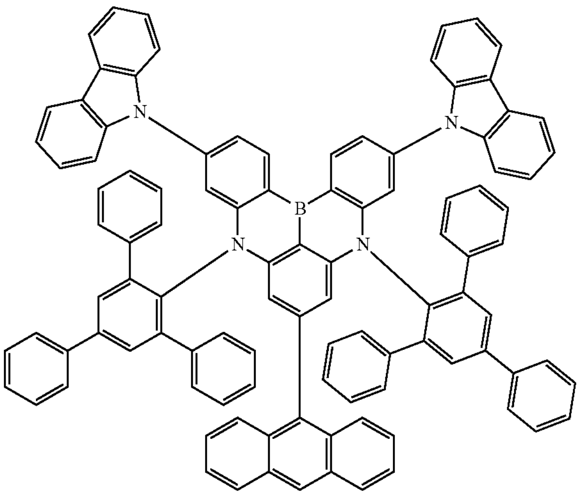

-continued
25
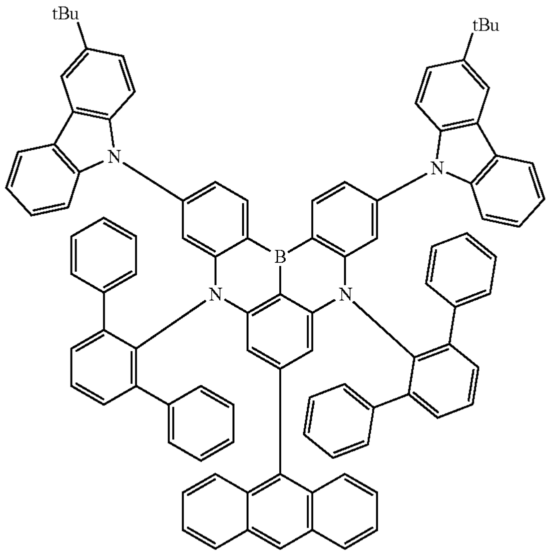
26
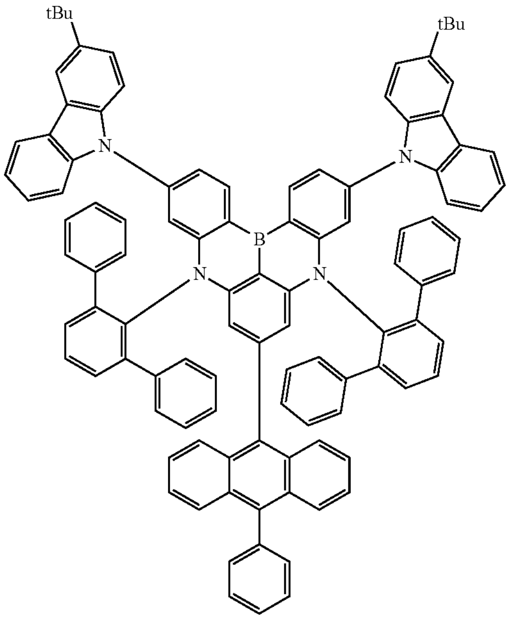
-continued
27
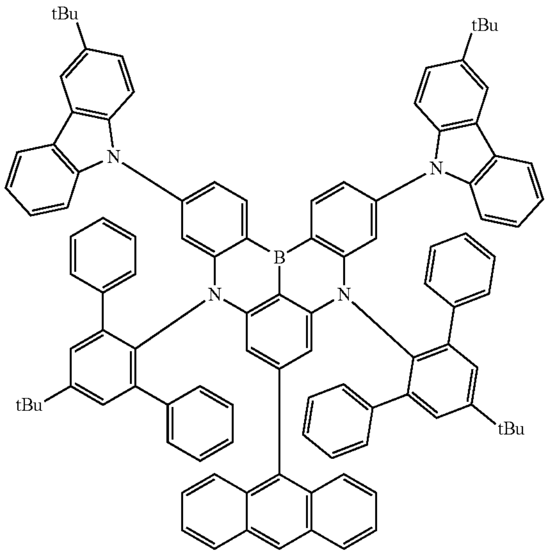
28
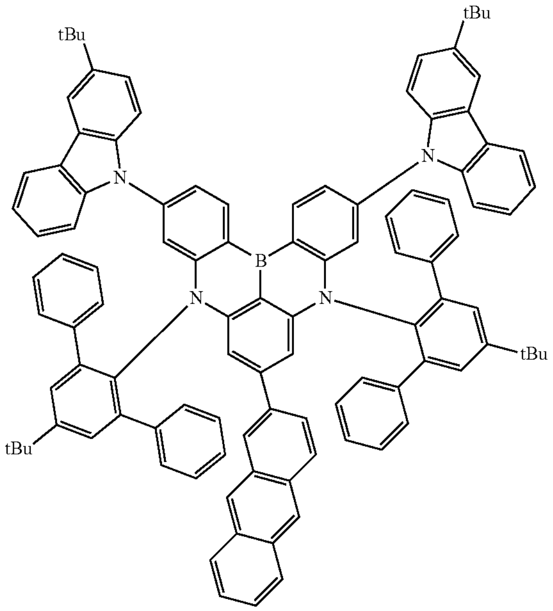

-continued
29
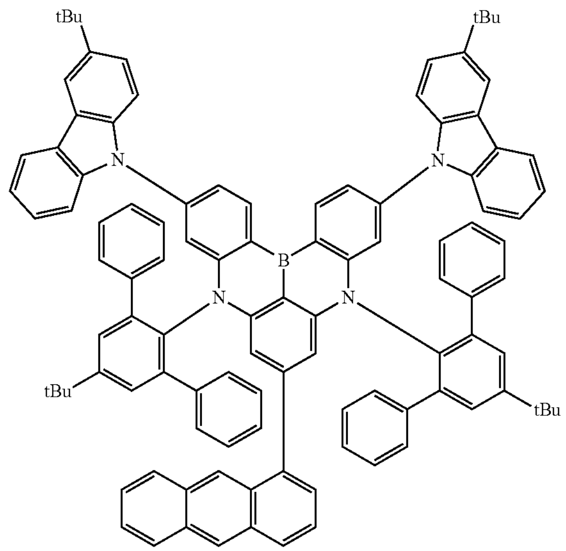
30
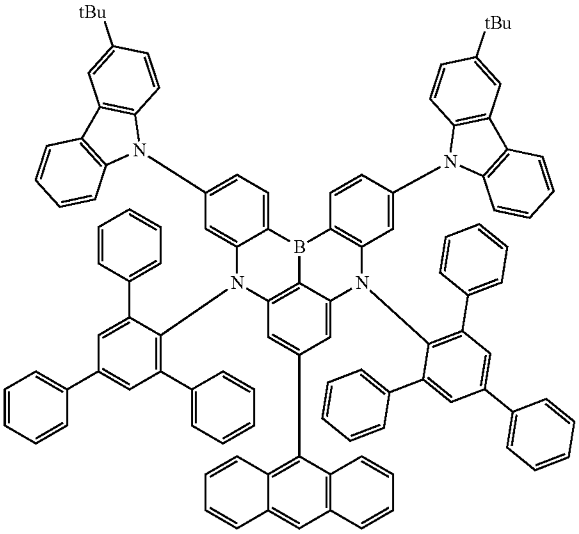
31
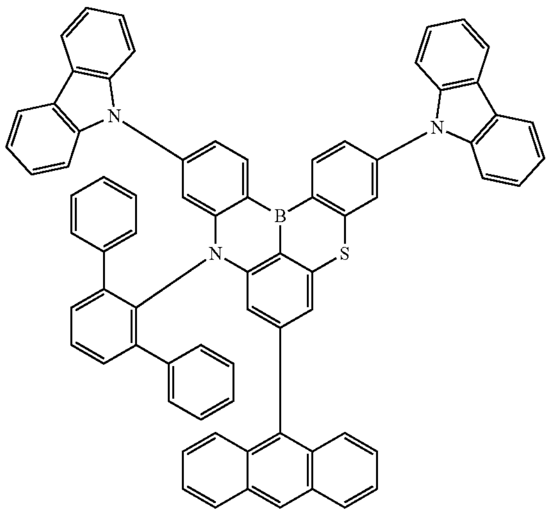
-continued
32
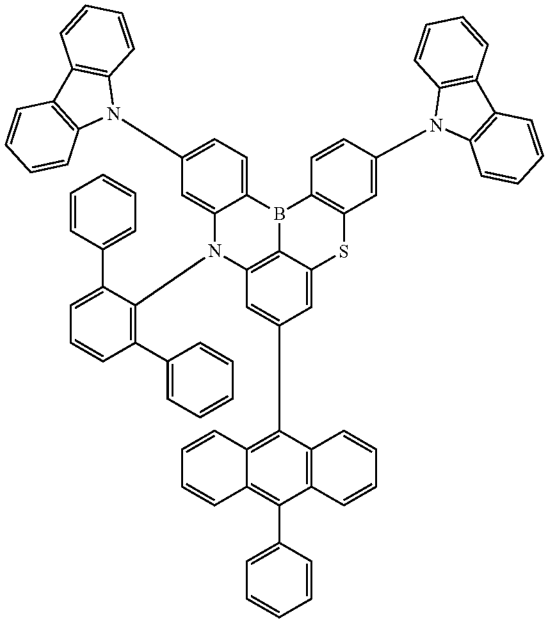
33
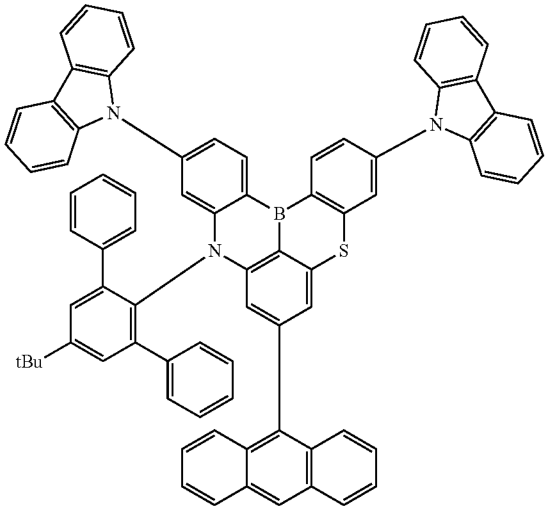

-continued
34
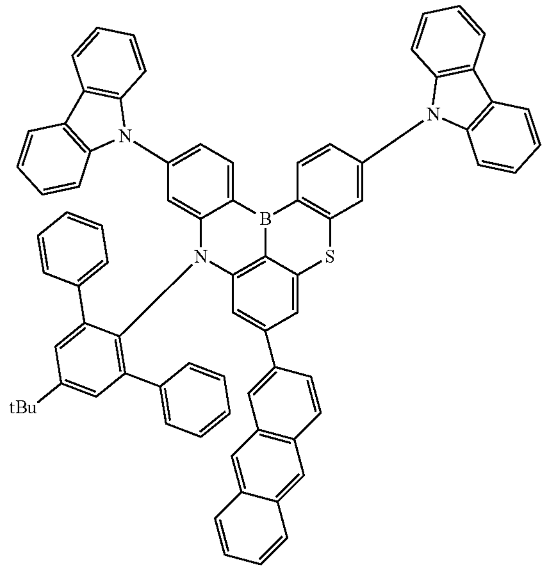
35
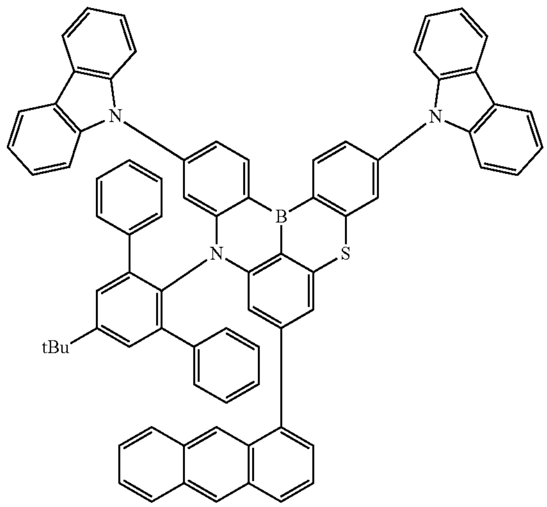
36
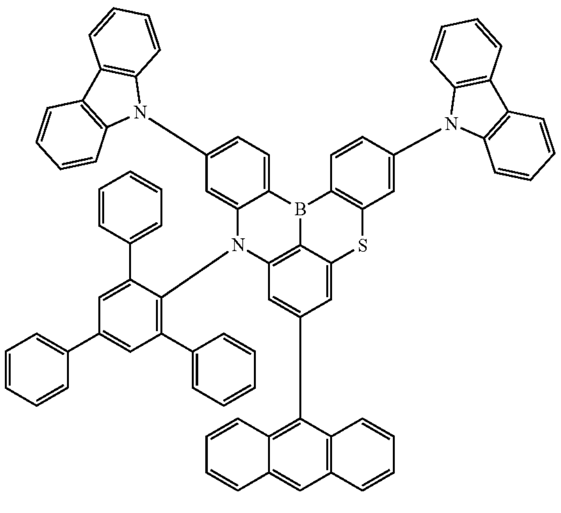
-continued
37
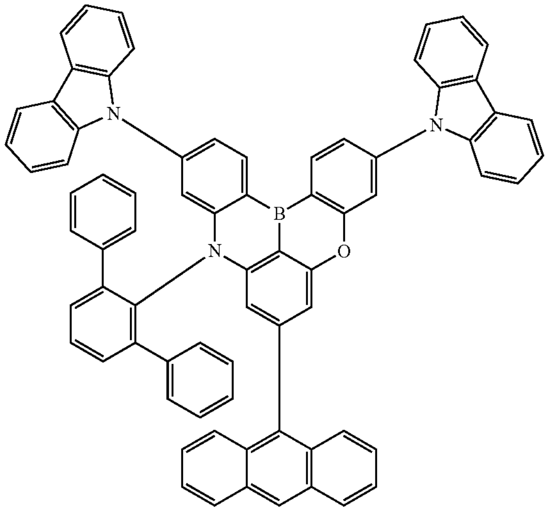
38
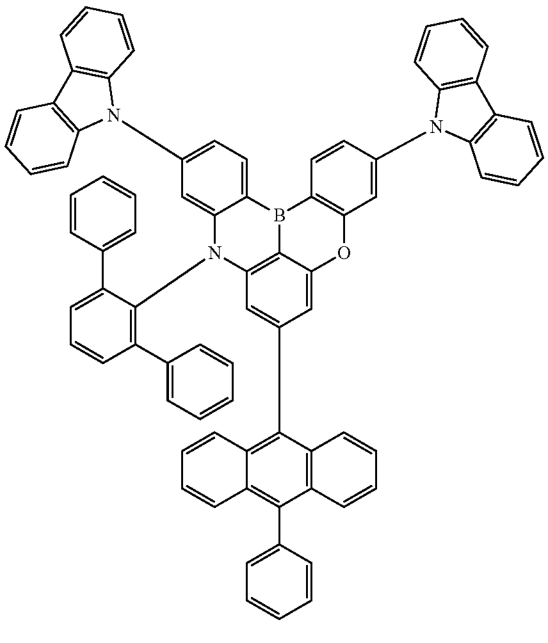

-continued
39
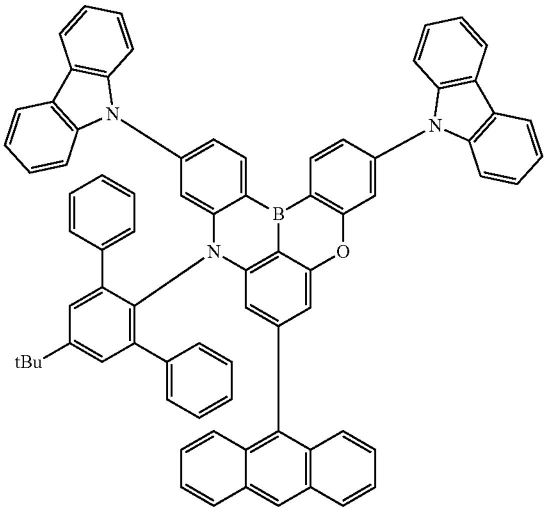
40
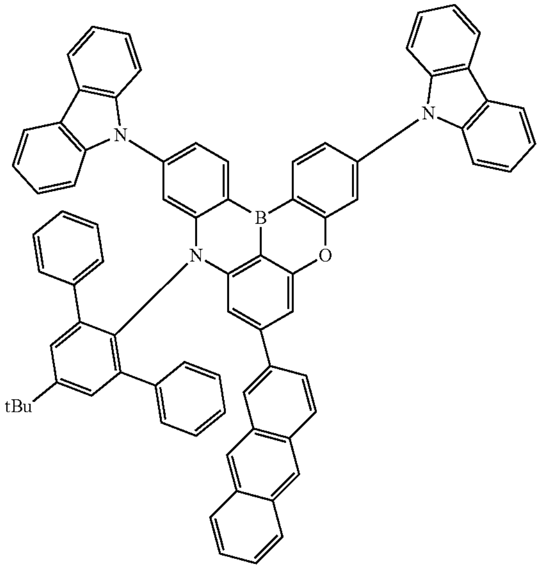
41
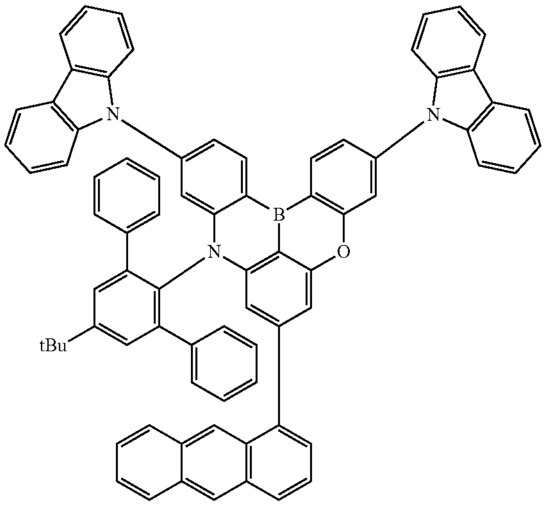
-continued
42
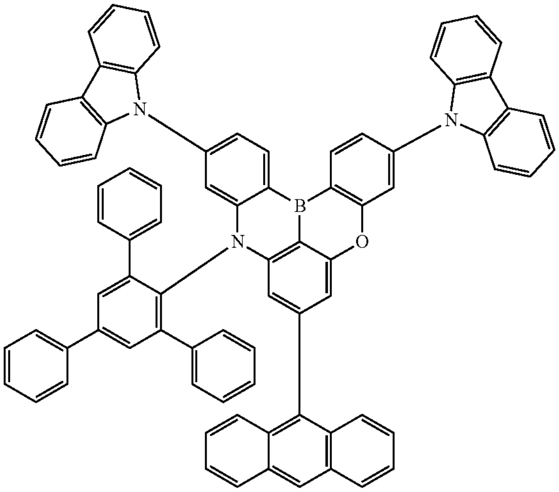
43
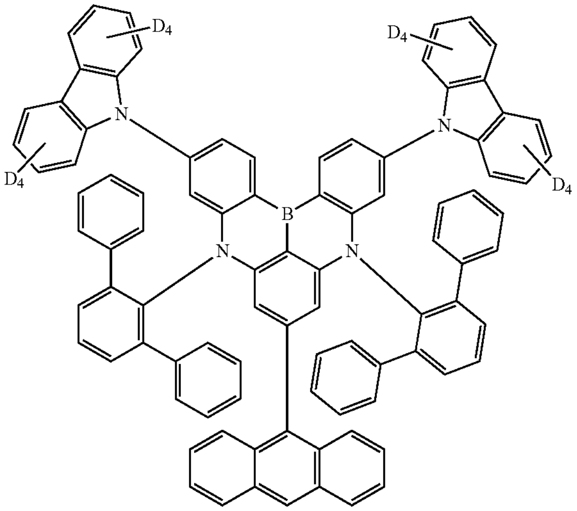

-continued
44
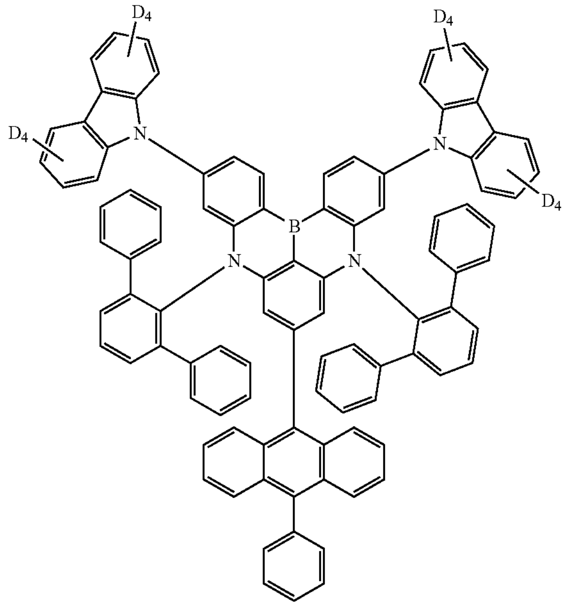
45
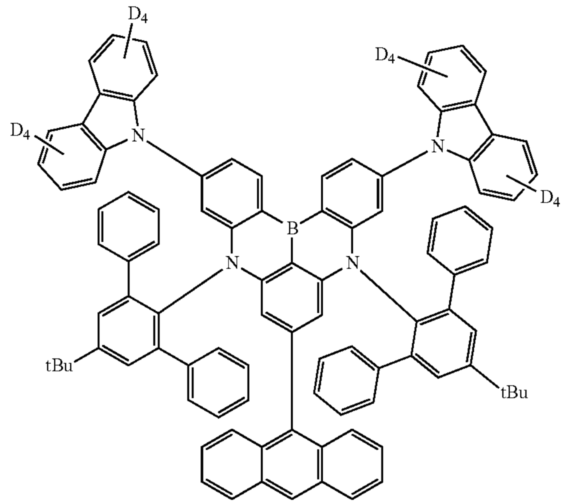
-continued
46
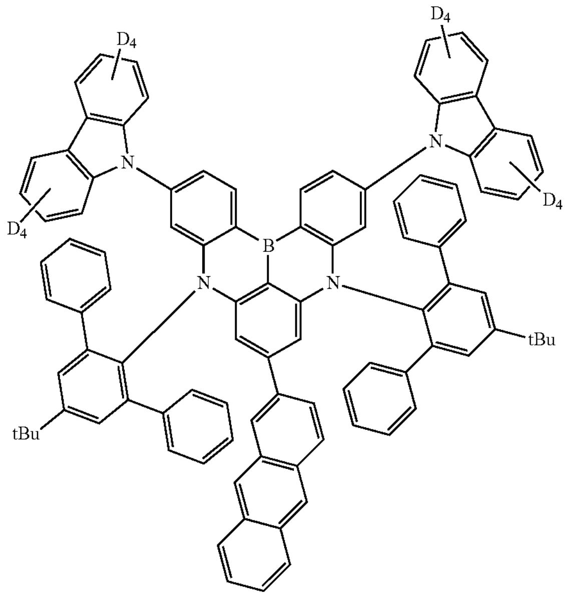
47
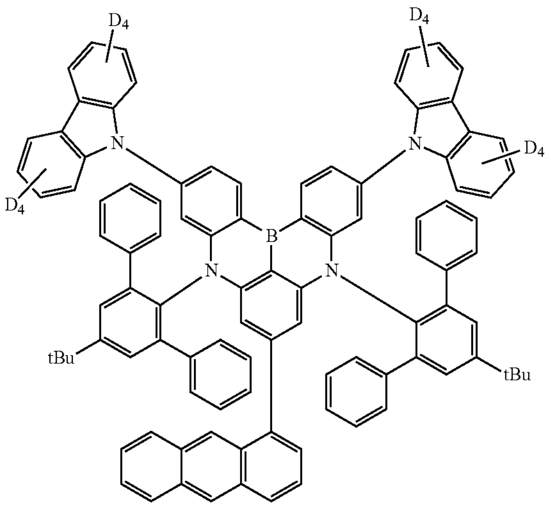

-continued

48

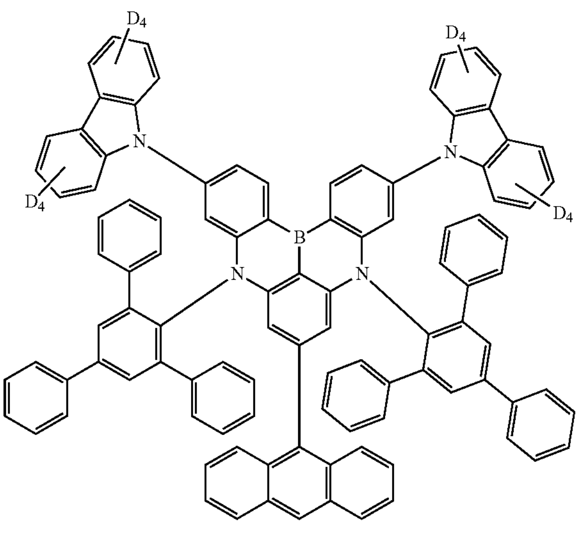

wherein in Compound Group 1,

D represents a deuterium atom, and tBu represents a t-butyl group.

12. A fused polycyclic compound represented by Formula 1:

[Formula 1}

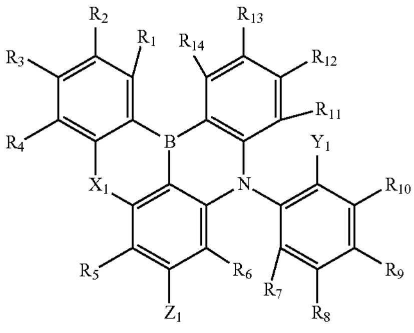

wherein in Formula 1, $X_1$ is $N(Ar_1)$, O, or S, $Ar_1$ and $Y_1$ are each independently a substituted or unsubstituted aryl group of 6 to 30 ring-forming carbon atoms or a substituted or unsubstituted heteroaryl group of 2 to 30 ring-forming carbon atoms, at least one of $R_1$ to $R_{14}$ and $Z_1$ is each independently a group represented by Formula 2, and the remainder of $R_1$ to $R_{14}$ and $Z_1$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms;

[Formula 2]

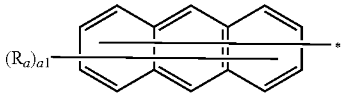

wherein in Formula 2, a1 is an integer from 0 to 9, and $R_a$ is a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

13. The fused polycyclic compound of claim 12, wherein the fused polycyclic compound represented by Formula 1 is represented by one of Formula 1-A1 to Formula 1-A3:

[Formula 1-A1]

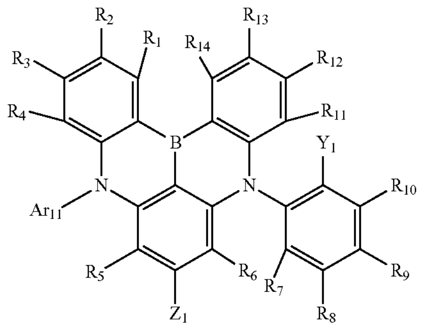

[Formula 1-A2]

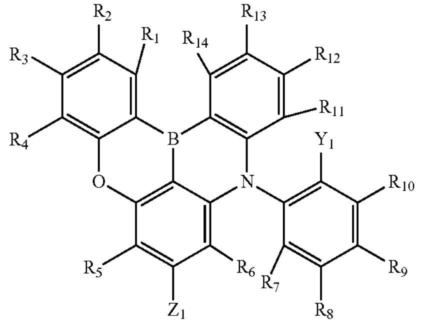

[Formula 1-A3]

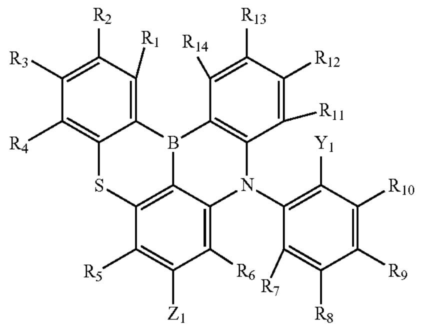

wherein in Formula 1-A1, $Ar_{11}$ is a substituted or unsubstituted aryl group of 6 to 30 ring-forming carbon atoms, and wherein in Formula 1-A1 to Formula 1-A3, $Y_1$, $R_1$ to $R_{14}$, and $Z_1$ are the same as defined in Formula 1.

14. The fused polycyclic compound of claim 13, wherein in Formula 1-A1, $Ar_{11}$ is a group represented by one of Formula AR-1 to Formula AR-5:

AR-1

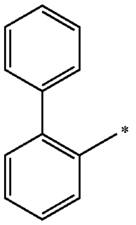

AR-2

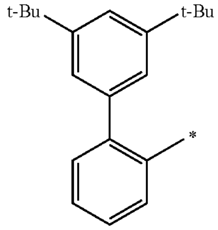

AR-3

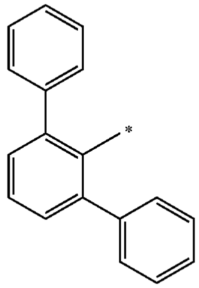

AR-4

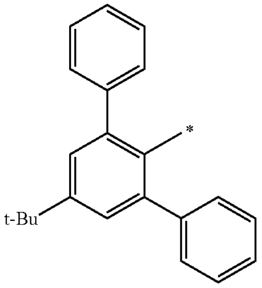

AR-5

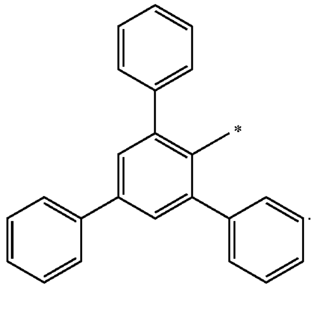

15. The fused polycyclic compound of claim 12, wherein the fused polycyclic compound represented by Formula 1 is represented by Formula 1-B:

[Formula 1-B]

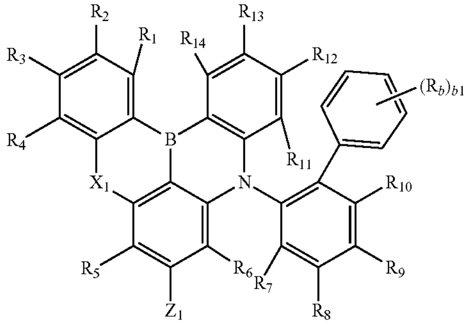

wherein in Formula 1-B, b1 is an integer from 0 to 5, $R_b$ is a hydrogen atom, a deuterium atom, or a substituted or unsubstituted alkyl group of 1 to 20 carbon atoms, and $X_1$, $R_1$ to $R_{14}$, and $Z_1$ are the same as defined in Formula 1.

16. The fused polycyclic compound of claim 12, wherein the group represented by Formula 2 is a group represented by one of Formula 2-A to Formula 2-C:

[Formula 2-A]

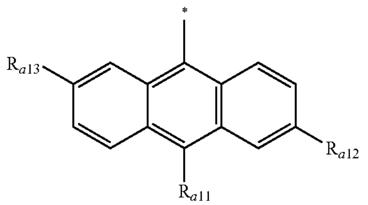

[Formula 2-B]

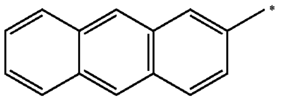

[Formula 2-C]

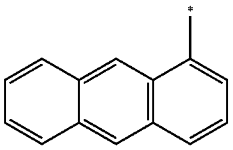

wherein in Formula 2-A, $R_{a11}$ to $R_{a13}$ are each independently a hydrogen atom, a deuterium atom, or a substituted or unsubstituted aryl group of 6 to 30 ring-forming carbon atoms.

17. The fused polycyclic compound of claim 12, wherein the fused polycyclic compound represented by Formula 1 is represented by Formula 1-C:

[Formula 1-C]

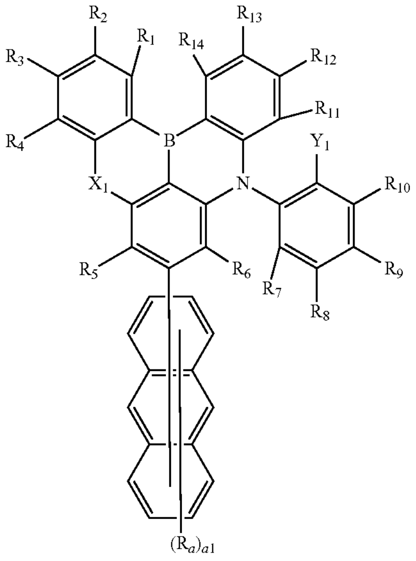

wherein in Formula 1-C, $X_1$, $Y_1$, and $R_1$ to $R_{14}$ are the same as defined in Formula 1, and a1 and $R_a$ are the same as defined in Formula 2.

18. The fused polycyclic compound of claim 17, wherein the fused polycyclic compound represented by Formula 1-C is represented by one of Formula 1-C1 to Formula 1-C3:

[Formula 1-C1]

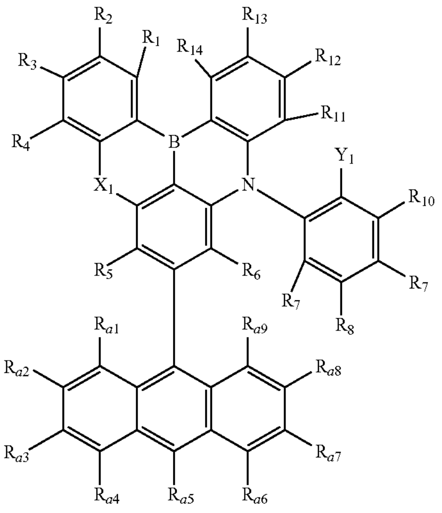

-continued

[Formula 1-C2]

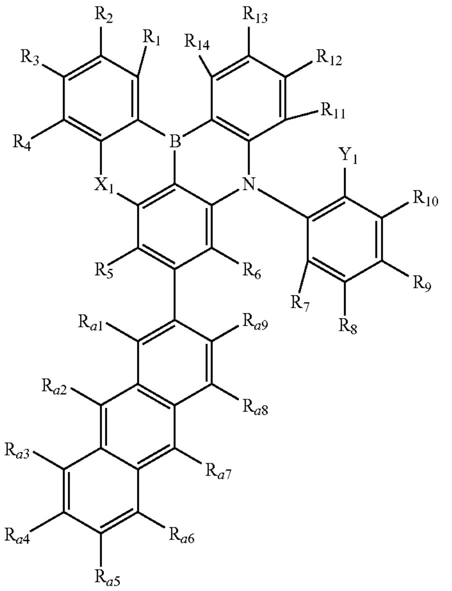

[Formula 1-C3]

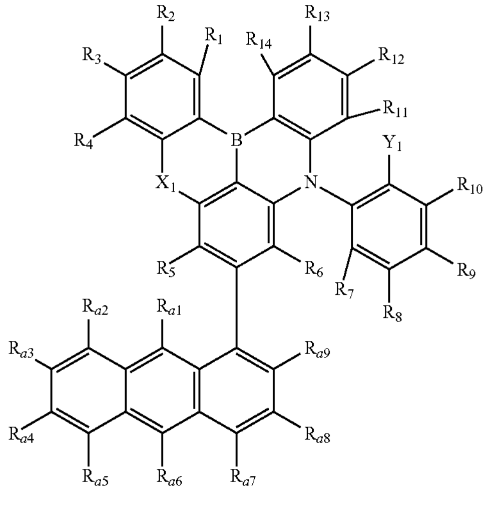

wherein in Formula 1-C1 to Formula 1-C3, $R_{a1}$ to $R_{a9}$ are each independently a hydrogen atom, a deuterium atom, or a substituted or unsubstituted aryl group of 6 to 30 ring-forming carbon atoms, and $X_1$, $Y_1$, and $R_1$ to $R_{14}$ are the same as defined in Formula 1-C.

19. The fused polycyclic compound of claim 18, wherein the fused polycyclic compound represented by Formula 1-C1 is represented by one of Formula 1-C11 to Formula 1-C13:

[Formula 1-C11]

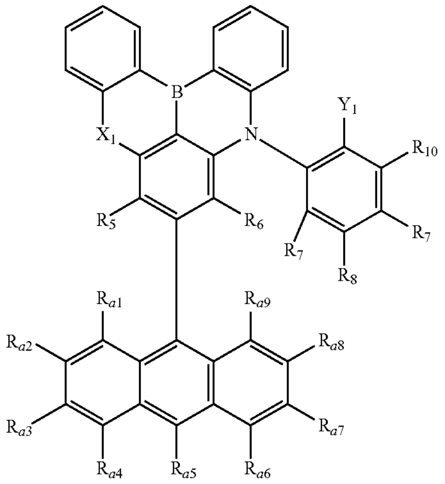

[Formula 1-C12]

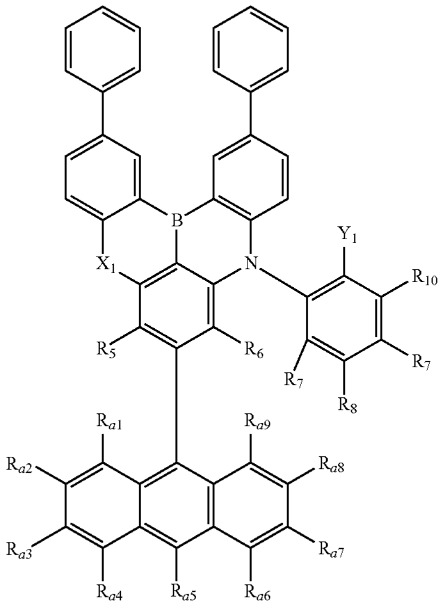

-continued

[Formula 1-C13]

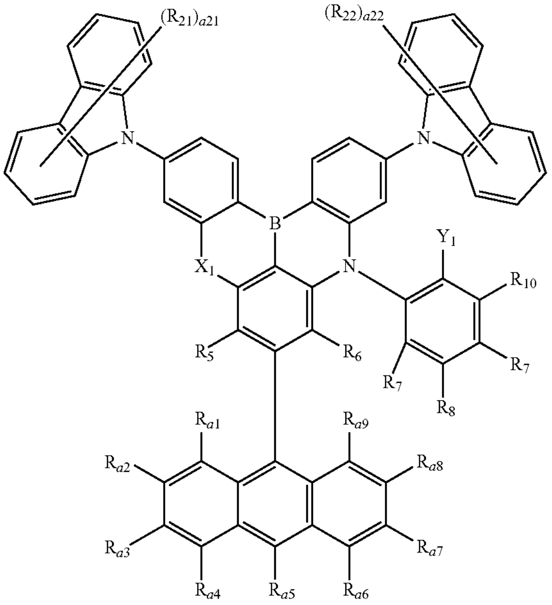

wherein in Formula 1-C13, a21 and a22 are each independently an integer from 0 to 8, and $R_{21}$ and $R_{22}$ are each independently a hydrogen atom, a deuterium atom, or a substituted or unsubstituted alkyl group of 1 to 20 carbon atoms, and wherein in Formula 1-C11 to Formula 1-C13, $X_1$, $Y_1$, $R_5$ to $R_{10}$, and $R_{a1}$ to $R_{a9}$ are the same as defined in Formula 1-C1.

20. The fused polycyclic compound of claim 12, wherein the fused polycyclic compound represented by Formula 1 is selected from Compound Group 1:

[Compound Group 1]

1

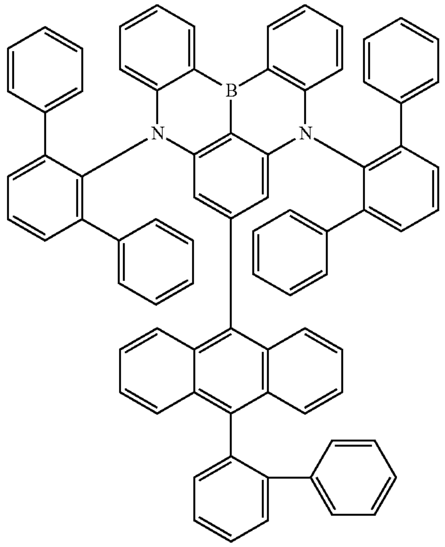

-continued
2
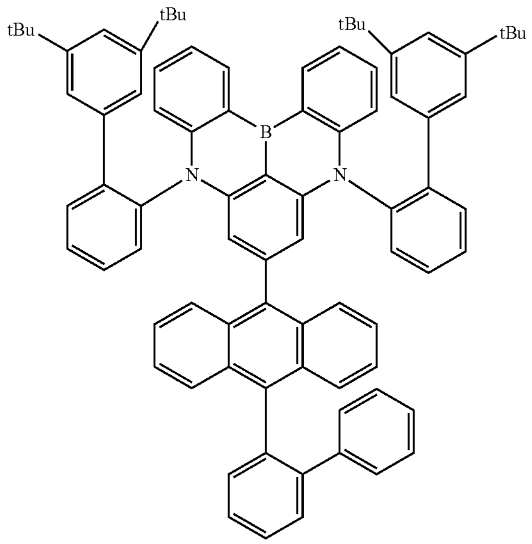
3
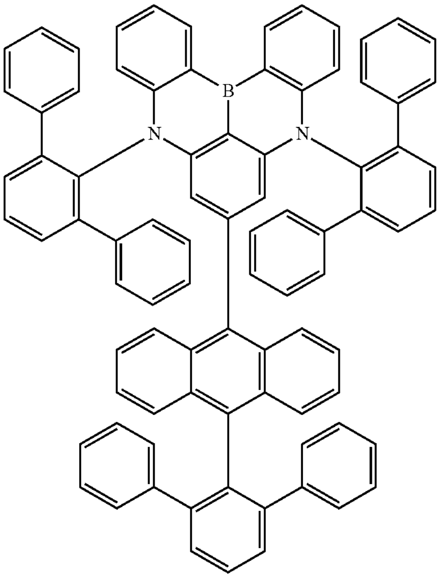
-continued
4
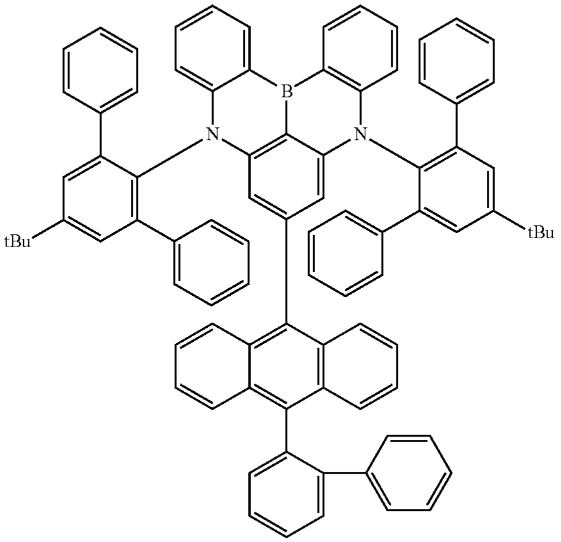
5
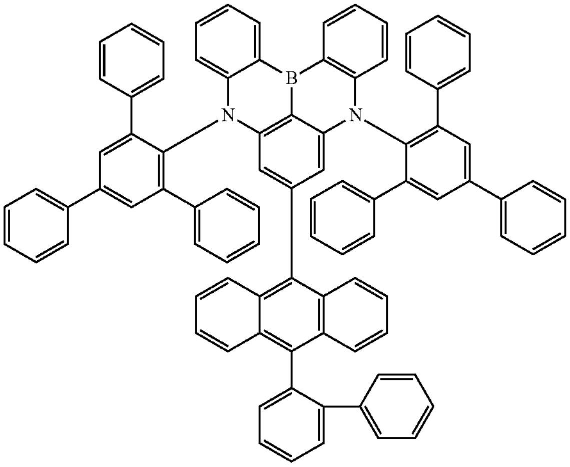
6
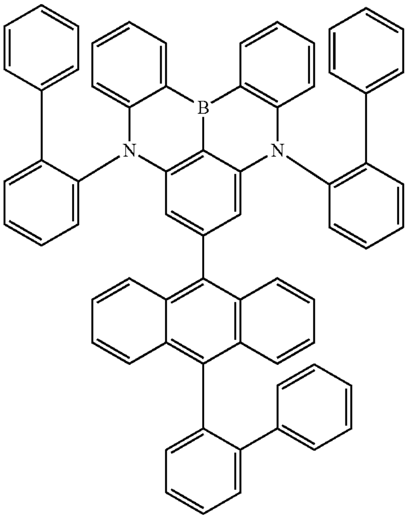

-continued
7
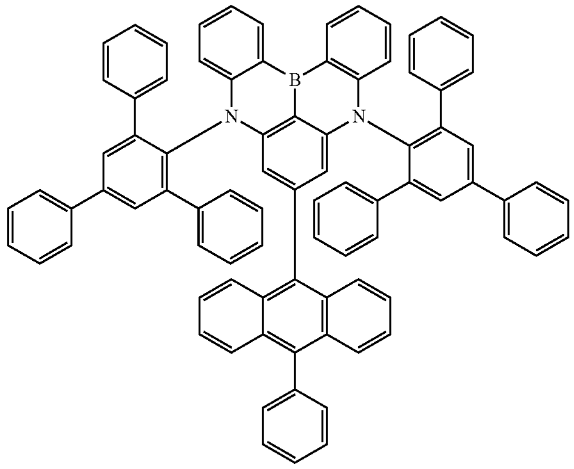
8
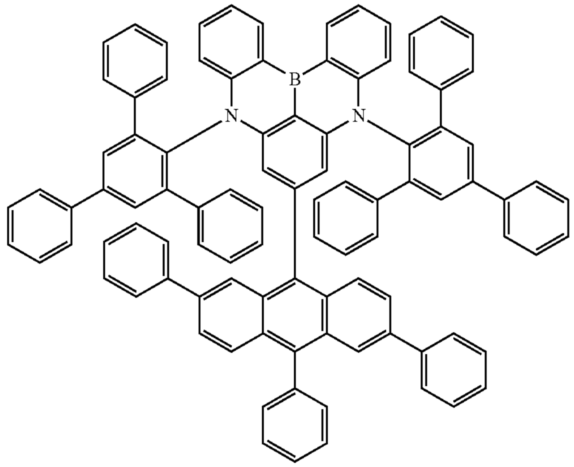
9
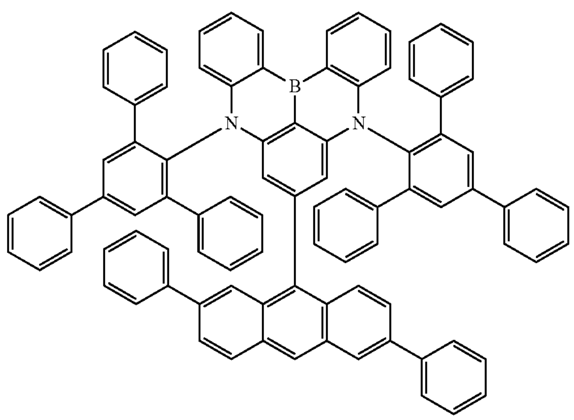
-continued
10
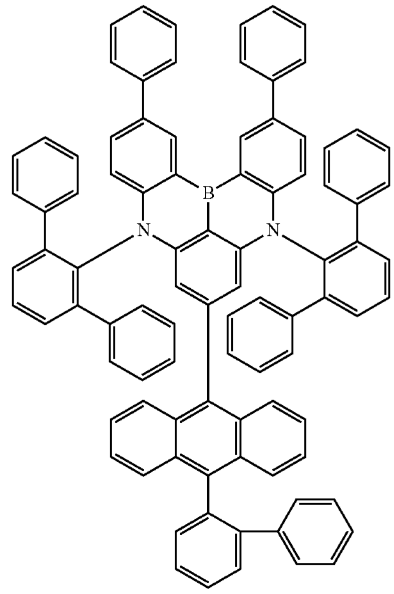
11
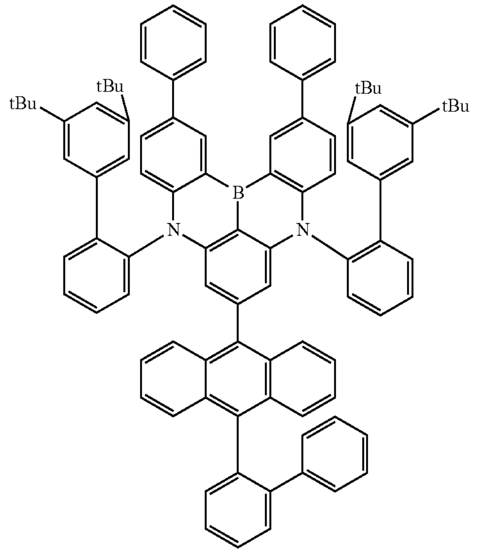

-continued
12
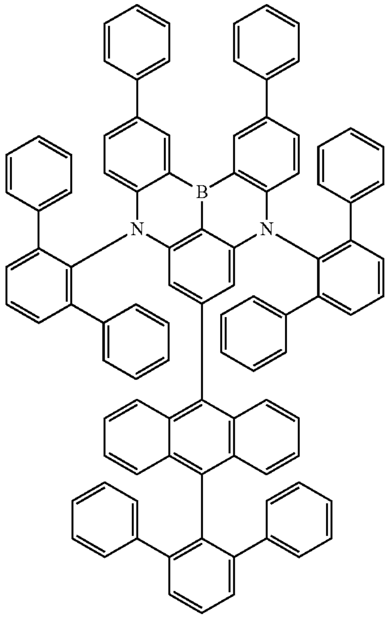
13
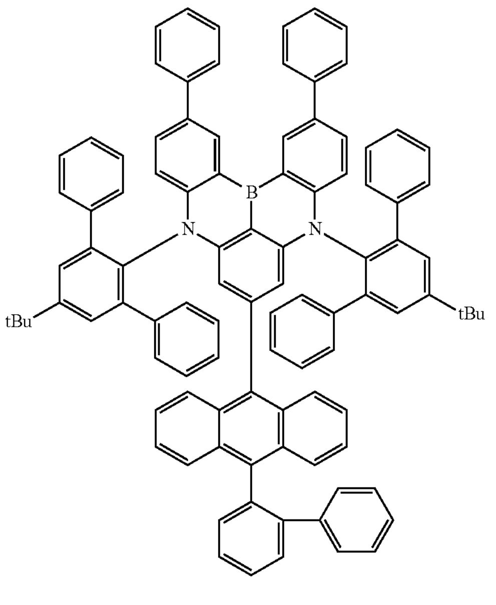
-continued
14
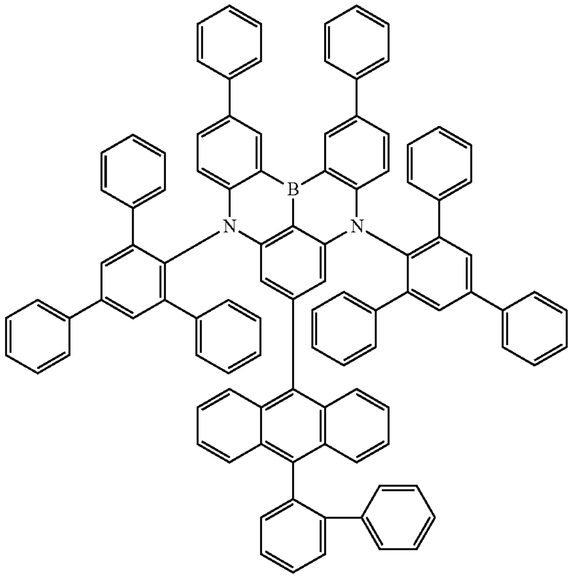
15
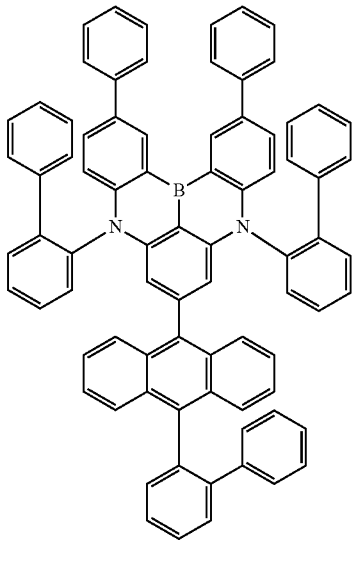

-continued
16
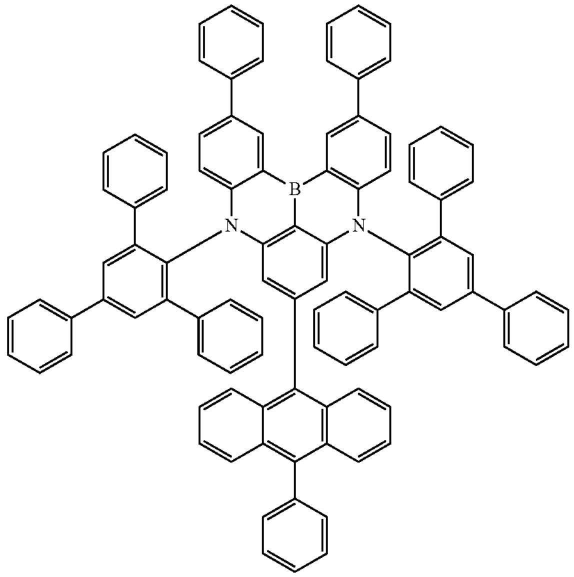
17
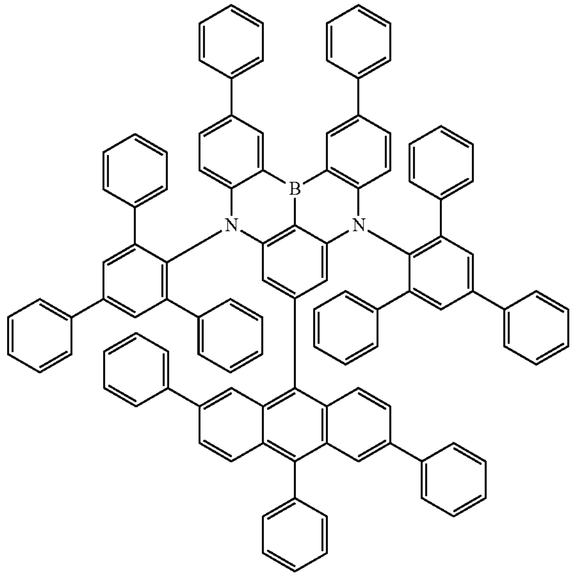
-continued
18
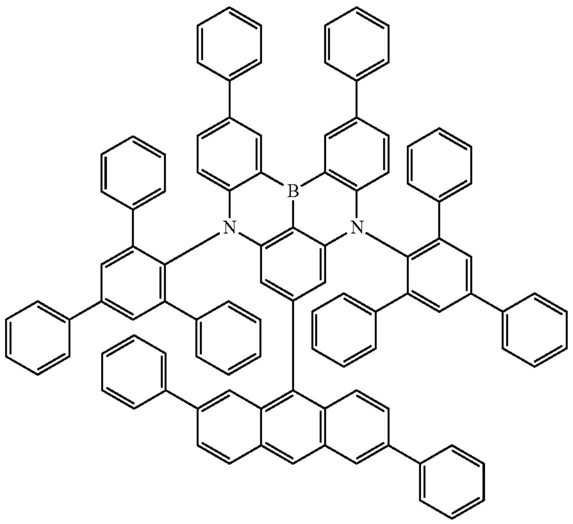
19
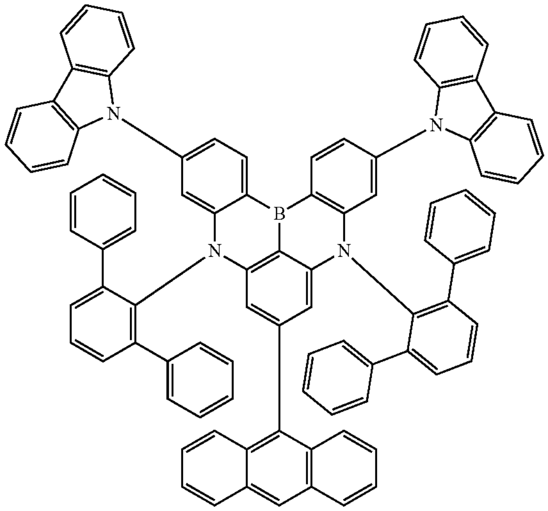

-continued
20
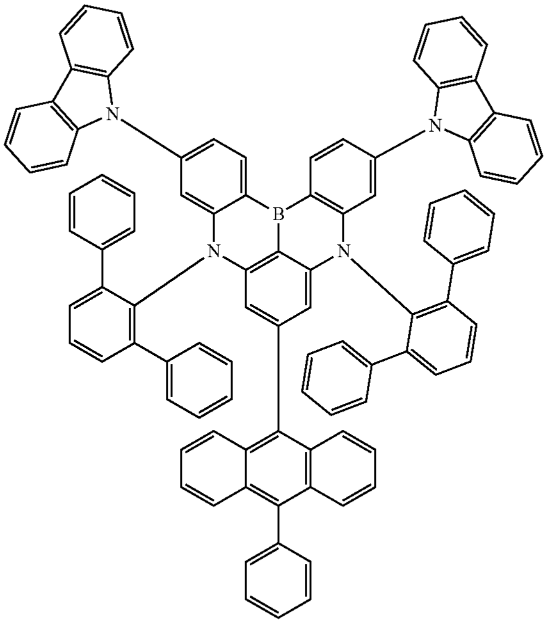
21
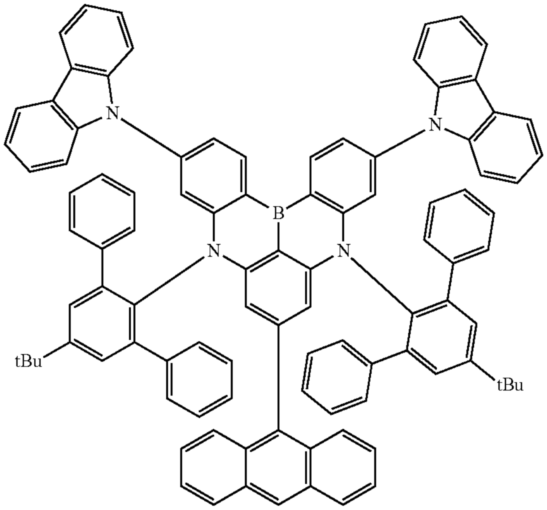
-continued
22
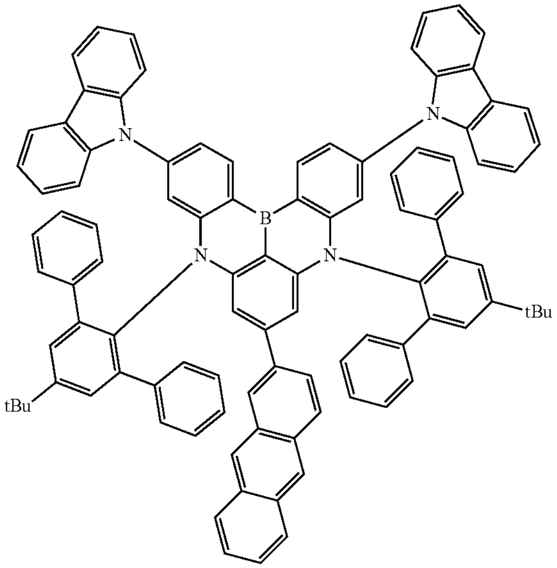
23
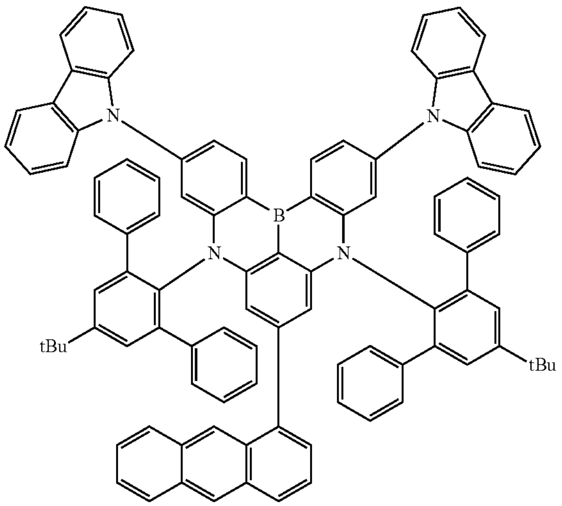
24
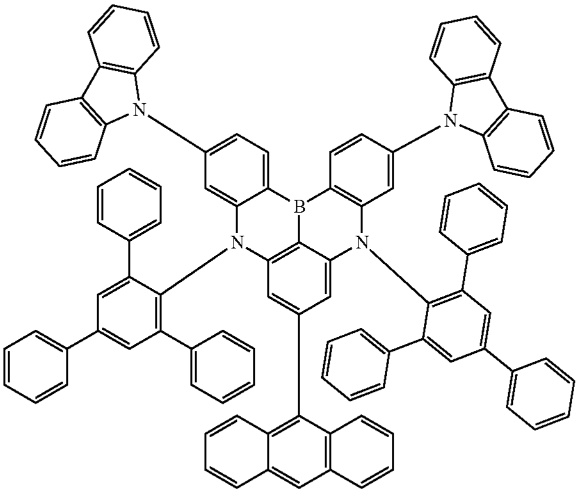

-continued
25
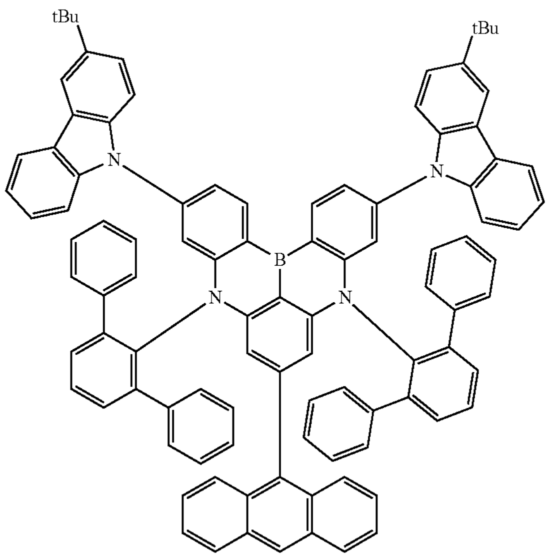
26
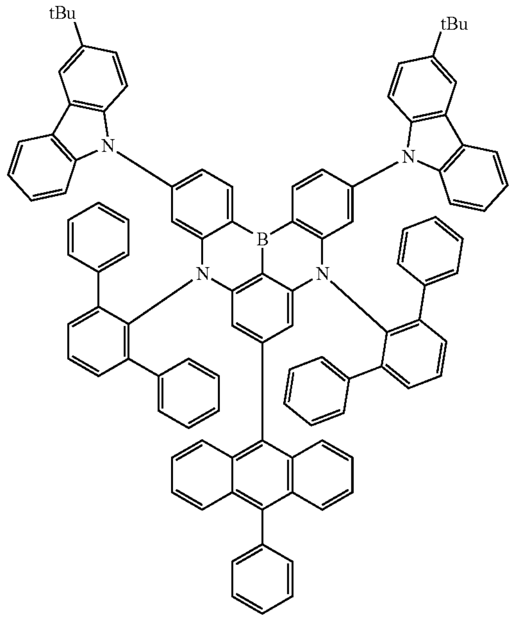
-continued
27
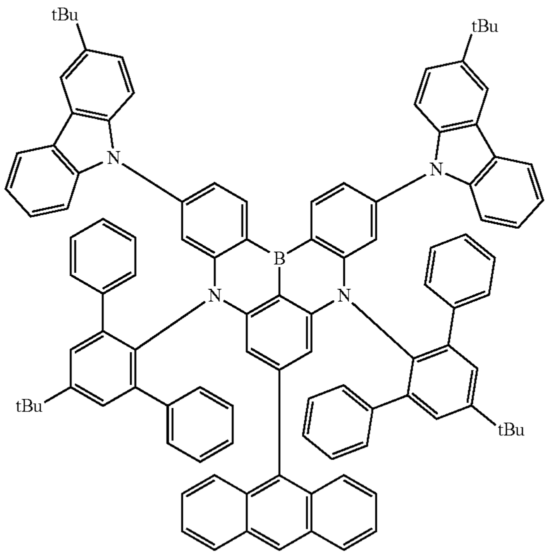
28
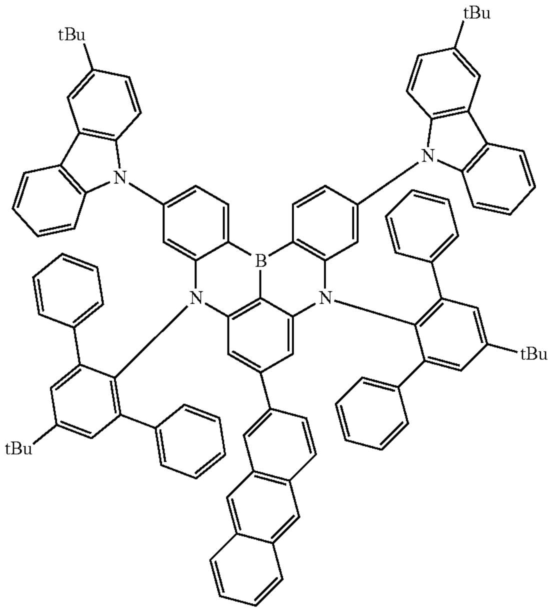

-continued
29
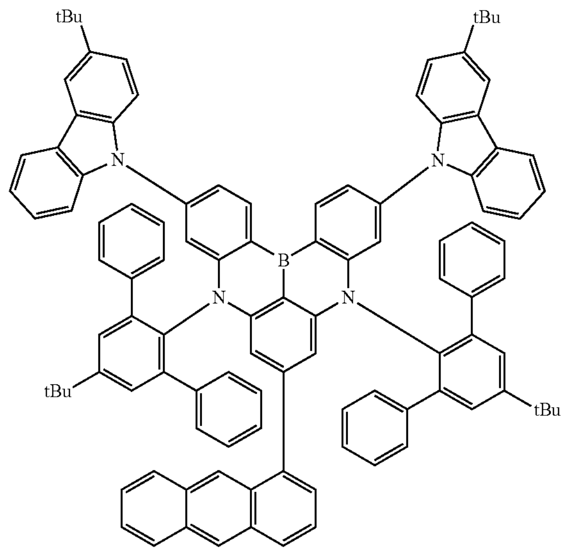
30
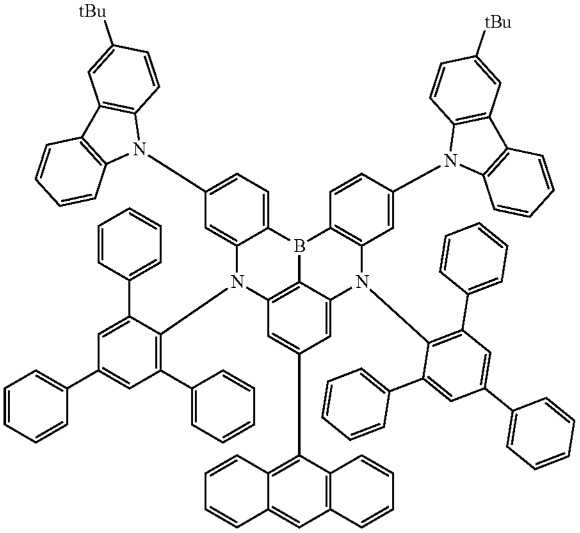
31
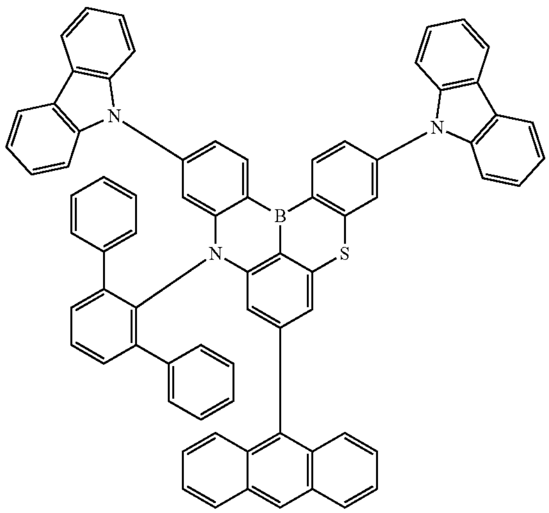
-continued
32
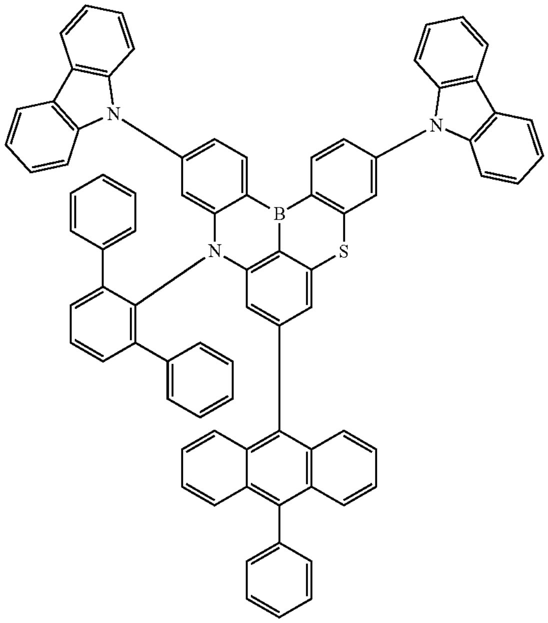
33
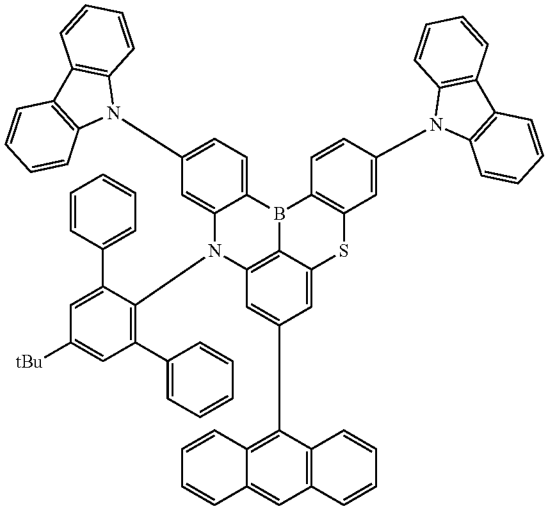

-continued
34
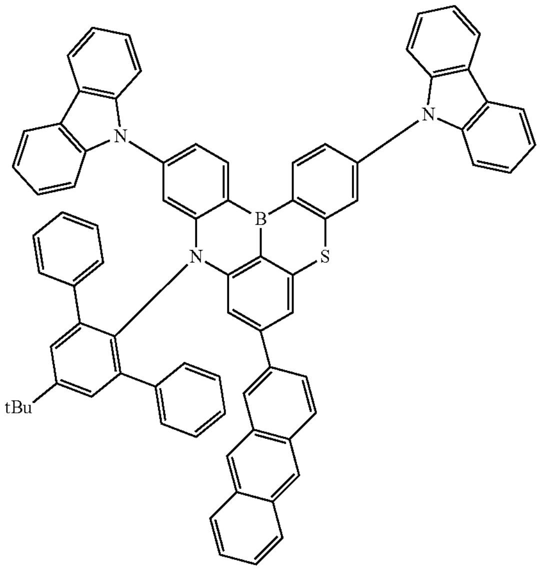
35
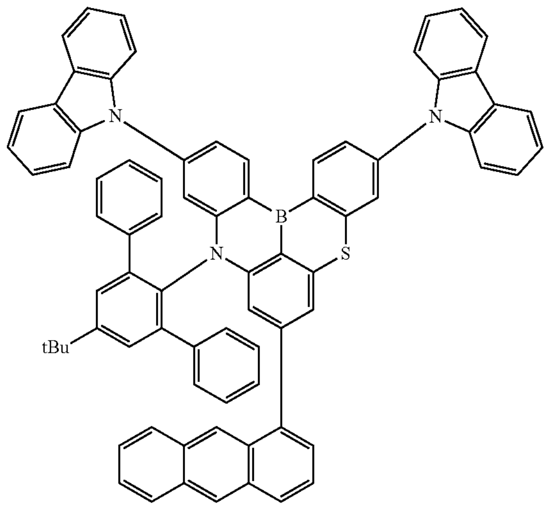
36
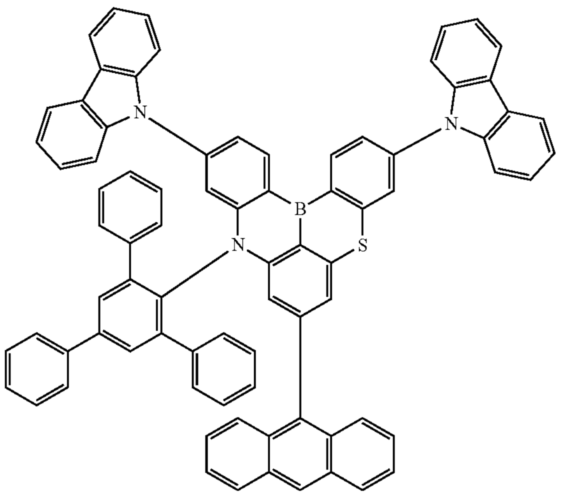
-continued
37
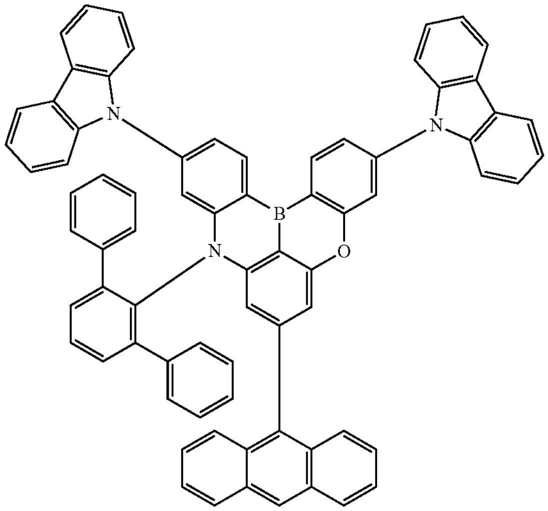
38
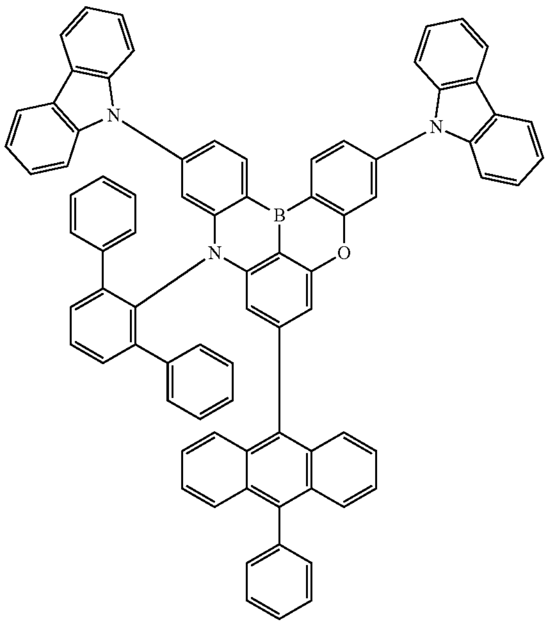

-continued
39
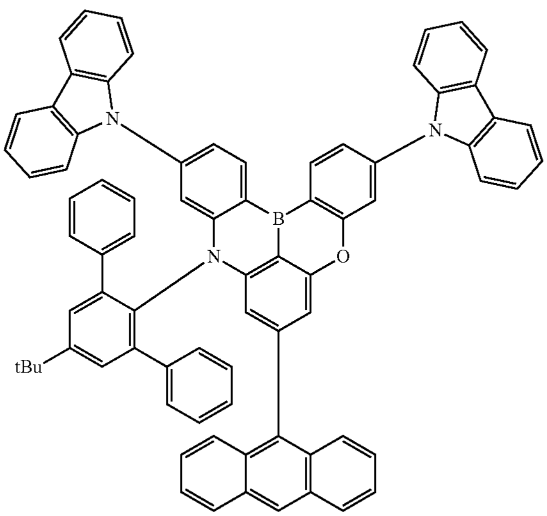
40
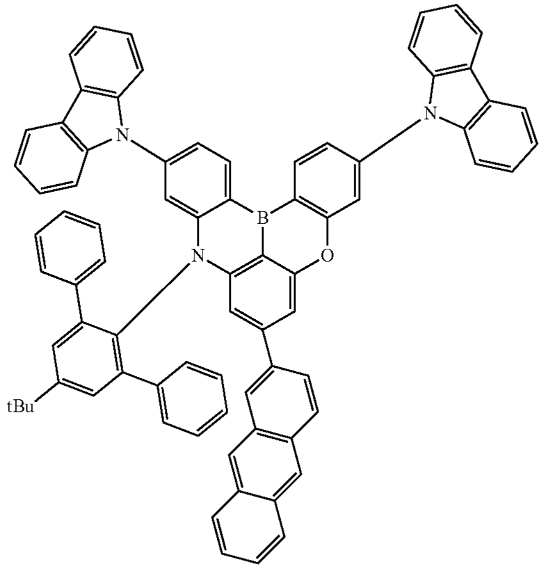
41
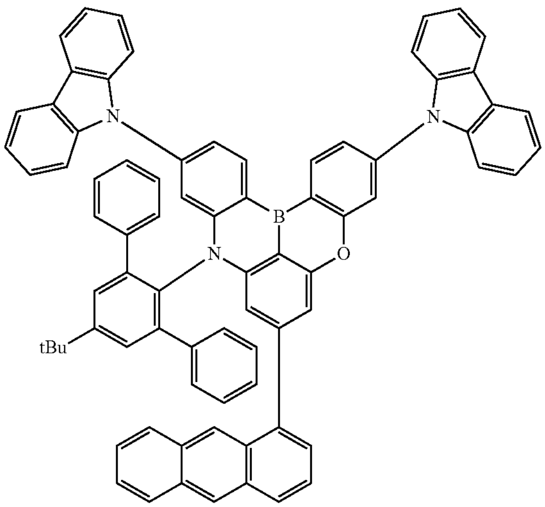
-continued
42
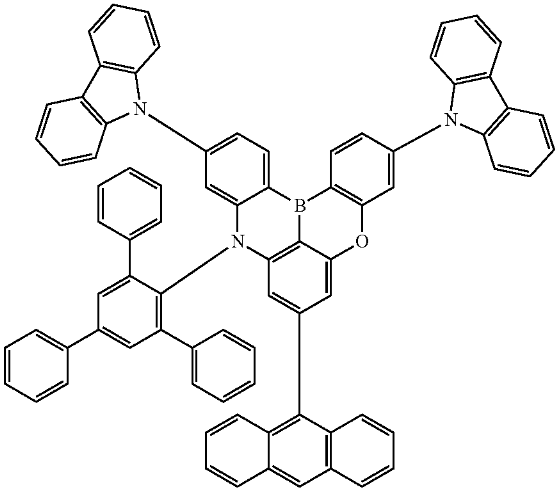
43
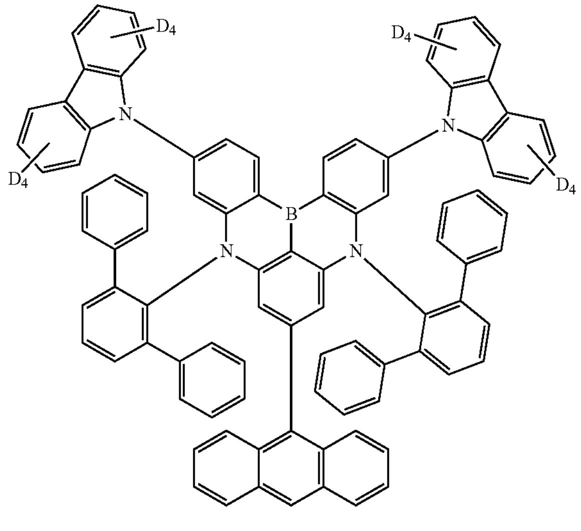

-continued
44
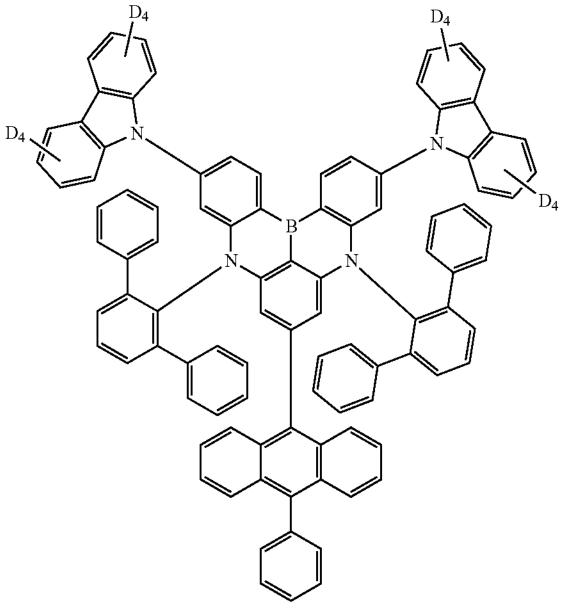
45
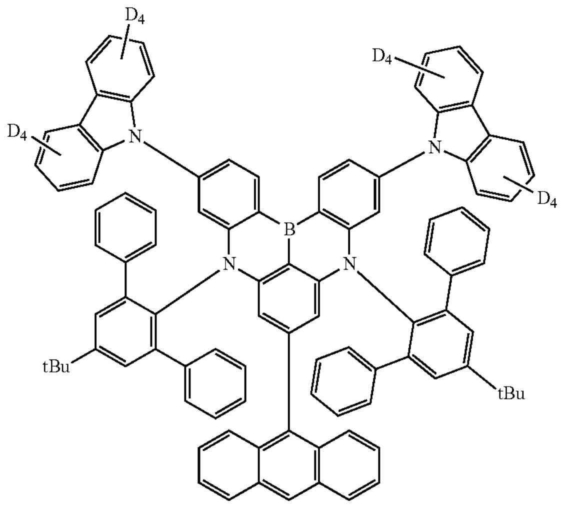
-continued
46
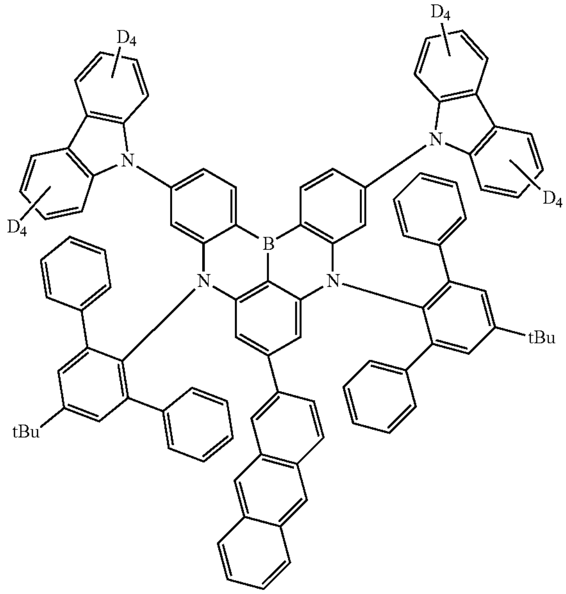
47
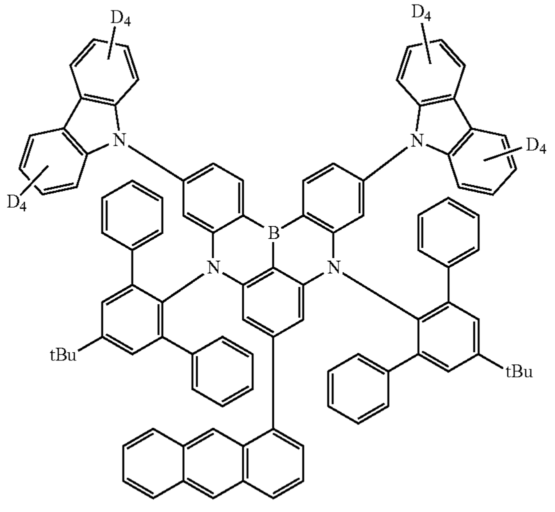

-continued
48
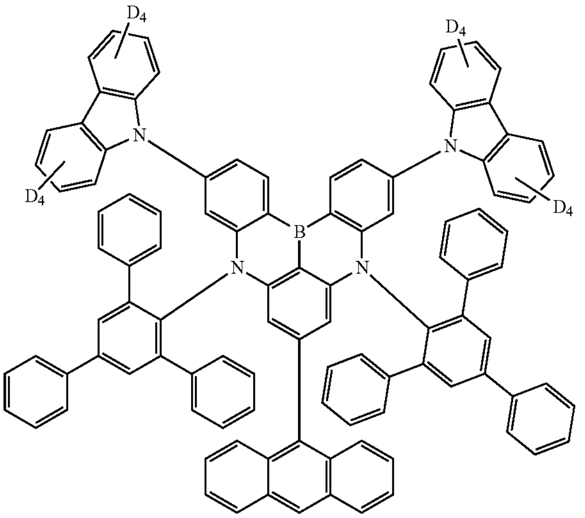
wherein in Compound Group 1, D represents a deuterium atom, and tBu represents a t-butyl group.
* * * * *